US007057536B2

(12) United States Patent
Lee et al.

(10) Patent No.: US 7,057,536 B2
(45) Date of Patent: Jun. 6, 2006

(54) RATE-13/15 MAXIMUM TRANSITION RUN CODE ENCODING AND DECODING METHOD AND APPARATUS

(75) Inventors: Jun Lee, Yongin-si (KR); Joo-hyun Lee, Seoul (KR); Kyu-suk Lee, Seoul (KR); Jae-jin Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 11/031,529

(22) Filed: Jan. 10, 2005

(65) Prior Publication Data

US 2005/0174262 A1 Aug. 11, 2005

(30) Foreign Application Priority Data

Jan. 8, 2004 (KR) ..................... 10-2004-0001298

(51) Int. Cl.
*H03M 7/00* (2006.01)

(52) U.S. Cl. .......................................... 341/59; 341/58

(58) Field of Classification Search .................. 341/59
See application file for complete search history.

(56) References Cited

U.S. PATENT DOCUMENTS 5,731,768 A * 3/1998 Tsang .......................... 341/59
6,011,497 A * 1/2000 Tsang et al. .................. 341/59
6,400,288 B1 * 6/2002 Fredrickson et al. .......... 341/59
6,829,306 B1 * 12/2004 Immink et al. ............. 375/253

* cited by examiner

*Primary Examiner*—Linh Van Nguyen
(74) *Attorney, Agent, or Firm*—Sughrue Mion, PLLC

(57) ABSTRACT

Provided are a rate 13/15 MTR code encoding/decoding method and apparatus. The encoding method includes: generating a predetermined rate-13/15 MTR code in which 13-bit data corresponds to 15-bit data; outputting input 13-bit data as a 15-bit codeword according to the rate-13/15 MTR code; checking whether codewords satisfy a predetermined constraint condition by connecting the 15-bit codeword and a subsequent 15-bit codeword; and converting specific bits of the codewords if the codewords violate the constraint condition and not converting the codewords if the codewords do not violate the constraint condition. The rate-13/15 MTR (j=2, k=8) code includes: 8192 codewords obtained to prevent the number of consecutive transitions from becoming 3 at code boundaries in a modulation coding process. Data can be reliably reproduced with high write density, and a large amount of data can be stored in and reproduced from a magnetic recording information storage medium.

20 Claims, 47 Drawing Sheets

START
CONVERT 13-BIT DATA INTO 15-BIT DATA — 300
CHECK MTR CONSTRAINT CONDITION — 310
IS MTR CONSTRAINT CONDITION SATISFIED ? — 320
YES
NO
CONVERT SPECIFIC BITS OF CODEWORDS — 330
OUTPUT CODEWORD — 340
END

FIG. 11A

| Source | Codeword | Source | Codeword | Source | Codeword | Source | Codeword |
|---|---|---|---|---|---|---|---|
| 0000000000000 | 000000100000001 | 0000000110010 | 000000101001001 | 0000001100100 | 000000110100000 | 0000010010110 | 000001000101010 |
| 0000000000001 | 000000100000010 | 0000000110011 | 000000101001010 | 0000001100101 | 000000110100001 | 0000010010111 | 000001000101011 |
| 0000000000010 | 000000100000011 | 0000000110100 | 000000101001011 | 0000001100110 | 000000110100010 | 0000010011000 | 000001000101100 |
| 0000000000011 | 000000100000100 | 0000000110101 | 000000101001100 | 0000001100111 | 000000110100011 | 0000010011001 | 000001000101101 |
| 0000000000100 | 000000100000101 | 0000000110110 | 000000101001101 | 0000001101000 | 000000110100100 | 0000010011010 | 000001000110000 |
| 0000000000101 | 000000100000110 | 0000000110111 | 000000101010000 | 0000001101001 | 000000110100101 | 0000010011011 | 000001000110001 |
| 0000000000110 | 000000100001000 | 0000000111000 | 000000101010001 | 0000001101010 | 000000110100110 | 0000010011100 | 000001000110010 |
| 0000000000111 | 000000100001001 | 0000000111001 | 000000101010010 | 0000001101011 | 000000110101000 | 0000010011101 | 000001000110011 |
| 0000000001000 | 000000100001010 | 0000000111010 | 000000101010011 | 0000001101100 | 000000110101001 | 0000010011110 | 000001000110100 |
| 0000000001001 | 000000100001011 | 0000000111011 | 000000101010100 | 0000001101101 | 000000110101010 | 0000010011111 | 000001000110101 |
| 0000000001010 | 000000100001100 | 0000000111100 | 000000101010101 | 0000001101110 | 000000110101011 | 0000010100000 | 000001000110110 |
| 0000000001011 | 000000100001101 | 0000000111101 | 000000101010110 | 0000001101111 | 000000110101100 | 0000010100001 | 000001001000000 |
| 0000000001100 | 000000100010000 | 0000000111110 | 000000101011000 | 0000001110000 | 000000110101101 | 0000010100010 | 000001001000001 |
| 0000000001101 | 000000100010001 | 0000000111111 | 000000101011001 | 0000001110001 | 000000110110000 | 0000010100011 | 000001001000010 |
| 0000000001110 | 000000100010010 | 0000001000000 | 000000101011010 | 0000001110010 | 000000110110001 | 0000010100100 | 000001001000011 |
| 0000000001111 | 000000100010011 | 0000001000001 | 000000101100000 | 0000001110011 | 000000110110010 | 0000010100101 | 000001001000100 |
| 0000000010000 | 000000100010100 | 0000001000010 | 000000101100001 | 0000001110100 | 000000110110011 | 0000010100110 | 000001001000101 |
| 0000000010001 | 000000100010101 | 0000001000011 | 000000101100010 | 0000001110101 | 000000110110100 | 0000010100111 | 000001001000110 |
| 0000000010010 | 000000100010110 | 0000001000100 | 000000101100011 | 0000001110110 | 000000110110101 | 0000010101000 | 000001001001000 |
| 0000000010011 | 000000100011000 | 0000001000101 | 000000101100100 | 0000001110111 | 000000110110110 | 0000010101001 | 000001001001001 |
| 0000000010100 | 000000100011001 | 0000001000110 | 000000101100101 | 0000001111000 | 000001000000010 | 0000010101010 | 000001001001010 |
| 0000000010101 | 000000100011010 | 0000001000111 | 000000101100110 | 0000001111001 | 000001000000011 | 0000010101011 | 000001001001011 |
| 0000000010110 | 000000100100000 | 0000001001000 | 000000101101000 | 0000001111010 | 000001000000100 | 0000010101100 | 000001001001100 |
| 0000000010111 | 000000100100001 | 0000001001001 | 000000101101001 | 0000001111011 | 000001000000101 | 0000010101101 | 000001001001101 |
| 0000000011000 | 000000100100010 | 0000001001010 | 000000101101010 | 0000001111100 | 000001000000110 | 0000010101110 | 000001001010000 |
| 0000000011001 | 000000100100011 | 0000001001011 | 000000101101011 | 0000001111101 | 000001000001000 | 0000010101111 | 000001001010001 |
| 0000000011010 | 000000100100100 | 0000001001100 | 000000101101100 | 0000001111110 | 000001000001001 | 0000010110000 | 000001001010010 |
| 0000000011011 | 000000100100101 | 0000001001101 | 000000101101101 | 0000001111111 | 000001000001010 | 0000010110001 | 000001001010011 |
| 0000000011100 | 000000100100110 | 0000001001110 | 000000110000001 | 0000010000000 | 000001000001011 | 0000010110010 | 000001001010100 |
| 0000000011101 | 000000100101000 | 0000001001111 | 000000110000010 | 0000010000001 | 000001000001100 | 0000010110011 | 000001001010101 |
| 0000000011110 | 000000100101001 | 0000001010000 | 000000110000011 | 0000010000010 | 000001000001101 | 0000010110100 | 000001001010110 |
| 0000000011111 | 000000100101010 | 0000001010001 | 000000110000100 | 0000010000011 | 000001000010000 | 0000010110101 | 000001001011000 |
| 0000000100000 | 000000100101011 | 0000001010010 | 000000110000101 | 0000010000100 | 000001000010001 | 0000010110110 | 000001001011001 |
| 0000000100001 | 000000100101100 | 0000001010011 | 000000110000110 | 0000010000101 | 000001000010010 | 0000010110111 | 000001001011010 |
| 0000000100010 | 000000100101101 | 0000001010100 | 000000110001000 | 0000010000110 | 000001000010011 | 0000010111000 | 000001001100000 |
| 0000000100011 | 000000100110000 | 0000001010101 | 000000110001001 | 0000010000111 | 000001000010100 | 0000010111001 | 000001001100001 |
| 0000000100100 | 000000100110001 | 0000001010110 | 000000110001010 | 0000010001000 | 000001000010101 | 0000010111010 | 000001001100010 |
| 0000000100101 | 000000100110010 | 0000001010111 | 000000110001011 | 0000010001001 | 000001000010110 | 0000010111011 | 000001001100011 |
| 0000000100110 | 000000100110011 | 0000001011000 | 000000110001100 | 0000010001010 | 000001000011000 | 0000010111100 | 000001001100100 |
| 0000000100111 | 000000100110100 | 0000001011001 | 000000110001101 | 0000010001011 | 000001000011001 | 0000010111101 | 000001001100101 |
| 0000000101000 | 000000100110101 | 0000001011010 | 000000110010000 | 0000010001100 | 000001000011010 | 0000010111110 | 000001001100110 |
| 0000000101001 | 000000100110110 | 0000001011011 | 000000110010001 | 0000010001101 | 000001000100000 | 0000010111111 | 000001001101000 |
| 0000000101010 | 000000101000000 | 0000001011100 | 000000110010010 | 0000010001110 | 000001000100001 | 0000011000000 | 000001001101001 |
| 0000000101011 | 000000101000001 | 0000001011101 | 000000110010011 | 0000010001111 | 000001000100010 | 0000011000001 | 000001001101010 |
| 0000000101100 | 000000101000010 | 0000001011110 | 000000110010100 | 0000010010000 | 000001000100011 | 0000011000010 | 000001001101011 |
| 0000000101101 | 000000101000011 | 0000001011111 | 000000110010101 | 0000010010001 | 000001000100100 | 0000011000011 | 000001001101100 |
| 0000000101110 | 000000101000100 | 0000001100000 | 000000110010110 | 0000010010010 | 000001000100101 | 0000011000100 | 000001001101101 |
| 0000000101111 | 000000101000101 | 0000001100001 | 000000110011000 | 0000010010011 | 000001000100110 | 0000011000101 | 000001010000001 |
| 0000000110000 | 000000101000110 | 0000001100010 | 000000110011001 | 0000010010100 | 000001000101000 | 0000011000110 | 000001010000010 |
| 0000000110001 | 000000101001000 | 0000001100011 | 000000110011010 | 0000010010101 | 000001000101001 | 0000011000111 | 000001010000011 |

FIG. 11B

| Source | Codeword | Source | Codeword | Source | Codeword | Source | Codeword |
|---|---|---|---|---|---|---|---|
| 0000011001000 | 000001010000100 | 0000011111010 | 000001011001100 | 0000100101100 | 000001100110011 | 0000101011110 | 000010000010001 |
| 0000011001001 | 000001010000101 | 0000011111011 | 000001011001101 | 0000100101101 | 000001100110100 | 0000101011111 | 000010000010010 |
| 0000011001010 | 000001010000110 | 0000011111100 | 000001011010000 | 0000100101110 | 000001100110101 | 0000101100000 | 000010000010011 |
| 0000011001011 | 000001010001000 | 0000011111101 | 000001011010001 | 0000100101111 | 000001100110110 | 0000101100001 | 000010000010100 |
| 0000011001100 | 000001010001001 | 0000011111110 | 000001011010010 | 0000100110000 | 000001101000000 | 0000101100010 | 000010000010101 |
| 0000011001101 | 000001010001010 | 0000011111111 | 000001011010011 | 0000100110001 | 000001101000001 | 0000101100011 | 000010000010110 |
| 0000011001110 | 000001010001011 | 0000100000000 | 000001011010100 | 0000100110010 | 000001101000010 | 0000101100100 | 000010000011000 |
| 0000011001111 | 000001010001100 | 0000100000001 | 000001011010101 | 0000100110011 | 000001101000011 | 0000101100101 | 000010000011001 |
| 0000011010000 | 000001010001101 | 0000100000010 | 000001011010110 | 0000100110100 | 000001101000100 | 0000101100110 | 000010000011010 |
| 0000011010001 | 000001010010000 | 0000100000011 | 000001011011000 | 0000100110101 | 000001101000101 | 0000101100111 | 000010000100000 |
| 0000011010010 | 000001010010001 | 0000100000100 | 000001011011001 | 0000100110110 | 000001101000110 | 0000101101000 | 000010000100001 |
| 0000011010011 | 000001010010010 | 0000100000101 | 000001011011010 | 0000100110111 | 000001101001000 | 0000101101001 | 000010000100010 |
| 0000011010100 | 000001010010011 | 0000100000110 | 000001100000001 | 0000100111000 | 000001101001001 | 0000101101010 | 000010000100011 |
| 0000011010101 | 000001010010100 | 0000100000111 | 000001100000010 | 0000100111001 | 000001101001010 | 0000101101011 | 000010000100100 |
| 0000011010110 | 000001010010101 | 0000100001000 | 000001100000011 | 0000100111010 | 000001101001011 | 0000101101100 | 000010000100101 |
| 0000011010111 | 000001010010110 | 0000100001001 | 000001100000100 | 0000100111011 | 000001101001100 | 0000101101101 | 000010000100110 |
| 0000011011000 | 000001010011000 | 0000100001010 | 000001100000101 | 0000100111100 | 000001101001101 | 0000101101110 | 000010000101000 |
| 0000011011001 | 000001010011001 | 0000100001011 | 000001100000110 | 0000100111101 | 000001101010000 | 0000101101111 | 000010000101001 |
| 0000011011010 | 000001010011010 | 0000100001100 | 000001100001000 | 0000100111110 | 000001101010001 | 0000101110000 | 000010000101010 |
| 0000011011011 | 000001010100000 | 0000100001101 | 000001100001001 | 0000100111111 | 000001101010010 | 0000101110001 | 000010000101011 |
| 0000011011100 | 000001010100001 | 0000100001110 | 000001100001010 | 0000101000000 | 000001101010011 | 0000101110010 | 000010000101100 |
| 0000011011101 | 000001010100010 | 0000100001111 | 000001100001011 | 0000101000001 | 000001101010100 | 0000101110011 | 000010000101101 |
| 0000011011110 | 000001010100011 | 0000100010000 | 000001100001100 | 0000101000010 | 000001101010101 | 0000101110100 | 000010000110000 |
| 0000011011111 | 000001010100100 | 0000100010001 | 000001100001101 | 0000101000011 | 000001101010110 | 0000101110101 | 000010000110001 |
| 0000011100000 | 000001010100101 | 0000100010010 | 000001100010000 | 0000101000100 | 000001101011000 | 0000101110110 | 000010000110010 |
| 0000011100001 | 000001010100110 | 0000100010011 | 000001100010001 | 0000101000101 | 000001101011001 | 0000101110111 | 000010000110011 |
| 0000011100010 | 000001010101000 | 0000100010100 | 000001100010010 | 0000101000110 | 000001101011010 | 0000101111000 | 000010000110100 |
| 0000011100011 | 000001010101001 | 0000100010101 | 000001100010011 | 0000101000111 | 000001101100000 | 0000101111001 | 000010000110101 |
| 0000011100100 | 000001010101010 | 0000100010110 | 000001100010100 | 0000101001000 | 000001101100001 | 0000101111010 | 000010000110110 |
| 0000011100101 | 000001010101011 | 0000100010111 | 000001100010101 | 0000101001001 | 000001101100010 | 0000101111011 | 000010001000000 |
| 0000011100110 | 000001010101100 | 0000100011000 | 000001100010110 | 0000101001010 | 000001101100011 | 0000101111100 | 000010001000001 |
| 0000011100111 | 000001010101101 | 0000100011001 | 000001100011000 | 0000101001011 | 000001101100100 | 0000101111101 | 000010001000010 |
| 0000011101000 | 000001010110000 | 0000100011010 | 000001100011001 | 0000101001100 | 000001101100101 | 0000101111110 | 000010001000011 |
| 0000011101001 | 000001010110001 | 0000100011011 | 000001100011010 | 0000101001101 | 000001101100110 | 0000101111111 | 000010001000100 |
| 0000011101010 | 000001010110010 | 0000100011100 | 000001100100000 | 0000101001110 | 000001101101000 | 0000110000000 | 000010001000101 |
| 0000011101011 | 000001010110011 | 0000100011101 | 000001100100001 | 0000101001111 | 000001101101001 | 0000110000001 | 000010001000110 |
| 0000011101100 | 000001010110100 | 0000100011110 | 000001100100010 | 0000101010000 | 000001101101010 | 0000110000010 | 000010001001000 |
| 0000011101101 | 000001010110101 | 0000100011111 | 000001100100011 | 0000101010001 | 000001101101011 | 0000110000011 | 000010001001001 |
| 0000011101110 | 000001010110110 | 0000100100000 | 000001100100100 | 0000101010010 | 000001101101100 | 0000110000100 | 000010001001010 |
| 0000011101111 | 000001011000000 | 0000100100001 | 000001100100101 | 0000101010011 | 000001101101101 | 0000110000101 | 000010001001011 |
| 0000011110000 | 000001011000001 | 0000100100010 | 000001100100110 | 0000101010100 | 000010000000100 | 0000110000110 | 000010001001100 |
| 0000011110001 | 000001011000010 | 0000100100011 | 000001100101000 | 0000101010101 | 000010000000101 | 0000110000111 | 000010001001101 |
| 0000011110010 | 000001011000011 | 0000100100100 | 000001100101001 | 0000101010110 | 000010000000110 | 0000110001000 | 000010001010000 |
| 0000011110011 | 000001011000100 | 0000100100101 | 000001100101010 | 0000101010111 | 000010000001000 | 0000110001001 | 000010001010001 |
| 0000011110100 | 000001011000101 | 0000100100110 | 000001100101011 | 0000101011000 | 000010000001001 | 0000110001010 | 000010001010010 |
| 0000011110101 | 000001011000110 | 0000100100111 | 000001100101100 | 0000101011001 | 000010000001010 | 0000110001011 | 000010001010011 |
| 0000011110110 | 000001011001000 | 0000100101000 | 000001100101101 | 0000101011010 | 000010000001011 | 0000110001100 | 000010001010100 |
| 0000011110111 | 000001011001001 | 0000100101001 | 000001100110000 | 0000101011011 | 000010000001100 | 0000110001101 | 000010001010101 |
| 0000011111000 | 000001011001010 | 0000100101010 | 000001100110001 | 0000101011100 | 000010000001101 | 0000110001110 | 000010001010110 |
| 0000011111001 | 000001011001011 | 0000100101011 | 000001100110010 | 0000101011101 | 000010000010000 | 0000110001111 | 000010001011000 |

FIG. 11C

| Source | Codeword | Source | Codeword | Source | Codeword | Source | Codeword |
|---|---|---|---|---|---|---|---|
| 0000110010000 | 000010001011001 | 0000111000010 | 000010010110000 | 0000111110100 | 000010100011001 | 0001000100110 | 000010101100101 |
| 0000110010001 | 000010001011010 | 0000111000011 | 000010010110001 | 0000111110101 | 000010100011010 | 0001000100111 | 000010101100110 |
| 0000110010010 | 000010001100000 | 0000111000100 | 000010010110010 | 0000111110110 | 000010100100000 | 0001000101000 | 000010101101000 |
| 0000110010011 | 000010001100001 | 0000111000101 | 000010010110011 | 0000111110111 | 000010100100001 | 0001000101001 | 000010101101001 |
| 0000110010100 | 000010001100010 | 0000111000110 | 000010010110100 | 0000111111000 | 000010100100010 | 0001000101010 | 000010101101010 |
| 0000110010101 | 000010001100011 | 0000111000111 | 000010010110101 | 0000111111001 | 000010100100011 | 0001000101011 | 000010101101011 |
| 0000110010110 | 000010001100100 | 0000111001000 | 000010010110110 | 0000111111010 | 000010100100100 | 0001000101100 | 000010101101100 |
| 0000110010111 | 000010001100101 | 0000111001001 | 000010011000000 | 0000111111011 | 000010100100101 | 0001000101101 | 000010101101101 |
| 0000110011000 | 000010001100110 | 0000111001010 | 000010011000001 | 0000111111100 | 000010100100110 | 0001000101110 | 000010110000001 |
| 0000110011001 | 000010001101000 | 0000111001011 | 000010011000010 | 0000111111101 | 000010100101000 | 0001000101111 | 000010110000010 |
| 0000110011010 | 000010001101001 | 0000111001100 | 000010011000011 | 0000111111110 | 000010100101001 | 0001000110000 | 000010110000011 |
| 0000110011011 | 000010001101010 | 0000111001101 | 000010011000100 | 0000111111111 | 000010100101010 | 0001000110001 | 000010110000100 |
| 0000110011100 | 000010001101011 | 0000111001110 | 000010011000101 | 0001000000000 | 000010100101011 | 0001000110010 | 000010110000101 |
| 0000110011101 | 000010001101100 | 0000111001111 | 000010011000110 | 0001000000001 | 000010100101100 | 0001000110011 | 000010110000110 |
| 0000110011110 | 000010001101101 | 0000111010000 | 000010011001000 | 0001000000010 | 000010100101101 | 0001000110100 | 000010110001000 |
| 0000110011111 | 000010010000001 | 0000111010001 | 000010011001001 | 0001000000011 | 000010100110000 | 0001000110101 | 000010110001001 |
| 0000110100000 | 000010010000010 | 0000111010010 | 000010011001010 | 0001000000100 | 000010100110001 | 0001000110110 | 000010110001010 |
| 0000110100001 | 000010010000011 | 0000111010011 | 000010011001011 | 0001000000101 | 000010100110010 | 0001000110111 | 000010110001011 |
| 0000110100010 | 000010010000100 | 0000111010100 | 000010011001100 | 0001000000110 | 000010100110011 | 0001000111000 | 000010110001100 |
| 0000110100011 | 000010010000101 | 0000111010101 | 000010011001101 | 0001000000111 | 000010100110100 | 0001000111001 | 000010110001101 |
| 0000110100100 | 000010010000110 | 0000111010110 | 000010011010000 | 0001000001000 | 000010100110101 | 0001000111010 | 000010110010000 |
| 0000110100101 | 000010010001000 | 0000111010111 | 000010011010001 | 0001000001001 | 000010100110110 | 0001000111011 | 000010110010001 |
| 0000110100110 | 000010010001001 | 0000111011000 | 000010011010010 | 0001000001010 | 000010101000000 | 0001000111100 | 000010110010010 |
| 0000110100111 | 000010010001010 | 0000111011001 | 000010011010011 | 0001000001011 | 000010101000001 | 0001000111101 | 000010110010011 |
| 0000110101000 | 000010010001011 | 0000111011010 | 000010011010100 | 0001000001100 | 000010101000010 | 0001000111110 | 000010110010100 |
| 0000110101001 | 000010010001100 | 0000111011011 | 000010011010101 | 0001000001101 | 000010101000011 | 0001000111111 | 000010110010101 |
| 0000110101010 | 000010010001101 | 0000111011100 | 000010011010110 | 0001000001110 | 000010101000100 | 0001001000000 | 000010110010110 |
| 0000110101011 | 000010010010000 | 0000111011101 | 000010011011000 | 0001000001111 | 000010101000101 | 0001001000001 | 000010110011000 |
| 0000110101100 | 000010010010001 | 0000111011110 | 000010011011001 | 0001000010000 | 000010101000110 | 0001001000010 | 000010110011001 |
| 0000110101101 | 000010010010010 | 0000111011111 | 000010011011010 | 0001000010001 | 000010101001000 | 0001001000011 | 000010110011010 |
| 0000110101110 | 000010010010011 | 0000111100000 | 000010100000001 | 0001000010010 | 000010101001001 | 0001001000100 | 000010110100000 |
| 0000110101111 | 000010010010100 | 0000111100001 | 000010100000010 | 0001000010011 | 000010101001010 | 0001001000101 | 000010110100001 |
| 0000110110000 | 000010010010101 | 0000111100010 | 000010100000011 | 0001000010100 | 000010101001011 | 0001001000110 | 000010110100010 |
| 0000110110001 | 000010010010110 | 0000111100011 | 000010100000100 | 0001000010101 | 000010101001100 | 0001001000111 | 000010110100011 |
| 0000110110010 | 000010010011000 | 0000111100100 | 000010100000101 | 0001000010110 | 000010101001101 | 0001001001000 | 000010110100100 |
| 0000110110011 | 000010010011001 | 0000111100101 | 000010100000110 | 0001000010111 | 000010101010000 | 0001001001001 | 000010110100101 |
| 0000110110100 | 000010010011010 | 0000111100110 | 000010100001000 | 0001000011000 | 000010101010001 | 0001001001010 | 000010110100110 |
| 0000110110101 | 000010010100000 | 0000111100111 | 000010100001001 | 0001000011001 | 000010101010010 | 0001001001011 | 000010110101000 |
| 0000110110110 | 000010010100001 | 0000111101000 | 000010100001010 | 0001000011010 | 000010101010011 | 0001001001100 | 000010110101001 |
| 0000110110111 | 000010010100010 | 0000111101001 | 000010100001011 | 0001000011011 | 000010101010100 | 0001001001101 | 000010110101010 |
| 0000110111000 | 000010010100011 | 0000111101010 | 000010100001100 | 0001000011100 | 000010101010101 | 0001001001110 | 000010110101011 |
| 0000110111001 | 000010010100100 | 0000111101011 | 000010100001101 | 0001000011101 | 000010101010110 | 0001001001111 | 000010110101100 |
| 0000110111010 | 000010010100101 | 0000111101100 | 000010100010000 | 0001000011110 | 000010101011000 | 0001001010000 | 000010110101101 |
| 0000110111011 | 000010010100110 | 0000111101101 | 000010100010001 | 0001000011111 | 000010101011001 | 0001001010001 | 000010110110000 |
| 0000110111100 | 000010010101000 | 0000111101110 | 000010100010010 | 0001000100000 | 000010101011010 | 0001001010010 | 000010110110001 |
| 0000110111101 | 000010010101001 | 0000111101111 | 000010100010011 | 0001000100001 | 000010101100000 | 0001001010011 | 000010110110010 |
| 0000110111110 | 000010010101010 | 0000111110000 | 000010100010100 | 0001000100010 | 000010101100001 | 0001001010100 | 000010110110011 |
| 0000110111111 | 000010010101011 | 0000111110001 | 000010100010101 | 0001000100011 | 000010101100010 | 0001001010101 | 000010110110100 |
| 0000111000000 | 000010010101100 | 0000111110010 | 000010100010110 | 0001000100100 | 000010101100011 | 0001001010110 | 000010110110101 |
| 0000111000001 | 000010010101101 | 0000111110011 | 000010100011000 | 0001000100101 | 000010101100100 | 0001001010111 | 000010110110110 |

FIG. 11D

| Source | Codeword | Source | Codeword | Source | Codeword | Source | Codeword |
|---|---|---|---|---|---|---|---|
| 0001001011000 | 000011000000010 | 0001010001010 | 000011001001010 | 0001010111100 | 000011010100001 | 0001011101110 | 000100000010010 |
| 0001001011001 | 000011000000011 | 0001010001011 | 000011001001011 | 0001010111101 | 000011010100010 | 0001011101111 | 000100000010011 |
| 0001001011010 | 000011000000100 | 0001010001100 | 000011001001100 | 0001010111110 | 000011010100011 | 0001011110000 | 000100000010100 |
| 0001001011011 | 000011000000101 | 0001010001101 | 000011001001101 | 0001010111111 | 000011010100100 | 0001011110001 | 000100000010101 |
| 0001001011100 | 000011000000110 | 0001010001110 | 000011001010000 | 0001011000000 | 000011010100101 | 0001011110010 | 000100000010110 |
| 0001001011101 | 000011000001000 | 0001010001111 | 000011001010001 | 0001011000001 | 000011010100110 | 0001011110011 | 000100000011000 |
| 0001001011110 | 000011000001001 | 0001010010000 | 000011001010010 | 0001011000010 | 000011010101000 | 0001011110100 | 000100000011001 |
| 0001001011111 | 000011000001010 | 0001010010001 | 000011001010011 | 0001011000011 | 000011010101001 | 0001011110101 | 000100000011010 |
| 0001001100000 | 000011000001011 | 0001010010010 | 000011001010100 | 0001011000100 | 000011010101010 | 0001011110110 | 000100000100000 |
| 0001001100001 | 000011000001100 | 0001010010011 | 000011001010101 | 0001011000101 | 000011010101011 | 0001011110111 | 000100000100001 |
| 0001001100010 | 000011000001101 | 0001010010100 | 000011001010110 | 0001011000110 | 000011010101100 | 0001011111000 | 000100000100010 |
| 0001001100011 | 000011000010000 | 0001010010101 | 000011001011000 | 0001011000111 | 000011010101101 | 0001011111001 | 000100000100011 |
| 0001001100100 | 000011000010001 | 0001010010110 | 000011001011001 | 0001011001000 | 000011010110000 | 0001011111010 | 000100000100100 |
| 0001001100101 | 000011000010010 | 0001010010111 | 000011001011010 | 0001011001001 | 000011010110001 | 0001011111011 | 000100000100101 |
| 0001001100110 | 000011000010011 | 0001010011000 | 000011001100000 | 0001011001010 | 000011010110010 | 0001011111100 | 000100000100110 |
| 0001001100111 | 000011000010100 | 0001010011001 | 000011001100001 | 0001011001011 | 000011010110011 | 0001011111101 | 000100000101000 |
| 0001001101000 | 000011000010101 | 0001010011010 | 000011001100010 | 0001011001100 | 000011010110100 | 0001011111110 | 000100000101001 |
| 0001001101001 | 000011000010110 | 0001010011011 | 000011001100011 | 0001011001101 | 000011010110101 | 0001011111111 | 000100000101010 |
| 0001001101010 | 000011000011000 | 0001010011100 | 000011001100100 | 0001011001110 | 000011010110110 | 0001100000000 | 000100000101011 |
| 0001001101011 | 000011000011001 | 0001010011101 | 000011001100101 | 0001011001111 | 000011011000000 | 0001100000001 | 000100000101100 |
| 0001001101100 | 000011000011010 | 0001010011110 | 000011001100110 | 0001011010000 | 000011011000001 | 0001100000010 | 000100000101101 |
| 0001001101101 | 000011000100000 | 0001010011111 | 000011001101000 | 0001011010001 | 000011011000010 | 0001100000011 | 000100000110000 |
| 0001001101110 | 000011000100001 | 0001010100000 | 000011001101001 | 0001011010010 | 000011011000011 | 0001100000100 | 000100000110001 |
| 0001001101111 | 000011000100010 | 0001010100001 | 000011001101010 | 0001011010011 | 000011011000100 | 0001100000101 | 000100000110010 |
| 0001001110000 | 000011000100011 | 0001010100010 | 000011001101011 | 0001011010100 | 000011011000101 | 0001100000110 | 000100000110011 |
| 0001001110001 | 000011000100100 | 0001010100011 | 000011001101100 | 0001011010101 | 000011011000110 | 0001100000111 | 000100000110100 |
| 0001001110010 | 000011000100101 | 0001010100100 | 000011001101101 | 0001011010110 | 000011011001000 | 0001100001000 | 000100000110101 |
| 0001001110011 | 000011000100110 | 0001010100101 | 000011010000001 | 0001011010111 | 000011011001001 | 0001100001001 | 000100000110110 |
| 0001001110100 | 000011000101000 | 0001010100110 | 000011010000010 | 0001011011000 | 000011011001010 | 0001100001010 | 000100001000000 |
| 0001001110101 | 000011000101001 | 0001010100111 | 000011010000011 | 0001011011001 | 000011011001011 | 0001100001011 | 000100001000001 |
| 0001001110110 | 000011000101010 | 0001010101000 | 000011010000100 | 0001011011010 | 000011011001100 | 0001100001100 | 000100001000010 |
| 0001001110111 | 000011000101011 | 0001010101001 | 000011010000101 | 0001011011011 | 000011011001101 | 0001100001101 | 000100001000011 |
| 0001001111000 | 000011000101100 | 0001010101010 | 000011010000110 | 0001011011100 | 000011011010000 | 0001100001110 | 000100001000100 |
| 0001001111001 | 000011000101101 | 0001010101011 | 000011010001000 | 0001011011101 | 000011011010001 | 0001100001111 | 000100001000101 |
| 0001001111010 | 000011000110000 | 0001010101100 | 000011010001001 | 0001011011110 | 000011011010010 | 0001100010000 | 000100001000110 |
| 0001001111011 | 000011000110001 | 0001010101101 | 000011010001010 | 0001011011111 | 000011011010011 | 0001100010001 | 000100001001000 |
| 0001001111100 | 000011000110010 | 0001010101110 | 000011010001011 | 0001011100000 | 000011011010100 | 0001100010010 | 000100001001001 |
| 0001001111101 | 000011000110011 | 0001010101111 | 000011010001100 | 0001011100001 | 000011011010101 | 0001100010011 | 000100001001010 |
| 0001001111110 | 000011000110100 | 0001010110000 | 000011010001101 | 0001011100010 | 000011011010110 | 0001100010100 | 000100001001011 |
| 0001001111111 | 000011000110101 | 0001010110001 | 000011010010000 | 0001011100011 | 000011011011000 | 0001100010101 | 000100001001100 |
| 0001010000000 | 000011000110110 | 0001010110010 | 000011010010001 | 0001011100100 | 000011011011001 | 0001100010110 | 000100001001101 |
| 0001010000001 | 000011001000000 | 0001010110011 | 000011010010010 | 0001011100101 | 000011011011010 | 0001100010111 | 000100001010000 |
| 0001010000010 | 000011001000001 | 0001010110100 | 000011010010011 | 0001011100110 | 000100000001000 | 0001100011000 | 000100001010001 |
| 0001010000011 | 000011001000010 | 0001010110101 | 000011010010100 | 0001011100111 | 000100000001001 | 0001100011001 | 000100001010010 |
| 0001010000100 | 000011001000011 | 0001010110110 | 000011010010101 | 0001011101000 | 000100000001010 | 0001100011010 | 000100001010011 |
| 0001010000101 | 000011001000100 | 0001010110111 | 000011010010110 | 0001011101001 | 000100000001011 | 0001100011011 | 000100001010100 |
| 0001010000110 | 000011001000101 | 0001010111000 | 000011010011000 | 0001011101010 | 000100000001100 | 0001100011100 | 000100001010101 |
| 0001010000111 | 000011001000110 | 0001010111001 | 000011010011001 | 0001011101011 | 000100000001101 | 0001100011101 | 000100001010110 |
| 0001010001000 | 000011001001000 | 0001010111010 | 000011010011010 | 0001011101100 | 000100000010000 | 0001100011110 | 000100001011000 |
| 0001010001001 | 000011001001001 | 0001010111011 | 000011010100000 | 0001011101101 | 000100000010001 | 0001100011111 | 000100001011001 |

FIG. 11E

| Source | Codeword | Source | Codeword | Source | Codeword | Source | Codeword |
|---|---|---|---|---|---|---|---|
| 0001100100000 | 000100001011010 | 0001101010010 | 000100010110001 | 0001110000100 | 000100100011010 | 0001110110110 | 000100101100110 |
| 0001100100001 | 000100001100000 | 0001101010011 | 000100010110010 | 0001110000101 | 000100100100000 | 0001110110111 | 000100101101000 |
| 0001100100010 | 000100001100001 | 0001101010100 | 000100010110011 | 0001110000110 | 000100100100001 | 0001110111000 | 000100101101001 |
| 0001100100011 | 000100001100010 | 0001101010101 | 000100010110100 | 0001110000111 | 000100100100010 | 0001110111001 | 000100101101010 |
| 0001100100100 | 000100001100011 | 0001101010110 | 000100010110101 | 0001110001000 | 000100100100011 | 0001110111010 | 000100101101011 |
| 0001100100101 | 000100001100100 | 0001101010111 | 000100010110110 | 0001110001001 | 000100100100100 | 0001110111011 | 000100101101100 |
| 0001100100110 | 000100001100101 | 0001101011000 | 000100011000000 | 0001110001010 | 000100100100101 | 0001110111100 | 000100101101101 |
| 0001100100111 | 000100001100110 | 0001101011001 | 000100011000001 | 0001110001011 | 000100100100110 | 0001110111101 | 000100110000001 |
| 0001100101000 | 000100001101000 | 0001101011010 | 000100011000010 | 0001110001100 | 000100100101000 | 0001110111110 | 000100110000010 |
| 0001100101001 | 000100001101001 | 0001101011011 | 000100011000011 | 0001110001101 | 000100100101001 | 0001110111111 | 000100110000011 |
| 0001100101010 | 000100001101010 | 0001101011100 | 000100011000100 | 0001110001110 | 000100100101010 | 0001111000000 | 000100110000100 |
| 0001100101011 | 000100001101011 | 0001101011101 | 000100011000101 | 0001110001111 | 000100100101011 | 0001111000001 | 000100110000101 |
| 0001100101100 | 000100001101100 | 0001101011110 | 000100011000110 | 0001110010000 | 000100100101100 | 0001111000010 | 000100110000110 |
| 0001100101101 | 000100001101101 | 0001101011111 | 000100011001000 | 0001110010001 | 000100100101101 | 0001111000011 | 000100110001000 |
| 0001100101110 | 000100010000001 | 0001101100000 | 000100011001001 | 0001110010010 | 000100100110000 | 0001111000100 | 000100110001001 |
| 0001100101111 | 000100010000010 | 0001101100001 | 000100011001010 | 0001110010011 | 000100100110001 | 0001111000101 | 000100110001010 |
| 0001100110000 | 000100010000011 | 0001101100010 | 000100011001011 | 0001110010100 | 000100100110010 | 0001111000110 | 000100110001011 |
| 0001100110001 | 000100010000100 | 0001101100011 | 000100011001100 | 0001110010101 | 000100100110011 | 0001111000111 | 000100110001100 |
| 0001100110010 | 000100010000101 | 0001101100100 | 000100011001101 | 0001110010110 | 000100100110100 | 0001111001000 | 000100110001101 |
| 0001100110011 | 000100010000110 | 0001101100101 | 000100011010000 | 0001110010111 | 000100100110101 | 0001111001001 | 000100110010000 |
| 0001100110100 | 000100010001000 | 0001101100110 | 000100011010001 | 0001110011000 | 000100100110110 | 0001111001010 | 000100110010001 |
| 0001100110101 | 000100010001001 | 0001101100111 | 000100011010010 | 0001110011001 | 000100101000000 | 0001111001011 | 000100110010010 |
| 0001100110110 | 000100010001010 | 0001101101000 | 000100011010011 | 0001110011010 | 000100101000001 | 0001111001100 | 000100110010011 |
| 0001100110111 | 000100010001011 | 0001101101001 | 000100011010100 | 0001110011011 | 000100101000010 | 0001111001101 | 000100110010100 |
| 0001100111000 | 000100010001100 | 0001101101010 | 000100011010101 | 0001110011100 | 000100101000011 | 0001111001110 | 000100110010101 |
| 0001100111001 | 000100010001101 | 0001101101011 | 000100011010110 | 0001110011101 | 000100101000100 | 0001111001111 | 000100110010110 |
| 0001100111010 | 000100010010000 | 0001101101100 | 000100011011000 | 0001110011110 | 000100101000101 | 0001111010000 | 000100110011000 |
| 0001100111011 | 000100010010001 | 0001101101101 | 000100011011001 | 0001110011111 | 000100101000110 | 0001111010001 | 000100110011001 |
| 0001100111100 | 000100010010010 | 0001101101110 | 000100011011010 | 0001110100000 | 000100101001000 | 0001111010010 | 000100110011010 |
| 0001100111101 | 000100010010011 | 0001101101111 | 000100100000001 | 0001110100001 | 000100101001001 | 0001111010011 | 000100110100000 |
| 0001100111110 | 000100010010100 | 0001101110000 | 000100100000010 | 0001110100010 | 000100101001010 | 0001111010100 | 000100110100001 |
| 0001100111111 | 000100010010101 | 0001101110001 | 000100100000011 | 0001110100011 | 000100101001011 | 0001111010101 | 000100110100010 |
| 0001101000000 | 000100010010110 | 0001101110010 | 000100100000100 | 0001110100100 | 000100101001100 | 0001111010110 | 000100110100011 |
| 0001101000001 | 000100010011000 | 0001101110011 | 000100100000101 | 0001110100101 | 000100101001101 | 0001111010111 | 000100110100100 |
| 0001101000010 | 000100010011001 | 0001101110100 | 000100100000110 | 0001110100110 | 000100101010000 | 0001111011000 | 000100110100101 |
| 0001101000011 | 000100010011010 | 0001101110101 | 000100100001000 | 0001110100111 | 000100101010001 | 0001111011001 | 000100110100110 |
| 0001101000100 | 000100010100000 | 0001101110110 | 000100100001001 | 0001110101000 | 000100101010010 | 0001111011010 | 000100110101000 |
| 0001101000101 | 000100010100001 | 0001101110111 | 000100100001010 | 0001110101001 | 000100101010011 | 0001111011011 | 000100110101001 |
| 0001101000110 | 000100010100010 | 0001101111000 | 000100100001011 | 0001110101010 | 000100101010100 | 0001111011100 | 000100110101010 |
| 0001101000111 | 000100010100011 | 0001101111001 | 000100100001100 | 0001110101011 | 000100101010101 | 0001111011101 | 000100110101011 |
| 0001101001000 | 000100010100100 | 0001101111010 | 000100100001101 | 0001110101100 | 000100101010110 | 0001111011110 | 000100110101100 |
| 0001101001001 | 000100010100101 | 0001101111011 | 000100100010000 | 0001110101101 | 000100101011000 | 0001111011111 | 000100110101101 |
| 0001101001010 | 000100010100110 | 0001101111100 | 000100100010001 | 0001110101110 | 000100101011001 | 0001111100000 | 000100110110000 |
| 0001101001011 | 000100010101000 | 0001101111101 | 000100100010010 | 0001110101111 | 000100101011010 | 0001111100001 | 000100110110001 |
| 0001101001100 | 000100010101001 | 0001101111110 | 000100100010011 | 0001110110000 | 000100101100000 | 0001111100010 | 000100110110010 |
| 0001101001101 | 000100010101010 | 0001101111111 | 000100100010100 | 0001110110001 | 000100101100001 | 0001111100011 | 000100110110011 |
| 0001101001110 | 000100010101011 | 0001110000000 | 000100100010101 | 0001110110010 | 000100101100010 | 0001111100100 | 000100110110100 |
| 0001101001111 | 000100010101100 | 0001110000001 | 000100100010110 | 0001110110011 | 000100101100011 | 0001111100101 | 000100110110101 |
| 0001101010000 | 000100010101101 | 0001110000010 | 000100100011000 | 0001110110100 | 000100101100100 | 0001111100110 | 000100110110110 |
| 0001101010001 | 000100010110000 | 0001110000011 | 000100100011001 | 0001110110101 | 000100101100101 | 0001111100111 | 000101000000010 |

FIG.11F

| Source | Codeword | Source | Codeword | Source | Codeword | Source | Codeword |
|---|---|---|---|---|---|---|---|
| 0001111101000 | 000101000000011 | 0010000011010 | 000101001001011 | 0010001001100 | 000101010100010 | 0010001111110 | 000101100001011 |
| 0001111101001 | 000101000000100 | 0010000011011 | 000101001001100 | 0010001001101 | 000101010100011 | 0010001111111 | 000101100001100 |
| 0001111101010 | 000101000000101 | 0010000011100 | 000101001001101 | 0010001001110 | 000101010100100 | 0010010000000 | 000101100001101 |
| 0001111101011 | 000101000000110 | 0010000011101 | 000101001010000 | 0010001001111 | 000101010100101 | 0010010000001 | 000101100010000 |
| 0001111101100 | 000101000001000 | 0010000011110 | 000101001010001 | 0010001010000 | 000101010100110 | 0010010000010 | 000101100010001 |
| 0001111101101 | 000101000001001 | 0010000011111 | 000101001010010 | 0010001010001 | 000101010101000 | 0010010000011 | 000101100010010 |
| 0001111101110 | 000101000001010 | 0010000100000 | 000101001010011 | 0010001010010 | 000101010101001 | 0010010000100 | 000101100010011 |
| 0001111101111 | 000101000001011 | 0010000100001 | 000101001010100 | 0010001010011 | 000101010101010 | 0010010000101 | 000101100010100 |
| 0001111110000 | 000101000001100 | 0010000100010 | 000101001010101 | 0010001010100 | 000101010101011 | 0010010000110 | 000101100010101 |
| 0001111110001 | 000101000001101 | 0010000100011 | 000101001010110 | 0010001010101 | 000101010101100 | 0010010000111 | 000101100010110 |
| 0001111110010 | 000101000010000 | 0010000100100 | 000101001011000 | 0010001010110 | 000101010101101 | 0010010001000 | 000101100011000 |
| 0001111110011 | 000101000010001 | 0010000100101 | 000101001011001 | 0010001010111 | 000101010110000 | 0010010001001 | 000101100011001 |
| 0001111110100 | 000101000010010 | 0010000100110 | 000101001011010 | 0010001011000 | 000101010110001 | 0010010001010 | 000101100011010 |
| 0001111110101 | 000101000010011 | 0010000100111 | 000101001100000 | 0010001011001 | 000101010110010 | 0010010001011 | 000101100100000 |
| 0001111110110 | 000101000010100 | 0010000101000 | 000101001100001 | 0010001011010 | 000101010110011 | 0010010001100 | 000101100100001 |
| 0001111110111 | 000101000010101 | 0010000101001 | 000101001100010 | 0010001011011 | 000101010110100 | 0010010001101 | 000101100100010 |
| 0001111111000 | 000101000010110 | 0010000101010 | 000101001100011 | 0010001011100 | 000101010110101 | 0010010001110 | 000101100100011 |
| 0001111111001 | 000101000011000 | 0010000101011 | 000101001100100 | 0010001011101 | 000101010110110 | 0010010001111 | 000101100100100 |
| 0001111111010 | 000101000011001 | 0010000101100 | 000101001100101 | 0010001011110 | 000101011000000 | 0010010010000 | 000101100100101 |
| 0001111111011 | 000101000011010 | 0010000101101 | 000101001100110 | 0010001011111 | 000101011000001 | 0010010010001 | 000101100100110 |
| 0001111111100 | 000101000100000 | 0010000101110 | 000101001101000 | 0010001100000 | 000101011000010 | 0010010010010 | 000101100101000 |
| 0001111111101 | 000101000100001 | 0010000101111 | 000101001101001 | 0010001100001 | 000101011000011 | 0010010010011 | 000101100101001 |
| 0001111111110 | 000101000100010 | 0010000110000 | 000101001101010 | 0010001100010 | 000101011000100 | 0010010010100 | 000101100101010 |
| 0001111111111 | 000101000100011 | 0010000110001 | 000101001101011 | 0010001100011 | 000101011000101 | 0010010010101 | 000101100101011 |
| 0010000000000 | 000101000100100 | 0010000110010 | 000101001101100 | 0010001100100 | 000101011000110 | 0010010010110 | 000101100101100 |
| 0010000000001 | 000101000100101 | 0010000110011 | 000101001101101 | 0010001100101 | 000101011001000 | 0010010010111 | 000101100101101 |
| 0010000000010 | 000101000100110 | 0010000110100 | 000101010000001 | 0010001100110 | 000101011001001 | 0010010011000 | 000101100110000 |
| 0010000000011 | 000101000101000 | 0010000110101 | 000101010000010 | 0010001100111 | 000101011001010 | 0010010011001 | 000101100110001 |
| 0010000000100 | 000101000101001 | 0010000110110 | 000101010000011 | 0010001101000 | 000101011001011 | 0010010011010 | 000101100110010 |
| 0010000000101 | 000101000101010 | 0010000110111 | 000101010000100 | 0010001101001 | 000101011001100 | 0010010011011 | 000101100110011 |
| 0010000000110 | 000101000101011 | 0010000111000 | 000101010000101 | 0010001101010 | 000101011001101 | 0010010011100 | 000101100110100 |
| 0010000000111 | 000101000101100 | 0010000111001 | 000101010000110 | 0010001101011 | 000101011010000 | 0010010011101 | 000101100110101 |
| 0010000001000 | 000101000101101 | 0010000111010 | 000101010001000 | 0010001101100 | 000101011010001 | 0010010011110 | 000101100110110 |
| 0010000001001 | 000101000110000 | 0010000111011 | 000101010001001 | 0010001101101 | 000101011010010 | 0010010011111 | 000101101000000 |
| 0010000001010 | 000101000110001 | 0010000111100 | 000101010001010 | 0010001101110 | 000101011010011 | 0010010100000 | 000101101000001 |
| 0010000001011 | 000101000110010 | 0010000111101 | 000101010001011 | 0010001101111 | 000101011010100 | 0010010100001 | 000101101000010 |
| 0010000001100 | 000101000110011 | 0010000111110 | 000101010001100 | 0010001110000 | 000101011010101 | 0010010100010 | 000101101000011 |
| 0010000001101 | 000101000110100 | 0010000111111 | 000101010001101 | 0010001110001 | 000101011010110 | 0010010100011 | 000101101000100 |
| 0010000001110 | 000101000110101 | 0010001000000 | 000101010010000 | 0010001110010 | 000101011011000 | 0010010100100 | 000101101000101 |
| 0010000001111 | 000101000110110 | 0010001000001 | 000101010010001 | 0010001110011 | 000101011011001 | 0010010100101 | 000101101000110 |
| 0010000010000 | 000101001000000 | 0010001000010 | 000101010010010 | 0010001110100 | 000101011011010 | 0010010100110 | 000101101001000 |
| 0010000010001 | 000101001000001 | 0010001000011 | 000101010010011 | 0010001110101 | 000101100000001 | 0010010100111 | 000101101001001 |
| 0010000010010 | 000101001000010 | 0010001000100 | 000101010010100 | 0010001110110 | 000101100000010 | 0010010101000 | 000101101001010 |
| 0010000010011 | 000101001000011 | 0010001000101 | 000101010010101 | 0010001110111 | 000101100000011 | 0010010101001 | 000101101001011 |
| 0010000010100 | 000101001000100 | 0010001000110 | 000101010010110 | 0010001111000 | 000101100000100 | 0010010101010 | 000101101001100 |
| 0010000010101 | 000101001000101 | 0010001000111 | 000101010011000 | 0010001111001 | 000101100000101 | 0010010101011 | 000101101001101 |
| 0010000010110 | 000101001000110 | 0010001001000 | 000101010011001 | 0010001111010 | 000101100000110 | 0010010101100 | 000101101010000 |
| 0010000010111 | 000101001001000 | 0010001001001 | 000101010011010 | 0010001111011 | 000101100001000 | 0010010101101 | 000101101010001 |
| 0010000011000 | 000101001001001 | 0010001001010 | 000101010100000 | 0010001111100 | 000101100001001 | 0010010101110 | 000101101010010 |
| 0010000011001 | 000101001001010 | 0010001001011 | 000101010100001 | 0010001111101 | 000101100001010 | 0010010101111 | 000101101010011 |

FIG. 11G

| Source | Codeword | Source | Codeword | Source | Codeword | Source | Codeword |
|---|---|---|---|---|---|---|---|
| 0010010110000 | 000101101010100 | 0010011100010 | 000110000101101 | 0010100010100 | 000110010001000 | 0010101000110 | 000110011010001 |
| 0010010110001 | 000101101010101 | 0010011100011 | 000110000110000 | 0010100010101 | 000110010001001 | 0010101000111 | 000110011010010 |
| 0010010110010 | 000101101010110 | 0010011100100 | 000110000110001 | 0010100010110 | 000110010001010 | 0010101001000 | 000110011010011 |
| 0010010110011 | 000101101011000 | 0010011100101 | 000110000110010 | 0010100010111 | 000110010001011 | 0010101001001 | 000110011010100 |
| 0010010110100 | 000101101011001 | 0010011100110 | 000110000110011 | 0010100011000 | 000110010001100 | 0010101001010 | 000110011010101 |
| 0010010110101 | 000101101011010 | 0010011100111 | 000110000110100 | 0010100011001 | 000110010001101 | 0010101001011 | 000110011010110 |
| 0010010110110 | 000101101100000 | 0010011101000 | 000110000110101 | 0010100011010 | 000110010010000 | 0010101001100 | 000110011011000 |
| 0010010110111 | 000101101100001 | 0010011101001 | 000110000110110 | 0010100011011 | 000110010010001 | 0010101001101 | 000110011011001 |
| 0010010111000 | 000101101100010 | 0010011101010 | 000110001000000 | 0010100011100 | 000110010010010 | 0010101001110 | 000110011011010 |
| 0010010111001 | 000101101100011 | 0010011101011 | 000110001000001 | 0010100011101 | 000110010010011 | 0010101001111 | 000110100000001 |
| 0010010111010 | 000101101100100 | 0010011101100 | 000110001000010 | 0010100011110 | 000110010010100 | 0010101010000 | 000110100000010 |
| 0010010111011 | 000101101100101 | 0010011101101 | 000110001000011 | 0010100011111 | 000110010010101 | 0010101010001 | 000110100000011 |
| 0010010111100 | 000101101100110 | 0010011101110 | 000110001000100 | 0010100100000 | 000110010010110 | 0010101010010 | 000110100000100 |
| 0010010111101 | 000101101101000 | 0010011101111 | 000110001000101 | 0010100100001 | 000110010011000 | 0010101010011 | 000110100000101 |
| 0010010111110 | 000101101101001 | 0010011110000 | 000110001000110 | 0010100100010 | 000110010011001 | 0010101010100 | 000110100000110 |
| 0010010111111 | 000101101101010 | 0010011110001 | 000110001001000 | 0010100100011 | 000110010011010 | 0010101010101 | 000110100001000 |
| 0010011000000 | 000101101101011 | 0010011110010 | 000110001001001 | 0010100100100 | 000110010100000 | 0010101010110 | 000110100001001 |
| 0010011000001 | 000101101101100 | 0010011110011 | 000110001001010 | 0010100100101 | 000110010100001 | 0010101010111 | 000110100001010 |
| 0010011000010 | 000101101101101 | 0010011110100 | 000110001001011 | 0010100100110 | 000110010100010 | 0010101011000 | 000110100001011 |
| 0010011000011 | 000110000000100 | 0010011110101 | 000110001001100 | 0010100100111 | 000110010100011 | 0010101011001 | 000110100001100 |
| 0010011000100 | 000110000000101 | 0010011110110 | 000110001001101 | 0010100101000 | 000110010100100 | 0010101011010 | 000110100001101 |
| 0010011000101 | 000110000000110 | 0010011110111 | 000110001010000 | 0010100101001 | 000110010100101 | 0010101011011 | 000110100010000 |
| 0010011000110 | 000110000001000 | 0010011111000 | 000110001010001 | 0010100101010 | 000110010100110 | 0010101011100 | 000110100010001 |
| 0010011000111 | 000110000001001 | 0010011111001 | 000110001010010 | 0010100101011 | 000110010101000 | 0010101011101 | 000110100010010 |
| 0010011001000 | 000110000001010 | 0010011111010 | 000110001010011 | 0010100101100 | 000110010101001 | 0010101011110 | 000110100010011 |
| 0010011001001 | 000110000001011 | 0010011111011 | 000110001010100 | 0010100101101 | 000110010101010 | 0010101011111 | 000110100010100 |
| 0010011001010 | 000110000001100 | 0010011111100 | 000110001010101 | 0010100101110 | 000110010101011 | 0010101100000 | 000110100010101 |
| 0010011001011 | 000110000001101 | 0010011111101 | 000110001010110 | 0010100101111 | 000110010101100 | 0010101100001 | 000110100010110 |
| 0010011001100 | 000110000010000 | 0010011111110 | 000110001011000 | 0010100110000 | 000110010101101 | 0010101100010 | 000110100011000 |
| 0010011001101 | 000110000010001 | 0010011111111 | 000110001011001 | 0010100110001 | 000110010110000 | 0010101100011 | 000110100011001 |
| 0010011001110 | 000110000010010 | 0010100000000 | 000110001011010 | 0010100110010 | 000110010110001 | 0010101100100 | 000110100011010 |
| 0010011001111 | 000110000010011 | 0010100000001 | 000110001100000 | 0010100110011 | 000110010110010 | 0010101100101 | 000110100100000 |
| 0010011010000 | 000110000010100 | 0010100000010 | 000110001100001 | 0010100110100 | 000110010110011 | 0010101100110 | 000110100100001 |
| 0010011010001 | 000110000010101 | 0010100000011 | 000110001100010 | 0010100110101 | 000110010110100 | 0010101100111 | 000110100100010 |
| 0010011010010 | 000110000010110 | 0010100000100 | 000110001100011 | 0010100110110 | 000110010110101 | 0010101101000 | 000110100100011 |
| 0010011010011 | 000110000011000 | 0010100000101 | 000110001100100 | 0010100110111 | 000110010110110 | 0010101101001 | 000110100100100 |
| 0010011010100 | 000110000011001 | 0010100000110 | 000110001100101 | 0010100111000 | 000110011000000 | 0010101101010 | 000110100100101 |
| 0010011010101 | 000110000011010 | 0010100000111 | 000110001100110 | 0010100111001 | 000110011000001 | 0010101101011 | 000110100100110 |
| 0010011010110 | 000110000100000 | 0010100001000 | 000110001101000 | 0010100111010 | 000110011000010 | 0010101101100 | 000110100101000 |
| 0010011010111 | 000110000100001 | 0010100001001 | 000110001101001 | 0010100111011 | 000110011000011 | 0010101101101 | 000110100101001 |
| 0010011011000 | 000110000100010 | 0010100001010 | 000110001101010 | 0010100111100 | 000110011000100 | 0010101101110 | 000110100101010 |
| 0010011011001 | 000110000100011 | 0010100001011 | 000110001101011 | 0010100111101 | 000110011000101 | 0010101101111 | 000110100101011 |
| 0010011011010 | 000110000100100 | 0010100001100 | 000110001101100 | 0010100111110 | 000110011000110 | 0010101110000 | 000110100101100 |
| 0010011011011 | 000110000100101 | 0010100001101 | 000110001101101 | 0010100111111 | 000110011001000 | 0010101110001 | 000110100101101 |
| 0010011011100 | 000110000100110 | 0010100001110 | 000110010000001 | 0010101000000 | 000110011001001 | 0010101110010 | 000110100110000 |
| 0010011011101 | 000110000101000 | 0010100001111 | 000110010000010 | 0010101000001 | 000110011001010 | 0010101110011 | 000110100110001 |
| 0010011011110 | 000110000101001 | 0010100010000 | 000110010000011 | 0010101000010 | 000110011001011 | 0010101110100 | 000110100110010 |
| 0010011011111 | 000110000101010 | 0010100010001 | 000110010000100 | 0010101000011 | 000110011001100 | 0010101110101 | 000110100110011 |
| 0010011100000 | 000110000101011 | 0010100010010 | 000110010000101 | 0010101000100 | 000110011001101 | 0010101110110 | 000110100110100 |
| 0010011100001 | 000110000101100 | 0010100010011 | 000110010000110 | 0010101000101 | 000110011010000 | 0010101110111 | 000110100110101 |

FIG. 11H

| Source | Codeword | Source | Codeword | Source | Codeword | Source | Codeword |
|---|---|---|---|---|---|---|---|
| 0010101111000 | 000110100110110 | 0010110101010 | 000110110010001 | 0010111011100 | 001000000101100 | 0011000001110 | 001000010000110 |
| 0010101111001 | 000110101000000 | 0010110101011 | 000110110010010 | 0010111011101 | 001000000101101 | 0011000001111 | 001000010001000 |
| 0010101111010 | 000110101000001 | 0010110101100 | 000110110010011 | 0010111011110 | 001000000110000 | 0011000010000 | 001000010001001 |
| 0010101111011 | 000110101000010 | 0010110101101 | 000110110010100 | 0010111011111 | 001000000110001 | 0011000010001 | 001000010001010 |
| 0010101111100 | 000110101000011 | 0010110101110 | 000110110010101 | 0010111100000 | 001000000110010 | 0011000010010 | 001000010001011 |
| 0010101111101 | 000110101000100 | 0010110101111 | 000110110010110 | 0010111100001 | 001000000110011 | 0011000010011 | 001000010001100 |
| 0010101111110 | 000110101000101 | 0010110110000 | 000110110011000 | 0010111100010 | 001000000110100 | 0011000010100 | 001000010001101 |
| 0010101111111 | 000110101000110 | 0010110110001 | 000110110011001 | 0010111100011 | 001000000110101 | 0011000010101 | 001000010010000 |
| 0010110000000 | 000110101001000 | 0010110110010 | 000110110011010 | 0010111100100 | 001000000110110 | 0011000010110 | 001000010010001 |
| 0010110000001 | 000110101001001 | 0010110110011 | 000110110100000 | 0010111100101 | 001000001000000 | 0011000010111 | 001000010010010 |
| 0010110000010 | 000110101001010 | 0010110110100 | 000110110100001 | 0010111100110 | 001000001000001 | 0011000011000 | 001000010010011 |
| 0010110000011 | 000110101001011 | 0010110110101 | 000110110100010 | 0010111100111 | 001000001000010 | 0011000011001 | 001000010010100 |
| 0010110000100 | 000110101001100 | 0010110110110 | 000110110100011 | 0010111101000 | 001000001000011 | 0011000011010 | 001000010010101 |
| 0010110000101 | 000110101001101 | 0010110110111 | 000110110100100 | 0010111101001 | 001000001000100 | 0011000011011 | 001000010010110 |
| 0010110000110 | 000110101010000 | 0010110111000 | 000110110100101 | 0010111101010 | 001000001000101 | 0011000011100 | 001000010011000 |
| 0010110000111 | 000110101010001 | 0010110111001 | 000110110100110 | 0010111101011 | 001000001000110 | 0011000011101 | 001000010011001 |
| 0010110001000 | 000110101010010 | 0010110111010 | 000110110101000 | 0010111101100 | 001000001001000 | 0011000011110 | 001000010011010 |
| 0010110001001 | 000110101010011 | 0010110111011 | 000110110101001 | 0010111101101 | 001000001001001 | 0011000011111 | 001000010100000 |
| 0010110001010 | 000110101010100 | 0010110111100 | 000110110101010 | 0010111101110 | 001000001001010 | 0011000100000 | 001000010100001 |
| 0010110001011 | 000110101010101 | 0010110111101 | 000110110101011 | 0010111101111 | 001000001001011 | 0011000100001 | 001000010100010 |
| 0010110001100 | 000110101010110 | 0010110111110 | 000110110101100 | 0010111110000 | 001000001001100 | 0011000100010 | 001000010100011 |
| 0010110001101 | 000110101011000 | 0010110111111 | 000110110101101 | 0010111110001 | 001000001001101 | 0011000100011 | 001000010100100 |
| 0010110001110 | 000110101011001 | 0010111000000 | 000110110110000 | 0010111110010 | 001000001010000 | 0011000100100 | 001000010100101 |
| 0010110001111 | 000110101011010 | 0010111000001 | 000110110110001 | 0010111110011 | 001000001010001 | 0011000100101 | 001000010100110 |
| 0010110010000 | 000110101100000 | 0010111000010 | 000110110110010 | 0010111110100 | 001000001010010 | 0011000100110 | 001000010101000 |
| 0010110010001 | 000110101100001 | 0010111000011 | 000110110110011 | 0010111110101 | 001000001010011 | 0011000100111 | 001000010101001 |
| 0010110010010 | 000110101100010 | 0010111000100 | 000110110110100 | 0010111110110 | 001000001010100 | 0011000101000 | 001000010101010 |
| 0010110010011 | 000110101100011 | 0010111000101 | 000110110110101 | 0010111110111 | 001000001010101 | 0011000101001 | 001000010101011 |
| 0010110010100 | 000110101100100 | 0010111000110 | 000110110110110 | 0010111111000 | 001000001010110 | 0011000101010 | 001000010101100 |
| 0010110010101 | 000110101100101 | 0010111000111 | 001000000010000 | 0010111111001 | 001000001011000 | 0011000101011 | 001000010101101 |
| 0010110010110 | 000110101100110 | 0010111001000 | 001000000010001 | 0010111111010 | 001000001011001 | 0011000101100 | 001000010110000 |
| 0010110010111 | 000110101101000 | 0010111001001 | 001000000010010 | 0010111111011 | 001000001011010 | 0011000101101 | 001000010110001 |
| 0010110011000 | 000110101101001 | 0010111001010 | 001000000010011 | 0010111111100 | 001000001100000 | 0011000101110 | 001000010110010 |
| 0010110011001 | 000110101101010 | 0010111001011 | 001000000010100 | 0010111111101 | 001000001100001 | 0011000101111 | 001000010110011 |
| 0010110011010 | 000110101101011 | 0010111001100 | 001000000010101 | 0010111111110 | 001000001100010 | 0011000110000 | 001000010110100 |
| 0010110011011 | 000110101101100 | 0010111001101 | 001000000010110 | 0010111111111 | 001000001100011 | 0011000110001 | 001000010110101 |
| 0010110011100 | 000110101101101 | 0010111001110 | 001000000011000 | 0011000000000 | 001000001100100 | 0011000110010 | 001000010110110 |
| 0010110011101 | 000110110000001 | 0010111001111 | 001000000011001 | 0011000000001 | 001000001100101 | 0011000110011 | 001000011000000 |
| 0010110011110 | 000110110000010 | 0010111010000 | 001000000011010 | 0011000000010 | 001000001100110 | 0011000110100 | 001000011000001 |
| 0010110011111 | 000110110000011 | 0010111010001 | 001000000100000 | 0011000000011 | 001000001101000 | 0011000110101 | 001000011000010 |
| 0010110100000 | 000110110000100 | 0010111010010 | 001000000100001 | 0011000000100 | 001000001101001 | 0011000110110 | 001000011000011 |
| 0010110100001 | 000110110000101 | 0010111010011 | 001000000100010 | 0011000000101 | 001000001101010 | 0011000110111 | 001000011000100 |
| 0010110100010 | 000110110000110 | 0010111010100 | 001000000100011 | 0011000000110 | 001000001101011 | 0011000111000 | 001000011000101 |
| 0010110100011 | 000110110001000 | 0010111010101 | 001000000100100 | 0011000000111 | 001000001101100 | 0011000111001 | 001000011000110 |
| 0010110100100 | 000110110001001 | 0010111010110 | 001000000100101 | 0011000001000 | 001000001101101 | 0011000111010 | 001000011001000 |
| 0010110100101 | 000110110001010 | 0010111010111 | 001000000100110 | 0011000001001 | 001000010000001 | 0011000111011 | 001000011001001 |
| 0010110100110 | 000110110001011 | 0010111011000 | 001000000101000 | 0011000001010 | 001000010000010 | 0011000111100 | 001000011001010 |
| 0010110100111 | 000110110001100 | 0010111011001 | 001000000101001 | 0011000001011 | 001000010000011 | 0011000111101 | 001000011001011 |
| 0010110101000 | 000110110001101 | 0010111011010 | 001000000101010 | 0011000001100 | 001000010000100 | 0011000111110 | 001000011001100 |
| 0010110101001 | 000110110010000 | 0010111011011 | 001000000101011 | 0011000001101 | 001000010000101 | 0011000111111 | 001000011001101 |

FIG. 11I

| Source | Codeword | Source | Codeword | Source | Codeword | Source | Codeword |
|---|---|---|---|---|---|---|---|
| 0011001000000 | 0010000011010000 | 0011001110010 | 0010000100110101 | 0011010100100 | 0010001100100000 | 0011011010110 | 0010010000011010 |
| 0011001000001 | 0010000011010001 | 0011001110011 | 0010000100110110 | 0011010100101 | 0010001100100001 | 0011011010111 | 0010010000100000 |
| 0011001000010 | 0010000011010010 | 0011001110100 | 0010000101000000 | 0011010100110 | 0010001100100010 | 0011011011000 | 0010010000100001 |
| 0011001000011 | 0010000011010011 | 0011001110101 | 0010000101000001 | 0011010100111 | 0010001100100011 | 0011011011001 | 0010010000100010 |
| 0011001000100 | 0010000011010100 | 0011001110110 | 0010000101000010 | 0011010101000 | 0010001100100100 | 0011011011010 | 0010010000100011 |
| 0011001000101 | 0010000011010101 | 0011001110111 | 0010000101000011 | 0011010101001 | 0010001100100101 | 0011011011011 | 0010010000100100 |
| 0011001000110 | 0010000011010110 | 0011001111000 | 0010000101000100 | 0011010101010 | 0010001100100110 | 0011011011100 | 0010010000100101 |
| 0011001000111 | 0010000011011000 | 0011001111001 | 0010000101000101 | 0011010101011 | 0010001100110000 | 0011011011101 | 0010010000100110 |
| 0011001001000 | 0010000011011001 | 0011001111010 | 0010000101000110 | 0011010101100 | 0010001100110001 | 0011011011110 | 0010010000101000 |
| 0011001001001 | 0010000011011010 | 0011001111011 | 0010000101001000 | 0011010101101 | 0010001100110010 | 0011011011111 | 0010010000101001 |
| 0011001001010 | 0010000100000001 | 0011001111100 | 0010000101001001 | 0011010101110 | 0010001101000000 | 0011011100000 | 0010010000101010 |
| 0011001001011 | 0010000100000010 | 0011001111101 | 0010000101001010 | 0011010101111 | 0010001101000001 | 0011011100001 | 0010010000101011 |
| 0011001001100 | 0010000100000011 | 0011001111110 | 0010000101001011 | 0011010110000 | 0010001101000010 | 0011011100010 | 0010010000101100 |
| 0011001001101 | 0010000100000100 | 0011001111111 | 0010000101001100 | 0011010110001 | 0010001101000011 | 0011011100011 | 0010010000101101 |
| 0011001001110 | 0010000100000101 | 0011010000000 | 0010000101001101 | 0011010110010 | 0010001101000100 | 0011011100100 | 0010010000110000 |
| 0011001001111 | 0010000100000110 | 0011010000001 | 0010000101010000 | 0011010110011 | 0010001101000101 | 0011011100101 | 0010010000110001 |
| 0011001010000 | 0010000100001000 | 0011010000010 | 0010000101010001 | 0011010110100 | 0010001101000110 | 0011011100110 | 0010010000110010 |
| 0011001010001 | 0010000100001001 | 0011010000011 | 0010000101010010 | 0011010110101 | 0010001101001000 | 0011011100111 | 0010010000110011 |
| 0011001010010 | 0010000100001010 | 0011010000100 | 0010000101010011 | 0011010110110 | 0010001101001001 | 0011011101000 | 0010010000110100 |
| 0011001010011 | 0010000100001011 | 0011010000101 | 0010000101010100 | 0011010110111 | 0010001101001010 | 0011011101001 | 0010010000110101 |
| 0011001010100 | 0010000100001100 | 0011010000110 | 0010000101010101 | 0011010111000 | 0010001101001011 | 0011011101010 | 0010010000110110 |
| 0011001010101 | 0010000100001101 | 0011010000111 | 0010000101010110 | 0011010111001 | 0010001101001100 | 0011011101011 | 0010010010000000 |
| 0011001010110 | 0010000100010000 | 0011010001000 | 0010000101011000 | 0011010111010 | 0010001101001101 | 0011011101100 | 0010010010000001 |
| 0011001010111 | 0010000100010001 | 0011010001001 | 0010000101011001 | 0011010111011 | 0010001101100000 | 0011011101101 | 0010010010000010 |
| 0011001011000 | 0010000100010010 | 0011010001010 | 0010000101011010 | 0011010111100 | 0010001101100001 | 0011011101110 | 0010010010000011 |
| 0011001011001 | 0010000100010011 | 0011010001011 | 0010000101100000 | 0011010111101 | 0010001101100010 | 0011011101111 | 0010010010000100 |
| 0011001011010 | 0010000100010100 | 0011010001100 | 0010000101100001 | 0011010111110 | 0010001101100011 | 0011011110000 | 0010010010000101 |
| 0011001011011 | 0010000100010101 | 0011010001101 | 0010000101100010 | 0011010111111 | 0010001101100100 | 0011011110001 | 0010010010000110 |
| 0011001011100 | 0010000100010110 | 0011010001110 | 0010000101100011 | 0011011000000 | 0010001101100101 | 0011011110010 | 0010010010001000 |
| 0011001011101 | 0010000100011000 | 0011010001111 | 0010000101100100 | 0011011000001 | 0010001101100110 | 0011011110011 | 0010010010001001 |
| 0011001011110 | 0010000100011001 | 0011010010000 | 0010000101100101 | 0011011000010 | 0010010000000010 | 0011011110100 | 0010010010001010 |
| 0011001011111 | 0010000100011010 | 0011010010001 | 0010000101100110 | 0011011000011 | 0010010000000011 | 0011011110101 | 0010010010001011 |
| 0011001100000 | 0010000100100000 | 0011010010010 | 0010000101101000 | 0011011000100 | 0010010000000100 | 0011011110110 | 0010010010001100 |
| 0011001100001 | 0010000100100001 | 0011010010011 | 0010000101101001 | 0011011000101 | 0010010000000101 | 0011011110111 | 0010010010001101 |
| 0011001100010 | 0010000100100010 | 0011010010100 | 0010000101101010 | 0011011000110 | 0010010000000110 | 0011011111000 | 0010010010010000 |
| 0011001100011 | 0010000100100011 | 0011010010101 | 0010000101101011 | 0011011000111 | 0010010000001000 | 0011011111001 | 0010010010010001 |
| 0011001100100 | 0010000100100100 | 0011010010110 | 0010000101101100 | 0011011001000 | 0010010000001001 | 0011011111010 | 0010010010010010 |
| 0011001100101 | 0010000100100101 | 0011010010111 | 0010000101101101 | 0011011001001 | 0010010000001010 | 0011011111011 | 0010010010010011 |
| 0011001100110 | 0010000100100110 | 0011010011000 | 0010000110000001 | 0011011001010 | 0010010000001011 | 0011011111100 | 0010010010010100 |
| 0011001100111 | 0010000100101000 | 0011010011001 | 0010000110000010 | 0011011001011 | 0010010000001100 | 0011011111101 | 0010010010010101 |
| 0011001101000 | 0010000100101001 | 0011010011010 | 0010000110000011 | 0011011001100 | 0010010000001101 | 0011011111110 | 0010010010010110 |
| 0011001101001 | 0010000100101010 | 0011010011011 | 0010000110000100 | 0011011001101 | 0010010000010000 | 0011011111111 | 0010010010011000 |
| 0011001101010 | 0010000100101011 | 0011010011100 | 0010000110000101 | 0011011001110 | 0010010000010001 | 0011100000000 | 0010010010011001 |
| 0011001101011 | 0010000100101100 | 0011010011101 | 0010000110000110 | 0011011001111 | 0010010000010010 | 0011100000001 | 0010010010011010 |
| 0011001101100 | 0010000100101101 | 0011010011110 | 0010000110001000 | 0011011010000 | 0010010000010011 | 0011100000010 | 0010010011000000 |
| 0011001101101 | 0010000100110000 | 0011010011111 | 0010000110001001 | 0011011010001 | 0010010000010100 | 0011100000011 | 0010010011000001 |
| 0011001101110 | 0010000100110001 | 0011010100000 | 0010000110001010 | 0011011010010 | 0010010000010101 | 0011100000100 | 0010010011000010 |
| 0011001101111 | 0010000100110010 | 0011010100001 | 0010000110001011 | 0011011010011 | 0010010000010110 | 0011100000101 | 0010010011000011 |
| 0011001110000 | 0010000100110011 | 0011010100010 | 0010000110001100 | 0011011010100 | 0010010000011000 | 0011100000110 | 0010010011000100 |
| 0011001110001 | 0010000100110100 | 0011010100011 | 0010000110001101 | 0011011010101 | 0010010000011001 | 0011100000111 | 0010010011000101 |

FIG. 11J

| Source | Codeword | Source | Codeword | Source | Codeword | Source | Codeword |
|---|---|---|---|---|---|---|---|
| 0011100001000 | 001001001100110 | 0011100111010 | 001001011000001 | 0011101101100 | 001001100100110 | 0011110011110 | 001010000000100 |
| 0011100001001 | 001001001101000 | 0011100111011 | 001001011000010 | 0011101101101 | 001001100101000 | 0011110011111 | 001010000000101 |
| 0011100001010 | 001001001101001 | 0011100111100 | 001001011000011 | 0011101101110 | 001001100101001 | 0011110100000 | 001010000000110 |
| 0011100001011 | 001001001101010 | 0011100111101 | 001001011000100 | 0011101101111 | 001001100101010 | 0011110100001 | 001010000001000 |
| 0011100001100 | 001001001101011 | 0011100111110 | 001001011000101 | 0011101110000 | 001001100101011 | 0011110100010 | 001010000001001 |
| 0011100001101 | 001001001101100 | 0011100111111 | 001001011000110 | 0011101110001 | 001001100101100 | 0011110100011 | 001010000001010 |
| 0011100001110 | 001001001101101 | 0011101000000 | 001001011001000 | 0011101110010 | 001001100101101 | 0011110100100 | 001010000001011 |
| 0011100001111 | 001001010000001 | 0011101000001 | 001001011001001 | 0011101110011 | 001001100110000 | 0011110100101 | 001010000001100 |
| 00' 100010000 | 001001010000010 | 0011101000010 | 001001011001010 | 0011101110100 | 001001100110001 | 0011110100110 | 001010000001101 |
| 0011100010001 | 001001010000011 | 0011101000011 | 001001011001011 | 0011101110101 | 001001100110010 | 0011110100111 | 001010000010000 |
| 0011100010010 | 001001010000100 | 0011101000100 | 001001011001100 | 0011101110110 | 001001100110011 | 0011110101000 | 001010000010001 |
| 0011100010011 | 001001010000101 | 0011101000101 | 001001011001101 | 0011101110111 | 001001100110100 | 0011110101001 | 001010000010010 |
| 0011100010100 | 001001010000110 | 0011101000110 | 001001011010000 | 0011101111000 | 001001100110101 | 0011110101010 | 001010000010011 |
| 0011100010101 | 001001010001000 | 0011101000111 | 001001011010001 | 0011101111001 | 001001100110110 | 0011110101011 | 001010000010100 |
| 0011100010110 | 001001010001001 | 0011101001000 | 001001011010010 | 0011101111010 | 001001101000000 | 0011110101100 | 001010000010101 |
| 0011100010111 | 001001010001010 | 0011101001001 | 001001011010011 | 0011101111011 | 001001101000001 | 0011110101101 | 001010000010110 |
| 0011100011000 | 001001010001011 | 0011101001010 | 001001011010100 | 0011101111100 | 001001101000010 | 0011110101110 | 001010000011000 |
| 0011100011001 | 001001010001100 | 0011101001011 | 001001011010101 | 0011101111101 | 001001101000011 | 0011110101111 | 001010000011001 |
| 0011100011010 | 001001010001101 | 0011101001100 | 001001011010110 | 0011101111110 | 001001101000100 | 0011110110000 | 001010000011010 |
| 0011100011011 | 001001010010000 | 0011101001101 | 001001011011000 | 0011101111111 | 001001101000101 | 0011110110001 | 001010000100000 |
| 0011100011100 | 001001010010001 | 0011101001110 | 001001011011001 | 0011110000000 | 001001101000110 | 0011110110010 | 001010000100001 |
| 0011100011101 | 001001010010010 | 0011101001111 | 001001011011010 | 0011110000001 | 001001101001000 | 0011110110011 | 001010000100010 |
| 0011100011110 | 001001010010011 | 0011101010000 | 001001100000001 | 0011110000010 | 001001101001001 | 0011110110100 | 001010000100011 |
| 0011100011111 | 001001010010100 | 0011101010001 | 001001100000010 | 0011110000011 | 001001101001010 | 0011110110101 | 001010000100100 |
| 0011100100000 | 001001010010101 | 0011101010010 | 001001100000011 | 0011110000100 | 001001101001011 | 0011110110110 | 001010000100101 |
| 0011100100001 | 001001010010110 | 0011101010011 | 001001100000100 | 0011110000101 | 001001101001100 | 0011110110111 | 001010000100110 |
| 0011100100010 | 001001010011000 | 0011101010100 | 001001100000101 | 0011110000110 | 001001101001101 | 0011110111000 | 001010000101000 |
| 0011100100011 | 001001010011001 | 0011101010101 | 001001100000110 | 0011110000111 | 001001101010000 | 0011110111001 | 001010000101001 |
| 0011100100100 | 001001010011010 | 0011101010110 | 001001100001000 | 0011110001000 | 001001101010001 | 0011110111010 | 001010000101010 |
| 0011100100101 | 001001010100000 | 0011101010111 | 001001100001001 | 0011110001001 | 001001101010010 | 0011110111011 | 001010000101011 |
| 0011100100110 | 001001010100001 | 0011101011000 | 001001100001010 | 0011110001010 | 001001101010011 | 0011110111100 | 001010000101100 |
| 0011100100111 | 001001010100010 | 0011101011001 | 001001100001011 | 0011110001011 | 001001101010100 | 0011110111101 | 001010000101101 |
| 0011100101000 | 001001010100011 | 0011101011010 | 001001100001100 | 0011110001100 | 001001101010101 | 0011110111110 | 001010000110000 |
| 0011100101001 | 001001010100100 | 0011101011011 | 001001100001101 | 0011110001101 | 001001101010110 | 0011110111111 | 001010000110001 |
| 0011100101010 | 001001010100101 | 0011101011100 | 001001100010000 | 0011110001110 | 001001101011000 | 0011111000000 | 001010000110010 |
| 0011100101011 | 001001010100110 | 0011101011101 | 001001100010001 | 0011110001111 | 001001101011001 | 0011111000001 | 001010000110011 |
| 0011100101100 | 001001010101000 | 0011101011110 | 001001100010010 | 0011110010000 | 001001101011010 | 0011111000010 | 001010000110100 |
| 0011100101101 | 001001010101001 | 0011101011111 | 001001100010011 | 0011110010001 | 001001101100000 | 0011111000011 | 001010000110101 |
| 0011100101110 | 001001010101010 | 0011101100000 | 001001100010100 | 0011110010010 | 001001101100001 | 0011111000100 | 001010000110110 |
| 0011100101111 | 001001010101011 | 0011101100001 | 001001100010101 | 0011110010011 | 001001101100010 | 0011111000101 | 001010001000000 |
| 0011100110000 | 001001010101100 | 0011101100010 | 001001100010110 | 0011110010100 | 001001101100011 | 0011111000110 | 001010001000001 |
| 0011100110001 | 001001010101101 | 0011101100011 | 001001100011000 | 0011110010101 | 001001101100100 | 0011111000111 | 001010001000010 |
| 0011100110010 | 001001010110000 | 0011101100100 | 001001100011001 | 0011110010110 | 001001101100101 | 0011111001000 | 001010001000011 |
| 0011100110011 | 001001010110001 | 0011101100101 | 001001100011010 | 0011110010111 | 001001101100110 | 0011111001001 | 001010001000100 |
| 0011100110100 | 001001010110010 | 0011101100110 | 001001100100000 | 0011110011000 | 001001101101000 | 0011111001010 | 001010001000101 |
| 0011100110101 | 001001010110011 | 0011101100111 | 001001100100001 | 0011110011001 | 001001101101001 | 0011111001011 | 001010001000110 |
| 0011100110110 | 001001010110100 | 0011101101000 | 001001100100010 | 0011110011010 | 001001101101010 | 0011111001100 | 001010001001000 |
| 0011100110111 | 001001010110101 | 0011101101001 | 001001100100011 | 0011110011011 | 001001101101011 | 0011111001101 | 001010001001001 |
| 0011100111000 | 001001010110110 | 0011101101010 | 001001100100100 | 0011110011100 | 001001101101100 | 0011111001110 | 001010001001010 |
| 0011100111001 | 001001011000000 | 0011101101011 | 001001100100101 | 0011110011101 | 001001101101101 | 0011111001111 | 001010001001011 |

FIG. 11K

| Source | Codeword | Source | Codeword | Source | Codeword | Source | Codeword |
|---|---|---|---|---|---|---|---|
| 0011111010000 | 001010001001100 | 0100000000010 | 001010010100011 | 0100000110100 | 001010100001100 | 0100001100110 | 001010101010101 |
| 0011111010001 | 001010001001101 | 0100000000011 | 001010010100100 | 0100000110101 | 001010100001101 | 0100001100111 | 001010101010110 |
| 0011111010010 | 001010001010000 | 0100000000100 | 001010010100101 | 0100000110110 | 001010100010000 | 0100001101000 | 001010101011000 |
| 0011111010011 | 001010001010001 | 0100000000101 | 001010010100110 | 0100000110111 | 001010100010001 | 0100001101001 | 001010101011001 |
| 0011111010100 | 001010001010010 | 0100000000110 | 001010010101000 | 0100000111000 | 001010100010010 | 0100001101010 | 001010101011010 |
| 0011111010101 | 001010001010011 | 0100000000111 | 001010010101001 | 0100000111001 | 001010100010011 | 0100001101011 | 001010101100000 |
| 0011111010110 | 001010001010100 | 0100000001000 | 001010010101010 | 0100000111010 | 001010100010100 | 0100001101100 | 001010101100001 |
| 0011111010111 | 001010001010101 | 0100000001001 | 001010010101011 | 0100000111011 | 001010100010101 | 0100001101101 | 001010101100010 |
| 0011111011000 | 001010001010110 | 0100000001010 | 001010010101100 | 0100000111100 | 001010100010110 | 0100001101110 | 001010101100011 |
| 0011111011001 | 001010001011000 | 0100000001011 | 001010010101101 | 0100000111101 | 001010100011000 | 0100001101111 | 001010101100100 |
| 0011111011010 | 001010001011001 | 0100000001100 | 001010010110000 | 0100000111110 | 001010100011001 | 0100001110000 | 001010101100101 |
| 0011111011011 | 001010001011010 | 0100000001101 | 001010010110001 | 0100000111111 | 001010100011010 | 0100001110001 | 001010101100110 |
| 0011111011100 | 001010001100000 | 0100000001110 | 001010010110010 | 0100001000000 | 001010100100000 | 0100001110010 | 001010101101000 |
| 0011111011101 | 001010001100001 | 0100000001111 | 001010010110011 | 0100001000001 | 001010100100001 | 0100001110011 | 001010101101001 |
| 0011111011110 | 001010001100010 | 0100000010000 | 001010010110100 | 0100001000010 | 001010100100010 | 0100001110100 | 001010101101010 |
| 0011111011111 | 001010001100011 | 0100000010001 | 001010010110101 | 0100001000011 | 001010100100011 | 0100001110101 | 001010101101011 |
| 0011111100000 | 001010001100100 | 0100000010010 | 001010010110110 | 0100001000100 | 001010100100100 | 0100001110110 | 001010101101100 |
| 0011111100001 | 001010001100101 | 0100000010011 | 001010011000000 | 0100001000101 | 001010100100101 | 0100001110111 | 001010101101101 |
| 0011111100010 | 001010001100110 | 0100000010100 | 001010011000001 | 0100001000110 | 001010100100110 | 0100001111000 | 001010110000001 |
| 0011111100011 | 001010001101000 | 0100000010101 | 001010011000010 | 0100001000111 | 001010100101000 | 0100001111001 | 001010110000010 |
| 0011111100100 | 001010001101001 | 0100000010110 | 001010011000011 | 0100001001000 | 001010100101001 | 0100001111010 | 001010110000011 |
| 0011111100101 | 001010001101010 | 0100000010111 | 001010011000100 | 0100001001001 | 001010100101010 | 0100001111011 | 001010110000100 |
| 0011111100110 | 001010001101011 | 0100000011000 | 001010011000101 | 0100001001010 | 001010100101011 | 0100001111100 | 001010110000101 |
| 0011111100111 | 001010001101100 | 0100000011001 | 001010011000110 | 0100001001011 | 001010100101100 | 0100001111101 | 001010110000110 |
| 0011111101000 | 001010001101101 | 0100000011010 | 001010011001000 | 0100001001100 | 001010100101101 | 0100001111110 | 001010110001000 |
| 0011111101001 | 001010010000001 | 0100000011011 | 001010011001001 | 0100001001101 | 001010100110000 | 0100001111111 | 001010110001001 |
| 0011111101010 | 001010010000010 | 0100000011100 | 001010011001010 | 0100001001110 | 001010100110001 | 0100010000000 | 001010110001010 |
| 0011111101011 | 001010010000011 | 0100000011101 | 001010011001011 | 0100001001111 | 001010100110010 | 0100010000001 | 001010110001011 |
| 0011111101100 | 001010010000100 | 0100000011110 | 001010011001100 | 0100001010000 | 001010100110011 | 0100010000010 | 001010110001100 |
| 0011111101101 | 001010010000101 | 0100000011111 | 001010011001101 | 0100001010001 | 001010100110100 | 0100010000011 | 001010110001101 |
| 0011111101110 | 001010010000110 | 0100000100000 | 001010011010000 | 0100001010010 | 001010100110101 | 0100010000100 | 001010110010000 |
| 0011111101111 | 001010010001000 | 0100000100001 | 001010011010001 | 0100001010011 | 001010100110110 | 0100010000101 | 001010110010001 |
| 0011111110000 | 001010010001001 | 0100000100010 | 001010011010010 | 0100001010100 | 001010101000000 | 0100010000110 | 001010110010010 |
| 0011111110001 | 001010010001010 | 0100000100011 | 001010011010011 | 0100001010101 | 001010101000001 | 0100010000111 | 001010110010011 |
| 0011111110010 | 001010010001011 | 0100000100100 | 001010011010100 | 0100001010110 | 001010101000010 | 0100010001000 | 001010110010100 |
| 0011111110011 | 001010010001100 | 0100000100101 | 001010011010101 | 0100001010111 | 001010101000011 | 0100010001001 | 001010110010101 |
| 0011111110100 | 001010010001101 | 0100000100110 | 001010011010110 | 0100001011000 | 001010101000100 | 0100010001010 | 001010110010110 |
| 0011111110101 | 001010010010000 | 0100000100111 | 001010011011000 | 0100001011001 | 001010101000101 | 0100010001011 | 001010110011000 |
| 0011111110110 | 001010010010001 | 0100000101000 | 001010011011001 | 0100001011010 | 001010101000110 | 0100010001100 | 001010110011001 |
| 0011111110111 | 001010010010010 | 0100000101001 | 001010011011010 | 0100001011011 | 001010101001000 | 0100010001101 | 001010110011010 |
| 0011111111000 | 001010010010011 | 0100000101010 | 001010100000001 | 0100001011100 | 001010101001001 | 0100010001110 | 001010110100000 |
| 0011111111001 | 001010010010100 | 0100000101011 | 001010100000010 | 0100001011101 | 001010101001010 | 0100010001111 | 001010110100001 |
| 0011111111010 | 001010010010101 | 0100000101100 | 001010100000011 | 0100001011110 | 001010101001011 | 0100010010000 | 001010110100010 |
| 0011111111011 | 001010010010110 | 0100000101101 | 001010100000100 | 0100001011111 | 001010101001100 | 0100010010001 | 001010110100011 |
| 0011111111100 | 001010010011000 | 0100000101110 | 001010100000101 | 0100001100000 | 001010101001101 | 0100010010010 | 001010110100100 |
| 0011111111101 | 001010010011001 | 0100000101111 | 001010100000110 | 0100001100001 | 001010101010000 | 0100010010011 | 001010110100101 |
| 0011111111110 | 001010010011010 | 0100000110000 | 001010100001000 | 0100001100010 | 001010101010001 | 0100010010100 | 001010110100110 |
| 0011111111111 | 001010010100000 | 0100000110001 | 001010100001001 | 0100001100011 | 001010101010010 | 0100010010101 | 001010110101000 |
| 0100000000000 | 001010010100001 | 0100000110010 | 001010100001010 | 0100001100100 | 001010101010011 | 0100010010110 | 001010110101001 |
| 0100000000001 | 001010010100010 | 0100000110011 | 001010100001011 | 0100001100101 | 001010101010100 | 0100010010111 | 001010110101010 |

FIG. 11L

| Source | Codeword | Source | Codeword | Source | Codeword | Source | Codeword |
|---|---|---|---|---|---|---|---|
| 0100010011000 | 001010110101011 | 0100011001010 | 001011000110110 | 0100011111100 | 001011010010001 | 0100100101110 | 001011011011001 |
| 0100010011001 | 001010110101100 | 0100011001011 | 001011001000000 | 0100011111101 | 001011010010010 | 0100100101111 | 001011011011010 |
| 0100010011010 | 001010110101101 | 0100011001100 | 001011001000001 | 0100011111110 | 001011010010011 | 0100100110000 | 001100000001000 |
| 0100010011011 | 001010110110000 | 0100011001101 | 001011001000010 | 0100011111111 | 001011010010100 | 0100100110001 | 001100000001001 |
| 0100010011100 | 001010110110001 | 0100011001110 | 001011001000011 | 0100100000000 | 001011010010101 | 0100100110010 | 001100000001010 |
| 0100010011101 | 001010110110010 | 0100011001111 | 001011001000100 | 0100100000001 | 001011010010110 | 0100100110011 | 001100000001011 |
| 0100010011110 | 001010110110011 | 0100011010000 | 001011001000101 | 0100100000010 | 001011010011000 | 0100100110100 | 001100000001100 |
| 0100010011111 | 001010110110100 | 0100011010001 | 001011001000110 | 0100100000011 | 001011010011001 | 0100100110101 | 001100000001101 |
| 0100010100000 | 001010110110101 | 0100011010010 | 001011001001000 | 0100100000100 | 001011010011010 | 0100100110110 | 001100000010000 |
| 0100010100001 | 001010110110110 | 0100011010011 | 001011001001001 | 0100100000101 | 001011010100000 | 0100100110111 | 001100000010001 |
| 0100010100010 | 001011000000010 | 0100011010100 | 001011001001010 | 0100100000110 | 001011010100001 | 0100100111000 | 001100000010010 |
| 0100010100011 | 001011000000011 | 0100011010101 | 001011001001011 | 0100100000111 | 001011010100010 | 0100100111001 | 001100000010011 |
| 0100010100100 | 001011000000100 | 0100011010110 | 001011001001100 | 0100100001000 | 001011010100011 | 0100100111010 | 001100000010100 |
| 0100010100101 | 001011000000101 | 0100011010111 | 001011001001101 | 0100100001001 | 001011010100100 | 0100100111011 | 001100000010101 |
| 0100010100110 | 001011000000110 | 0100011011000 | 001011001010000 | 0100100001010 | 001011010100101 | 0100100111100 | 001100000010110 |
| 0100010100111 | 001011000001000 | 0100011011001 | 001011001010001 | 0100100001011 | 001011010100110 | 0100100111101 | 001100000011000 |
| 0100010101000 | 001011000001001 | 0100011011010 | 001011001010010 | 0100100001100 | 001011010101000 | 0100100111110 | 001100000011001 |
| 0100010101001 | 001011000001010 | 0100011011011 | 001011001010011 | 0100100001101 | 001011010101001 | 0100100111111 | 001100000011010 |
| 0100010101010 | 001011000001011 | 0100011011100 | 001011001010100 | 0100100001110 | 001011010101010 | 0100101000000 | 001100000100000 |
| 0100010101011 | 001011000001100 | 0100011011101 | 001011001010101 | 0100100001111 | 001011010101011 | 0100101000001 | 001100000100001 |
| 0100010101100 | 001011000001101 | 0100011011110 | 001011001010110 | 0100100010000 | 001011010101100 | 0100101000010 | 001100000100010 |
| 0100010101101 | 001011000010000 | 0100011011111 | 001011001011000 | 0100100010001 | 001011010101101 | 0100101000011 | 001100000100011 |
| 0100010101110 | 001011000010001 | 0100011100000 | 001011001011001 | 0100100010010 | 001011010110000 | 0100101000100 | 001100000100100 |
| 0100010101111 | 001011000010010 | 0100011100001 | 001011001011010 | 0100100010011 | 001011010110001 | 0100101000101 | 001100000100101 |
| 0100010110000 | 001011000010011 | 0100011100010 | 001011001100000 | 0100100010100 | 001011010110010 | 0100101000110 | 001100000100110 |
| 0100010110001 | 001011000010100 | 0100011100011 | 001011001100001 | 0100100010101 | 001011010110011 | 0100101000111 | 001100000101000 |
| 0100010110010 | 001011000010101 | 0100011100100 | 001011001100010 | 0100100010110 | 001011010110100 | 0100101001000 | 001100000101001 |
| 0100010110011 | 001011000010110 | 0100011100101 | 001011001100011 | 0100100010111 | 001011010110101 | 0100101001001 | 001100000101010 |
| 0100010110100 | 001011000011000 | 0100011100110 | 001011001100100 | 0100100011000 | 001011010110110 | 0100101001010 | 001100000101011 |
| 0100010110101 | 001011000011001 | 0100011100111 | 001011001100101 | 0100100011001 | 001011011000000 | 0100101001011 | 001100000101100 |
| 0100010110110 | 001011000011010 | 0100011101000 | 001011001100110 | 0100100011010 | 001011011000001 | 0100101001100 | 001100000101101 |
| 0100010110111 | 001011000100000 | 0100011101001 | 001011001101000 | 0100100011011 | 001011011000010 | 0100101001101 | 001100000110000 |
| 0100010111000 | 001011000100001 | 0100011101010 | 001011001101001 | 0100100011100 | 001011011000011 | 0100101001110 | 001100000110001 |
| 0100010111001 | 001011000100010 | 0100011101011 | 001011001101010 | 0100100011101 | 001011011000100 | 0100101001111 | 001100000110010 |
| 0100010111010 | 001011000100011 | 0100011101100 | 001011001101011 | 0100100011110 | 001011011000101 | 0100101010000 | 001100000110011 |
| 0100010111011 | 001011000100100 | 0100011101101 | 001011001101100 | 0100100011111 | 001011011000110 | 0100101010001 | 001100000110100 |
| 0100010111100 | 001011000100101 | 0100011101110 | 001011001101101 | 0100100100000 | 001011011001000 | 0100101010010 | 001100000110101 |
| 0100010111101 | 001011000100110 | 0100011101111 | 001011010000001 | 0100100100001 | 001011011001001 | 0100101010011 | 001100000110110 |
| 0100010111110 | 001011000101000 | 0100011110000 | 001011010000010 | 0100100100010 | 001011011001010 | 0100101010100 | 001100001000000 |
| 0100010111111 | 001011000101001 | 0100011110001 | 001011010000011 | 0100100100011 | 001011011001011 | 0100101010101 | 001100001000001 |
| 0100011000000 | 001011000101010 | 0100011110010 | 001011010000100 | 0100100100100 | 001011011001100 | 0100101010110 | 001100001000010 |
| 0100011000001 | 001011000101011 | 0100011110011 | 001011010000101 | 0100100100101 | 001011011001101 | 0100101010111 | 001100001000011 |
| 0100011000010 | 001011000101100 | 0100011110100 | 001011010000110 | 0100100100110 | 001011011010000 | 0100101011000 | 001100001000100 |
| 0100011000011 | 001011000101101 | 0100011110101 | 001011010001000 | 0100100100111 | 001011011010001 | 0100101011001 | 001100001000101 |
| 0100011000100 | 001011000110000 | 0100011110110 | 001011010001001 | 0100100101000 | 001011011010010 | 0100101011010 | 001100001000110 |
| 0100011000101 | 001011000110001 | 0100011110111 | 001011010001010 | 0100100101001 | 001011011010011 | 0100101011011 | 001100001001000 |
| 0100011000110 | 001011000110010 | 0100011111000 | 001011010001011 | 0100100101010 | 001011011010100 | 0100101011100 | 001100001001001 |
| 0100011000111 | 001011000110011 | 0100011111001 | 001011010001100 | 0100100101011 | 001011011010101 | 0100101011101 | 001100001001010 |
| 0100011001000 | 001011000110100 | 0100011111010 | 001011010001101 | 0100100101100 | 001011011010110 | 0100101011110 | 001100001001011 |
| 0100011001001 | 001011000110101 | 0100011111011 | 001011010010000 | 0100100101101 | 001011011011000 | 0100101011111 | 001100001001100 |

FIG. 11M

| Source | Codeword | Source | Codeword | Source | Codeword | Source | Codeword |
|---|---|---|---|---|---|---|---|
| 0100101100000 | 001100001001101 | 0100110010010 | 001100010100100 | 0100111000100 | 001100100001101 | 0100111110110 | 001100101010110 |
| 0100101100001 | 001100001010000 | 0100110010011 | 001100010100101 | 0100111000101 | 001100100010000 | 0100111110111 | 001100101011000 |
| 0100101100010 | 001100001010001 | 0100110010100 | 001100010100110 | 0100111000110 | 001100100010001 | 0100111111000 | 001100101011001 |
| 0100101100011 | 001100001010010 | 0100110010101 | 001100010101000 | 0100111000111 | 001100100010010 | 0100111111001 | 001100101011010 |
| 0100101100100 | 001100001010011 | 0100110010110 | 001100010101001 | 0100111001000 | 001100100010011 | 0100111111010 | 001100101100000 |
| 0100101100101 | 001100001010100 | 0100110010111 | 001100010101010 | 0100111001001 | 001100100010100 | 0100111111011 | 001100101100001 |
| 0100101100110 | 001100001010101 | 0100110011000 | 001100010101011 | 0100111001010 | 001100100010101 | 0100111111100 | 001100101100010 |
| 0100101100111 | 001100001010110 | 0100110011001 | 001100010101100 | 0100111001011 | 001100100010110 | 0100111111101 | 001100101100011 |
| 0100101101000 | 001100001011000 | 0100110011010 | 001100010101101 | 0100111001100 | 001100100011000 | 0100111111110 | 001100101100100 |
| 0100101101001 | 001100001011001 | 0100110011011 | 001100010110000 | 0100111001101 | 001100100011001 | 0100111111111 | 001100101100101 |
| 0100101101010 | 001100001011010 | 0100110011100 | 001100010110001 | 0100111001110 | 001100100011010 | 0101000000000 | 001100101100110 |
| 0100101101011 | 001100001100000 | 0100110011101 | 001100010110010 | 0100111001111 | 001100100100000 | 0101000000001 | 001100101101000 |
| 0100101101100 | 001100001100001 | 0100110011110 | 001100010110011 | 0100111010000 | 001100100100001 | 0101000000010 | 001100101101001 |
| 0100101101101 | 001100001100010 | 0100110011111 | 001100010110100 | 0100111010001 | 001100100100010 | 0101000000011 | 001100101101010 |
| 0100101101110 | 001100001100011 | 0100110100000 | 001100010110101 | 0100111010010 | 001100100100011 | 0101000000100 | 001100101101011 |
| 0100101101111 | 001100001100100 | 0100110100001 | 001100010110110 | 0100111010011 | 001100100100100 | 0101000000101 | 001100101101100 |
| 0100101110000 | 001100001100101 | 0100110100010 | 001100011000000 | 0100111010100 | 001100100100101 | 0101000000110 | 001100101101101 |
| 0100101110001 | 001100001100110 | 0100110100011 | 001100011000001 | 0100111010101 | 001100100100110 | 0101000000111 | 001100110000001 |
| 0100101110010 | 001100001101000 | 0100110100100 | 001100011000010 | 0100111010110 | 001100100101000 | 0101000001000 | 001100110000010 |
| 0100101110011 | 001100001101001 | 0100110100101 | 001100011000011 | 0100111010111 | 001100100101001 | 0101000001001 | 001100110000011 |
| 0100101110100 | 001100001101010 | 0100110100110 | 001100011000100 | 0100111011000 | 001100100101010 | 0101000001010 | 001100110000100 |
| 0100101110101 | 001100001101011 | 0100110100111 | 001100011000101 | 0100111011001 | 001100100101011 | 0101000001011 | 001100110000101 |
| 0100101110110 | 001100001101100 | 0100110101000 | 001100011000110 | 0100111011010 | 001100100101100 | 0101000001100 | 001100110000110 |
| 0100101110111 | 001100001101101 | 0100110101001 | 001100011001000 | 0100111011011 | 001100100101101 | 0101000001101 | 001100110001000 |
| 0100101111000 | 001100010000001 | 0100110101010 | 001100011001001 | 0100111011100 | 001100100110000 | 0101000001110 | 001100110001001 |
| 0100101111001 | 001100010000010 | 0100110101011 | 001100011001010 | 0100111011101 | 001100100110001 | 0101000001111 | 001100110001010 |
| 0100101111010 | 001100010000011 | 0100110101100 | 001100011001011 | 0100111011110 | 001100100110010 | 0101000010000 | 001100110001011 |
| 0100101111011 | 001100010000100 | 0100110101101 | 001100011001100 | 0100111011111 | 001100100110011 | 0101000010001 | 001100110001100 |
| 0100101111100 | 001100010000101 | 0100110101110 | 001100011001101 | 0100111100000 | 001100100110100 | 0101000010010 | 001100110001101 |
| 0100101111101 | 001100010000110 | 0100110101111 | 001100011010000 | 0100111100001 | 001100100110101 | 0101000010011 | 001100110010000 |
| 0100101111110 | 001100010001000 | 0100110110000 | 001100011010001 | 0100111100010 | 001100100110110 | 0101000010100 | 001100110010001 |
| 0100101111111 | 001100010001001 | 0100110110001 | 001100011010010 | 0100111100011 | 001100101000000 | 0101000010101 | 001100110010010 |
| 0100110000000 | 001100010001010 | 0100110110010 | 001100011010011 | 0100111100100 | 001100101000001 | 0101000010110 | 001100110010011 |
| 0100110000001 | 001100010001011 | 0100110110011 | 001100011010100 | 0100111100101 | 001100101000010 | 0101000010111 | 001100110010100 |
| 0100110000010 | 001100010001100 | 0100110110100 | 001100011010101 | 0100111100110 | 001100101000011 | 0101000011000 | 001100110010101 |
| 0100110000011 | 001100010001101 | 0100110110101 | 001100011010110 | 0100111100111 | 001100101000100 | 0101000011001 | 001100110010110 |
| 0100110000100 | 001100010010000 | 0100110110110 | 001100011011000 | 0100111101000 | 001100101000101 | 0101000011010 | 001100110011000 |
| 0100110000101 | 001100010010001 | 0100110110111 | 001100011011001 | 0100111101001 | 001100101000110 | 0101000011011 | 001100110011001 |
| 0100110000110 | 001100010010010 | 0100110111000 | 001100011011010 | 0100111101010 | 001100101001000 | 0101000011100 | 001100110011010 |
| 0100110000111 | 001100010010011 | 0100110111001 | 001100100000001 | 0100111101011 | 001100101001001 | 0101000011101 | 001100110100000 |
| 0100110001000 | 001100010010100 | 0100110111010 | 001100100000010 | 0100111101100 | 001100101001010 | 0101000011110 | 001100110100001 |
| 0100110001001 | 001100010010101 | 0100110111011 | 001100100000011 | 0100111101101 | 001100101001011 | 0101000011111 | 001100110100010 |
| 0100110001010 | 001100010010110 | 0100110111100 | 001100100000100 | 0100111101110 | 001100101001100 | 0101000100000 | 001100110100011 |
| 0100110001011 | 001100010011000 | 0100110111101 | 001100100000101 | 0100111101111 | 001100101001101 | 0101000100001 | 001100110100100 |
| 0100110001100 | 001100010011001 | 0100110111110 | 001100100000110 | 0100111110000 | 001100101010000 | 0101000100010 | 001100110100101 |
| 0100110001101 | 001100010011010 | 0100110111111 | 001100100001000 | 0100111110001 | 001100101010001 | 0101000100011 | 001100110100110 |
| 0100110001110 | 001100010100000 | 0100111000000 | 001100100001001 | 0100111110010 | 001100101010010 | 0101000100100 | 001100110101000 |
| 0100110001111 | 001100010100001 | 0100111000001 | 001100100001010 | 0100111110011 | 001100101010011 | 0101000100101 | 001100110101001 |
| 0100110010000 | 001100010100010 | 0100111000010 | 001100100001011 | 0100111110100 | 001100101010100 | 0101000100110 | 001100110101010 |
| 0100110010001 | 001100010100011 | 0100111000011 | 001100100001100 | 0100111110101 | 001100101010101 | 0101000100111 | 001100110101011 |

FIG. 11N

| Source | Codeword | Source | Codeword | Source | Codeword | Source | Codeword |
|---|---|---|---|---|---|---|---|
| 0101000101000 | 001100110101100 | 0101001011010 | 001101001000000 | 0101010001100 | 001101010010010 | 0101010111110 | 001101011011010 |
| 0101000101001 | 001100110101101 | 0101001011011 | 001101001000001 | 0101010001101 | 001101010010011 | 0101010111111 | 001101100000001 |
| 0101000101010 | 001100110110000 | 0101001011100 | 001101001000010 | 0101010001110 | 001101010010100 | 0101011000000 | 001101100000010 |
| 0101000101011 | 001100110110001 | 0101001011101 | 001101001000011 | 0101010001111 | 001101010010101 | 0101011000001 | 001101100000011 |
| 0101000101100 | 001100110110010 | 0101001011110 | 001101001000100 | 0101010010000 | 001101010010110 | 0101011000010 | 001101100000100 |
| 0101000101101 | 001100110110011 | 0101001011111 | 001101001000101 | 0101010010001 | 001101010011000 | 0101011000011 | 001101100000101 |
| 0101000101110 | 001100110110100 | 0101001100000 | 001101001000110 | 0101010010010 | 001101010011001 | 0101011000100 | 001101100000110 |
| 0101000101111 | 001100110110101 | 0101001100001 | 001101001001000 | 0101010010011 | 001101010011010 | 0101011000101 | 001101100001000 |
| 0101000110000 | 001100110110110 | 0101001100010 | 001101001001001 | 0101010010100 | 001101010100000 | 0101011000110 | 001101100001001 |
| 0101000110001 | 001101000000010 | 0101001100011 | 001101001001010 | 0101010010101 | 001101010100001 | 0101011000111 | 001101100001010 |
| 0101000110010 | 001101000000011 | 0101001100100 | 001101001001011 | 0101010010110 | 001101010100010 | 0101011001000 | 001101100001011 |
| 0101000110011 | 001101000000100 | 0101001100101 | 001101001001100 | 0101010010111 | 001101010100011 | 0101011001001 | 001101100001100 |
| 0101000110100 | 001101000000101 | 0101001100110 | 001101001001101 | 0101010011000 | 001101010100100 | 0101011001010 | 001101100001101 |
| 0101000110101 | 001101000000110 | 0101001100111 | 001101001010000 | 0101010011001 | 001101010100101 | 0101011001011 | 001101100010000 |
| 0101000110110 | 001101000001000 | 0101001101000 | 001101001010001 | 0101010011010 | 001101010100110 | 0101011001100 | 001101100010001 |
| 0101000110111 | 001101000001001 | 0101001101001 | 001101001010010 | 0101010011011 | 001101010101000 | 0101011001101 | 001101100010010 |
| 0101000111000 | 001101000001010 | 0101001101010 | 001101001010011 | 0101010011100 | 001101010101001 | 0101011001110 | 001101100010011 |
| 0101000111001 | 001101000001011 | 0101001101011 | 001101001010100 | 0101010011101 | 001101010101010 | 0101011001111 | 001101100010100 |
| 0101000111010 | 001101000001100 | 0101001101100 | 001101001010101 | 0101010011110 | 001101010101011 | 0101011010000 | 001101100010101 |
| 0101000111011 | 001101000001101 | 0101001101101 | 001101001010110 | 0101010011111 | 001101010101100 | 0101011010001 | 001101100010110 |
| 0101000111100 | 001101000010000 | 0101001101110 | 001101001011000 | 0101010100000 | 001101010101101 | 0101011010010 | 001101100011000 |
| 0101000111101 | 001101000010001 | 0101001101111 | 001101001011001 | 0101010100001 | 001101010110000 | 0101011010011 | 001101100011001 |
| 0101000111110 | 001101000010010 | 0101001110000 | 001101001011010 | 0101010100010 | 001101010110001 | 0101011010100 | 001101100011010 |
| 0101000111111 | 001101000010011 | 0101001110001 | 001101001100000 | 0101010100011 | 001101010110010 | 0101011010101 | 001101100100000 |
| 0101001000000 | 001101000010100 | 0101001110010 | 001101001100001 | 0101010100100 | 001101010110011 | 0101011010110 | 001101100100001 |
| 0101001000001 | 001101000010101 | 0101001110011 | 001101001100010 | 0101010100101 | 001101010110100 | 0101011010111 | 001101100100010 |
| 0101001000010 | 001101000010110 | 0101001110100 | 001101001100011 | 0101010100110 | 001101010110101 | 0101011011000 | 001101100100011 |
| 0101001000011 | 001101000011000 | 0101001110101 | 001101001100100 | 0101010100111 | 001101010110110 | 0101011011001 | 001101100100100 |
| 0101001000100 | 001101000011001 | 0101001110110 | 001101001100101 | 0101010101000 | 001101011000000 | 0101011011010 | 001101100100101 |
| 0101001000101 | 001101000011010 | 0101001110111 | 001101001100110 | 0101010101001 | 001101011000001 | 0101011011011 | 001101100100110 |
| 0101001000110 | 001101000100000 | 0101001111000 | 001101001101000 | 0101010101010 | 001101011000010 | 0101011011100 | 001101100101000 |
| 0101001000111 | 001101000100001 | 0101001111001 | 001101001101001 | 0101010101011 | 001101011000011 | 0101011011101 | 001101100101001 |
| 0101001001000 | 001101000100010 | 0101001111010 | 001101001101010 | 0101010101100 | 001101011000100 | 0101011011110 | 001101100101010 |
| 0101001001001 | 001101000100011 | 0101001111011 | 001101001101011 | 0101010101101 | 001101011000101 | 0101011011111 | 001101100101011 |
| 0101001001010 | 001101000100100 | 0101001111100 | 001101001101100 | 0101010101110 | 001101011000110 | 0101011100000 | 001101100101100 |
| 0101001001011 | 001101000100101 | 0101001111101 | 001101001101101 | 0101010101111 | 001101011001000 | 0101011100001 | 001101100101101 |
| 0101001001100 | 001101000100110 | 0101001111110 | 001101010000001 | 0101010110000 | 001101011001001 | 0101011100010 | 001101100110000 |
| 0101001001101 | 001101000101000 | 0101001111111 | 001101010000010 | 0101010110001 | 001101011001010 | 0101011100011 | 001101100110001 |
| 0101001001110 | 001101000101001 | 0101010000000 | 001101010000011 | 0101010110010 | 001101011001011 | 0101011100100 | 001101100110010 |
| 0101001001111 | 001101000101010 | 0101010000001 | 001101010000100 | 0101010110011 | 001101011001100 | 0101011100101 | 001101100110011 |
| 0101001010000 | 001101000101011 | 0101010000010 | 001101010000101 | 0101010110100 | 001101011001101 | 0101011100110 | 001101100110100 |
| 0101001010001 | 001101000101100 | 0101010000011 | 001101010000110 | 0101010110101 | 001101011010000 | 0101011100111 | 001101100110101 |
| 0101001010010 | 001101000101101 | 0101010000100 | 001101010001000 | 0101010110110 | 001101011010001 | 0101011101000 | 001101100110110 |
| 0101001010011 | 001101000110000 | 0101010000101 | 001101010001001 | 0101010110111 | 001101011010010 | 0101011101001 | 001101101000000 |
| 0101001010100 | 001101000110001 | 0101010000110 | 001101010001010 | 0101010111000 | 001101011010011 | 0101011101010 | 001101101000001 |
| 0101001010101 | 001101000110010 | 0101010000111 | 001101010001011 | 0101010111001 | 001101011010100 | 0101011101011 | 001101101000010 |
| 0101001010110 | 001101000110011 | 0101010001000 | 001101010001100 | 0101010111010 | 001101011010101 | 0101011101100 | 001101101000011 |
| 0101001010111 | 001101000110100 | 0101010001001 | 001101010001101 | 0101010111011 | 001101011010110 | 0101011101101 | 001101101000100 |
| 0101001011000 | 001101000110101 | 0101010001010 | 001101010010000 | 0101010111100 | 001101011011000 | 0101011101110 | 001101101000101 |
| 0101001011001 | 001101000110110 | 0101010001011 | 001101010010001 | 0101010111101 | 001101011011001 | 0101011101111 | 001101101000110 |

FIG. 110

| Source | Codeword | Source | Codeword | Source | Codeword | Source | Codeword |
|---|---|---|---|---|---|---|---|
| 0101011110000 | 010000001000001 | 0101100100010 | 010000001000001 | 0101101010100 | 010000010010011 | 0101110000110 | 010000100000001 |
| 0101011110001 | 010000001000010 | 0101100100011 | 010000001000010 | 0101101010101 | 010000010010100 | 0101110000111 | 010000100000010 |
| 0101011110010 | 010000001000011 | 0101100100100 | 010000001000011 | 0101101010110 | 010000010010101 | 0101110001000 | 010000100000011 |
| 0101011110011 | 010000001000100 | 0101100100101 | 010000001000100 | 0101101010111 | 010000010010110 | 0101110001001 | 010000100000100 |
| 0101011110100 | 010000001000101 | 0101100100110 | 010000001000101 | 0101101011000 | 010000010011000 | 0101110001010 | 010000100000101 |
| 0101011110101 | 010000001000110 | 0101100100111 | 010000001000110 | 0101101011001 | 010000010011001 | 0101110001011 | 010000100000110 |
| 0101011110110 | 010000001001000 | 0101100101000 | 010000001001000 | 0101101011010 | 010000010011010 | 0101110001100 | 010000100001000 |
| 0101011110111 | 010000001001001 | 0101100101001 | 010000001001001 | 0101101011011 | 010000010100000 | 0101110001101 | 010000100001001 |
| 0101011111000 | 010000001001010 | 0101100101010 | 010000001001010 | 0101101011100 | 010000010100001 | 0101110001110 | 010000100001010 |
| 0101011111001 | 010000001001011 | 0101100101011 | 010000001001011 | 0101101011101 | 010000010100010 | 0101110001111 | 010000100001011 |
| 0101011111010 | 010000001001100 | 0101100101100 | 010000001001100 | 0101101011110 | 010000010100011 | 0101110010000 | 010000100001100 |
| 0101011111011 | 010000001001101 | 0101100101101 | 010000001001101 | 0101101011111 | 010000010100100 | 0101110010001 | 010000100001101 |
| 0101011111100 | 010000001010000 | 0101100101110 | 010000001010000 | 0101101100000 | 010000010100101 | 0101110010010 | 010000100010000 |
| 0101011111101 | 010000001010001 | 0101100101111 | 010000001010001 | 0101101100001 | 010000010100110 | 0101110010011 | 010000100010001 |
| 0101011111110 | 010000001010010 | 0101100110000 | 010000001010010 | 0101101100010 | 010000010101000 | 0101110010100 | 010000100010010 |
| 0101011111111 | 010000001010011 | 0101100110001 | 010000001010011 | 0101101100011 | 010000010101001 | 0101110010101 | 010000100010011 |
| 0101100000000 | 010000001010100 | 0101100110010 | 010000001010100 | 0101101100100 | 010000010101010 | 0101110010110 | 010000100010100 |
| 0101100000001 | 010000001010101 | 0101100110011 | 010000001010101 | 0101101100101 | 010000010101011 | 0101110010111 | 010000100010101 |
| 0101100000010 | 010000001010110 | 0101100110100 | 010000001010110 | 0101101100110 | 010000010101100 | 0101110011000 | 010000100010110 |
| 0101100000011 | 010000001011000 | 0101100110101 | 010000001011000 | 0101101100111 | 010000010101101 | 0101110011001 | 010000100011000 |
| 0101100000100 | 010000001011001 | 0101100110110 | 010000001011001 | 0101101101000 | 010000010110000 | 0101110011010 | 010000100011001 |
| 0101100000101 | 010000001011010 | 0101100110111 | 010000001011010 | 0101101101001 | 010000010110001 | 0101110011011 | 010000100011010 |
| 0101100000110 | 010000001100000 | 0101100111000 | 010000001100000 | 0101101101010 | 010000010110010 | 0101110011100 | 010000100100000 |
| 0101100000111 | 010000001100001 | 0101100111001 | 010000001100001 | 0101101101011 | 010000010110011 | 0101110011101 | 010000100100001 |
| 0101100001000 | 010000001100010 | 0101100111010 | 010000001100010 | 0101101101100 | 010000010110100 | 0101110011110 | 010000100100010 |
| 0101100001001 | 010000001100011 | 0101100111011 | 010000001100011 | 0101101101101 | 010000010110101 | 0101110011111 | 010000100100011 |
| 0101100001010 | 010000001100100 | 0101100111100 | 010000001100100 | 0101101101110 | 010000010110110 | 0101110100000 | 010000100100100 |
| 0101100001011 | 010000001100101 | 0101100111101 | 010000001100101 | 0101101101111 | 010000011000000 | 0101110100001 | 010000100100101 |
| 0101100001100 | 010000001100110 | 0101100111110 | 010000001100110 | 0101101110000 | 010000011000001 | 0101110100010 | 010000100100110 |
| 0101100001101 | 010000001101000 | 0101100111111 | 010000001101000 | 0101101110001 | 010000011000010 | 0101110100011 | 010000100101000 |
| 0101100001110 | 010000001101001 | 0101101000000 | 010000001101001 | 0101101110010 | 010000011000011 | 0101110100100 | 010000100101001 |
| 0101100001111 | 010000001101010 | 0101101000001 | 010000001101010 | 0101101110011 | 010000011000100 | 0101110100101 | 010000100101010 |
| 0101100010000 | 010000001101011 | 0101101000010 | 010000001101011 | 0101101110100 | 010000011000101 | 0101110100110 | 010000100101011 |
| 0101100010001 | 010000001101100 | 0101101000011 | 010000001101100 | 0101101110101 | 010000011000110 | 0101110100111 | 010000100101100 |
| 0101100010010 | 010000001101101 | 0101101000100 | 010000001101101 | 0101101110110 | 010000011001000 | 0101110101000 | 010000100101101 |
| 0101100010011 | 010000010000001 | 0101101000101 | 010000010000001 | 0101101110111 | 010000011001001 | 0101110101001 | 010000100110000 |
| 0101100010100 | 010000010000010 | 0101101000110 | 010000010000010 | 0101101111000 | 010000011001010 | 0101110101010 | 010000100110001 |
| 0101100010101 | 010000010000011 | 0101101000111 | 010000010000011 | 0101101111001 | 010000011001011 | 0101110101011 | 010000100110010 |
| 0101100010110 | 010000010000100 | 0101101001000 | 010000010000100 | 0101101111010 | 010000011001100 | 0101110101100 | 010000100110011 |
| 0101100010111 | 010000010000101 | 0101101001001 | 010000010000101 | 0101101111011 | 010000011001101 | 0101110101101 | 010000100110100 |
| 0101100011000 | 010000010000110 | 0101101001010 | 010000010000110 | 0101101111100 | 010000011010000 | 0101110101110 | 010000100110101 |
| 0101100011001 | 010000010001000 | 0101101001011 | 010000010001000 | 0101101111101 | 010000011010001 | 0101110101111 | 010000100110110 |
| 0101100011010 | 010000010001001 | 0101101001100 | 010000010001001 | 0101101111110 | 010000011010010 | 0101110110000 | 010000101000000 |
| 0101100011011 | 010000010001010 | 0101101001101 | 010000010001010 | 0101101111111 | 010000011010011 | 0101110110001 | 010000101000001 |
| 0101100011100 | 010000010001011 | 0101101001110 | 010000010001011 | 0101110000000 | 010000011010100 | 0101110110010 | 010000101000010 |
| 0101100011101 | 010000010001100 | 0101101001111 | 010000010001100 | 0101110000001 | 010000011010101 | 0101110110011 | 010000101000011 |
| 0101100011110 | 010000010001101 | 0101101010000 | 010000010001101 | 0101110000010 | 010000011010110 | 0101110110100 | 010000101000100 |
| 0101100011111 | 010000010010000 | 0101101010001 | 010000010010000 | 0101110000011 | 010000011011000 | 0101110110101 | 010000101000101 |
| 0101100100000 | 010000010010001 | 0101101010010 | 010000010010001 | 0101110000100 | 010000011011001 | 0101110110110 | 010000101000110 |
| 0101100100001 | 010000010010010 | 0101101010011 | 010000010010010 | 0101110000101 | 010000011011010 | 0101110110111 | 010000101001000 |

FIG. 11P

| Source | Codeword | Source | Codeword | Source | Codeword | Source | Codeword |
|---|---|---|---|---|---|---|---|
| 0101110111000 | 010000101001001 | 0101111101010 | 010000110100000 | 0110000011100 | 010001000101010 | 0110001001110 | 010001010000100 |
| 0101110111001 | 010000101001010 | 0101111101011 | 010000110100001 | 0110000011101 | 010001000101011 | 0110001001111 | 010001010000101 |
| 0101110111010 | 010000101001011 | 0101111101100 | 010000110100010 | 0110000011110 | 010001000101100 | 0110001010000 | 010001010000110 |
| 0101110111011 | 010000101001100 | 0101111101101 | 010000110100011 | 0110000011111 | 010001000101101 | 0110001010001 | 010001010001000 |
| 0101110111100 | 010000101001101 | 0101111101110 | 010000110100100 | 0110000100000 | 010001000110000 | 0110001010010 | 010001010001001 |
| 0101110111101 | 010000101010000 | 0101111101111 | 010000110100101 | 0110000100001 | 010001000110001 | 0110001010011 | 010001010001010 |
| 0101110111110 | 010000101010001 | 0101111110000 | 010000110100110 | 0110000100010 | 010001000110010 | 0110001010100 | 010001010001011 |
| 0101110111111 | 010000101010010 | 0101111110001 | 010000110101000 | 0110000100011 | 010001000110011 | 0110001010101 | 010001010001100 |
| 0101111000000 | 010000101010011 | 0101111110010 | 010000110101001 | 0110000100100 | 010001000110100 | 0110001010110 | 010001010001101 |
| 0101111000001 | 010000101010100 | 0101111110011 | 010000110101010 | 0110000100101 | 010001000110101 | 0110001010111 | 010001010010000 |
| 0101111000010 | 010000101010101 | 0101111110100 | 010000110101011 | 0110000100110 | 010001000110110 | 0110001011000 | 010001010010001 |
| 0101111000011 | 010000101010110 | 0101111110101 | 010000110101100 | 0110000100111 | 010001001000000 | 0110001011001 | 010001010010010 |
| 0101111000100 | 010000101011000 | 0101111110110 | 010000110101101 | 0110000101000 | 010001001000001 | 0110001011010 | 010001010010011 |
| 0101111000101 | 010000101011001 | 0101111110111 | 010000110110000 | 0110000101001 | 010001001000010 | 0110001011011 | 010001010010100 |
| 0101111000110 | 010000101011010 | 0101111111000 | 010000110110001 | 0110000101010 | 010001001000011 | 0110001011100 | 010001010010101 |
| 0101111000111 | 010000101100000 | 0101111111001 | 010000110110010 | 0110000101011 | 010001001000100 | 0110001011101 | 010001010010110 |
| 0101111001000 | 010000101100001 | 0101111111010 | 010000110110011 | 0110000101100 | 010001001000101 | 0110001011110 | 010001010011000 |
| 0101111001001 | 010000101100010 | 0101111111011 | 010000110110100 | 0110000101101 | 010001001000110 | 0110001011111 | 010001010011001 |
| 0101111001010 | 010000101100011 | 0101111111100 | 010000110110101 | 0110000101110 | 010001001001000 | 0110001100000 | 010001010011010 |
| 0101111001011 | 010000101100100 | 0101111111101 | 010000110110110 | 0110000101111 | 010001001001001 | 0110001100001 | 010001010100000 |
| 0101111001100 | 010000101100101 | 0101111111110 | 010001000000010 | 0110000110000 | 010001001001010 | 0110001100010 | 010001010100001 |
| 0101111001101 | 010000101100110 | 0101111111111 | 010001000000011 | 0110000110001 | 010001001001011 | 0110001100011 | 010001010100010 |
| 0101111001110 | 010000101101000 | 0110000000000 | 010001000000100 | 0110000110010 | 010001001001100 | 0110001100100 | 010001010100011 |
| 0101111001111 | 010000101101001 | 0110000000001 | 010001000000101 | 0110000110011 | 010001001001101 | 0110001100101 | 010001010100100 |
| 0101111010000 | 010000101101010 | 0110000000010 | 010001000000110 | 0110000110100 | 010001001010000 | 0110001100110 | 010001010100101 |
| 0101111010001 | 010000101101011 | 0110000000011 | 010001000001000 | 0110000110101 | 010001001010001 | 0110001100111 | 010001010100110 |
| 0101111010010 | 010000101101100 | 0110000000100 | 010001000001001 | 0110000110110 | 010001001010010 | 0110001101000 | 010001010101000 |
| 0101111010011 | 010000101101101 | 0110000000101 | 010001000001010 | 0110000110111 | 010001001010011 | 0110001101001 | 010001010101001 |
| 0101111010100 | 010000110000001 | 0110000000110 | 010001000001011 | 0110000111000 | 010001001010100 | 0110001101010 | 010001010101010 |
| 0101111010101 | 010000110000010 | 0110000000111 | 010001000001100 | 0110000111001 | 010001001010101 | 0110001101011 | 010001010101011 |
| 0101111010110 | 010000110000011 | 0110000001000 | 010001000001101 | 0110000111010 | 010001001010110 | 0110001101100 | 010001010101100 |
| 0101111010111 | 010000110000100 | 0110000001001 | 010001000010000 | 0110000111011 | 010001001011000 | 0110001101101 | 010001010101101 |
| 0101111011000 | 010000110000101 | 0110000001010 | 010001000010001 | 0110000111100 | 010001001011001 | 0110001101110 | 010001010110000 |
| 0101111011001 | 010000110000110 | 0110000001011 | 010001000010010 | 0110000111101 | 010001001011010 | 0110001101111 | 010001010110001 |
| 0101111011010 | 010000110001000 | 0110000001100 | 010001000010011 | 0110000111110 | 010001001100000 | 0110001110000 | 010001010110010 |
| 0101111011011 | 010000110001001 | 0110000001101 | 010001000010100 | 0110000111111 | 010001001100001 | 0110001110001 | 010001010110011 |
| 0101111011100 | 010000110001010 | 0110000001110 | 010001000010101 | 0110001000000 | 010001001100010 | 0110001110010 | 010001010110100 |
| 0101111011101 | 010000110001011 | 0110000001111 | 010001000010110 | 0110001000001 | 010001001100011 | 0110001110011 | 010001010110101 |
| 0101111011110 | 010000110001100 | 0110000010000 | 010001000011000 | 0110001000010 | 010001001100100 | 0110001110100 | 010001010110110 |
| 0101111011111 | 010000110001101 | 0110000010001 | 010001000011001 | 0110001000011 | 010001001100101 | 0110001110101 | 010001011000000 |
| 0101111100000 | 010000110010000 | 0110000010010 | 010001000011010 | 0110001000100 | 010001001100110 | 0110001110110 | 010001011000001 |
| 0101111100001 | 010000110010001 | 0110000010011 | 010001000100000 | 0110001000101 | 010001001101000 | 0110001110111 | 010001011000010 |
| 0101111100010 | 010000110010010 | 0110000010100 | 010001000100001 | 0110001000110 | 010001001101001 | 0110001111000 | 010001011000011 |
| 0101111100011 | 010000110010011 | 0110000010101 | 010001000100010 | 0110001000111 | 010001001101010 | 0110001111001 | 010001011000100 |
| 0101111100100 | 010000110010100 | 0110000010110 | 010001000100011 | 0110001001000 | 010001001101011 | 0110001111010 | 010001011000101 |
| 0101111100101 | 010000110010101 | 0110000010111 | 010001000100100 | 0110001001001 | 010001001101100 | 0110001111011 | 010001011000110 |
| 0101111100110 | 010000110010110 | 0110000011000 | 010001000100101 | 0110001001010 | 010001001101101 | 0110001111100 | 010001011001000 |
| 0101111100111 | 010000110011000 | 0110000011001 | 010001000100110 | 0110001001011 | 010001010000001 | 0110001111101 | 010001011001001 |
| 0101111101000 | 010000110011001 | 0110000011010 | 010001000101000 | 0110001001100 | 010001010000010 | 0110001111110 | 010001011001010 |
| 0101111101001 | 010000110011010 | 0110000011011 | 010001000101001 | 0110001001101 | 010001010000011 | 0110001111111 | 010001011001011 |

FIG. 11Q

| Source | Codeword | Source | Codeword | Source | Codeword | Source | Codeword |
|---|---|---|---|---|---|---|---|
| 0110010000000 | 0100010111001100 | 0110010110010 | 0100011001010011 | 0110011100100 | 0100100000010001 | 0110100010110 | 0100100001011001 |
| 0110010000001 | 0100010111001101 | 0110010110011 | 0100011001010100 | 0110011100101 | 0100100000010010 | 0110100010111 | 0100100001011010 |
| 0110010000010 | 0100010111010000 | 0110010110100 | 0100011001010101 | 0110011100110 | 0100100000010011 | 0110100011000 | 0100100001100000 |
| 0110010000011 | 0100010111010001 | 0110010110101 | 0100011001010110 | 0110011100111 | 0100100000010100 | 0110100011001 | 0100100001100001 |
| 0110010000100 | 0100010111010010 | 0110010110110 | 0100011010000000 | 0110011101000 | 0100100000010101 | 0110100011010 | 0100100001100010 |
| 0110010000101 | 0100010111010011 | 0110010110111 | 0100011010000001 | 0110011101001 | 0100100000010110 | 0110100011011 | 0100100001100011 |
| 0110010000110 | 0100010111010100 | 0110010111000 | 0100011010000010 | 0110011101010 | 0100100000011000 | 0110100011100 | 0100100001100100 |
| 0110010000111 | 0100010111010101 | 0110010111001 | 0100011010000011 | 0110011101011 | 0100100000011001 | 0110100011101 | 0100100001100101 |
| 0110010001000 | 0100010111010110 | 0110010111010 | 0100011010000100 | 0110011101100 | 0100100000011010 | 0110100011110 | 0100100001100110 |
| 0110010001001 | 0100010111011000 | 0110010111011 | 0100011010000101 | 0110011101101 | 0100100000100000 | 0110100011111 | 0100100001101000 |
| 0110010001010 | 0100010111011001 | 0110010111100 | 0100011010000110 | 0110011101110 | 0100100000100001 | 0110100100000 | 0100100001101001 |
| 0110010001011 | 0100010111011010 | 0110010111101 | 0100011010001000 | 0110011101111 | 0100100000100010 | 0110100100001 | 0100100001101010 |
| 0110010001100 | 0100011000000001 | 0110010111110 | 0100011010001001 | 0110011110000 | 0100100000100011 | 0110100100010 | 0100100001101011 |
| 0110010001101 | 0100011000000010 | 0110010111111 | 0100011010001010 | 0110011110001 | 0100100000100100 | 0110100100011 | 0100100001101100 |
| 0110010001110 | 0100011000000011 | 0110011000000 | 0100011010001011 | 0110011110010 | 0100100000100101 | 0110100100100 | 0100100001101101 |
| 0110010001111 | 0100011000000100 | 0110011000001 | 0100011010001100 | 0110011110011 | 0100100000100110 | 0110100100101 | 0100100100000001 |
| 0110010010000 | 0100011000000101 | 0110011000010 | 0100011010001101 | 0110011110100 | 0100100000101000 | 0110100100110 | 0100100100000010 |
| 0110010010001 | 0100011000000110 | 0110011000011 | 0100011010010000 | 0110011110101 | 0100100000101001 | 0110100100111 | 0100100100000011 |
| 0110010010010 | 0100011000001000 | 0110011000100 | 0100011010010001 | 0110011110110 | 0100100000101010 | 0110100101000 | 0100100100000100 |
| 0110010010011 | 0100011000001001 | 0110011000101 | 0100011010010010 | 0110011110111 | 0100100000101011 | 0110100101001 | 0100100100000101 |
| 0110010010100 | 0100011000001010 | 0110011000110 | 0100011010010011 | 0110011111000 | 0100100000101100 | 0110100101010 | 0100100100000110 |
| 0110010010101 | 0100011000001011 | 0110011000111 | 0100011010010100 | 0110011111001 | 0100100000101101 | 0110100101011 | 0100100100001000 |
| 0110010010110 | 0100011000001100 | 0110011001000 | 0100011010010101 | 0110011111010 | 0100100000110000 | 0110100101100 | 0100100100001001 |
| 0110010010111 | 0100011000001101 | 0110011001001 | 0100011010010110 | 0110011111011 | 0100100000110001 | 0110100101101 | 0100100100001010 |
| 0110010011000 | 0100011000010000 | 0110011001010 | 0100011010011000 | 0110011111100 | 0100100000110010 | 0110100101110 | 0100100100001011 |
| 0110010011001 | 0100011000010001 | 0110011001011 | 0100011010011001 | 0110011111101 | 0100100000110011 | 0110100101111 | 0100100100001100 |
| 0110010011010 | 0100011000010010 | 0110011001100 | 0100011010011010 | 0110011111110 | 0100100000110100 | 0110100110000 | 0100100100001101 |
| 0110010011011 | 0100011000010011 | 0110011001101 | 0100011011000000 | 0110011111111 | 0100100000110101 | 0110100110001 | 0100100100010000 |
| 0110010011100 | 0100011000010100 | 0110011001110 | 0100011011000001 | 0110100000000 | 0100100000110110 | 0110100110010 | 0100100100010001 |
| 0110010011101 | 0100011000010101 | 0110011001111 | 0100011011000010 | 0110100000001 | 0100100001000000 | 0110100110011 | 0100100100010010 |
| 0110010011110 | 0100011000010110 | 0110011010000 | 0100011011000011 | 0110100000010 | 0100100001000001 | 0110100110100 | 0100100100010011 |
| 0110010011111 | 0100011000011000 | 0110011010001 | 0100011011000100 | 0110100000011 | 0100100001000010 | 0110100110101 | 0100100100010100 |
| 0110010100000 | 0100011000011001 | 0110011010010 | 0100011011000101 | 0110100000100 | 0100100001000011 | 0110100110110 | 0100100100010101 |
| 0110010100001 | 0100011000011010 | 0110011010011 | 0100011011000110 | 0110100000101 | 0100100001000100 | 0110100110111 | 0100100100010110 |
| 0110010100010 | 0100011001000000 | 0110011010100 | 0100011011001000 | 0110100000110 | 0100100001000101 | 0110100111000 | 0100100100011000 |
| 0110010100011 | 0100011001000001 | 0110011010101 | 0100011011001001 | 0110100000111 | 0100100001000110 | 0110100111001 | 0100100100011001 |
| 0110010100100 | 0100011001000010 | 0110011010110 | 0100011011001010 | 0110100001000 | 0100100001001000 | 0110100111010 | 0100100100011010 |
| 0110010100101 | 0100011001000011 | 0110011010111 | 0100011011001011 | 0110100001001 | 0100100001001001 | 0110100111011 | 0100100101000000 |
| 0110010100110 | 0100011001000100 | 0110011011000 | 0100011011001100 | 0110100001010 | 0100100001001010 | 0110100111100 | 0100100101000001 |
| 0110010100111 | 0100011001000101 | 0110011011001 | 0100011011001101 | 0110100001011 | 0100100001001011 | 0110100111101 | 0100100101000010 |
| 0110010101000 | 0100011001000110 | 0110011011010 | 0100100000000100 | 0110100001100 | 0100100001001100 | 0110100111110 | 0100100101000011 |
| 0110010101001 | 0100011001001000 | 0110011011011 | 0100100000000101 | 0110100001101 | 0100100001001101 | 0110100111111 | 0100100101000100 |
| 0110010101010 | 0100011001001001 | 0110011011100 | 0100100000000110 | 0110100001110 | 0100100001010000 | 0110101000000 | 0100100101000101 |
| 0110010101011 | 0100011001001010 | 0110011011101 | 0100100000001000 | 0110100001111 | 0100100001010001 | 0110101000001 | 0100100101000110 |
| 0110010101100 | 0100011001001011 | 0110011011110 | 0100100000001001 | 0110100010000 | 0100100001010010 | 0110101000010 | 0100100101001000 |
| 0110010101101 | 0100011001001100 | 0110011011111 | 0100100000001010 | 0110100010001 | 0100100001010011 | 0110101000011 | 0100100101001001 |
| 0110010101110 | 0100011001001101 | 0110011100000 | 0100100000001011 | 0110100010010 | 0100100001010100 | 0110101000100 | 0100100101001010 |
| 0110010101111 | 0100011001010000 | 0110011100001 | 0100100000001100 | 0110100010011 | 0100100001010101 | 0110101000101 | 0100100101001011 |
| 0110010110000 | 0100011001010001 | 0110011100010 | 0100100000001101 | 0110100010100 | 0100100001010110 | 0110101000110 | 0100100101001100 |
| 0110010110001 | 0100011001010010 | 0110011100011 | 0100100000010000 | 0110100010101 | 0100100001011000 | 0110101000111 | 0100100101001101 |

FIG. 11R

| Source | Codeword | Source | Codeword | Source | Codeword | Source | Codeword |
|---|---|---|---|---|---|---|---|
| 0110101001000 | 010010010110000 | 0110101111010 | 010010100011001 | 0110110101100 | 010010101100101 | 0110111011110 | 010011000000010 |
| 0110101001001 | 010010010110001 | 0110101111011 | 010010100011010 | 0110110101101 | 010010101100110 | 0110111011111 | 010011000000011 |
| 0110101001010 | 010010010110010 | 0110101111100 | 010010100100000 | 0110110101110 | 010010101101000 | 0110111100000 | 010011000000100 |
| 0110101001011 | 010010010110011 | 0110101111101 | 010010100100001 | 0110110101111 | 010010101101001 | 0110111100001 | 010011000000101 |
| 0110101001100 | 010010010110100 | 0110101111110 | 010010100100010 | 0110110110000 | 010010101101010 | 0110111100010 | 010011000000110 |
| 0110101001101 | 010010010110101 | 0110101111111 | 010010100100011 | 0110110110001 | 010010101101011 | 0110111100011 | 010011000001000 |
| 0110101001110 | 010010010110110 | 0110110000000 | 010010100100100 | 0110110110010 | 010010101101100 | 0110111100100 | 010011000001001 |
| 0110101001111 | 010010011000000 | 0110110000001 | 010010100100101 | 0110110110011 | 010010101101101 | 0110111100101 | 010011000001010 |
| 0110101010000 | 010010011000001 | 0110110000010 | 010010100100110 | 0110110110100 | 010010110000001 | 0110111100110 | 010011000001011 |
| 0110101010001 | 010010011000010 | 0110110000011 | 010010100101000 | 0110110110101 | 010010110000010 | 0110111100111 | 010011000001100 |
| 0110101010010 | 010010011000011 | 0110110000100 | 010010100101001 | 0110110110110 | 010010110000011 | 0110111101000 | 010011000001101 |
| 0110101010011 | 010010011000100 | 0110110000101 | 010010100101010 | 0110110110111 | 010010110000100 | 0110111101001 | 010011000010000 |
| 0110101010100 | 010010011000101 | 0110110000110 | 010010100101011 | 0110110111000 | 010010110000101 | 0110111101010 | 010011000010001 |
| 0110101010101 | 010010011000110 | 0110110000111 | 010010100101100 | 0110110111001 | 010010110000110 | 0110111101011 | 010011000010010 |
| 0110101010110 | 010010011001000 | 0110110001000 | 010010100101101 | 0110110111010 | 010010110001000 | 0110111101100 | 010011000010011 |
| 0110101010111 | 010010011001001 | 0110110001001 | 010010100110000 | 0110110111011 | 010010110001001 | 0110111101101 | 010011000010100 |
| 0110101011000 | 010010011001010 | 0110110001010 | 010010100110001 | 0110110111100 | 010010110001010 | 0110111101110 | 010011000010101 |
| 0110101011001 | 010010011001011 | 0110110001011 | 010010100110010 | 0110110111101 | 010010110001011 | 0110111101111 | 010011000010110 |
| 0110101011010 | 010010011001100 | 0110110001100 | 010010100110011 | 0110110111110 | 010010110001100 | 0110111110000 | 010011000011000 |
| 0110101011011 | 010010011001101 | 0110110001101 | 010010100110100 | 0110110111111 | 010010110001101 | 0110111110001 | 010011000011001 |
| 0110101011100 | 010010011010000 | 0110110001110 | 010010100110101 | 0110111000000 | 010010110010000 | 0110111110010 | 010011000011010 |
| 0110101011101 | 010010011010001 | 0110110001111 | 010010100110110 | 0110111000001 | 010010110010001 | 0110111110011 | 010011000100000 |
| 0110101011110 | 010010011010010 | 0110110010000 | 010010101000000 | 0110111000010 | 010010110010010 | 0110111110100 | 010011000100001 |
| 0110101011111 | 010010011010011 | 0110110010001 | 010010101000001 | 0110111000011 | 010010110010011 | 0110111110101 | 010011000100010 |
| 0110101100000 | 010010011010100 | 0110110010010 | 010010101000010 | 0110111000100 | 010010110010100 | 0110111110110 | 010011000100011 |
| 0110101100001 | 010010011010101 | 0110110010011 | 010010101000011 | 0110111000101 | 010010110010101 | 0110111110111 | 010011000100100 |
| 0110101100010 | 010010011010110 | 0110110010100 | 010010101000100 | 0110111000110 | 010010110010110 | 0110111111000 | 010011000100101 |
| 0110101100011 | 010010011011000 | 0110110010101 | 010010101000101 | 0110111000111 | 010010110011000 | 0110111111001 | 010011000100110 |
| 0110101100100 | 010010011011001 | 0110110010110 | 010010101000110 | 0110111001000 | 010010110011001 | 0110111111010 | 010011000101000 |
| 0110101100101 | 010010011011010 | 0110110010111 | 010010101001000 | 0110111001001 | 010010110011010 | 0110111111011 | 010011000101001 |
| 0110101100110 | 010010100000001 | 0110110011000 | 010010101001001 | 0110111001010 | 010010110100000 | 0110111111100 | 010011000101010 |
| 0110101100111 | 010010100000010 | 0110110011001 | 010010101001010 | 0110111001011 | 010010110100001 | 0110111111101 | 010011000101011 |
| 0110101101000 | 010010100000011 | 0110110011010 | 010010101001011 | 0110111001100 | 010010110100010 | 0110111111110 | 010011000101100 |
| 0110101101001 | 010010100000100 | 0110110011011 | 010010101001100 | 0110111001101 | 010010110100011 | 0110111111111 | 010011000101101 |
| 0110101101010 | 010010100000101 | 0110110011100 | 010010101001101 | 0110111001110 | 010010110100100 | 0111000000000 | 010011000110000 |
| 0110101101011 | 010010100000110 | 0110110011101 | 010010101010000 | 0110111001111 | 010010110100101 | 0111000000001 | 010011000110001 |
| 0110101101100 | 010010100001000 | 0110110011110 | 010010101010001 | 0110111010000 | 010010110100110 | 0111000000010 | 010011000110010 |
| 0110101101101 | 010010100001001 | 0110110011111 | 010010101010010 | 0110111010001 | 010010110101000 | 0111000000011 | 010011000110011 |
| 0110101101110 | 010010100001010 | 0110110100000 | 010010101010011 | 0110111010010 | 010010110101001 | 0111000000100 | 010011000110100 |
| 0110101101111 | 010010100001011 | 0110110100001 | 010010101010100 | 0110111010011 | 010010110101010 | 0111000000101 | 010011000110101 |
| 0110101110000 | 010010100001100 | 0110110100010 | 010010101010101 | 0110111010100 | 010010110101011 | 0111000000110 | 010011000110110 |
| 0110101110001 | 010010100001101 | 0110110100011 | 010010101010110 | 0110111010101 | 010010110101100 | 0111000000111 | 010011001000000 |
| 0110101110010 | 010010100010000 | 0110110100100 | 010010101011000 | 0110111010110 | 010010110101101 | 0111000001000 | 010011001000001 |
| 0110101110011 | 010010100010001 | 0110110100101 | 010010101011001 | 0110111010111 | 010010110110000 | 0111000001001 | 010011001000010 |
| 0110101110100 | 010010100010010 | 0110110100110 | 010010101011010 | 0110111011000 | 010010110110001 | 0111000001010 | 010011001000011 |
| 0110101110101 | 010010100010011 | 0110110100111 | 010010101100000 | 0110111011001 | 010010110110010 | 0111000001011 | 010011001000100 |
| 0110101110110 | 010010100010100 | 0110110101000 | 010010101100001 | 0110111011010 | 010010110110011 | 0111000001100 | 010011001000101 |
| 0110101110111 | 010010100010101 | 0110110101001 | 010010101100010 | 0110111011011 | 010010110110100 | 0111000001101 | 010011001000110 |
| 0110101111000 | 010010100010110 | 0110110101010 | 010010101100011 | 0110111011100 | 010010110110101 | 0111000001110 | 010011001001000 |
| 0110101111001 | 010010100011000 | 0110110101011 | 010010101100100 | 0110111011101 | 010010110110110 | 0111000001111 | 010011001001001 |

FIG. 11S

| Source | Codeword | Source | Codeword | Source | Codeword | Source | Codeword |
|---|---|---|---|---|---|---|---|
| 0111000010000 | 010011001001010 | 0111001000010 | 010011010100001 | 0111001110100 | 010100000010010 | 0111010100110 | 010100001011010 |
| 0111000010001 | 010011001001011 | 0111001000011 | 010011010100010 | 0111001110101 | 010100000010011 | 0111010100111 | 010100001100000 |
| 0111000010010 | 010011001001100 | 0111001000100 | 010011010100011 | 0111001110110 | 010100000010100 | 0111010101000 | 010100001100001 |
| 0111000010011 | 010011001001101 | 0111001000101 | 010011010100100 | 0111001110111 | 010100000010101 | 0111010101001 | 010100001100010 |
| 0111000010100 | 010011001010000 | 0111001000110 | 010011010100101 | 0111001111000 | 010100000010110 | 0111010101010 | 010100001100011 |
| 0111000010101 | 010011001010001 | 0111001000111 | 010011010100110 | 0111001111001 | 010100000011000 | 0111010101011 | 010100001100100 |
| 0111000010110 | 010011001010010 | 0111001001000 | 010011010101000 | 0111001111010 | 010100000011001 | 0111010101100 | 010100001100101 |
| 0111000010111 | 010011001010011 | 0111001001001 | 010011010101001 | 0111001111011 | 010100000011010 | 0111010101101 | 010100001100110 |
| 0111000011000 | 010011001010100 | 0111001001010 | 010011010101010 | 0111001111100 | 010100000100000 | 0111010101110 | 010100001101000 |
| 0111000011001 | 010011001010101 | 0111001001011 | 010011010101011 | 0111001111101 | 010100000100001 | 0111010101111 | 010100001101001 |
| 0111000011010 | 010011001010110 | 0111001001100 | 010011010101100 | 0111001111110 | 010100000100010 | 0111010110000 | 010100001101010 |
| 0111000011011 | 010011001011000 | 0111001001101 | 010011010101101 | 0111001111111 | 010100000100011 | 0111010110001 | 010100001101011 |
| 0111000011100 | 010011001011001 | 0111001001110 | 010011010110000 | 0111010000000 | 010100000100100 | 0111010110010 | 010100001101100 |
| 0111000011101 | 010011001011010 | 0111001001111 | 010011010110001 | 0111010000001 | 010100000100101 | 0111010110011 | 010100001101101 |
| 0111000011110 | 010011001100000 | 0111001010000 | 010011010110010 | 0111010000010 | 010100000100110 | 0111010110100 | 010100010000001 |
| 0111000011111 | 010011001100001 | 0111001010001 | 010011010110011 | 0111010000011 | 010100000101000 | 0111010110101 | 010100010000010 |
| 0111000100000 | 010011001100010 | 0111001010010 | 010011010110100 | 0111010000100 | 010100000101001 | 0111010110110 | 010100010000011 |
| 0111000100001 | 010011001100011 | 0111001010011 | 010011010110101 | 0111010000101 | 010100000101010 | 0111010110111 | 010100010000100 |
| 0111000100010 | 010011001100100 | 0111001010100 | 010011010110110 | 0111010000110 | 010100000101011 | 0111010111000 | 010100010000101 |
| 0111000100011 | 010011001100101 | 0111001010101 | 010011011000000 | 0111010000111 | 010100000101100 | 0111010111001 | 010100010000110 |
| 0111000100100 | 010011001100110 | 0111001010110 | 010011011000001 | 0111010001000 | 010100000101101 | 0111010111010 | 010100010001000 |
| 0111000100101 | 010011001101000 | 0111001010111 | 010011011000010 | 0111010001001 | 010100000110000 | 0111010111011 | 010100010001001 |
| 0111000100110 | 010011001101001 | 0111001011000 | 010011011000011 | 0111010001010 | 010100000110001 | 0111010111100 | 010100010001010 |
| 0111000100111 | 010011001101010 | 0111001011001 | 010011011000100 | 0111010001011 | 010100000110010 | 0111010111101 | 010100010001011 |
| 0111000101000 | 010011001101011 | 0111001011010 | 010011011000101 | 0111010001100 | 010100000110011 | 0111010111110 | 010100010001100 |
| 0111000101001 | 010011001101100 | 0111001011011 | 010011011000110 | 0111010001101 | 010100000110100 | 0111010111111 | 010100010001101 |
| 0111000101010 | 010011001101101 | 0111001011100 | 010011011001000 | 0111010001110 | 010100000110101 | 0111011000000 | 010100010010000 |
| 0111000101011 | 010011010000001 | 0111001011101 | 010011011001001 | 0111010001111 | 010100000110110 | 0111011000001 | 010100010010001 |
| 0111000101100 | 010011010000010 | 0111001011110 | 010011011001010 | 0111010010000 | 010100001000000 | 0111011000010 | 010100010010010 |
| 0111000101101 | 010011010000011 | 0111001011111 | 010011011001011 | 0111010010001 | 010100001000001 | 0111011000011 | 010100010010011 |
| 0111000101110 | 010011010000100 | 0111001100000 | 010011011001100 | 0111010010010 | 010100001000010 | 0111011000100 | 010100010010100 |
| 0111000101111 | 010011010000101 | 0111001100001 | 010011011001101 | 0111010010011 | 010100001000011 | 0111011000101 | 010100010010101 |
| 0111000110000 | 010011010000110 | 0111001100010 | 010011011010000 | 0111010010100 | 010100001000100 | 0111011000110 | 010100010010110 |
| 0111000110001 | 010011010001000 | 0111001100011 | 010011011010001 | 0111010010101 | 010100001000101 | 0111011000111 | 010100010011000 |
| 0111000110010 | 010011010001001 | 0111001100100 | 010011011010010 | 0111010010110 | 010100001000110 | 0111011001000 | 010100010011001 |
| 0111000110011 | 010011010001010 | 0111001100101 | 010011011010011 | 0111010010111 | 010100001001000 | 0111011001001 | 010100010011010 |
| 0111000110100 | 010011010001011 | 0111001100110 | 010011011010100 | 0111010011000 | 010100001001001 | 0111011001010 | 010100010100000 |
| 0111000110101 | 010011010001100 | 0111001100111 | 010011011010101 | 0111010011001 | 010100001001010 | 0111011001011 | 010100010100001 |
| 0111000110110 | 010011010001101 | 0111001101000 | 010011011010110 | 0111010011010 | 010100001001011 | 0111011001100 | 010100010100010 |
| 0111000110111 | 010011010010000 | 0111001101001 | 010011011011000 | 0111010011011 | 010100001001100 | 0111011001101 | 010100010100011 |
| 0111000111000 | 010011010010001 | 0111001101010 | 010011011011001 | 0111010011100 | 010100001001101 | 0111011001110 | 010100010100100 |
| 0111000111001 | 010011010010010 | 0111001101011 | 010011011011010 | 0111010011101 | 010100001010000 | 0111011001111 | 010100010100101 |
| 0111000111010 | 010011010010011 | 0111001101100 | 010100000001000 | 0111010011110 | 010100001010001 | 0111011010000 | 010100010100110 |
| 0111000111011 | 010011010010100 | 0111001101101 | 010100000001001 | 0111010011111 | 010100001010010 | 0111011010001 | 010100010101000 |
| 0111000111100 | 010011010010101 | 0111001101110 | 010100000001010 | 0111010100000 | 010100001010011 | 0111011010010 | 010100010101001 |
| 0111000111101 | 010011010010110 | 0111001101111 | 010100000001011 | 0111010100001 | 010100001010100 | 0111011010011 | 010100010101010 |
| 0111000111110 | 010011010011000 | 0111001110000 | 010100000001100 | 0111010100010 | 010100001010101 | 0111011010100 | 010100010101011 |
| 0111000111111 | 010011010011001 | 0111001110001 | 010100000001101 | 0111010100011 | 010100001010110 | 0111011010101 | 010100010101100 |
| 0111001000000 | 010011010011010 | 0111001110010 | 010100000010000 | 0111010100100 | 010100001011000 | 0111011010110 | 010100010101101 |
| 0111001000001 | 010011010100000 | 0111001110011 | 010100000010001 | 0111010100101 | 010100001011001 | 0111011010111 | 010100010110000 |

FIG. 11T

| Source | Codeword | Source | Codeword | Source | Codeword | Source | Codeword |
|---|---|---|---|---|---|---|---|
| 0111011011000 | 010100010110001 | 0111100001010 | 010100100011010 | 0111100111100 | 010100101100110 | 0111101101110 | 010101000000011 |
| 0111011011001 | 010100010110010 | 0111100001011 | 010100100100000 | 0111100111101 | 010100101101000 | 0111101101111 | 010101000000100 |
| 0111011011010 | 010100010110011 | 0111100001100 | 010100100100001 | 0111100111110 | 010100101101001 | 0111101110000 | 010101000000101 |
| 0111011011011 | 010100010110100 | 0111100001101 | 010100100100010 | 0111100111111 | 010100101101010 | 0111101110001 | 010101000000110 |
| 0111011011100 | 010100010110101 | 0111100001110 | 010100100100011 | 0111101000000 | 010100101101011 | 0111101110010 | 010101000001000 |
| 0111011011101 | 010100010110110 | 0111100001111 | 010100100100100 | 0111101000001 | 010100101101100 | 0111101110011 | 010101000001001 |
| 0111011011110 | 010100011000000 | 0111100010000 | 010100100100101 | 0111101000010 | 010100101101101 | 0111101110100 | 010101000001010 |
| 0111011011111 | 010100011000001 | 0111100010001 | 010100100100110 | 0111101000011 | 010100110000001 | 0111101110101 | 010101000001011 |
| 0111011100000 | 010100011000010 | 0111100010010 | 010100100101000 | 0111101000100 | 010100110000010 | 0111101110110 | 010101000001100 |
| 0111011100001 | 010100011000011 | 0111100010011 | 010100100101001 | 0111101000101 | 010100110000011 | 0111101110111 | 010101000001101 |
| 0111011100010 | 010100011000100 | 0111100010100 | 010100100101010 | 0111101000110 | 010100110000100 | 0111101111000 | 010101000010000 |
| 0111011100011 | 010100011000101 | 0111100010101 | 010100100101011 | 0111101000111 | 010100110000101 | 0111101111001 | 010101000010001 |
| 0111011100100 | 010100011000110 | 0111100010110 | 010100100101100 | 0111101001000 | 010100110000110 | 0111101111010 | 010101000010010 |
| 0111011100101 | 010100011001000 | 0111100010111 | 010100100101101 | 0111101001001 | 010100110001000 | 0111101111011 | 010101000010011 |
| 0111011100110 | 010100011001001 | 0111100011000 | 010100100110000 | 0111101001010 | 010100110001001 | 0111101111100 | 010101000010100 |
| 0111011100111 | 010100011001010 | 0111100011001 | 010100100110001 | 0111101001011 | 010100110001010 | 0111101111101 | 010101000010101 |
| 0111011101000 | 010100011001011 | 0111100011010 | 010100100110010 | 0111101001100 | 010100110001011 | 0111101111110 | 010101000010110 |
| 0111011101001 | 010100011001100 | 0111100011011 | 010100100110011 | 0111101001101 | 010100110001100 | 0111101111111 | 010101000011000 |
| 0111011101010 | 010100011001101 | 0111100011100 | 010100100110100 | 0111101001110 | 010100110001101 | 0111110000000 | 010101000011001 |
| 0111011101011 | 010100011010000 | 0111100011101 | 010100100110101 | 0111101001111 | 010100110010000 | 0111110000001 | 010101000011010 |
| 0111011101100 | 010100011010001 | 0111100011110 | 010100100110110 | 0111101010000 | 010100110010001 | 0111110000010 | 010101000100000 |
| 0111011101101 | 010100011010010 | 0111100011111 | 010100101000000 | 0111101010001 | 010100110010010 | 0111110000011 | 010101000100001 |
| 0111011101110 | 010100011010011 | 0111100100000 | 010100101000001 | 0111101010010 | 010100110010011 | 0111110000100 | 010101000100010 |
| 0111011101111 | 010100011010100 | 0111100100001 | 010100101000010 | 0111101010011 | 010100110010100 | 0111110000101 | 010101000100011 |
| 0111011110000 | 010100011010101 | 0111100100010 | 010100101000011 | 0111101010100 | 010100110010101 | 0111110000110 | 010101000100100 |
| 0111011110001 | 010100011010110 | 0111100100011 | 010100101000100 | 0111101010101 | 010100110010110 | 0111110000111 | 010101000100101 |
| 0111011110010 | 010100011011000 | 0111100100100 | 010100101000101 | 0111101010110 | 010100110011000 | 0111110001000 | 010101000100110 |
| 0111011110011 | 010100011011001 | 0111100100101 | 010100101000110 | 0111101010111 | 010100110011001 | 0111110001001 | 010101000101000 |
| 0111011110100 | 010100011011010 | 0111100100110 | 010100101001000 | 0111101011000 | 010100110011010 | 0111110001010 | 010101000101001 |
| 0111011110101 | 010100100000001 | 0111100100111 | 010100101001001 | 0111101011001 | 010100110100000 | 0111110001011 | 010101000101010 |
| 0111011110110 | 010100100000010 | 0111100101000 | 010100101001010 | 0111101011010 | 010100110100001 | 0111110001100 | 010101000101011 |
| 0111011110111 | 010100100000011 | 0111100101001 | 010100101001011 | 0111101011011 | 010100110100010 | 0111110001101 | 010101000101100 |
| 0111011111000 | 010100100000100 | 0111100101010 | 010100101001100 | 0111101011100 | 010100110100011 | 0111110001110 | 010101000101101 |
| 0111011111001 | 010100100000101 | 0111100101011 | 010100101001101 | 0111101011101 | 010100110100100 | 0111110001111 | 010101000110000 |
| 0111011111010 | 010100100000110 | 0111100101100 | 010100101010000 | 0111101011110 | 010100110100101 | 0111110010000 | 010101000110001 |
| 0111011111011 | 010100100001000 | 0111100101101 | 010100101010001 | 0111101011111 | 010100110100110 | 0111110010001 | 010101000110010 |
| 0111011111100 | 010100100001001 | 0111100101110 | 010100101010010 | 0111101100000 | 010100110101000 | 0111110010010 | 010101000110011 |
| 0111011111101 | 010100100001010 | 0111100101111 | 010100101010011 | 0111101100001 | 010100110101001 | 0111110010011 | 010101000110100 |
| 0111011111110 | 010100100001011 | 0111100110000 | 010100101010100 | 0111101100010 | 010100110101010 | 0111110010100 | 010101000110101 |
| 0111011111111 | 010100100001100 | 0111100110001 | 010100101010101 | 0111101100011 | 010100110101011 | 0111110010101 | 010101000110110 |
| 0111100000000 | 010100100001101 | 0111100110010 | 010100101010110 | 0111101100100 | 010100110101100 | 0111110010110 | 010101001000000 |
| 0111100000001 | 010100100010000 | 0111100110011 | 010100101011000 | 0111101100101 | 010100110101101 | 0111110010111 | 010101001000001 |
| 0111100000010 | 010100100010001 | 0111100110100 | 010100101011001 | 0111101100110 | 010100110110000 | 0111110011000 | 010101001000010 |
| 0111100000011 | 010100100010010 | 0111100110101 | 010100101011010 | 0111101100111 | 010100110110001 | 0111110011001 | 010101001000011 |
| 0111100000100 | 010100100010011 | 0111100110110 | 010100101100000 | 0111101101000 | 010100110110010 | 0111110011010 | 010101001000100 |
| 0111100000101 | 010100100010100 | 0111100110111 | 010100101100001 | 0111101101001 | 010100110110011 | 0111110011011 | 010101001000101 |
| 0111100000110 | 010100100010101 | 0111100111000 | 010100101100010 | 0111101101010 | 010100110110100 | 0111110011100 | 010101001000110 |
| 0111100000111 | 010100100010110 | 0111100111001 | 010100101100011 | 0111101101011 | 010100110110101 | 0111110011101 | 010101001001000 |
| 0111100001000 | 010100100011000 | 0111100111010 | 010100101100100 | 0111101101100 | 010100110110110 | 0111110011110 | 010101001001001 |
| 0111100001001 | 010100100011001 | 0111100111011 | 010100101100101 | 0111101101101 | 010101000000010 | 0111110011111 | 010101001001010 |

FIG. 11U

| Source | Codeword | Source | Codeword | Source | Codeword | Source | Codeword |
|---|---|---|---|---|---|---|---|
| 0111110100000 | 010101001001011 | 0111111010010 | 010101010100010 | 1000000000100 | 010101100001011 | 1000000110110 | 010101101010100 |
| 0111110100001 | 010101001001100 | 0111111010011 | 010101010100011 | 1000000000101 | 010101100001100 | 1000000110111 | 010101101010101 |
| 0111110100010 | 010101001001101 | 0111111010100 | 010101010100100 | 1000000000110 | 010101100001101 | 1000000111000 | 010101101010110 |
| 0111110100011 | 010101001010000 | 0111111010101 | 010101010100101 | 1000000000111 | 010101100010000 | 1000000111001 | 010101101011000 |
| 0111110100100 | 010101001010001 | 0111111010110 | 010101010100110 | 1000000001000 | 010101100010001 | 1000000111010 | 010101101011001 |
| 0111110100101 | 010101001010010 | 0111111010111 | 010101010101000 | 1000000001001 | 010101100010010 | 1000000111011 | 010101101011010 |
| 0111110100110 | 010101001010011 | 0111111011000 | 010101010101001 | 1000000001010 | 010101100010011 | 1000000111100 | 010101101100000 |
| 0111110100111 | 010101001010100 | 0111111011001 | 010101010101010 | 1000000001011 | 010101100010100 | 1000000111101 | 010101101100001 |
| 0111110101000 | 010101001010101 | 0111111011010 | 010101010101011 | 1000000001100 | 010101100010101 | 1000000111110 | 010101101100010 |
| 0111110101001 | 010101001010110 | 0111111011011 | 010101010101100 | 1000000001101 | 010101100010110 | 1000000111111 | 010101101100011 |
| 0111110101010 | 010101001011000 | 0111111011100 | 010101010101101 | 1000000001110 | 010101100011000 | 1000001000000 | 010101101100100 |
| 0111110101011 | 010101001011001 | 0111111011101 | 010101010110000 | 1000000001111 | 010101100011001 | 1000001000001 | 010101101100101 |
| 0111110101100 | 010101001011010 | 0111111011110 | 010101010110001 | 1000000010000 | 010101100011010 | 1000001000010 | 010101101100110 |
| 0111110101101 | 010101001100000 | 0111111011111 | 010101010110010 | 1000000010001 | 010101100100000 | 1000001000011 | 010101101101000 |
| 0111110101110 | 010101001100001 | 0111111100000 | 010101010110011 | 1000000010010 | 010101100100001 | 1000001000100 | 010101101101001 |
| 0111110101111 | 010101001100010 | 0111111100001 | 010101010110100 | 1000000010011 | 010101100100010 | 1000001000101 | 010101101101010 |
| 0111110110000 | 010101001100011 | 0111111100010 | 010101010110101 | 1000000010100 | 010101100100011 | 1000001000110 | 010101101101011 |
| 0111110110001 | 010101001100100 | 0111111100011 | 010101010110110 | 1000000010101 | 010101100100100 | 1000001000111 | 010101101101100 |
| 0111110110010 | 010101001100101 | 0111111100100 | 010101011000000 | 1000000010110 | 010101100100101 | 1000001001000 | 010101101101101 |
| 0111110110011 | 010101001100110 | 0111111100101 | 010101011000001 | 1000000010111 | 010101100100110 | 1000001001001 | 010110000000100 |
| 0111110110100 | 010101001101000 | 0111111100110 | 010101011000010 | 1000000011000 | 010101100101000 | 1000001001010 | 010110000000101 |
| 0111110110101 | 010101001101001 | 0111111100111 | 010101011000011 | 1000000011001 | 010101100101001 | 1000001001011 | 010110000000110 |
| 0111110110110 | 010101001101010 | 0111111101000 | 010101011000100 | 1000000011010 | 010101100101010 | 1000001001100 | 010110000001000 |
| 0111110110111 | 010101001101011 | 0111111101001 | 010101011000101 | 1000000011011 | 010101100101011 | 1000001001101 | 010110000001001 |
| 0111110111000 | 010101001101100 | 0111111101010 | 010101011000110 | 1000000011100 | 010101100101100 | 1000001001110 | 010110000001010 |
| 0111110111001 | 010101001101101 | 0111111101011 | 010101011001000 | 1000000011101 | 010101100101101 | 1000001001111 | 010110000001011 |
| 0111110111010 | 010101010000001 | 0111111101100 | 010101011001001 | 1000000011110 | 010101100110000 | 1000001010000 | 010110000001100 |
| 0111110111011 | 010101010000010 | 0111111101101 | 010101011001010 | 1000000011111 | 010101100110001 | 1000001010001 | 010110000001101 |
| 0111110111100 | 010101010000011 | 0111111101110 | 010101011001011 | 1000000100000 | 010101100110010 | 1000001010010 | 010110000010000 |
| 0111110111101 | 010101010000100 | 0111111101111 | 010101011001100 | 1000000100001 | 010101100110011 | 1000001010011 | 010110000010001 |
| 0111110111110 | 010101010000101 | 0111111110000 | 010101011001101 | 1000000100010 | 010101100110100 | 1000001010100 | 010110000010010 |
| 0111110111111 | 010101010000110 | 0111111110001 | 010101011010000 | 1000000100011 | 010101100110101 | 1000001010101 | 010110000010011 |
| 0111111000000 | 010101010001000 | 0111111110010 | 010101011010001 | 1000000100100 | 010101100110110 | 1000001010110 | 010110000010100 |
| 0111111000001 | 010101010001001 | 0111111110011 | 010101011010010 | 1000000100101 | 010101101000000 | 1000001010111 | 010110000010101 |
| 0111111000010 | 010101010001010 | 0111111110100 | 010101011010011 | 1000000100110 | 010101101000001 | 1000001011000 | 010110000010110 |
| 0111111000011 | 010101010001011 | 0111111110101 | 010101011010100 | 1000000100111 | 010101101000010 | 1000001011001 | 010110000011000 |
| 0111111000100 | 010101010001100 | 0111111110110 | 010101011010101 | 1000000101000 | 010101101000011 | 1000001011010 | 010110000011001 |
| 0111111000101 | 010101010001101 | 0111111110111 | 010101011010110 | 1000000101001 | 010101101000100 | 1000001011011 | 010110000011010 |
| 0111111000110 | 010101010010000 | 0111111111000 | 010101011011000 | 1000000101010 | 010101101000101 | 1000001011100 | 010110000100000 |
| 0111111000111 | 010101010010001 | 0111111111001 | 010101011011001 | 1000000101011 | 010101101000110 | 1000001011101 | 010110000100001 |
| 0111111001000 | 010101010010010 | 0111111111010 | 010101011011010 | 1000000101100 | 010101101001000 | 1000001011110 | 010110000100010 |
| 0111111001001 | 010101010010011 | 0111111111011 | 010101100000001 | 1000000101101 | 010101101001001 | 1000001011111 | 010110000100011 |
| 0111111001010 | 010101010010100 | 0111111111100 | 010101100000010 | 1000000101110 | 010101101001010 | 1000001100000 | 010110000100100 |
| 0111111001011 | 010101010010101 | 0111111111101 | 010101100000011 | 1000000101111 | 010101101001011 | 1000001100001 | 010110000100101 |
| 0111111001100 | 010101010010110 | 0111111111110 | 010101100000100 | 1000000110000 | 010101101001100 | 1000001100010 | 010110000100110 |
| 0111111001101 | 010101010011000 | 0111111111111 | 010101100000101 | 1000000110001 | 010101101001101 | 1000001100011 | 010110000101000 |
| 0111111001110 | 010101010011001 | 1000000000000 | 010101100000110 | 1000000110010 | 010101101010000 | 1000001100100 | 010110000101001 |
| 0111111001111 | 010101010011010 | 1000000000001 | 010101100001000 | 1000000110011 | 010101101010001 | 1000001100101 | 010110000101010 |
| 0111111010000 | 010101010100000 | 1000000000010 | 010101100001001 | 1000000110100 | 010101101010010 | 1000001100110 | 010110000101011 |
| 0111111010001 | 010101010100001 | 1000000000011 | 010101100001010 | 1000000110101 | 010101101010011 | 1000001100111 | 010110000101100 |

FIG. 11V

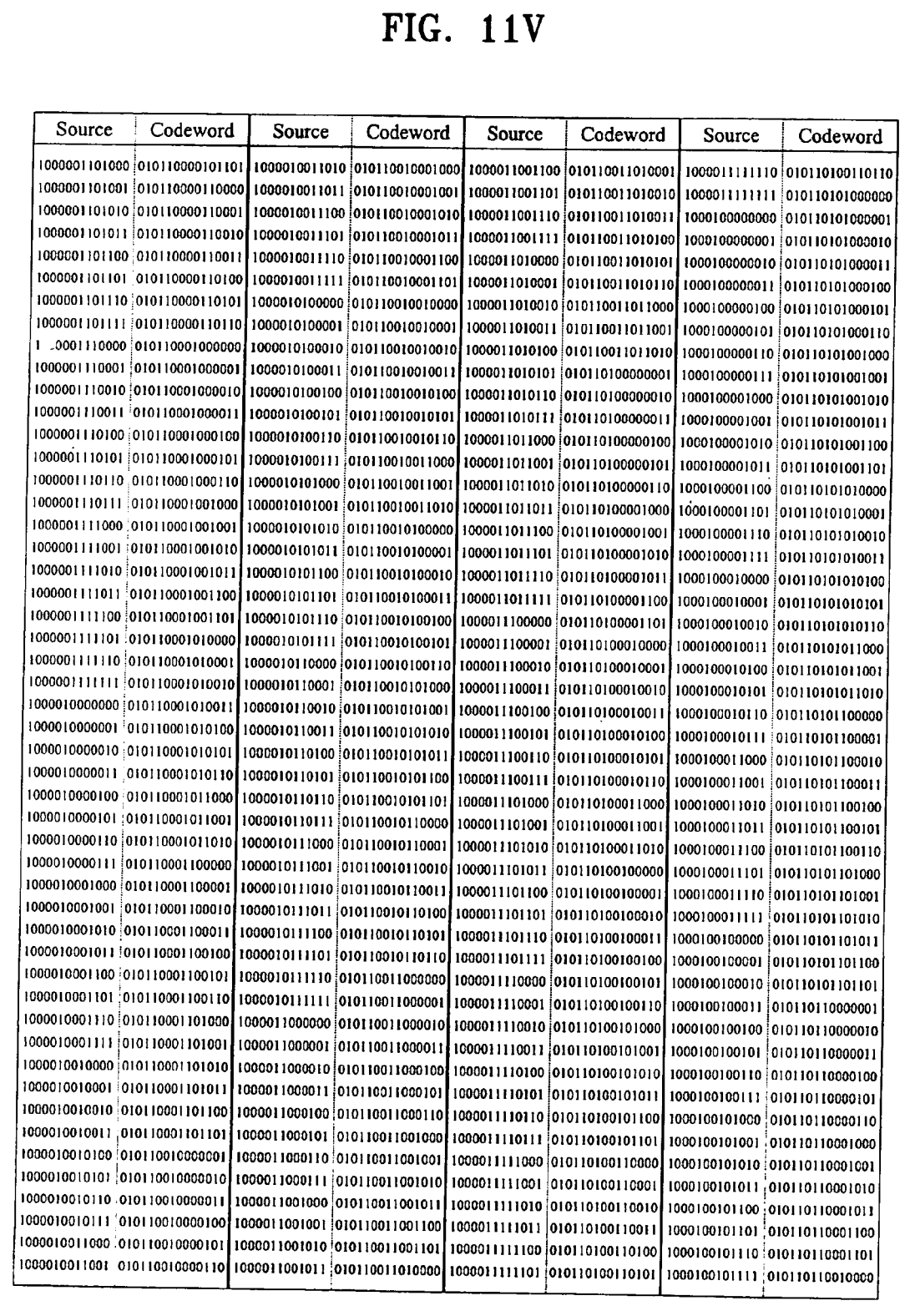

| Source | Codeword | Source | Codeword | Source | Codeword | Source | Codeword |
|---|---|---|---|---|---|---|---|
| 1000001101000 | 010110000101101 | 1000010011010 | 010110010001000 | 1000011001100 | 010110011010001 | 1000011111110 | 010110100110110 |
| 1000001101001 | 010110000110000 | 1000010011011 | 010110010001001 | 1000011001101 | 010110011010010 | 1000011111111 | 010110101000000 |
| 1000001101010 | 010110000110001 | 1000010011100 | 010110010001010 | 1000011001110 | 010110011010011 | 1000100000000 | 010110101000001 |
| 1000001101011 | 010110000110010 | 1000010011101 | 010110010001011 | 1000011001111 | 010110011010100 | 1000100000001 | 010110101000010 |
| 1000001101100 | 010110000110011 | 1000010011110 | 010110010001100 | 1000011010000 | 010110011010101 | 1000100000010 | 010110101000011 |
| 1000001101101 | 010110000110100 | 1000010011111 | 010110010001101 | 1000011010001 | 010110011010110 | 1000100000011 | 010110101000100 |
| 1000001101110 | 010110000110101 | 1000010100000 | 010110010010000 | 1000011010010 | 010110011011000 | 1000100000100 | 010110101000101 |
| 1000001101111 | 010110000110110 | 1000010100001 | 010110010010001 | 1000011010011 | 010110011011001 | 1000100000101 | 010110101000110 |
| 1000001110000 | 010110001000000 | 1000010100010 | 010110010010010 | 1000011010100 | 010110011011010 | 1000100000110 | 010110101001000 |
| 1000001110001 | 010110001000001 | 1000010100011 | 010110010010011 | 1000011010101 | 010110100000001 | 1000100000111 | 010110101001001 |
| 1000001110010 | 010110001000010 | 1000010100100 | 010110010010100 | 1000011010110 | 010110100000010 | 1000100001000 | 010110101001010 |
| 1000001110011 | 010110001000011 | 1000010100101 | 010110010010101 | 1000011010111 | 010110100000011 | 1000100001001 | 010110101001011 |
| 1000001110100 | 010110001000100 | 1000010100110 | 010110010010110 | 1000011011000 | 010110100000100 | 1000100001010 | 010110101001100 |
| 1000001110101 | 010110001000101 | 1000010100111 | 010110010011000 | 1000011011001 | 010110100000101 | 1000100001011 | 010110101001101 |
| 1000001110110 | 010110001000110 | 1000010101000 | 010110010011001 | 1000011011010 | 010110100000110 | 1000100001100 | 010110101010000 |
| 1000001110111 | 010110001001000 | 1000010101001 | 010110010011010 | 1000011011011 | 010110100001000 | 1000100001101 | 010110101010001 |
| 1000001111000 | 010110001001001 | 1000010101010 | 010110010100000 | 1000011011100 | 010110100001001 | 1000100001110 | 010110101010010 |
| 1000001111001 | 010110001001010 | 1000010101011 | 010110010100001 | 1000011011101 | 010110100001010 | 1000100001111 | 010110101010011 |
| 1000001111010 | 010110001001011 | 1000010101100 | 010110010100010 | 1000011011110 | 010110100001011 | 1000100010000 | 010110101010100 |
| 1000001111011 | 010110001001100 | 1000010101101 | 010110010100011 | 1000011011111 | 010110100001100 | 1000100010001 | 010110101010101 |
| 1000001111100 | 010110001001101 | 1000010101110 | 010110010100100 | 1000011100000 | 010110100001101 | 1000100010010 | 010110101010110 |
| 1000001111101 | 010110001010000 | 1000010101111 | 010110010100101 | 1000011100001 | 010110100010000 | 1000100010011 | 010110101011000 |
| 1000001111110 | 010110001010001 | 1000010110000 | 010110010100110 | 1000011100010 | 010110100010001 | 1000100010100 | 010110101011001 |
| 1000001111111 | 010110001010010 | 1000010110001 | 010110010101000 | 1000011100011 | 010110100010010 | 1000100010101 | 010110101011010 |
| 1000010000000 | 010110001010011 | 1000010110010 | 010110010101001 | 1000011100100 | 010110100010011 | 1000100010110 | 010110101100000 |
| 1000010000001 | 010110001010100 | 1000010110011 | 010110010101010 | 1000011100101 | 010110100010100 | 1000100010111 | 010110101100001 |
| 1000010000010 | 010110001010101 | 1000010110100 | 010110010101011 | 1000011100110 | 010110100010101 | 1000100011000 | 010110101100010 |
| 1000010000011 | 010110001010110 | 1000010110101 | 010110010101100 | 1000011100111 | 010110100010110 | 1000100011001 | 010110101100011 |
| 1000010000100 | 010110001011000 | 1000010110110 | 010110010101101 | 1000011101000 | 010110100011000 | 1000100011010 | 010110101100100 |
| 1000010000101 | 010110001011001 | 1000010110111 | 010110010110000 | 1000011101001 | 010110100011001 | 1000100011011 | 010110101100101 |
| 1000010000110 | 010110001011010 | 1000010111000 | 010110010110001 | 1000011101010 | 010110100011010 | 1000100011100 | 010110101100110 |
| 1000010000111 | 010110001100000 | 1000010111001 | 010110010110010 | 1000011101011 | 010110100100000 | 1000100011101 | 010110101101000 |
| 1000010001000 | 010110001100001 | 1000010111010 | 010110010110011 | 1000011101100 | 010110100100001 | 1000100011110 | 010110101101001 |
| 1000010001001 | 010110001100010 | 1000010111011 | 010110010110100 | 1000011101101 | 010110100100010 | 1000100011111 | 010110101101010 |
| 1000010001010 | 010110001100011 | 1000010111100 | 010110010110101 | 1000011101110 | 010110100100011 | 1000100100000 | 010110101101011 |
| 1000010001011 | 010110001100100 | 1000010111101 | 010110010110110 | 1000011101111 | 010110100100100 | 1000100100001 | 010110101101100 |
| 1000010001100 | 010110001100101 | 1000010111110 | 010110011000000 | 1000011110000 | 010110100100101 | 1000100100010 | 010110101101101 |
| 1000010001101 | 010110001100110 | 1000010111111 | 010110011000001 | 1000011110001 | 010110100100110 | 1000100100011 | 010110110000001 |
| 1000010001110 | 010110001101000 | 1000011000000 | 010110011000010 | 1000011110010 | 010110100101000 | 1000100100100 | 010110110000010 |
| 1000010001111 | 010110001101001 | 1000011000001 | 010110011000011 | 1000011110011 | 010110100101001 | 1000100100101 | 010110110000011 |
| 1000010010000 | 010110001101010 | 1000011000010 | 010110011000100 | 1000011110100 | 010110100101010 | 1000100100110 | 010110110000100 |
| 1000010010001 | 010110001101011 | 1000011000011 | 010110011000101 | 1000011110101 | 010110100101011 | 1000100100111 | 010110110000101 |
| 1000010010010 | 010110001101100 | 1000011000100 | 010110011000110 | 1000011110110 | 010110100101100 | 1000100101000 | 010110110000110 |
| 1000010010011 | 010110001101101 | 1000011000101 | 010110011001000 | 1000011110111 | 010110100101101 | 1000100101001 | 010110110001000 |
| 1000010010100 | 010110010000001 | 1000011000110 | 010110011001001 | 1000011111000 | 010110100110000 | 1000100101010 | 010110110001001 |
| 1000010010101 | 010110010000010 | 1000011000111 | 010110011001010 | 1000011111001 | 010110100110001 | 1000100101011 | 010110110001010 |
| 1000010010110 | 010110010000011 | 1000011001000 | 010110011001011 | 1000011111010 | 010110100110010 | 1000100101100 | 010110110001011 |
| 1000010010111 | 010110010000100 | 1000011001001 | 010110011001100 | 1000011111011 | 010110100110011 | 1000100101101 | 010110110001100 |
| 1000010011000 | 010110010000101 | 1000011001010 | 010110011001101 | 1000011111100 | 010110100110100 | 1000100101110 | 010110110001101 |
| 1000010011001 | 010110010000110 | 1000011001011 | 010110011010000 | 1000011111101 | 010110100110101 | 1000100101111 | 010110110010000 |

FIG. 11W

| Source | Codeword | Source | Codeword | Source | Codeword | Source | Codeword |
|---|---|---|---|---|---|---|---|
| 1000100110000 | 010110110010001 | 1000101100010 | 011000000101100 | 1000110010100 | 011000010000110 | 1000111000110 | 011000011010000 |
| 1000100110001 | 010110110010010 | 1000101100011 | 011000000101101 | 1000110010101 | 011000010001000 | 1000111000111 | 011000011010001 |
| 1000100110010 | 010110110010011 | 1000101100100 | 011000000110000 | 1000110010110 | 011000010001001 | 1000111001000 | 011000011010010 |
| 1000100110011 | 010110110010100 | 1000101100101 | 011000000110001 | 1000110010111 | 011000010001010 | 1000111001001 | 011000011010011 |
| 1000100110100 | 010110110010101 | 1000101100110 | 011000000110010 | 1000110011000 | 011000010001011 | 1000111001010 | 011000011010100 |
| 1000100110101 | 010110110010110 | 1000101100111 | 011000000110011 | 1000110011001 | 011000010001100 | 1000111001011 | 011000011010101 |
| 1000100110110 | 010110110011000 | 1000101101000 | 011000000110100 | 1000110011010 | 011000010001101 | 1000111001100 | 011000011010110 |
| 1000100110111 | 010110110011001 | 1000101101001 | 011000000110101 | 1000110011011 | 011000010010000 | 1000111001101 | 011000011011000 |
| 1000100111000 | 010110110011010 | 1000101101010 | 011000000110110 | 1000110011100 | 011000010010001 | 1000111001110 | 011000011011001 |
| 1000100111001 | 010110110100000 | 1000101101011 | 011000001000000 | 1000110011101 | 011000010010010 | 1000111001111 | 011000011011010 |
| 1000100111010 | 010110110100001 | 1000101101100 | 011000001000001 | 1000110011110 | 011000010010011 | 1000111010000 | 011000100000001 |
| 1000100111011 | 010110110100010 | 1000101101101 | 011000001000010 | 1000110011111 | 011000010010100 | 1000111010001 | 011000100000010 |
| 1000100111100 | 010110110100011 | 1000101101110 | 011000001000011 | 1000110100000 | 011000010010101 | 1000111010010 | 011000100000011 |
| 1000100111101 | 010110110100100 | 1000101101111 | 011000001000100 | 1000110100001 | 011000010010110 | 1000111010011 | 011000100000100 |
| 1000100111110 | 010110110100101 | 1000101110000 | 011000001000101 | 1000110100010 | 011000010011000 | 1000111010100 | 011000100000101 |
| 1000100111111 | 010110110100110 | 1000101110001 | 011000001000110 | 1000110100011 | 011000010011001 | 1000111010101 | 011000100000110 |
| 1000101000000 | 010110110101000 | 1000101110010 | 011000001001000 | 1000110100100 | 011000010011010 | 1000111010110 | 011000100001000 |
| 1000101000001 | 010110110101001 | 1000101110011 | 011000001001001 | 1000110100101 | 011000010100000 | 1000111010111 | 011000100001001 |
| 1000101000010 | 010110110101010 | 1000101110100 | 011000001001010 | 1000110100110 | 011000010100001 | 1000111011000 | 011000100001010 |
| 1000101000011 | 010110110101011 | 1000101110101 | 011000001001011 | 1000110100111 | 011000010100010 | 1000111011001 | 011000100001011 |
| 1000101000100 | 010110110101100 | 1000101110110 | 011000001001100 | 1000110101000 | 011000010100011 | 1000111011010 | 011000100001100 |
| 1000101000101 | 010110110101101 | 1000101110111 | 011000001001101 | 1000110101001 | 011000010100100 | 1000111011011 | 011000100001101 |
| 1000101000110 | 010110110110000 | 1000101111000 | 011000001010000 | 1000110101010 | 011000010100101 | 1000111011100 | 011000100010000 |
| 1000101000111 | 010110110110001 | 1000101111001 | 011000001010001 | 1000110101011 | 011000010100110 | 1000111011101 | 011000100010001 |
| 1000101001000 | 010110110110010 | 1000101111010 | 011000001010010 | 1000110101100 | 011000010101000 | 1000111011110 | 011000100010010 |
| 1000101001001 | 010110110110011 | 1000101111011 | 011000001010011 | 1000110101101 | 011000010101001 | 1000111011111 | 011000100010011 |
| 1000101001010 | 010110110110100 | 1000101111100 | 011000001010100 | 1000110101110 | 011000010101010 | 1000111100000 | 011000100010100 |
| 1000101001011 | 010110110110101 | 1000101111101 | 011000001010101 | 1000110101111 | 011000010101011 | 1000111100001 | 011000100010101 |
| 1000101001100 | 010110110110110 | 1000101111110 | 011000001010110 | 1000110110000 | 011000010101100 | 1000111100010 | 011000100010110 |
| 1000101001101 | 011000000010000 | 1000101111111 | 011000001011000 | 1000110110001 | 011000010101101 | 1000111100011 | 011000100011000 |
| 1000101001110 | 011000000010001 | 1000110000000 | 011000001011001 | 1000110110010 | 011000010110000 | 1000111100100 | 011000100011001 |
| 1000101001111 | 011000000010010 | 1000110000001 | 011000001011010 | 1000110110011 | 011000010110001 | 1000111100101 | 011000100011010 |
| 1000101010000 | 011000000010011 | 1000110000010 | 011000001100000 | 1000110110100 | 011000010110010 | 1000111100110 | 011000100100000 |
| 1000101010001 | 011000000010100 | 1000110000011 | 011000001100001 | 1000110110101 | 011000010110011 | 1000111100111 | 011000100100001 |
| 1000101010010 | 011000000010101 | 1000110000100 | 011000001100010 | 1000110110110 | 011000010110100 | 1000111101000 | 011000100100010 |
| 1000101010011 | 011000000010110 | 1000110000101 | 011000001100011 | 1000110110111 | 011000010110101 | 1000111101001 | 011000100100011 |
| 1000101010100 | 011000000011000 | 1000110000110 | 011000001100100 | 1000110111000 | 011000010110110 | 1000111101010 | 011000100100100 |
| 1000101010101 | 011000000011001 | 1000110000111 | 011000001100101 | 1000110111001 | 011000011000000 | 1000111101011 | 011000100100101 |
| 1000101010110 | 011000000011010 | 1000110001000 | 011000001100110 | 1000110111010 | 011000011000001 | 1000111101100 | 011000100100110 |
| 1000101010111 | 011000000100000 | 1000110001001 | 011000001101000 | 1000110111011 | 011000011000010 | 1000111101101 | 011000100101000 |
| 1000101011000 | 011000000100001 | 1000110001010 | 011000001101001 | 1000110111100 | 011000011000011 | 1000111101110 | 011000100101001 |
| 1000101011001 | 011000000100010 | 1000110001011 | 011000001101010 | 1000110111101 | 011000011000100 | 1000111101111 | 011000100101010 |
| 1000101011010 | 011000000100011 | 1000110001100 | 011000001101011 | 1000110111110 | 011000011000101 | 1000111110000 | 011000100101011 |
| 1000101011011 | 011000000100100 | 1000110001101 | 011000001101100 | 1000110111111 | 011000011000110 | 1000111110001 | 011000100101100 |
| 1000101011100 | 011000000100101 | 1000110001110 | 011000001101101 | 1000111000000 | 011000011001000 | 1000111110010 | 011000100101101 |
| 1000101011101 | 011000000100110 | 1000110001111 | 011000010000001 | 1000111000001 | 011000011001001 | 1000111110011 | 011000100110000 |
| 1000101011110 | 011000000101000 | 1000110010000 | 011000010000010 | 1000111000010 | 011000011001010 | 1000111110100 | 011000100110001 |
| 1000101011111 | 011000000101001 | 1000110010001 | 011000010000011 | 1000111000011 | 011000011001011 | 1000111110101 | 011000100110010 |
| 1000101100000 | 011000000101010 | 1000110010010 | 011000010000100 | 1000111000100 | 011000011001100 | 1000111110110 | 011000100110011 |
| 1000101100001 | 011000000101011 | 1000110010011 | 011000010000101 | 1000111000101 | 011000011001101 | 1000111110111 | 011000100110100 |

FIG. 11X

| Source | Codeword | Source | Codeword | Source | Codeword | Source | Codeword |
|---|---|---|---|---|---|---|---|
| 1000111111000 | 011000100110101 | 1001000101010 | 011000110010000 | 1001001011100 | 011001000011010 | 1001010001110 | 011001001100110 |
| 1000111111001 | 011000100110110 | 1001000101011 | 011000110010001 | 1001001011101 | 011001000100000 | 1001010001111 | 011001001101000 |
| 1000111111010 | 011000101000000 | 1001000101100 | 011000110010010 | 1001001011110 | 011001000100001 | 1001010010000 | 011001001101001 |
| 1000111111011 | 011000101000001 | 1001000101101 | 011000110010011 | 1001001011111 | 011001000100010 | 1001010010001 | 011001001101010 |
| 1000111111100 | 011000101000010 | 1001000101110 | 011000110010100 | 1001001100000 | 011001000100011 | 1001010010010 | 011001001101011 |
| 1000111111101 | 011000101000011 | 1001000101111 | 011000110010101 | 1001001100001 | 011001000100100 | 1001010010011 | 011001001101100 |
| 1000111111110 | 011000101000100 | 1001000110000 | 011000110010110 | 1001001100010 | 011001000100101 | 1001010010100 | 011001001101101 |
| 1000111111111 | 011000101000101 | 1001000110001 | 011000110011000 | 1001001100011 | 011001000100110 | 1001010010101 | 011001010000001 |
| 1001000000000 | 011000101000110 | 1001000110010 | 011000110011001 | 1001001100100 | 011001000101000 | 1001010010110 | 011001010000010 |
| 1001000000001 | 011000101001000 | 1001000110011 | 011000110011010 | 1001001100101 | 011001000101001 | 1001010010111 | 011001010000011 |
| 1001000000010 | 011000101001001 | 1001000110100 | 011000110100000 | 1001001100110 | 011001000101010 | 1001010011000 | 011001010000100 |
| 1001000000011 | 011000101001010 | 1001000110101 | 011000110100001 | 1001001100111 | 011001000101011 | 1001010011001 | 011001010000101 |
| 1001000000100 | 011000101001011 | 1001000110110 | 011000110100010 | 1001001101000 | 011001000101100 | 1001010011010 | 011001010000110 |
| 1001000000101 | 011000101001100 | 1001000110111 | 011000110100011 | 1001001101001 | 011001000101101 | 1001010011011 | 011001010001000 |
| 1001000000110 | 011000101001101 | 1001000111000 | 011000110100100 | 1001001101010 | 011001000110000 | 1001010011100 | 011001010001001 |
| 1001000000111 | 011000101010000 | 1001000111001 | 011000110100101 | 1001001101011 | 011001000110001 | 1001010011101 | 011001010001010 |
| 1001000001000 | 011000101010001 | 1001000111010 | 011000110100110 | 1001001101100 | 011001000110010 | 1001010011110 | 011001010001011 |
| 1001000001001 | 011000101010010 | 1001000111011 | 011000110101000 | 1001001101101 | 011001000110011 | 1001010011111 | 011001010001100 |
| 1001000001010 | 011000101010011 | 1001000111100 | 011000110101001 | 1001001101110 | 011001000110100 | 1001010100000 | 011001010001101 |
| 1001000001011 | 011000101010100 | 1001000111101 | 011000110101010 | 1001001101111 | 011001000110101 | 1001010100001 | 011001010010000 |
| 1001000001100 | 011000101010101 | 1001000111110 | 011000110101011 | 1001001110000 | 011001000110110 | 1001010100010 | 011001010010001 |
| 1001000001101 | 011000101010110 | 1001000111111 | 011000110101100 | 1001001110001 | 011001001000000 | 1001010100011 | 011001010010010 |
| 1001000001110 | 011000101011000 | 1001001000000 | 011000110101101 | 1001001110010 | 011001001000001 | 1001010100100 | 011001010010011 |
| 1001000001111 | 011000101011001 | 1001001000001 | 011000110110000 | 1001001110011 | 011001001000010 | 1001010100101 | 011001010010100 |
| 1001000010000 | 011000101011010 | 1001001000010 | 011000110110001 | 1001001110100 | 011001001000011 | 1001010100110 | 011001010010101 |
| 1001000010001 | 011000101100000 | 1001001000011 | 011000110110010 | 1001001110101 | 011001001000100 | 1001010100111 | 011001010010110 |
| 1001000010010 | 011000101100001 | 1001001000100 | 011000110110011 | 1001001110110 | 011001001000101 | 1001010101000 | 011001010011000 |
| 1001000010011 | 011000101100010 | 1001001000101 | 011000110110100 | 1001001110111 | 011001001000110 | 1001010101001 | 011001010011001 |
| 1001000010100 | 011000101100011 | 1001001000110 | 011000110110101 | 1001001111000 | 011001001001000 | 1001010101010 | 011001010011010 |
| 1001000010101 | 011000101100100 | 1001001000111 | 011000110110110 | 1001001111001 | 011001001001001 | 1001010101011 | 011001010100000 |
| 1001000010110 | 011000101100101 | 1001001001000 | 011001000000010 | 1001001111010 | 011001001001010 | 1001010101100 | 011001010100001 |
| 1001000010111 | 011000101100110 | 1001001001001 | 011001000000011 | 1001001111011 | 011001001001011 | 1001010101101 | 011001010100010 |
| 1001000011000 | 011000101101000 | 1001001001010 | 011001000000100 | 1001001111100 | 011001001001100 | 1001010101110 | 011001010100011 |
| 1001000011001 | 011000101101001 | 1001001001011 | 011001000000101 | 1001001111101 | 011001001001101 | 1001010101111 | 011001010100100 |
| 1001000011010 | 011000101101010 | 1001001001100 | 011001000000110 | 1001001111110 | 011001001010000 | 1001010110000 | 011001010100101 |
| 1001000011011 | 011000101101011 | 1001001001101 | 011001000001000 | 1001001111111 | 011001001010001 | 1001010110001 | 011001010100110 |
| 1001000011100 | 011000101101100 | 1001001001110 | 011001000001001 | 1001010000000 | 011001001010010 | 1001010110010 | 011001010101000 |
| 1001000011101 | 011000101101101 | 1001001001111 | 011001000001010 | 1001010000001 | 011001001010011 | 1001010110011 | 011001010101001 |
| 1001000011110 | 011000110000001 | 1001001010000 | 011001000001011 | 1001010000010 | 011001001010100 | 1001010110100 | 011001010101010 |
| 1001000011111 | 011000110000010 | 1001001010001 | 011001000001100 | 1001010000011 | 011001001010101 | 1001010110101 | 011001010101011 |
| 1001000100000 | 011000110000011 | 1001001010010 | 011001000001101 | 1001010000100 | 011001001010110 | 1001010110110 | 011001010101100 |
| 1001000100001 | 011000110000100 | 1001001010011 | 011001000010000 | 1001010000101 | 011001001011000 | 1001010110111 | 011001010101101 |
| 1001000100010 | 011000110000101 | 1001001010100 | 011001000010001 | 1001010000110 | 011001001011001 | 1001010111000 | 011001010110000 |
| 1001000100011 | 011000110000110 | 1001001010101 | 011001000010010 | 1001010000111 | 011001001011010 | 1001010111001 | 011001010110001 |
| 1001000100100 | 011000110001000 | 1001001010110 | 011001000010011 | 1001010001000 | 011001001100000 | 1001010111010 | 011001010110010 |
| 1001000100101 | 011000110001001 | 1001001010111 | 011001000010100 | 1001010001001 | 011001001100001 | 1001010111011 | 011001010110011 |
| 1001000100110 | 011000110001010 | 1001001011000 | 011001000010101 | 1001010001010 | 011001001100010 | 1001010111100 | 011001010110100 |
| 1001000100111 | 011000110001011 | 1001001011001 | 011001000010110 | 1001010001011 | 011001001100011 | 1001010111101 | 011001010110101 |
| 1001000101000 | 011000110001100 | 1001001011010 | 011001000011000 | 1001010001100 | 011001001100100 | 1001010111110 | 011001010110110 |
| 1001000101001 | 011000110001101 | 1001001011011 | 011001000011001 | 1001010001101 | 011001001100101 | 1001010111111 | 011001011000000 |

FIG. 11Y

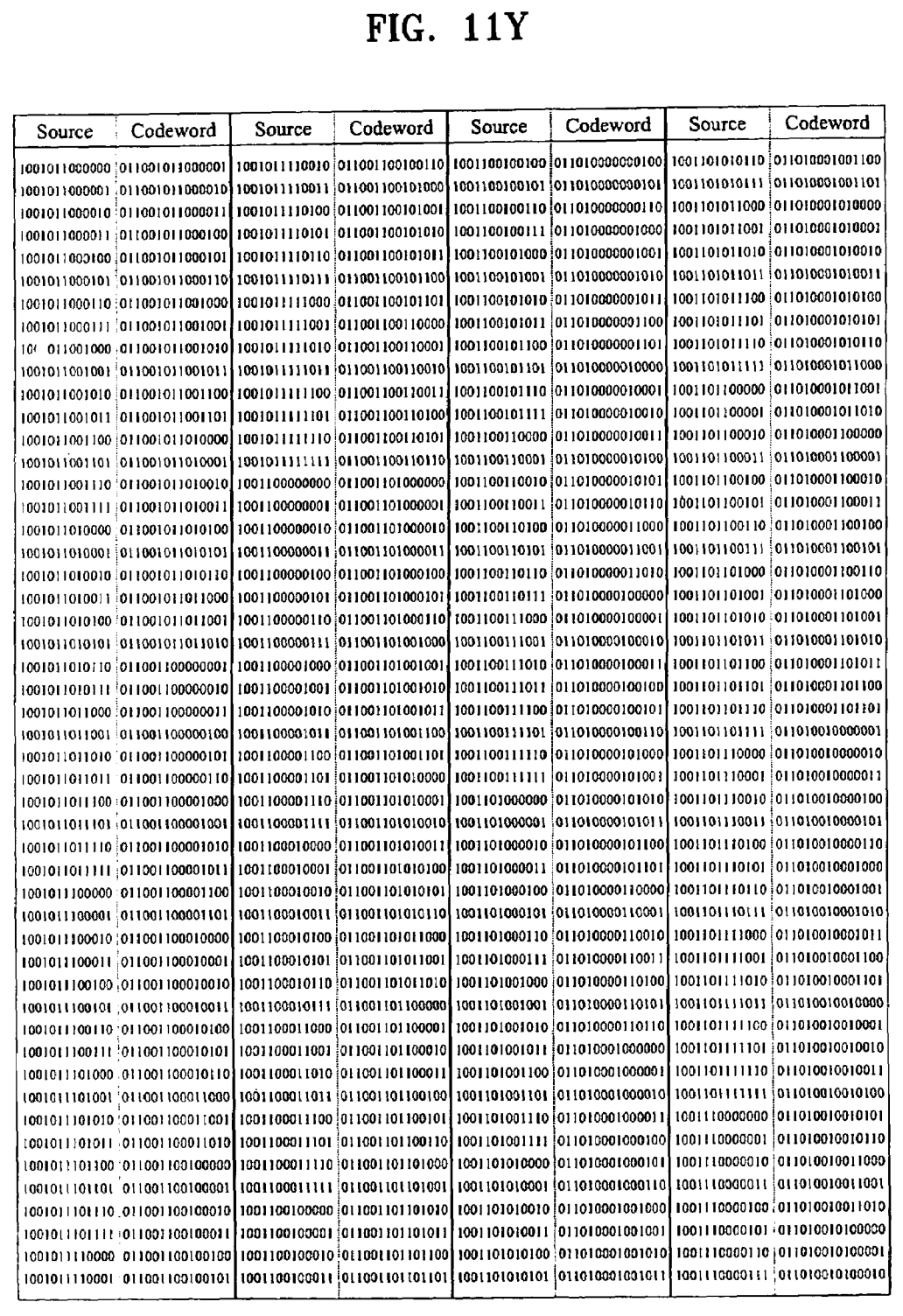

| Source | Codeword | Source | Codeword | Source | Codeword | Source | Codeword |
|---|---|---|---|---|---|---|---|
| 1001011000000 | 011001011000001 | 1001011110010 | 011001100100110 | 1001100100100 | 011010000000100 | 1001101010110 | 011010001001100 |
| 1001011000001 | 011001011000010 | 1001011110011 | 011001100101000 | 1001100100101 | 011010000000101 | 1001101010111 | 011010001001101 |
| 1001011000010 | 011001011000011 | 1001011110100 | 011001100101001 | 1001100100110 | 011010000000110 | 1001101011000 | 011010001010000 |
| 1001011000011 | 011001011000100 | 1001011110101 | 011001100101010 | 1001100100111 | 011010000001000 | 1001101011001 | 011010001010001 |
| 1001011000100 | 011001011000101 | 1001011110110 | 011001100101011 | 1001100101000 | 011010000001001 | 1001101011010 | 011010001010010 |
| 1001011000101 | 011001011000110 | 1001011110111 | 011001100101100 | 1001100101001 | 011010000001010 | 1001101011011 | 011010001010011 |
| 1001011000110 | 011001011001000 | 1001011111000 | 011001100101101 | 1001100101010 | 011010000001011 | 1001101011100 | 011010001010100 |
| 1001011000111 | 011001011001001 | 1001011111001 | 011001100110000 | 1001100101011 | 011010000001100 | 1001101011101 | 011010001010101 |
| 10[illegible]011001000 | 011001011001010 | 1001011111010 | 011001100110001 | 1001100101100 | 011010000001101 | 1001101011110 | 011010001010110 |
| 1001011001001 | 011001011001011 | 1001011111011 | 011001100110010 | 1001100101101 | 011010000010000 | 1001101011111 | 011010001011000 |
| 1001011001010 | 011001011001100 | 1001011111100 | 011001100110011 | 1001100101110 | 011010000010001 | 1001101100000 | 011010001011001 |
| 1001011001011 | 011001011001101 | 1001011111101 | 011001100110100 | 1001100101111 | 011010000010010 | 1001101100001 | 011010001011010 |
| 1001011001100 | 011001011010000 | 1001011111110 | 011001100110101 | 1001100110000 | 011010000010011 | 1001101100010 | 011010001100000 |
| 1001011001101 | 011001011010001 | 1001011111111 | 011001100110110 | 1001100110001 | 011010000010100 | 1001101100011 | 011010001100001 |
| 1001011001110 | 011001011010010 | 1001100000000 | 011001101000000 | 1001100110010 | 011010000010101 | 1001101100100 | 011010001100010 |
| 1001011001111 | 011001011010011 | 1001100000001 | 011001101000001 | 1001100110011 | 011010000010110 | 1001101100101 | 011010001100011 |
| 1001011010000 | 011001011010100 | 1001100000010 | 011001101000010 | 1001100110100 | 011010000011000 | 1001101100110 | 011010001100100 |
| 1001011010001 | 011001011010101 | 1001100000011 | 011001101000011 | 1001100110101 | 011010000011001 | 1001101100111 | 011010001100101 |
| 1001011010010 | 011001011010110 | 1001100000100 | 011001101000100 | 1001100110110 | 011010000011010 | 1001101101000 | 011010001100110 |
| 1001011010011 | 011001011011000 | 1001100000101 | 011001101000101 | 1001100110111 | 011010000100000 | 1001101101001 | 011010001101000 |
| 1001011010100 | 011001011011001 | 1001100000110 | 011001101000110 | 1001100111000 | 011010000100001 | 1001101101010 | 011010001101001 |
| 1001011010101 | 011001011011010 | 1001100000111 | 011001101001000 | 1001100111001 | 011010000100010 | 1001101101011 | 011010001101010 |
| 1001011010110 | 011001100000001 | 1001100001000 | 011001101001001 | 1001100111010 | 011010000100011 | 1001101101100 | 011010001101011 |
| 1001011010111 | 011001100000010 | 1001100001001 | 011001101001010 | 1001100111011 | 011010000100100 | 1001101101101 | 011010001101100 |
| 1001011011000 | 011001100000011 | 1001100001010 | 011001101001011 | 1001100111100 | 011010000100101 | 1001101101110 | 011010001101101 |
| 1001011011001 | 011001100000100 | 1001100001011 | 011001101001100 | 1001100111101 | 011010000100110 | 1001101101111 | 011010010000001 |
| 1001011011010 | 011001100000101 | 1001100001100 | 011001101001101 | 1001100111110 | 011010000101000 | 1001101110000 | 011010010000010 |
| 1001011011011 | 011001100000110 | 1001100001101 | 011001101010000 | 1001100111111 | 011010000101001 | 1001101110001 | 011010010000011 |
| 1001011011100 | 011001100001000 | 1001100001110 | 011001101010001 | 1001101000000 | 011010000101010 | 1001101110010 | 011010010000100 |
| 1001011011101 | 011001100001001 | 1001100001111 | 011001101010010 | 1001101000001 | 011010000101011 | 1001101110011 | 011010010000101 |
| 1001011011110 | 011001100001010 | 1001100010000 | 011001101010011 | 1001101000010 | 011010000101100 | 1001101110100 | 011010010000110 |
| 1001011011111 | 011001100001011 | 1001100010001 | 011001101010100 | 1001101000011 | 011010000101101 | 1001101110101 | 011010010001000 |
| 1001011100000 | 011001100001100 | 1001100010010 | 011001101010101 | 1001101000100 | 011010000110000 | 1001101110110 | 011010010001001 |
| 1001011100001 | 011001100001101 | 1001100010011 | 011001101010110 | 1001101000101 | 011010000110001 | 1001101110111 | 011010010001010 |
| 1001011100010 | 011001100010000 | 1001100010100 | 011001101011000 | 1001101000110 | 011010000110010 | 1001101111000 | 011010010001011 |
| 1001011100011 | 011001100010001 | 1001100010101 | 011001101011001 | 1001101000111 | 011010000110011 | 1001101111001 | 011010010001100 |
| 1001011100100 | 011001100010010 | 1001100010110 | 011001101011010 | 1001101001000 | 011010000110100 | 1001101111010 | 011010010001101 |
| 1001011100101 | 011001100010011 | 1001100010111 | 011001101100000 | 1001101001001 | 011010000110101 | 1001101111011 | 011010010010000 |
| 1001011100110 | 011001100010100 | 1001100011000 | 011001101100001 | 1001101001010 | 011010000110110 | 1001101111100 | 011010010010001 |
| 1001011100111 | 011001100010101 | 1001100011001 | 011001101100010 | 1001101001011 | 011010001000000 | 1001101111101 | 011010010010010 |
| 1001011101000 | 011001100010110 | 1001100011010 | 011001101100011 | 1001101001100 | 011010001000001 | 1001101111110 | 011010010010011 |
| 1001011101001 | 011001100011000 | 1001100011011 | 011001101100100 | 1001101001101 | 011010001000010 | 1001101111111 | 011010010010100 |
| 1001011101010 | 011001100011001 | 1001100011100 | 011001101100101 | 1001101001110 | 011010001000011 | 1001110000000 | 011010010010101 |
| 1001011101011 | 011001100011010 | 1001100011101 | 011001101100110 | 1001101001111 | 011010001000100 | 1001110000001 | 011010010010110 |
| 1001011101100 | 011001100100000 | 1001100011110 | 011001101101000 | 1001101010000 | 011010001000101 | 1001110000010 | 011010010011000 |
| 1001011101101 | 011001100100001 | 1001100011111 | 011001101101001 | 1001101010001 | 011010001000110 | 1001110000011 | 011010010011001 |
| 1001011101110 | 011001100100010 | 1001100100000 | 011001101101010 | 1001101010010 | 011010001001000 | 1001110000100 | 011010010011010 |
| 1001011101111 | 011001100100011 | 1001100100001 | 011001101101011 | 1001101010011 | 011010001001001 | 1001110000101 | 011010010100000 |
| 1001011110000 | 011001100100100 | 1001100100010 | 011001101101100 | 1001101010100 | 011010001001010 | 1001110000110 | 011010010100001 |
| 1001011110001 | 011001100100101 | 1001100100011 | 011001101101101 | 1001101010101 | 011010001001011 | 1001110000111 | 011010010100010 |

FIG.11Z

| Source | Codeword | Source | Codeword | Source | Codeword | Source | Codeword |
|---|---|---|---|---|---|---|---|
| 1001110001000 | 011010010100011 | 1001110111010 | 011010100001100 | 1001111101100 | 011010101010101 | 1010000011110 | 011010110101011 |
| 1001110001001 | 011010010100100 | 1001110111011 | 011010100001101 | 1001111101101 | 011010101010110 | 1010000011111 | 011010110101100 |
| 1001110001010 | 011010010100101 | 1001110111100 | 011010100010000 | 1001111101110 | 011010101011000 | 1010000100000 | 011010110101101 |
| 1001110001011 | 011010010100110 | 1001110111101 | 011010100010001 | 1001111101111 | 011010101011001 | 1010000100001 | 011010110110000 |
| 1001110001100 | 011010010101000 | 1001110111110 | 011010100010010 | 1001111110000 | 011010101011010 | 1010000100010 | 011010110110001 |
| 1001110001101 | 011010010101001 | 1001110111111 | 011010100010011 | 1001111110001 | 011010101100000 | 1010000100011 | 011010110110010 |
| 1001110001110 | 011010010101010 | 1001111000000 | 011010100010100 | 1001111110010 | 011010101100001 | 1010000100100 | 011010110110011 |
| 1001110001111 | 011010010101011 | 1001111000001 | 011010100010101 | 1001111110011 | 011010101100010 | 1010000100101 | 011010110110100 |
| 1001110010000 | 011010010101100 | 1001111000010 | 011010100010110 | 1001111110100 | 011010101100011 | 1010000100110 | 011010110110101 |
| 1001110010001 | 011010010101101 | 1001111000011 | 011010100011000 | 1001111110101 | 011010101100100 | 1010000100111 | 011010110110110 |
| 1001110010010 | 011010010110000 | 1001111000100 | 011010100011001 | 1001111110110 | 011010101100101 | 1010000101000 | 011011000000010 |
| 1001110010011 | 011010010110001 | 1001111000101 | 011010100011010 | 1001111110111 | 011010101100110 | 1010000101001 | 011011000000011 |
| 1001110010100 | 011010010110010 | 1001111000110 | 011010100100000 | 1001111111000 | 011010101101000 | 1010000101010 | 011011000000100 |
| 1001110010101 | 011010010110011 | 1001111000111 | 011010100100001 | 1001111111001 | 011010101101001 | 1010000101011 | 011011000000101 |
| 1001110010110 | 011010010110100 | 1001111001000 | 011010100100010 | 1001111111010 | 011010101101010 | 1010000101100 | 011011000000110 |
| 1001110010111 | 011010010110101 | 1001111001001 | 011010100100011 | 1001111111011 | 011010101101011 | 1010000101101 | 011011000001000 |
| 1001110011000 | 011010010110110 | 1001111001010 | 011010100100100 | 1001111111100 | 011010101101100 | 1010000101110 | 011011000001001 |
| 1001110011001 | 011010011000000 | 1001111001011 | 011010100100101 | 1001111111101 | 011010101101101 | 1010000101111 | 011011000001010 |
| 1001110011010 | 011010011000001 | 1001111001100 | 011010100100110 | 1001111111110 | 011010110000001 | 1010000110000 | 011011000001011 |
| 1001110011011 | 011010011000010 | 1001111001101 | 011010100101000 | 1001111111111 | 011010110000010 | 1010000110001 | 011011000001100 |
| 1001110011100 | 011010011000011 | 1001111001110 | 011010100101001 | 1010000000000 | 011010110000011 | 1010000110010 | 011011000001101 |
| 1001110011101 | 011010011000100 | 1001111001111 | 011010100101010 | 1010000000001 | 011010110000100 | 1010000110011 | 011011000010000 |
| 1001110011110 | 011010011000101 | 1001111010000 | 011010100101011 | 1010000000010 | 011010110000101 | 1010000110100 | 011011000010001 |
| 1001110011111 | 011010011000110 | 1001111010001 | 011010100101100 | 1010000000011 | 011010110000110 | 1010000110101 | 011011000010010 |
| 1001110100000 | 011010011001000 | 1001111010010 | 011010100101101 | 1010000000100 | 011010110001000 | 1010000110110 | 011011000010011 |
| 1001110100001 | 011010011001001 | 1001111010011 | 011010100110000 | 1010000000101 | 011010110001001 | 1010000110111 | 011011000010100 |
| 1001110100010 | 011010011001010 | 1001111010100 | 011010100110001 | 1010000000110 | 011010110001010 | 1010000111000 | 011011000010101 |
| 1001110100011 | 011010011001011 | 1001111010101 | 011010100110010 | 1010000000111 | 011010110001011 | 1010000111001 | 011011000010110 |
| 1001110100100 | 011010011001100 | 1001111010110 | 011010100110011 | 1010000001000 | 011010110001100 | 1010000111010 | 011011000011000 |
| 1001110100101 | 011010011001101 | 1001111010111 | 011010100110100 | 1010000001001 | 011010110001101 | 1010000111011 | 011011000011001 |
| 1001110100110 | 011010011010000 | 1001111011000 | 011010100110101 | 1010000001010 | 011010110010000 | 1010000111100 | 011011000011010 |
| 1001110100111 | 011010011010001 | 1001111011001 | 011010100110110 | 1010000001011 | 011010110010001 | 1010000111101 | 011011000100000 |
| 1001110101000 | 011010011010010 | 1001111011010 | 011010101000000 | 1010000001100 | 011010110010010 | 1010000111110 | 011011000100001 |
| 1001110101001 | 011010011010011 | 1001111011011 | 011010101000001 | 1010000001101 | 011010110010011 | 1010000111111 | 011011000100010 |
| 1001110101010 | 011010011010100 | 1001111011100 | 011010101000010 | 1010000001110 | 011010110010100 | 1010001000000 | 011011000100011 |
| 1001110101011 | 011010011010101 | 1001111011101 | 011010101000011 | 1010000001111 | 011010110010101 | 1010001000001 | 011011000100100 |
| 1001110101100 | 011010011010110 | 1001111011110 | 011010101000100 | 1010000010000 | 011010110010110 | 1010001000010 | 011011000100101 |
| 1001110101101 | 011010011011000 | 1001111011111 | 011010101000101 | 1010000010001 | 011010110011000 | 1010001000011 | 011011000100110 |
| 1001110101110 | 011010011011001 | 1001111100000 | 011010101000110 | 1010000010010 | 011010110011001 | 1010001000100 | 011011000101000 |
| 1001110101111 | 011010011011010 | 1001111100001 | 011010101001000 | 1010000010011 | 011010110011010 | 1010001000101 | 011011000101001 |
| 1001110110000 | 011010100000001 | 1001111100010 | 011010101001001 | 1010000010100 | 011010110100000 | 1010001000110 | 011011000101010 |
| 1001110110001 | 011010100000010 | 1001111100011 | 011010101001010 | 1010000010101 | 011010110100001 | 1010001000111 | 011011000101011 |
| 1001110110010 | 011010100000011 | 1001111100100 | 011010101001011 | 1010000010110 | 011010110100010 | 1010001001000 | 011011000101100 |
| 1001110110011 | 011010100000100 | 1001111100101 | 011010101001100 | 1010000010111 | 011010110100011 | 1010001001001 | 011011000101101 |
| 1001110110100 | 011010100000101 | 1001111100110 | 011010101001101 | 1010000011000 | 011010110100100 | 1010001001010 | 011011000110000 |
| 1001110110101 | 011010100000110 | 1001111100111 | 011010101010000 | 1010000011001 | 011010110100101 | 1010001001011 | 011011000110001 |
| 1001110110110 | 011010100001000 | 1001111101000 | 011010101010001 | 1010000011010 | 011010110100110 | 1010001001100 | 011011000110010 |
| 1001110110111 | 011010100001001 | 1001111101001 | 011010101010010 | 1010000011011 | 011010110101000 | 1010001001101 | 011011000110011 |
| 1001110111000 | 011010100001010 | 1001111101010 | 011010101010011 | 1010000011100 | 011010110101001 | 1010001001110 | 011011000110100 |
| 1001110111001 | 011010100001011 | 1001111101011 | 011010101010100 | 1010000011101 | 011010110101010 | 1010001001111 | 011011000110101 |

FIG. 12A

| Source | Codeword | Source | Codeword | Source | Codeword | Source | Codeword |
|---|---|---|---|---|---|---|---|
| 1010001010000 | 011011000110110 | 1010010000010 | 011011010010001 | 1010010110100 | 011011011011001 | 1010011100110 | 100000010010000 |
| 1010001010001 | 011011001000000 | 1010010000011 | 011011010010010 | 1010010110101 | 011011011011010 | 1010011100111 | 100000010010001 |
| 1010001010010 | 011011001000001 | 1010010000100 | 011011010010011 | 1010010110110 | 100000001000000 | 1010011101000 | 100000010010010 |
| 1010001010011 | 011011001000010 | 1010010000101 | 011011010010100 | 1010010110111 | 100000001000001 | 1010011101001 | 100000010010011 |
| 1010001010100 | 011011001000011 | 1010010000110 | 011011010010101 | 1010010111000 | 100000001000010 | 1010011101010 | 100000010010100 |
| 1010001010101 | 011011001000100 | 1010010000111 | 011011010010110 | 1010010111001 | 100000001000011 | 1010011101011 | 100000010010101 |
| 1010001010110 | 011011001000101 | 1010010001000 | 011011010011000 | 1010010111010 | 100000001000100 | 1010011101100 | 100000010010110 |
| 1010001010111 | 011011001000110 | 1010010001001 | 011011010011001 | 1010010111011 | 100000001000101 | 1010011101101 | 100000010011000 |
| 1010001011000 | 011011001001000 | 1010010001010 | 011011010011010 | 1010010111100 | 100000001000110 | 1010011101110 | 100000010011001 |
| 1010001011001 | 011011001001001 | 1010010001011 | 011011010100000 | 1010010111101 | 100000001001000 | 1010011101111 | 100000010011010 |
| 1010001011010 | 011011001001010 | 1010010001100 | 011011010100001 | 1010010111110 | 100000001001001 | 1010011110000 | 100000010100000 |
| 1010001011011 | 011011001001011 | 1010010001101 | 011011010100010 | 1010010111111 | 100000001001010 | 1010011110001 | 100000010100001 |
| 1010001011100 | 011011001001100 | 1010010001110 | 011011010100011 | 1010011000000 | 100000001001011 | 1010011110010 | 100000010100010 |
| 1010001011101 | 011011001001101 | 1010010001111 | 011011010100100 | 1010011000001 | 100000001001100 | 1010011110011 | 100000010100011 |
| 1010001011110 | 011011001010000 | 1010010010000 | 011011010100101 | 1010011000010 | 100000001001101 | 1010011110100 | 100000010100100 |
| 1010001011111 | 011011001010001 | 1010010010001 | 011011010100110 | 1010011000011 | 100000001010000 | 1010011110101 | 100000010100101 |
| 1010001100000 | 011011001010010 | 1010010010010 | 011011010101000 | 1010011000100 | 100000001010001 | 1010011110110 | 100000010100110 |
| 1010001100001 | 011011001010011 | 1010010010011 | 011011010101001 | 1010011000101 | 100000001010010 | 1010011110111 | 100000010101000 |
| 1010001100010 | 011011001010100 | 1010010010100 | 011011010101010 | 1010011000110 | 100000001010011 | 1010011111000 | 100000010101001 |
| 1010001100011 | 011011001010101 | 1010010010101 | 011011010101011 | 1010011000111 | 100000001010100 | 1010011111001 | 100000010101010 |
| 1010001100100 | 011011001010110 | 1010010010110 | 011011010101100 | 1010011001000 | 100000001010101 | 1010011111010 | 100000010101011 |
| 1010001100101 | 011011001011000 | 1010010010111 | 011011010101101 | 1010011001001 | 100000001010110 | 1010011111011 | 100000010101100 |
| 1010001100110 | 011011001011001 | 1010010011000 | 011011010110000 | 1010011001010 | 100000001011000 | 1010011111100 | 100000010101101 |
| 1010001100111 | 011011001011010 | 1010010011001 | 011011010110001 | 1010011001011 | 100000001011001 | 1010011111101 | 100000010110000 |
| 1010001101000 | 011011001100000 | 1010010011010 | 011011010110010 | 1010011001100 | 100000001011010 | 1010011111110 | 100000010110001 |
| 1010001101001 | 011011001100001 | 1010010011011 | 011011010110011 | 1010011001101 | 100000001100000 | 1010011111111 | 100000010110010 |
| 1010001101010 | 011011001100010 | 1010010011100 | 011011010110100 | 1010011001110 | 100000001100001 | 1010100000000 | 100000010110011 |
| 1010001101011 | 011011001100011 | 1010010011101 | 011011010110101 | 1010011001111 | 100000001100010 | 1010100000001 | 100000010110100 |
| 1010001101100 | 011011001100100 | 1010010011110 | 011011010110110 | 1010011010000 | 100000001100011 | 1010100000010 | 100000010110101 |
| 1010001101101 | 011011001100101 | 1010010011111 | 011011011000000 | 1010011010001 | 100000001100100 | 1010100000011 | 100000010110110 |
| 1010001101110 | 011011001100110 | 1010010100000 | 011011011000001 | 1010011010010 | 100000001100101 | 1010100000100 | 100000011000000 |
| 1010001101111 | 011011001101000 | 1010010100001 | 011011011000010 | 1010011010011 | 100000001100110 | 1010100000101 | 100000011000001 |
| 1010001110000 | 011011001101001 | 1010010100010 | 011011011000011 | 1010011010100 | 100000001101000 | 1010100000110 | 100000011000010 |
| 1010001110001 | 011011001101010 | 1010010100011 | 011011011000100 | 1010011010101 | 100000001101001 | 1010100000111 | 100000011000011 |
| 1010001110010 | 011011001101011 | 1010010100100 | 011011011000101 | 1010011010110 | 100000001101010 | 1010100001000 | 100000011000100 |
| 1010001110011 | 011011001101100 | 1010010100101 | 011011011000110 | 1010011010111 | 100000001101011 | 1010100001001 | 100000011000101 |
| 1010001110100 | 011011001101101 | 1010010100110 | 011011011001000 | 1010011011000 | 100000001101100 | 1010100001010 | 100000011000110 |
| 1010001110101 | 011011010000001 | 1010010100111 | 011011011001001 | 1010011011001 | 100000001101101 | 1010100001011 | 100000011001000 |
| 1010001110110 | 011011010000010 | 1010010101000 | 011011011001010 | 1010011011010 | 100000010000001 | 1010100001100 | 100000011001001 |
| 1010001110111 | 011011010000011 | 1010010101001 | 011011011001011 | 1010011011011 | 100000010000010 | 1010100001101 | 100000011001010 |
| 1010001111000 | 011011010000100 | 1010010101010 | 011011011001100 | 1010011011100 | 100000010000011 | 1010100001110 | 100000011001011 |
| 1010001111001 | 011011010000101 | 1010010101011 | 011011011001101 | 1010011011101 | 100000010000100 | 1010100001111 | 100000011001100 |
| 1010001111010 | 011011010000110 | 1010010101100 | 011011011010000 | 1010011011110 | 100000010000101 | 1010100010000 | 100000011001101 |
| 1010001111011 | 011011010001000 | 1010010101101 | 011011011010001 | 1010011011111 | 100000010000110 | 1010100010001 | 100000011010000 |
| 1010001111100 | 011011010001001 | 1010010101110 | 011011011010010 | 1010011100000 | 100000010001000 | 1010100010010 | 100000011010001 |
| 1010001111101 | 011011010001010 | 1010010101111 | 011011011010011 | 1010011100001 | 100000010001001 | 1010100010011 | 100000011010010 |
| 1010001111110 | 011011010001011 | 1010010110000 | 011011011010100 | 1010011100010 | 100000010001010 | 1010100010100 | 100000011010011 |
| 1010001111111 | 011011010001100 | 1010010110001 | 011011011010101 | 1010011100011 | 100000010001011 | 1010100010101 | 100000011010100 |
| 1010010000000 | 011011010001101 | 1010010110010 | 011011011010110 | 1010011100100 | 100000010001100 | 1010100010110 | 100000011010101 |
| 1010010000001 | 011011010010000 | 1010010110011 | 011011011011000 | 1010011100101 | 100000010001101 | 1010100010111 | 100000011010110 |

FIG. 12B

| Source | Codeword | Source | Codeword | Source | Codeword | Source | Codeword |
|---|---|---|---|---|---|---|---|
| 1010100011000 | 100000011011000 | 1010101001010 | 100000101000101 | 1010101111100 | 100000110011000 | 1010110101110 | 100001000100110 |
| 1010100011001 | 100000011011001 | 1010101001011 | 100000101000110 | 1010101111101 | 100000110011001 | 1010110101111 | 100001000101000 |
| 1010100011010 | 100000011011010 | 1010101001100 | 100000101001000 | 1010101111110 | 100000110011010 | 1010110110000 | 100001000101001 |
| 1010100011011 | 100000100000001 | 1010101001101 | 100000101001001 | 1010101111111 | 100000110100000 | 1010110110001 | 100001000101010 |
| 1010100011100 | 100000100000010 | 1010101001110 | 100000101001010 | 1010110000000 | 100000110100001 | 1010110110010 | 100001000101011 |
| 1010100011101 | 100000100000011 | 1010101001111 | 100000101001011 | 1010110000001 | 100000110100010 | 1010110110011 | 100001000101100 |
| 1010100011110 | 100000100000100 | 1010101010000 | 100000101001100 | 1010110000010 | 100000110100011 | 1010110110100 | 100001000101101 |
| 1010100011111 | 100000100000101 | 1010101010001 | 100000101001101 | 1010110000011 | 100000110100100 | 1010110110101 | 100001000110000 |
| 1010100100000 | 100000100000110 | 1010101010010 | 100000101010000 | 1010110000100 | 100000110100101 | 1010110110110 | 100001000110001 |
| 1010100100001 | 100000100001000 | 1010101010011 | 100000101010001 | 1010110000101 | 100000110100110 | 1010110110111 | 100001000110010 |
| 1010100100010 | 100000100001001 | 1010101010100 | 100000101010010 | 1010110000110 | 100000110101000 | 1010110111000 | 100001000110011 |
| 1010100100011 | 100000100001010 | 1010101010101 | 100000101010011 | 1010110000111 | 100000110101001 | 1010110111001 | 100001000110100 |
| 1010100100100 | 100000100001011 | 1010101010110 | 100000101010100 | 1010110001000 | 100000110101010 | 1010110111010 | 100001000110101 |
| 1010100100101 | 100000100001100 | 1010101010111 | 100000101010101 | 1010110001001 | 100000110101011 | 1010110111011 | 100001000110110 |
| 1010100100110 | 100000100001101 | 1010101011000 | 100000101010110 | 1010110001010 | 100000110101100 | 1010110111100 | 100001001000000 |
| 1010100100111 | 100000100010000 | 1010101011001 | 100000101011000 | 1010110001011 | 100000110101101 | 1010110111101 | 100001001000001 |
| 1010100101000 | 100000100010001 | 1010101011010 | 100000101011001 | 1010110001100 | 100000110110000 | 1010110111110 | 100001001000010 |
| 1010100101001 | 100000100010010 | 1010101011011 | 100000101011010 | 1010110001101 | 100000110110001 | 1010110111111 | 100001001000011 |
| 1010100101010 | 100000100010011 | 1010101011100 | 100000101100000 | 1010110001110 | 100000110110010 | 1010111000000 | 100001001000100 |
| 1010100101011 | 100000100010100 | 1010101011101 | 100000101100001 | 1010110001111 | 100000110110011 | 1010111000001 | 100001001000101 |
| 1010100101100 | 100000100010101 | 1010101011110 | 100000101100010 | 1010110010000 | 100000110110100 | 1010111000010 | 100001001000110 |
| 1010100101101 | 100000100010110 | 1010101011111 | 100000101100011 | 1010110010001 | 100000110110101 | 1010111000011 | 100001001001000 |
| 1010100101110 | 100000100011000 | 1010101100000 | 100000101100100 | 1010110010010 | 100000110110110 | 1010111000100 | 100001001001001 |
| 1010100101111 | 100000100011001 | 1010101100001 | 100000101100101 | 1010110010011 | 100001000000010 | 1010111000101 | 100001001001010 |
| 1010100110000 | 100000100011010 | 1010101100010 | 100000101100110 | 1010110010100 | 100001000000011 | 1010111000110 | 100001001001011 |
| 1010100110001 | 100000100100000 | 1010101100011 | 100000101101000 | 1010110010101 | 100001000000100 | 1010111000111 | 100001001001100 |
| 1010100110010 | 100000100100001 | 1010101100100 | 100000101101001 | 1010110010110 | 100001000000101 | 1010111001000 | 100001001001101 |
| 1010100110011 | 100000100100010 | 1010101100101 | 100000101101010 | 1010110010111 | 100001000000110 | 1010111001001 | 100001001010000 |
| 1010100110100 | 100000100100011 | 1010101100110 | 100000101101011 | 1010110011000 | 100001000001000 | 1010111001010 | 100001001010001 |
| 1010100110101 | 100000100100100 | 1010101100111 | 100000101101100 | 1010110011001 | 100001000001001 | 1010111001011 | 100001001010010 |
| 1010100110110 | 100000100100101 | 1010101101000 | 100000101101101 | 1010110011010 | 100001000001010 | 1010111001100 | 100001001010011 |
| 1010100110111 | 100000100100110 | 1010101101001 | 100000110000001 | 1010110011011 | 100001000001011 | 1010111001101 | 100001001010100 |
| 1010100111000 | 100000100101000 | 1010101101010 | 100000110000010 | 1010110011100 | 100001000001100 | 1010111001110 | 100001001010101 |
| 1010100111001 | 100000100101001 | 1010101101011 | 100000110000011 | 1010110011101 | 100001000001101 | 1010111001111 | 100001001010110 |
| 1010100111010 | 100000100101010 | 1010101101100 | 100000110000100 | 1010110011110 | 100001000010000 | 1010111010000 | 100001001011000 |
| 1010100111011 | 100000100101011 | 1010101101101 | 100000110000101 | 1010110011111 | 100001000010001 | 1010111010001 | 100001001011001 |
| 1010100111100 | 100000100101100 | 1010101101110 | 100000110000110 | 1010110100000 | 100001000010010 | 1010111010010 | 100001001011010 |
| 1010100111101 | 100000100101101 | 1010101101111 | 100000110001000 | 1010110100001 | 100001000010011 | 1010111010011 | 100001001100000 |
| 1010100111110 | 100000100110000 | 1010101110000 | 100000110001001 | 1010110100010 | 100001000010100 | 1010111010100 | 100001001100001 |
| 1010100111111 | 100000100110001 | 1010101110001 | 100000110001010 | 1010110100011 | 100001000010101 | 1010111010101 | 100001001100010 |
| 1010101000000 | 100000100110010 | 1010101110010 | 100000110001011 | 1010110100100 | 100001000010110 | 1010111010110 | 100001001100011 |
| 1010101000001 | 100000100110011 | 1010101110011 | 100000110001100 | 1010110100101 | 100001000011000 | 1010111010111 | 100001001100100 |
| 1010101000010 | 100000100110100 | 1010101110100 | 100000110001101 | 1010110100110 | 100001000011001 | 1010111011000 | 100001001100101 |
| 1010101000011 | 100000100110101 | 1010101110101 | 100000110010000 | 1010110100111 | 100001000011010 | 1010111011001 | 100001001100110 |
| 1010101000100 | 100000100110110 | 1010101110110 | 100000110010001 | 1010110101000 | 100001000100000 | 1010111011010 | 100001001101000 |
| 1010101000101 | 100000101000000 | 1010101110111 | 100000110010010 | 1010110101001 | 100001000100001 | 1010111011011 | 100001001101001 |
| 1010101000110 | 100000101000001 | 1010101111000 | 100000110010011 | 1010110101010 | 100001000100010 | 1010111011100 | 100001001101010 |
| 1010101000111 | 100000101000010 | 1010101111001 | 100000110010100 | 1010110101011 | 100001000100011 | 1010111011101 | 100001001101011 |
| 1010101001000 | 100000101000011 | 1010101111010 | 100000110010101 | 1010110101100 | 100001000100100 | 1010111011110 | 100001001101100 |
| 1010101001001 | 100000101000100 | 1010101111011 | 100000110010110 | 1010110101101 | 100001000100101 | 1010111011111 | 100001001101101 |

FIG. 12C

| Source | Codeword | Source | Codeword | Source | Codeword | Source | Codeword |
|---|---|---|---|---|---|---|---|
| 1010111100000 | 100001010000001 | 1011000010010 | 100001011001001 | 1011001000100 | 100001100110000 | 1011001110110 | 100010000001100 |
| 1010111100001 | 100001010000010 | 1011000010011 | 100001011001010 | 1011001000101 | 100001100110001 | 1011001110111 | 100010000001101 |
| 1010111100010 | 100001010000011 | 1011000010100 | 100001011001011 | 1011001000110 | 100001100110010 | 1011001111000 | 100010000010000 |
| 1010111100011 | 100001010000100 | 1011000010101 | 100001011001100 | 1011001000111 | 100001100110011 | 1011001111001 | 100010000010001 |
| 1010111100100 | 100001010000101 | 1011000010110 | 100001011001101 | 1011001001000 | 100001100110100 | 1011001111010 | 100010000010010 |
| 1010111100101 | 100001010000110 | 1011000010111 | 100001011010000 | 1011001001001 | 100001100110101 | 1011001111011 | 100010000010011 |
| 1010111100110 | 100001010001000 | 1011000011000 | 100001011010001 | 1011001001010 | 100001100110110 | 1011001111100 | 100010000010100 |
| 1010111100111 | 100001010001001 | 1011000011001 | 100001011010010 | 1011001001011 | 100001101000000 | 1011001111101 | 100010000010101 |
| 1010111101000 | 100001010001010 | 1011000011010 | 100001011010011 | 1011001001100 | 100001101000001 | 1011001111110 | 100010000010110 |
| 1010111101001 | 100001010001011 | 1011000011011 | 100001011010100 | 1011001001101 | 100001101000010 | 1011001111111 | 100010000011000 |
| 1010111101010 | 100001010001100 | 1011000011100 | 100001011010101 | 1011001001110 | 100001101000011 | 1011010000000 | 100010000011001 |
| 1010111101011 | 100001010001101 | 1011000011101 | 100001011010110 | 1011001001111 | 100001101000100 | 1011010000001 | 100010000011010 |
| 1010111101100 | 100001010010000 | 1011000011110 | 100001011011000 | 1011001010000 | 100001101000101 | 1011010000010 | 100010000100000 |
| 1010111101101 | 100001010010001 | 1011000011111 | 100001011011001 | 1011001010001 | 100001101000110 | 1011010000011 | 100010000100001 |
| 1010111101110 | 100001010010010 | 1011000100000 | 100001011011010 | 1011001010010 | 100001101001000 | 1011010000100 | 100010000100010 |
| 1010111101111 | 100001010010011 | 1011000100001 | 100001100000001 | 1011001010011 | 100001101001001 | 1011010000101 | 100010000100011 |
| 1010111110000 | 100001010010100 | 1011000100010 | 100001100000010 | 1011001010100 | 100001101001010 | 1011010000110 | 100010000100100 |
| 1010111110001 | 100001010010101 | 1011000100011 | 100001100000011 | 1011001010101 | 100001101001011 | 1011010000111 | 100010000100101 |
| 1010111110010 | 100001010010110 | 1011000100100 | 100001100000100 | 1011001010110 | 100001101001100 | 1011010001000 | 100010000100110 |
| 1010111110011 | 100001010011000 | 1011000100101 | 100001100000101 | 1011001010111 | 100001101001101 | 1011010001001 | 100010000101000 |
| 1010111110100 | 100001010011001 | 1011000100110 | 100001100000110 | 1011001011000 | 100001101010000 | 1011010001010 | 100010000101001 |
| 1010111110101 | 100001010011010 | 1011000100111 | 100001100001000 | 1011001011001 | 100001101010001 | 1011010001011 | 100010000101010 |
| 1010111110110 | 100001010100000 | 1011000101000 | 100001100001001 | 1011001011010 | 100001101010010 | 1011010001100 | 100010000101011 |
| 1010111110111 | 100001010100001 | 1011000101001 | 100001100001010 | 1011001011011 | 100001101010011 | 1011010001101 | 100010000101100 |
| 1010111111000 | 100001010100010 | 1011000101010 | 100001100001011 | 1011001011100 | 100001101010100 | 1011010001110 | 100010000101101 |
| 1010111111001 | 100001010100011 | 1011000101011 | 100001100001100 | 1011001011101 | 100001101010101 | 1011010001111 | 100010000110000 |
| 1010111111010 | 100001010100100 | 1011000101100 | 100001100001101 | 1011001011110 | 100001101010110 | 1011010010000 | 100010000110001 |
| 1010111111011 | 100001010100101 | 1011000101101 | 100001100010000 | 1011001011111 | 100001101011000 | 1011010010001 | 100010000110010 |
| 1010111111100 | 100001010100110 | 1011000101110 | 100001100010001 | 1011001100000 | 100001101011001 | 1011010010010 | 100010000110011 |
| 1010111111101 | 100001010101000 | 1011000101111 | 100001100010010 | 1011001100001 | 100001101011010 | 1011010010011 | 100010000110100 |
| 1010111111110 | 100001010101001 | 1011000110000 | 100001100010011 | 1011001100010 | 100001101100000 | 1011010010100 | 100010000110101 |
| 1010111111111 | 100001010101010 | 1011000110001 | 100001100010100 | 1011001100011 | 100001101100001 | 1011010010101 | 100010000110110 |
| 1011000000000 | 100001010101011 | 1011000110010 | 100001100010101 | 1011001100100 | 100001101100010 | 1011010010110 | 100010001000000 |
| 1011000000001 | 100001010101100 | 1011000110011 | 100001100010110 | 1011001100101 | 100001101100011 | 1011010010111 | 100010001000001 |
| 1011000000010 | 100001010101101 | 1011000110100 | 100001100011000 | 1011001100110 | 100001101100100 | 1011010011000 | 100010001000010 |
| 1011000000011 | 100001010110000 | 1011000110101 | 100001100011001 | 1011001100111 | 100001101100101 | 1011010011001 | 100010001000011 |
| 1011000000100 | 100001010110001 | 1011000110110 | 100001100011010 | 1011001101000 | 100001101100110 | 1011010011010 | 100010001000100 |
| 1011000000101 | 100001010110010 | 1011000110111 | 100001100100000 | 1011001101001 | 100001101101000 | 1011010011011 | 100010001000101 |
| 1011000000110 | 100001010110011 | 1011000111000 | 100001100100001 | 1011001101010 | 100001101101001 | 1011010011100 | 100010001000110 |
| 1011000000111 | 100001010110100 | 1011000111001 | 100001100100010 | 1011001101011 | 100001101101010 | 1011010011101 | 100010001001000 |
| 1011000001000 | 100001010110101 | 1011000111010 | 100001100100011 | 1011001101100 | 100001101101011 | 1011010011110 | 100010001001001 |
| 1011000001001 | 100001010110110 | 1011000111011 | 100001100100100 | 1011001101101 | 100001101101100 | 1011010011111 | 100010001001010 |
| 1011000001010 | 100001011000000 | 1011000111100 | 100001100100101 | 1011001101110 | 100001101101101 | 1011010100000 | 100010001001011 |
| 1011000001011 | 100001011000001 | 1011000111101 | 100001100100110 | 1011001101111 | 100010000000100 | 1011010100001 | 100010001001100 |
| 1011000001100 | 100001011000010 | 1011000111110 | 100001100101000 | 1011001110000 | 100010000000101 | 1011010100010 | 100010001001101 |
| 1011000001101 | 100001011000011 | 1011000111111 | 100001100101001 | 1011001110001 | 100010000000110 | 1011010100011 | 100010001010000 |
| 1011000001110 | 100001011000100 | 1011001000000 | 100001100101010 | 1011001110010 | 100010000001000 | 1011010100100 | 100010001010001 |
| 1011000001111 | 100001011000101 | 1011001000001 | 100001100101011 | 1011001110011 | 100010000001001 | 1011010100101 | 100010001010010 |
| 1011000010000 | 100001011000110 | 1011001000010 | 100001100101100 | 1011001110100 | 100010000001010 | 1011010100110 | 100010001010011 |
| 1011000010001 | 100001011001000 | 1011001000011 | 100001100101101 | 1011001110101 | 100010000001011 | 1011010100111 | 100010001010100 |

FIG. 12D

| Source | Codeword | Source | Codeword | Source | Codeword | Source | Codeword |
|---|---|---|---|---|---|---|---|
| 1011010101000 | 100010001010101 | 1011011011010 | 100010010101011 | 1011100001100 | 100010100010101 | 1011100111110 | 100010101100010 |
| 1011010101001 | 100010001010110 | 1011011011011 | 100010010101100 | 1011100001101 | 100010100010110 | 1011100111111 | 100010101100011 |
| 1011010101010 | 100010001011000 | 1011011011100 | 100010010101101 | 1011100001110 | 100010100011000 | 1011101000000 | 100010101100100 |
| 1011010101011 | 100010001011001 | 1011011011101 | 100010010110000 | 1011100001111 | 100010100011001 | 1011101000001 | 100010101100101 |
| 1011010101100 | 100010001011010 | 1011011011110 | 100010010110001 | 1011100010000 | 100010100011010 | 1011101000010 | 100010101100110 |
| 1011010101101 | 100010001100000 | 1011011011111 | 100010010110010 | 1011100010001 | 100010100100000 | 1011101000011 | 100010101101000 |
| 1011010101110 | 100010001100001 | 1011011100000 | 100010010110011 | 1011100010010 | 100010100100001 | 1011101000100 | 100010101101001 |
| 1011010101111 | 100010001100010 | 1011011100001 | 100010010110100 | 1011100010011 | 100010100100010 | 1011101000101 | 100010101101010 |
| 1011010110000 | 100010001100011 | 1011011100010 | 100010010110101 | 1011100010100 | 100010100100011 | 1011101000110 | 100010101101011 |
| 1011010110001 | 100010001100100 | 1011011100011 | 100010010110110 | 1011100010101 | 100010100100100 | 1011101000111 | 100010101101100 |
| 1011010110010 | 100010001100101 | 1011011100100 | 100010011000000 | 1011100010110 | 100010100100101 | 1011101001000 | 100010101101101 |
| 1011010110011 | 100010001100110 | 1011011100101 | 100010011000001 | 1011100010111 | 100010100100110 | 1011101001001 | 100010110000001 |
| 1011010110100 | 100010001101000 | 1011011100110 | 100010011000010 | 1011100011000 | 100010100101000 | 1011101001010 | 100010110000010 |
| 1011010110101 | 100010001101001 | 1011011100111 | 100010011000011 | 1011100011001 | 100010100101001 | 1011101001011 | 100010110000011 |
| 1011010110110 | 100010001101010 | 1011011101000 | 100010011000100 | 1011100011010 | 100010100101010 | 1011101001100 | 100010110000100 |
| 1011010110111 | 100010001101011 | 1011011101001 | 100010011000101 | 1011100011011 | 100010100101011 | 1011101001101 | 100010110000101 |
| 1011010111000 | 100010001101100 | 1011011101010 | 100010011000110 | 1011100011100 | 100010100101100 | 1011101001110 | 100010110000110 |
| 1011010111001 | 100010001101101 | 1011011101011 | 100010011001000 | 1011100011101 | 100010100101101 | 1011101001111 | 100010110001000 |
| 1011010111010 | 100010010000001 | 1011011101100 | 100010011001001 | 1011100011110 | 100010100110000 | 1011101010000 | 100010110001001 |
| 1011010111011 | 100010010000010 | 1011011101101 | 100010011001010 | 1011100011111 | 100010100110001 | 1011101010001 | 100010110001010 |
| 1011010111100 | 100010010000011 | 1011011101110 | 100010011001011 | 1011100100000 | 100010100110010 | 1011101010010 | 100010110001011 |
| 1011010111101 | 100010010000100 | 1011011101111 | 100010011001100 | 1011100100001 | 100010100110011 | 1011101010011 | 100010110001100 |
| 1011010111110 | 100010010000101 | 1011011110000 | 100010011001101 | 1011100100010 | 100010100110100 | 1011101010100 | 100010110001101 |
| 1011010111111 | 100010010000110 | 1011011110001 | 100010011010000 | 1011100100011 | 100010100110101 | 1011101010101 | 100010110010000 |
| 1011011000000 | 100010010001000 | 1011011110010 | 100010011010001 | 1011100100100 | 100010100110110 | 1011101010110 | 100010110010001 |
| 1011011000001 | 100010010001001 | 1011011110011 | 100010011010010 | 1011100100101 | 100010101000000 | 1011101010111 | 100010110010010 |
| 1011011000010 | 100010010001010 | 1011011110100 | 100010011010011 | 1011100100110 | 100010101000001 | 1011101011000 | 100010110010011 |
| 1011011000011 | 100010010001011 | 1011011110101 | 100010011010100 | 1011100100111 | 100010101000010 | 1011101011001 | 100010110010100 |
| 1011011000100 | 100010010001100 | 1011011110110 | 100010011010101 | 1011100101000 | 100010101000011 | 1011101011010 | 100010110010101 |
| 1011011000101 | 100010010001101 | 1011011110111 | 100010011010110 | 1011100101001 | 100010101000100 | 1011101011011 | 100010110010110 |
| 1011011000110 | 100010010010000 | 1011011111000 | 100010011011000 | 1011100101010 | 100010101000101 | 1011101011100 | 100010110011000 |
| 1011011000111 | 100010010010001 | 1011011111001 | 100010011011001 | 1011100101011 | 100010101000110 | 1011101011101 | 100010110011001 |
| 1011011001000 | 100010010010010 | 1011011111010 | 100010011011010 | 1011100101100 | 100010101001000 | 1011101011110 | 100010110011010 |
| 1011011001001 | 100010010010011 | 1011011111011 | 100010100000001 | 1011100101101 | 100010101001001 | 1011101011111 | 100010110100000 |
| 1011011001010 | 100010010010100 | 1011011111100 | 100010100000010 | 1011100101110 | 100010101001010 | 1011101100000 | 100010110100001 |
| 1011011001011 | 100010010010101 | 1011011111101 | 100010100000011 | 1011100101111 | 100010101001011 | 1011101100001 | 100010110100010 |
| 1011011001100 | 100010010010110 | 1011011111110 | 100010100000100 | 1011100110000 | 100010101001100 | 1011101100010 | 100010110100011 |
| 1011011001101 | 100010010011000 | 1011011111111 | 100010100000101 | 1011100110001 | 100010101001101 | 1011101100011 | 100010110100100 |
| 1011011001110 | 100010010011001 | 1011100000000 | 100010100000110 | 1011100110010 | 100010101010000 | 1011101100100 | 100010110100101 |
| 1011011001111 | 100010010011010 | 1011100000001 | 100010100001000 | 1011100110011 | 100010101010001 | 1011101100101 | 100010110100110 |
| 1011011010000 | 100010010100000 | 1011100000010 | 100010100001001 | 1011100110100 | 100010101010010 | 1011101100110 | 100010110101000 |
| 1011011010001 | 100010010100001 | 1011100000011 | 100010100001010 | 1011100110101 | 100010101010011 | 1011101100111 | 100010110101001 |
| 1011011010010 | 100010010100010 | 1011100000100 | 100010100001011 | 1011100110110 | 100010101010100 | 1011101101000 | 100010110101010 |
| 1011011010011 | 100010010100011 | 1011100000101 | 100010100001100 | 1011100110111 | 100010101010101 | 1011101101001 | 100010110101011 |
| 1011011010100 | 100010010100100 | 1011100000110 | 100010100001101 | 1011100111000 | 100010101010110 | 1011101101010 | 100010110101100 |
| 1011011010101 | 100010010100101 | 1011100000111 | 100010100010000 | 1011100111001 | 100010101011000 | 1011101101011 | 100010110101101 |
| 1011011010110 | 100010010100110 | 1011100001000 | 100010100010001 | 1011100111010 | 100010101011001 | 1011101101100 | 100010110110000 |
| 1011011010111 | 100010010101000 | 1011100001001 | 100010100010010 | 1011100111011 | 100010101011010 | 1011101101101 | 100010110110001 |
| 1011011011000 | 100010010101001 | 1011100001010 | 100010100010011 | 1011100111100 | 100010101100000 | 1011101101110 | 100010110110010 |
| 1011011011001 | 100010010101010 | 1011100001011 | 100010100010100 | 1011100111101 | 100010101100001 | 1011101101111 | 100010110110011 |

FIG. 12E

| Source | Codeword | Source | Codeword | Source | Codeword | Source | Codeword |
|---|---|---|---|---|---|---|---|
| 1011101110000 | 100010110110100 | 1011110100010 | 100011001000110 | 1011111010100 | 100011010011001 | 1100000000110 | 100100000001101 |
| 1011101110001 | 100010110110101 | 1011110100011 | 100011001001000 | 1011111010101 | 100011010011010 | 1100000000111 | 100100000010000 |
| 1011101110010 | 100010110110110 | 1011110100100 | 100011001001001 | 1011111010110 | 100011010100000 | 1100000001000 | 100100000010001 |
| 1011101110011 | 100011000000010 | 1011110100101 | 100011001001010 | 1011111010111 | 100011010100001 | 1100000001001 | 100100000010010 |
| 1011101110100 | 100011000000011 | 1011110100110 | 100011001001011 | 1011111011000 | 100011010100010 | 1100000001010 | 100100000010011 |
| 1011101110101 | 100011000000100 | 1011110100111 | 100011001001100 | 1011111011001 | 100011010100011 | 1100000001011 | 100100000010100 |
| 1011101110110 | 100011000000101 | 1011110101000 | 100011001001101 | 1011111011010 | 100011010100100 | 1100000001100 | 100100000010101 |
| 1011101110111 | 100011000000110 | 1011110101001 | 100011001010000 | 1011111011011 | 100011010100101 | 1100000001101 | 100100000010110 |
| 1011101111000 | 100011000001000 | 1011110101010 | 100011001010001 | 1011111011100 | 100011010100110 | 1100000001110 | 100100000011000 |
| 10 101111001 | 100011000001001 | 1011110101011 | 100011001010010 | 1011111011101 | 100011010101000 | 1100000001111 | 100100000011001 |
| 1011101111010 | 100011000001010 | 1011110101100 | 100011001010011 | 1011111011110 | 100011010101001 | 1100000010000 | 100100000011010 |
| 1011101111011 | 100011000001011 | 1011110101101 | 100011001010100 | 1011111011111 | 100011010101010 | 1100000010001 | 100100000100000 |
| 1011101111100 | 100011000001100 | 1011110101110 | 100011001010101 | 1011111100000 | 100011010101011 | 1100000010010 | 100100000100001 |
| 1011101111101 | 100011000001101 | 1011110101111 | 100011001010110 | 1011111100001 | 100011010101100 | 1100000010011 | 100100000100010 |
| 1011101111110 | 100011000010000 | 1011110110000 | 100011001011000 | 1011111100010 | 100011010101101 | 1100000010100 | 100100000100011 |
| 1011101111111 | 100011000010001 | 1011110110001 | 100011001011001 | 1011111100011 | 100011010110000 | 1100000010101 | 100100000100100 |
| 1011110000000 | 100011000010010 | 1011110110010 | 100011001011010 | 1011111100100 | 100011010110001 | 1100000010110 | 100100000100101 |
| 1011110000001 | 100011000010011 | 1011110110011 | 100011001100000 | 1011111100101 | 100011010110010 | 1100000010111 | 100100000100110 |
| 1011110000010 | 100011000010100 | 1011110110100 | 100011001100001 | 1011111100110 | 100011010110011 | 1100000011000 | 100100000101000 |
| 1011110000011 | 100011000010101 | 1011110110101 | 100011001100010 | 1011111100111 | 100011010110100 | 1100000011001 | 100100000101001 |
| 1011110000100 | 100011000010110 | 1011110110110 | 100011001100011 | 1011111101000 | 100011010110101 | 1100000011010 | 100100000101010 |
| 1011110000101 | 100011000011000 | 1011110110111 | 100011001100100 | 1011111101001 | 100011010110110 | 1100000011011 | 100100000101011 |
| 1011110000110 | 100011000011001 | 1011110111000 | 100011001100101 | 1011111101010 | 100011011000000 | 1100000011100 | 100100000101100 |
| 1011110000111 | 100011000011010 | 1011110111001 | 100011001100110 | 1011111101011 | 100011011000001 | 1100000011101 | 100100000101101 |
| 1011110001000 | 100011000100000 | 1011110111010 | 100011001101000 | 1011111101100 | 100011011000010 | 1100000011110 | 100100000110000 |
| 1011110001001 | 100011000100001 | 1011110111011 | 100011001101001 | 1011111101101 | 100011011000011 | 1100000011111 | 100100000110001 |
| 1011110001010 | 100011000100010 | 1011110111100 | 100011001101010 | 1011111101110 | 100011011000100 | 1100000100000 | 100100000110010 |
| 1011110001011 | 100011000100011 | 1011110111101 | 100011001101011 | 1011111101111 | 100011011000101 | 1100000100001 | 100100000110011 |
| 1011110001100 | 100011000100100 | 1011110111110 | 100011001101100 | 1011111110000 | 100011011000110 | 1100000100010 | 100100000110100 |
| 1011110001101 | 100011000100101 | 1011110111111 | 100011001101101 | 1011111110001 | 100011011001000 | 1100000100011 | 100100000110101 |
| 1011110001110 | 100011000100110 | 1011111000000 | 100011010000001 | 1011111110010 | 100011011001001 | 1100000100100 | 100100000110110 |
| 1011110001111 | 100011000101000 | 1011111000001 | 100011010000010 | 1011111110011 | 100011011001010 | 1100000100101 | 100100001000000 |
| 1011110010000 | 100011000101001 | 1011111000010 | 100011010000011 | 1011111110100 | 100011011001011 | 1100000100110 | 100100001000001 |
| 1011110010001 | 100011000101010 | 1011111000011 | 100011010000100 | 1011111110101 | 100011011001100 | 1100000100111 | 100100001000010 |
| 1011110010010 | 100011000101011 | 1011111000100 | 100011010000101 | 1011111110110 | 100011011001101 | 1100000101000 | 100100001000011 |
| 1011110010011 | 100011000101100 | 1011111000101 | 100011010000110 | 1011111110111 | 100011011010000 | 1100000101001 | 100100001000100 |
| 1011110010100 | 100011000101101 | 1011111000110 | 100011010001000 | 1011111111000 | 100011011010001 | 1100000101010 | 100100001000101 |
| 1011110010101 | 100011000110000 | 1011111000111 | 100011010001001 | 1011111111001 | 100011011010010 | 1100000101011 | 100100001000110 |
| 1011110010110 | 100011000110001 | 1011111001000 | 100011010001010 | 1011111111010 | 100011011010011 | 1100000101100 | 100100001001000 |
| 1011110010111 | 100011000110010 | 1011111001001 | 100011010001011 | 1011111111011 | 100011011010100 | 1100000101101 | 100100001001001 |
| 1011110011000 | 100011000110011 | 1011111001010 | 100011010001100 | 1011111111100 | 100011011010101 | 1100000101110 | 100100001001010 |
| 1011110011001 | 100011000110100 | 1011111001011 | 100011010001101 | 1011111111101 | 100011011010110 | 1100000101111 | 100100001001011 |
| 1011110011010 | 100011000110101 | 1011111001100 | 100011010010000 | 1011111111110 | 100011011011000 | 1100000110000 | 100100001001100 |
| 1011110011011 | 100011000110110 | 1011111001101 | 100011010010001 | 1011111111111 | 100011011011001 | 1100000110001 | 100100001001101 |
| 1011110011100 | 100011001000000 | 1011111001110 | 100011010010010 | 1100000000000 | 100011011011010 | 1100000110010 | 100100001010000 |
| 1011110011101 | 100011001000001 | 1011111001111 | 100011010010011 | 1100000000001 | 100100000001000 | 1100000110011 | 100100001010001 |
| 1011110011110 | 100011001000010 | 1011111010000 | 100011010010100 | 1100000000010 | 100100000001001 | 1100000110100 | 100100001010010 |
| 1011110011111 | 100011001000011 | 1011111010001 | 100011010010101 | 1100000000011 | 100100000001010 | 1100000110101 | 100100001010011 |
| 1011110100000 | 100011001000100 | 1011111010010 | 100011010010110 | 1100000000100 | 100100000001011 | 1100000110110 | 100100001010100 |
| 1011110100001 | 100011001000101 | 1011111010011 | 100011010011000 | 1100000000101 | 100100000001100 | 1100000110111 | 100100001010101 |

FIG. 12F

| Source | Codeword | Source | Codeword | Source | Codeword | Source | Codeword |
|---|---|---|---|---|---|---|---|
| 1100000111000 | 100100001010110 | 1100001101010 | 100100010101100 | 1100010011100 | 100100100010110 | 1100011001110 | 100100101100011 |
| 1100000111001 | 100100001011000 | 1100001101011 | 100100010101101 | 1100010011101 | 100100100011000 | 1100011001111 | 100100101100100 |
| 1100000111010 | 100100001011001 | 1100001101100 | 100100010110000 | 1100010011110 | 100100100011001 | 1100011010000 | 100100101100101 |
| 1100000111011 | 100100001011010 | 1100001101101 | 100100010110001 | 1100010011111 | 100100100011010 | 1100011010001 | 100100101100110 |
| 1100000111100 | 100100001100000 | 1100001101110 | 100100010110010 | 1100010100000 | 100100100100000 | 1100011010010 | 100100101101000 |
| 1100000111101 | 100100001100001 | 1100001101111 | 100100010110011 | 1100010100001 | 100100100100001 | 1100011010011 | 100100101101001 |
| 1100000111110 | 100100001100010 | 1100001110000 | 100100010110100 | 1100010100010 | 100100100100010 | 1100011010100 | 100100101101010 |
| 1100000111111 | 100100001100011 | 1100001110001 | 100100010110101 | 1100010100011 | 100100100100011 | 1100011010101 | 100100101101011 |
| 1100001000000 | 100100001100100 | 1100001110010 | 100100010110110 | 1100010100100 | 100100100100100 | 1100011010110 | 100100101101100 |
| 1100001000001 | 100100001100101 | 1100001110011 | 100100011000000 | 1100010100101 | 100100100100101 | 1100011010111 | 100100101101101 |
| 1100001000010 | 100100001100110 | 1100001110100 | 100100011000001 | 1100010100110 | 100100100100110 | 1100011011000 | 100100110000001 |
| 1100001000011 | 100100001101000 | 1100001110101 | 100100011000010 | 1100010100111 | 100100100101000 | 1100011011001 | 100100110000010 |
| 1100001000100 | 100100001101001 | 1100001110110 | 100100011000011 | 1100010101000 | 100100100101001 | 1100011011010 | 100100110000011 |
| 1100001000101 | 100100001101010 | 1100001110111 | 100100011000100 | 1100010101001 | 100100100101010 | 1100011011011 | 100100110000100 |
| 1100001000110 | 100100001101011 | 1100001111000 | 100100011000101 | 1100010101010 | 100100100101011 | 1100011011100 | 100100110000101 |
| 1100001000111 | 100100001101100 | 1100001111001 | 100100011000110 | 1100010101011 | 100100100101100 | 1100011011101 | 100100110000110 |
| 1100001001000 | 100100001101101 | 1100001111010 | 100100011001000 | 1100010101100 | 100100100101101 | 1100011011110 | 100100110001000 |
| 1100001001001 | 100100010000001 | 1100001111011 | 100100011001001 | 1100010101101 | 100100100110000 | 1100011011111 | 100100110001001 |
| 1100001001010 | 100100010000010 | 1100001111100 | 100100011001010 | 1100010101110 | 100100100110001 | 1100011100000 | 100100110001010 |
| 1100001001011 | 100100010000011 | 1100001111101 | 100100011001011 | 1100010101111 | 100100100110010 | 1100011100001 | 100100110001011 |
| 1100001001100 | 100100010000100 | 1100001111110 | 100100011001100 | 1100010110000 | 100100100110011 | 1100011100010 | 100100110001100 |
| 1100001001101 | 100100010000101 | 1100001111111 | 100100011001101 | 1100010110001 | 100100100110100 | 1100011100011 | 100100110001101 |
| 1100001001110 | 100100010000110 | 1100010000000 | 100100011010000 | 1100010110010 | 100100100110101 | 1100011100100 | 100100110010000 |
| 1100001001111 | 100100010001000 | 1100010000001 | 100100011010001 | 1100010110011 | 100100100110110 | 1100011100101 | 100100110010001 |
| 1100001010000 | 100100010001001 | 1100010000010 | 100100011010010 | 1100010110100 | 100100101000000 | 1100011100110 | 100100110010010 |
| 1100001010001 | 100100010001010 | 1100010000011 | 100100011010011 | 1100010110101 | 100100101000001 | 1100011100111 | 100100110010011 |
| 1100001010010 | 100100010001011 | 1100010000100 | 100100011010100 | 1100010110110 | 100100101000010 | 1100011101000 | 100100110010100 |
| 1100001010011 | 100100010001100 | 1100010000101 | 100100011010101 | 1100010110111 | 100100101000011 | 1100011101001 | 100100110010101 |
| 1100001010100 | 100100010001101 | 1100010000110 | 100100011010110 | 1100010111000 | 100100101000100 | 1100011101010 | 100100110010110 |
| 1100001010101 | 100100010010000 | 1100010000111 | 100100011011000 | 1100010111001 | 100100101000101 | 1100011101011 | 100100110011000 |
| 1100001010110 | 100100010010001 | 1100010001000 | 100100011011001 | 1100010111010 | 100100101000110 | 1100011101100 | 100100110011001 |
| 1100001010111 | 100100010010010 | 1100010001001 | 100100011011010 | 1100010111011 | 100100101001000 | 1100011101101 | 100100110011010 |
| 1100001011000 | 100100010010011 | 1100010001010 | 100100100000001 | 1100010111100 | 100100101001001 | 1100011101110 | 100100110100000 |
| 1100001011001 | 100100010010100 | 1100010001011 | 100100100000010 | 1100010111101 | 100100101001010 | 1100011101111 | 100100110100001 |
| 1100001011010 | 100100010010101 | 1100010001100 | 100100100000011 | 1100010111110 | 100100101001011 | 1100011110000 | 100100110100010 |
| 1100001011011 | 100100010010110 | 1100010001101 | 100100100000100 | 1100010111111 | 100100101001100 | 1100011110001 | 100100110100011 |
| 1100001011100 | 100100010011000 | 1100010001110 | 100100100000101 | 1100011000000 | 100100101001101 | 1100011110010 | 100100110100100 |
| 1100001011101 | 100100010011001 | 1100010001111 | 100100100000110 | 1100011000001 | 100100101010000 | 1100011110011 | 100100110100101 |
| 1100001011110 | 100100010011010 | 1100010010000 | 100100100001000 | 1100011000010 | 100100101010001 | 1100011110100 | 100100110100110 |
| 1100001011111 | 100100010100000 | 1100010010001 | 100100100001001 | 1100011000011 | 100100101010010 | 1100011110101 | 100100110101000 |
| 1100001100000 | 100100010100001 | 1100010010010 | 100100100001010 | 1100011000100 | 100100101010011 | 1100011110110 | 100100110101001 |
| 1100001100001 | 100100010100010 | 1100010010011 | 100100100001011 | 1100011000101 | 100100101010100 | 1100011110111 | 100100110101010 |
| 1100001100010 | 100100010100011 | 1100010010100 | 100100100001100 | 1100011000110 | 100100101010101 | 1100011111000 | 100100110101011 |
| 1100001100011 | 100100010100100 | 1100010010101 | 100100100001101 | 1100011000111 | 100100101010110 | 1100011111001 | 100100110101100 |
| 1100001100100 | 100100010100101 | 1100010010110 | 100100100010000 | 1100011001000 | 100100101011000 | 1100011111010 | 100100110101101 |
| 1100001100101 | 100100010100110 | 1100010010111 | 100100100010001 | 1100011001001 | 100100101011001 | 1100011111011 | 100100110110000 |
| 1100001100110 | 100100010101000 | 1100010011000 | 100100100010010 | 1100011001010 | 100100101011010 | 1100011111100 | 100100110110001 |
| 1100001100111 | 100100010101001 | 1100010011001 | 100100100010011 | 1100011001011 | 100100101100000 | 1100011111101 | 100100110110010 |
| 1100001101000 | 100100010101010 | 1100010011010 | 100100100010100 | 1100011001100 | 100100101100001 | 1100011111110 | 100100110110011 |
| 1100001101001 | 100100010101011 | 1100010011011 | 100100100010101 | 1100011001101 | 100100101100010 | 1100011111111 | 100100110110100 |

FIG. 12G

| Source | Codeword | Source | Codeword | Source | Codeword | Source | Codeword |
|---|---|---|---|---|---|---|---|
| 1100100000000 | 100100110110101 | 1100100110010 | 100101001001000 | 1100101100100 | 100101010011010 | 1100110010110 | 100101100001000 |
| 1100100000001 | 100100110110110 | 1100100110011 | 100101001001001 | 1100101100101 | 100101010100000 | 1100110010111 | 100101100001001 |
| 1100100000010 | 100101000000010 | 1100100110100 | 100101001001010 | 1100101100110 | 100101010100001 | 1100110011000 | 100101100001010 |
| 1100100000011 | 100101000000011 | 1100100110101 | 100101001001011 | 1100101100111 | 100101010100010 | 1100110011001 | 100101100001011 |
| 1100100000100 | 100101000000100 | 1100100110110 | 100101001001100 | 1100101101000 | 100101010100011 | 1100110011010 | 100101100001100 |
| 1100100000101 | 100101000000101 | 1100100110111 | 100101001001101 | 1100101101001 | 100101010100100 | 1100110011011 | 100101100001101 |
| 1100100000110 | 100101000000110 | 1100100111000 | 100101001010000 | 1100101101010 | 100101010100101 | 1100110011100 | 100101100010000 |
| 1100100000111 | 100101000001000 | 1100100111001 | 100101001010001 | 1100101101011 | 100101010100110 | 1100110011101 | 100101100010001 |
| 1100100001000 | 100101000001001 | 1100100111010 | 100101001010010 | 1100101101100 | 100101010101000 | 1100110011110 | 100101100010010 |
| 1100100001001 | 100101000001010 | 1100100111011 | 100101001010011 | 1100101101101 | 100101010101001 | 1100110011111 | 100101100010011 |
| 1100100001010 | 100101000001011 | 1100100111100 | 100101001010100 | 1100101101110 | 100101010101010 | 1100110100000 | 100101100010100 |
| 1100100001011 | 100101000001100 | 1100100111101 | 100101001010101 | 1100101101111 | 100101010101011 | 1100110100001 | 100101100010101 |
| 1100100001100 | 100101000001101 | 1100100111110 | 100101001010110 | 1100101110000 | 100101010101100 | 1100110100010 | 100101100010110 |
| 1100100001101 | 100101000010000 | 1100100111111 | 100101001011000 | 1100101110001 | 100101010101101 | 1100110100011 | 100101100011000 |
| 1100100001110 | 100101000010001 | 1100101000000 | 100101001011001 | 1100101110010 | 100101010110000 | 1100110100100 | 100101100011001 |
| 1100100001111 | 100101000010010 | 1100101000001 | 100101001011010 | 1100101110011 | 100101010110001 | 1100110100101 | 100101100011010 |
| 1100100010000 | 100101000010011 | 1100101000010 | 100101001100000 | 1100101110100 | 100101010110010 | 1100110100110 | 100101100100000 |
| 1100100010001 | 100101000010100 | 1100101000011 | 100101001100001 | 1100101110101 | 100101010110011 | 1100110100111 | 100101100100001 |
| 1100100010010 | 100101000010101 | 1100101000100 | 100101001100010 | 1100101110110 | 100101010110100 | 1100110101000 | 100101100100010 |
| 1100100010011 | 100101000010110 | 1100101000101 | 100101001100011 | 1100101110111 | 100101010110101 | 1100110101001 | 100101100100011 |
| 1100100010100 | 100101000011000 | 1100101000110 | 100101001100100 | 1100101111000 | 100101010110110 | 1100110101010 | 100101100100100 |
| 1100100010101 | 100101000011001 | 1100101000111 | 100101001100101 | 1100101111001 | 100101011000000 | 1100110101011 | 100101100100101 |
| 1100100010110 | 100101000011010 | 1100101001000 | 100101001100110 | 1100101111010 | 100101011000001 | 1100110101100 | 100101100100110 |
| 1100100010111 | 100101000100000 | 1100101001001 | 100101001101000 | 1100101111011 | 100101011000010 | 1100110101101 | 100101100101000 |
| 1100100011000 | 100101000100001 | 1100101001010 | 100101001101001 | 1100101111100 | 100101011000011 | 1100110101110 | 100101100101001 |
| 1100100011001 | 100101000100010 | 1100101001011 | 100101001101010 | 1100101111101 | 100101011000100 | 1100110101111 | 100101100101010 |
| 1100100011010 | 100101000100011 | 1100101001100 | 100101001101011 | 1100101111110 | 100101011000101 | 1100110110000 | 100101100101011 |
| 1100100011011 | 100101000100100 | 1100101001101 | 100101001101100 | 1100101111111 | 100101011000110 | 1100110110001 | 100101100101100 |
| 1100100011100 | 100101000100101 | 1100101001110 | 100101001101101 | 1100110000000 | 100101011001000 | 1100110110010 | 100101100101101 |
| 1100100011101 | 100101000100110 | 1100101001111 | 100101010000001 | 1100110000001 | 100101011001001 | 1100110110011 | 100101100110000 |
| 1100100011110 | 100101000101000 | 1100101010000 | 100101010000010 | 1100110000010 | 100101011001010 | 1100110110100 | 100101100110001 |
| 1100100011111 | 100101000101001 | 1100101010001 | 100101010000011 | 1100110000011 | 100101011001011 | 1100110110101 | 100101100110010 |
| 1100100100000 | 100101000101010 | 1100101010010 | 100101010000100 | 1100110000100 | 100101011001100 | 1100110110110 | 100101100110011 |
| 1100100100001 | 100101000101011 | 1100101010011 | 100101010000101 | 1100110000101 | 100101011001101 | 1100110110111 | 100101100110100 |
| 1100100100010 | 100101000101100 | 1100101010100 | 100101010000110 | 1100110000110 | 100101011010000 | 1100110111000 | 100101100110101 |
| 1100100100011 | 100101000101101 | 1100101010101 | 100101010001000 | 1100110000111 | 100101011010001 | 1100110111001 | 100101100110110 |
| 1100100100100 | 100101000110000 | 1100101010110 | 100101010001001 | 1100110001000 | 100101011010010 | 1100110111010 | 100101101000000 |
| 1100100100101 | 100101000110001 | 1100101010111 | 100101010001010 | 1100110001001 | 100101011010011 | 1100110111011 | 100101101000001 |
| 1100100100110 | 100101000110010 | 1100101011000 | 100101010001011 | 1100110001010 | 100101011010100 | 1100110111100 | 100101101000010 |
| 1100100100111 | 100101000110011 | 1100101011001 | 100101010001100 | 1100110001011 | 100101011010101 | 1100110111101 | 100101101000011 |
| 1100100101000 | 100101000110100 | 1100101011010 | 100101010001101 | 1100110001100 | 100101011010110 | 1100110111110 | 100101101000100 |
| 1100100101001 | 100101000110101 | 1100101011011 | 100101010010000 | 1100110001101 | 100101011011000 | 1100110111111 | 100101101000101 |
| 1100100101010 | 100101000110110 | 1100101011100 | 100101010010001 | 1100110001110 | 100101011011001 | 1100111000000 | 100101101000110 |
| 1100100101011 | 100101001000000 | 1100101011101 | 100101010010010 | 1100110001111 | 100101011011010 | 1100111000001 | 100101101001000 |
| 1100100101100 | 100101001000001 | 1100101011110 | 100101010010011 | 1100110010000 | 100101100000001 | 1100111000010 | 100101101001001 |
| 1100100101101 | 100101001000010 | 1100101011111 | 100101010010100 | 1100110010001 | 100101100000010 | 1100111000011 | 100101101001010 |
| 1100100101110 | 100101001000011 | 1100101100000 | 100101010010101 | 1100110010010 | 100101100000011 | 1100111000100 | 100101101001011 |
| 1100100101111 | 100101001000100 | 1100101100001 | 100101010010110 | 1100110010011 | 100101100000100 | 1100111000101 | 100101101001100 |
| 1100100110000 | 100101001000101 | 1100101100010 | 100101010011000 | 1100110010100 | 100101100000101 | 1100111000110 | 100101101001101 |
| 1100100110001 | 100101001000110 | 1100101100011 | 100101010011001 | 1100110010101 | 100101100000110 | 1100111000111 | 100101101010000 |

FIG. 12H

| Source | Codeword | Source | Codeword | Source | Codeword | Source | Codeword |
|---|---|---|---|---|---|---|---|
| 1100111001000 | 100101101010001 | 1100111111010 | 100110000101010 | 1101000101100 | 100110010000100 | 1101001011110 | 100110011001100 |
| 1100111001001 | 100101101010010 | 1100111111011 | 100110000101011 | 1101000101101 | 100110010000101 | 1101001011111 | 100110011001101 |
| 1100111001010 | 100101101010011 | 1100111111100 | 100110000101100 | 1101000101110 | 100110010000110 | 1101001100000 | 100110011010000 |
| 1100111001011 | 100101101010100 | 1100111111101 | 100110000101101 | 1101000101111 | 100110010001000 | 1101001100001 | 100110011010001 |
| 1100111001100 | 100101101010101 | 1100111111110 | 100110000110000 | 1101000110000 | 100110010001001 | 1101001100010 | 100110011010010 |
| 1100111001101 | 100101101010110 | 1100111111111 | 100110000110001 | 1101000110001 | 100110010001010 | 1101001100011 | 100110011010011 |
| 1100111001110 | 100101101011000 | 1101000000000 | 100110000110010 | 1101000110010 | 100110010001011 | 1101001100100 | 100110011010100 |
| 1100111001111 | 100101101011001 | 1101000000001 | 100110000110011 | 1101000110011 | 100110010001100 | 1101001100101 | 100110011010101 |
| 1100111010000 | 100101101011010 | 1101000000010 | 100110000110100 | 1101000110100 | 100110010001101 | 1101001100110 | 100110011010110 |
| 1100111010001 | 100101101100000 | 1101000000011 | 100110000110101 | 1101000110101 | 100110010010000 | 1101001100111 | 100110011011000 |
| 1100111010010 | 100101101100001 | 1101000000100 | 100110000110110 | 1101000110110 | 100110010010001 | 1101001101000 | 100110011011001 |
| 1100111010011 | 100101101100010 | 1101000000101 | 100110001000000 | 1101000110111 | 100110010010010 | 1101001101001 | 100110011011010 |
| 1100111010100 | 100101101100011 | 1101000000110 | 100110001000001 | 1101000111000 | 100110010010011 | 1101001101010 | 100110100000001 |
| 1100111010101 | 100101101100100 | 1101000000111 | 100110001000010 | 1101000111001 | 100110010010100 | 1101001101011 | 100110100000010 |
| 1100111010110 | 100101101100101 | 1101000001000 | 100110001000011 | 1101000111010 | 100110010010101 | 1101001101100 | 100110100000011 |
| 1100111010111 | 100101101100110 | 1101000001001 | 100110001000100 | 1101000111011 | 100110010010110 | 1101001101101 | 100110100000100 |
| 1100111011000 | 100101101101000 | 1101000001010 | 100110001000101 | 1101000111100 | 100110010011000 | 1101001101110 | 100110100000101 |
| 1100111011001 | 100101101101001 | 1101000001011 | 100110001000110 | 1101000111101 | 100110010011001 | 1101001101111 | 100110100000110 |
| 1100111011010 | 100101101101010 | 1101000001100 | 100110001001000 | 1101000111110 | 100110010011010 | 1101001110000 | 100110100001000 |
| 1100111011011 | 100101101101011 | 1101000001101 | 100110001001001 | 1101000111111 | 100110010100000 | 1101001110001 | 100110100001001 |
| 1100111011100 | 100101101101100 | 1101000001110 | 100110001001010 | 1101001000000 | 100110010100001 | 1101001110010 | 100110100001010 |
| 1100111011101 | 100101101101101 | 1101000001111 | 100110001001011 | 1101001000001 | 100110010100010 | 1101001110011 | 100110100001011 |
| 1100111011110 | 100110000000100 | 1101000010000 | 100110001001100 | 1101001000010 | 100110010100011 | 1101001110100 | 100110100001100 |
| 1100111011111 | 100110000000101 | 1101000010001 | 100110001001101 | 1101001000011 | 100110010100100 | 1101001110101 | 100110100001101 |
| 1100111100000 | 100110000000110 | 1101000010010 | 100110001010000 | 1101001000100 | 100110010100101 | 1101001110110 | 100110100010000 |
| 1100111100001 | 100110000001000 | 1101000010011 | 100110001010001 | 1101001000101 | 100110010100110 | 1101001110111 | 100110100010001 |
| 1100111100010 | 100110000001001 | 1101000010100 | 100110001010010 | 1101001000110 | 100110010101000 | 1101001111000 | 100110100010010 |
| 1100111100011 | 100110000001010 | 1101000010101 | 100110001010011 | 1101001000111 | 100110010101001 | 1101001111001 | 100110100010011 |
| 1100111100100 | 100110000001011 | 1101000010110 | 100110001010100 | 1101001001000 | 100110010101010 | 1101001111010 | 100110100010100 |
| 1100111100101 | 100110000001100 | 1101000010111 | 100110001010101 | 1101001001001 | 100110010101011 | 1101001111011 | 100110100010101 |
| 1100111100110 | 100110000001101 | 1101000011000 | 100110001010110 | 1101001001010 | 100110010101100 | 1101001111100 | 100110100010110 |
| 1100111100111 | 100110000010000 | 1101000011001 | 100110001011000 | 1101001001011 | 100110010101101 | 1101001111101 | 100110100011000 |
| 1100111101000 | 100110000010001 | 1101000011010 | 100110001011001 | 1101001001100 | 100110010110000 | 1101001111110 | 100110100011001 |
| 1100111101001 | 100110000010010 | 1101000011011 | 100110001011010 | 1101001001101 | 100110010110001 | 1101001111111 | 100110100011010 |
| 1100111101010 | 100110000010011 | 1101000011100 | 100110001100000 | 1101001001110 | 100110010110010 | 1101010000000 | 100110100100000 |
| 1100111101011 | 100110000010100 | 1101000011101 | 100110001100001 | 1101001001111 | 100110010110011 | 1101010000001 | 100110100100001 |
| 1100111101100 | 100110000010101 | 1101000011110 | 100110001100010 | 1101001010000 | 100110010110100 | 1101010000010 | 100110100100010 |
| 1100111101101 | 100110000010110 | 1101000011111 | 100110001100011 | 1101001010001 | 100110010110101 | 1101010000011 | 100110100100011 |
| 1100111101110 | 100110000011000 | 1101000100000 | 100110001100100 | 1101001010010 | 100110010110110 | 1101010000100 | 100110100100100 |
| 1100111101111 | 100110000011001 | 1101000100001 | 100110001100101 | 1101001010011 | 100110011000000 | 1101010000101 | 100110100100101 |
| 1100111110000 | 100110000011010 | 1101000100010 | 100110001100110 | 1101001010100 | 100110011000001 | 1101010000110 | 100110100100110 |
| 1100111110001 | 100110000100000 | 1101000100011 | 100110001101000 | 1101001010101 | 100110011000010 | 1101010000111 | 100110100101000 |
| 1100111110010 | 100110000100001 | 1101000100100 | 100110001101001 | 1101001010110 | 100110011000011 | 1101010001000 | 100110100101001 |
| 1100111110011 | 100110000100010 | 1101000100101 | 100110001101010 | 1101001010111 | 100110011000100 | 1101010001001 | 100110100101010 |
| 1100111110100 | 100110000100011 | 1101000100110 | 100110001101011 | 1101001011000 | 100110011000101 | 1101010001010 | 100110100101011 |
| 1100111110101 | 100110000100100 | 1101000100111 | 100110001101100 | 1101001011001 | 100110011000110 | 1101010001011 | 100110100101100 |
| 1100111110110 | 100110000100101 | 1101000101000 | 100110001101101 | 1101001011010 | 100110011001000 | 1101010001100 | 100110100101101 |
| 1100111110111 | 100110000100110 | 1101000101001 | 100110010000001 | 1101001011011 | 100110011001001 | 1101010001101 | 100110100110000 |
| 1100111111000 | 100110000101000 | 1101000101010 | 100110010000010 | 1101001011100 | 100110011001010 | 1101010001110 | 100110100110001 |
| 1100111111001 | 100110000101001 | 1101000101011 | 100110010000011 | 1101001011101 | 100110011001011 | 1101010001111 | 100110100110010 |

FIG. 12I

| Source | Codeword | Source | Codeword | Source | Codeword | Source | Codeword |
|---|---|---|---|---|---|---|---|
| 1101010010000 | 100110100110011 | 1101011000010 | 100110110001100 | 1101011110100 | 101000000101001 | 1101100100110 | 101000010000011 |
| 1101010010001 | 100110100110100 | 1101011000011 | 100110110001101 | 1101011110101 | 101000000101010 | 1101100100111 | 101000010000100 |
| 1101010010010 | 100110100110101 | 1101011000100 | 100110110010000 | 1101011110110 | 101000000101011 | 1101100101000 | 101000010000101 |
| 1101010010011 | 100110100110110 | 1101011000101 | 100110110010001 | 1101011110111 | 101000000101100 | 1101100101001 | 101000010000110 |
| 1101010010100 | 100110101000000 | 1101011000110 | 100110110010010 | 1101011111000 | 101000000101101 | 1101100101010 | 101000010001000 |
| 1101010010101 | 100110101000001 | 1101011000111 | 100110110010011 | 1101011111001 | 101000000110000 | 1101100101011 | 101000010001001 |
| 1101010010110 | 100110101000010 | 1101011001000 | 100110110010100 | 1101011111010 | 101000000110001 | 1101100101100 | 101000010001010 |
| 1101010010111 | 100110101000011 | 1101011001001 | 100110110010101 | 1101011111011 | 101000000110010 | 1101100101101 | 101000010001011 |
| 1101010011000 | 100110101000100 | 1101011001010 | 100110110010110 | 1101011111100 | 101000000110011 | 1101100101110 | 101000010001100 |
| 1101010011001 | 100110101000101 | 1101011001011 | 100110110011000 | 1101011111101 | 101000000110100 | 1101100101111 | 101000010001101 |
| 1101010011010 | 100110101000110 | 1101011001100 | 100110110011001 | 1101011111110 | 101000000110101 | 1101100110000 | 101000010010000 |
| 1101010011011 | 100110101001000 | 1101011001101 | 100110110011010 | 1101011111111 | 101000000110110 | 1101100110001 | 101000010010001 |
| 1101010011100 | 100110101001001 | 1101011001110 | 100110110100000 | 1101100000000 | 101000001000000 | 1101100110010 | 101000010010010 |
| 1101010011101 | 100110101001010 | 1101011001111 | 100110110100001 | 1101100000001 | 101000001000001 | 1101100110011 | 101000010010011 |
| 1101010011110 | 100110101001011 | 1101011010000 | 100110110100010 | 1101100000010 | 101000001000010 | 1101100110100 | 101000010010100 |
| 1101010011111 | 100110101001100 | 1101011010001 | 100110110100011 | 1101100000011 | 101000001000011 | 1101100110101 | 101000010010101 |
| 1101010100000 | 100110101001101 | 1101011010010 | 100110110100100 | 1101100000100 | 101000001000100 | 1101100110110 | 101000010010110 |
| 1101010100001 | 100110101010000 | 1101011010011 | 100110110100101 | 1101100000101 | 101000001000101 | 1101100110111 | 101000010011000 |
| 1101010100010 | 100110101010001 | 1101011010100 | 100110110100110 | 1101100000110 | 101000001000110 | 1101100111000 | 101000010011001 |
| 1101010100011 | 100110101010010 | 1101011010101 | 100110110101000 | 1101100000111 | 101000001001000 | 1101100111001 | 101000010011010 |
| 1101010100100 | 100110101010011 | 1101011010110 | 100110110101001 | 1101100001000 | 101000001001001 | 1101100111010 | 101000010100000 |
| 1101010100101 | 100110101010100 | 1101011010111 | 100110110101010 | 1101100001001 | 101000001001010 | 1101100111011 | 101000010100001 |
| 1101010100110 | 100110101010101 | 1101011011000 | 100110110101011 | 1101100001010 | 101000001001011 | 1101100111100 | 101000010100010 |
| 1101010100111 | 100110101010110 | 1101011011001 | 100110110101100 | 1101100001011 | 101000001001100 | 1101100111101 | 101000010100011 |
| 1101010101000 | 100110101011000 | 1101011011010 | 100110110101101 | 1101100001100 | 101000001001101 | 1101100111110 | 101000010100100 |
| 1101010101001 | 100110101011001 | 1101011011011 | 100110110110000 | 1101100001101 | 101000001010000 | 1101100111111 | 101000010100101 |
| 1101010101010 | 100110101011010 | 1101011011100 | 100110110110001 | 1101100001110 | 101000001010001 | 1101101000000 | 101000010100110 |
| 1101010101011 | 100110101100000 | 1101011011101 | 100110110110010 | 1101100001111 | 101000001010010 | 1101101000001 | 101000010101000 |
| 1101010101100 | 100110101100001 | 1101011011110 | 100110110110011 | 1101100010000 | 101000001010011 | 1101101000010 | 101000010101001 |
| 1101010101101 | 100110101100010 | 1101011011111 | 100110110110100 | 1101100010001 | 101000001010100 | 1101101000011 | 101000010101010 |
| 1101010101110 | 100110101100011 | 1101011100000 | 100110110110101 | 1101100010010 | 101000001010101 | 1101101000100 | 101000010101011 |
| 1101010101111 | 100110101100100 | 1101011100001 | 100110110110110 | 1101100010011 | 101000001010110 | 1101101000101 | 101000010101100 |
| 1101010110000 | 100110101100101 | 1101011100010 | 101000000010000 | 1101100010100 | 101000001011000 | 1101101000110 | 101000010101101 |
| 1101010110001 | 100110101100110 | 1101011100011 | 101000000010001 | 1101100010101 | 101000001011001 | 1101101000111 | 101000010110000 |
| 1101010110010 | 100110101101000 | 1101011100100 | 101000000010010 | 1101100010110 | 101000001011010 | 1101101001000 | 101000010110001 |
| 1101010110011 | 100110101101001 | 1101011100101 | 101000000010011 | 1101100010111 | 101000001100000 | 1101101001001 | 101000010110010 |
| 1101010110100 | 100110101101010 | 1101011100110 | 101000000010100 | 1101100011000 | 101000001100001 | 1101101001010 | 101000010110011 |
| 1101010110101 | 100110101101011 | 1101011100111 | 101000000010101 | 1101100011001 | 101000001100010 | 1101101001011 | 101000010110100 |
| 1101010110110 | 100110101101100 | 1101011101000 | 101000000010110 | 1101100011010 | 101000001100011 | 1101101001100 | 101000010110101 |
| 1101010110111 | 100110101101101 | 1101011101001 | 101000000011000 | 1101100011011 | 101000001100100 | 1101101001101 | 101000010110110 |
| 1101010111000 | 100110110000001 | 1101011101010 | 101000000011001 | 1101100011100 | 101000001100101 | 1101101001110 | 101000011000000 |
| 1101010111001 | 100110110000010 | 1101011101011 | 101000000011010 | 1101100011101 | 101000001100110 | 1101101001111 | 101000011000001 |
| 1101010111010 | 100110110000011 | 1101011101100 | 101000000100000 | 1101100011110 | 101000001101000 | 1101101010000 | 101000011000010 |
| 1101010111011 | 100110110000100 | 1101011101101 | 101000000100001 | 1101100011111 | 101000001101001 | 1101101010001 | 101000011000011 |
| 1101010111100 | 100110110000101 | 1101011101110 | 101000000100010 | 1101100100000 | 101000001101010 | 1101101010010 | 101000011000100 |
| 1101010111101 | 100110110000110 | 1101011101111 | 101000000100011 | 1101100100001 | 101000001101011 | 1101101010011 | 101000011000101 |
| 1101010111110 | 100110110001000 | 1101011110000 | 101000000100100 | 1101100100010 | 101000001101100 | 1101101010100 | 101000011000110 |
| 1101010111111 | 100110110001001 | 1101011110001 | 101000000100101 | 1101100100011 | 101000001101101 | 1101101010101 | 101000011001000 |
| 1101011000000 | 100110110001010 | 1101011110010 | 101000000100110 | 1101100100100 | 101000010000001 | 1101101010110 | 101000011001001 |
| 1101011000001 | 100110110001011 | 1101011110011 | 101000000101000 | 1101100100101 | 101000010000010 | 1101101010111 | 101000011001010 |

FIG. 12J

| Source | Codeword | Source | Codeword | Source | Codeword | Source | Codeword |
|---|---|---|---|---|---|---|---|
| 1101101011000 | 101000011001011 | 1101110001010 | 101000100110010 | 1101110111100 | 101000110001011 | 1101111101110 | 101001000010110 |
| 1101101011001 | 101000011001100 | 1101110001011 | 101000100110011 | 1101110111101 | 101000110001100 | 1101111101111 | 101001000011000 |
| 1101101011010 | 101000011001101 | 1101110001100 | 101000100110100 | 1101110111110 | 101000110001101 | 1101111110000 | 101001000011001 |
| 1101101011011 | 101000011010000 | 1101110001101 | 101000100110101 | 1101110111111 | 101000110010000 | 1101111110001 | 101001000011010 |
| 1101101011100 | 101000011010001 | 1101110001110 | 101000100110110 | 1101111000000 | 101000110010001 | 1101111110010 | 101001000100000 |
| 1101101011101 | 101000011010010 | 1101110001111 | 101000101000000 | 1101111000001 | 101000110010010 | 1101111110011 | 101001000100001 |
| 1101101011110 | 101000011010011 | 1101110010000 | 101000101000001 | 1101111000010 | 101000110010011 | 1101111110100 | 101001000100010 |
| 1101101011111 | 101000011010100 | 1101110010001 | 101000101000010 | 1101111000011 | 101000110010100 | 1101111110101 | 101001000100011 |
| 1101101100000 | 101000011010101 | 1101110010010 | 101000101000011 | 1101111000100 | 101000110010101 | 1101111110110 | 101001000100100 |
| 1101101100001 | 101000011010110 | 1101110010011 | 101000101000100 | 1101111000101 | 101000110010110 | 1101111110111 | 101001000100101 |
| 1101101100010 | 101000011011000 | 1101110010100 | 101000101000101 | 1101111000110 | 101000110011000 | 1101111111000 | 101001000100110 |
| 1101101100011 | 101000011011001 | 1101110010101 | 101000101000110 | 1101111000111 | 101000110011001 | 1101111111001 | 101001000101000 |
| 1101101100100 | 101000011011010 | 1101110010110 | 101000101001000 | 1101111001000 | 101000110011010 | 1101111111010 | 101001000101001 |
| 1101101100101 | 101000100000001 | 1101110010111 | 101000101001001 | 1101111001001 | 101000110100000 | 1101111111011 | 101001000101010 |
| 1101101100110 | 101000100000010 | 1101110011000 | 101000101001010 | 1101111001010 | 101000110100001 | 1101111111100 | 101001000101011 |
| 1101101100111 | 101000100000011 | 1101110011001 | 101000101001011 | 1101111001011 | 101000110100010 | 1101111111101 | 101001000101100 |
| 1101101101000 | 101000100000100 | 1101110011010 | 101000101001100 | 1101111001100 | 101000110100011 | 1101111111110 | 101001000101101 |
| 1101101101001 | 101000100000101 | 1101110011011 | 101000101001101 | 1101111001101 | 101000110100100 | 1101111111111 | 101001000110000 |
| 1101101101010 | 101000100000110 | 1101110011100 | 101000101010000 | 1101111001110 | 101000110100101 | 1110000000000 | 101001000110001 |
| 1101101101011 | 101000100001000 | 1101110011101 | 101000101010001 | 1101111001111 | 101000110100110 | 1110000000001 | 101001000110010 |
| 1101101101100 | 101000100001001 | 1101110011110 | 101000101010010 | 1101111010000 | 101000110101000 | 1110000000010 | 101001000110011 |
| 1101101101101 | 101000100001010 | 1101110011111 | 101000101010011 | 1101111010001 | 101000110101001 | 1110000000011 | 101001000110100 |
| 1101101101110 | 101000100001011 | 1101110100000 | 101000101010100 | 1101111010010 | 101000110101010 | 1110000000100 | 101001000110101 |
| 1101101101111 | 101000100001100 | 1101110100001 | 101000101010101 | 1101111010011 | 101000110101011 | 1110000000101 | 101001000110110 |
| 1101101110000 | 101000100001101 | 1101110100010 | 101000101010110 | 1101111010100 | 101000110101100 | 1110000000110 | 101001001000000 |
| 1101101110001 | 101000100010000 | 1101110100011 | 101000101011000 | 1101111010101 | 101000110101101 | 1110000000111 | 101001001000001 |
| 1101101110010 | 101000100010001 | 1101110100100 | 101000101011001 | 1101111010110 | 101000110110000 | 1110000001000 | 101001001000010 |
| 1101101110011 | 101000100010010 | 1101110100101 | 101000101011010 | 1101111010111 | 101000110110001 | 1110000001001 | 101001001000011 |
| 1101101110100 | 101000100010011 | 1101110100110 | 101000101100000 | 1101111011000 | 101000110110010 | 1110000001010 | 101001001000100 |
| 1101101110101 | 101000100010100 | 1101110100111 | 101000101100001 | 1101111011001 | 101000110110011 | 1110000001011 | 101001001000101 |
| 1101101110110 | 101000100010101 | 1101110101000 | 101000101100010 | 1101111011010 | 101000110110100 | 1110000001100 | 101001001000110 |
| 1101101110111 | 101000100010110 | 1101110101001 | 101000101100011 | 1101111011011 | 101000110110101 | 1110000001101 | 101001001001000 |
| 1101101111000 | 101000100011000 | 1101110101010 | 101000101100100 | 1101111011100 | 101000110110110 | 1110000001110 | 101001001001001 |
| 1101101111001 | 101000100011001 | 1101110101011 | 101000101100101 | 1101111011101 | 101001000000010 | 1110000001111 | 101001001001010 |
| 1101101111010 | 101000100011010 | 1101110101100 | 101000101100110 | 1101111011110 | 101001000000011 | 1110000010000 | 101001001001011 |
| 1101101111011 | 101000100100000 | 1101110101101 | 101000101101000 | 1101111011111 | 101001000000100 | 1110000010001 | 101001001001100 |
| 1101101111100 | 101000100100001 | 1101110101110 | 101000101101001 | 1101111100000 | 101001000000101 | 1110000010010 | 101001001001101 |
| 1101101111101 | 101000100100010 | 1101110101111 | 101000101101010 | 1101111100001 | 101001000000110 | 1110000010011 | 101001001010000 |
| 1101101111110 | 101000100100011 | 1101110110000 | 101000101101011 | 1101111100010 | 101001000001000 | 1110000010100 | 101001001010001 |
| 1101101111111 | 101000100100100 | 1101110110001 | 101000101101100 | 1101111100011 | 101001000001001 | 1110000010101 | 101001001010010 |
| 1101110000000 | 101000100100101 | 1101110110010 | 101000101101101 | 1101111100100 | 101001000001010 | 1110000010110 | 101001001010011 |
| 1101110000001 | 101000100100110 | 1101110110011 | 101000110000001 | 1101111100101 | 101001000001011 | 1110000010111 | 101001001010100 |
| 1101110000010 | 101000100101000 | 1101110110100 | 101000110000010 | 1101111100110 | 101001000001100 | 1110000011000 | 101001001010101 |
| 1101110000011 | 101000100101001 | 1101110110101 | 101000110000011 | 1101111100111 | 101001000001101 | 1110000011001 | 101001001010110 |
| 1101110000100 | 101000100101010 | 1101110110110 | 101000110000100 | 1101111101000 | 101001000010000 | 1110000011010 | 101001001011000 |
| 1101110000101 | 101000100101011 | 1101110110111 | 101000110000101 | 1101111101001 | 101001000010001 | 1110000011011 | 101001001011001 |
| 1101110000110 | 101000100101100 | 1101110111000 | 101000110000110 | 1101111101010 | 101001000010010 | 1110000011100 | 101001001011010 |
| 1101110000111 | 101000100101101 | 1101110111001 | 101000110001000 | 1101111101011 | 101001000010011 | 1110000011101 | 101001001100000 |
| 1101110001000 | 101000100110000 | 1101110111010 | 101000110001001 | 1101111101100 | 101001000010100 | 1110000011110 | 101001001100001 |
| 1101110001001 | 101000100110001 | 1101110111011 | 101000110001010 | 1101111101101 | 101001000010101 | 1110000011111 | 101001001100010 |

FIG. 12K

| Source | Codeword | Source | Codeword | Source | Codeword | Source | Codeword |
|---|---|---|---|---|---|---|---|
| 1110000100000 | 101001001100011 | 1110001010010 | 101001010110101 | 1110010000100 | 101001100100011 | 1110010110110 | 101001101101011 |
| 1110000100001 | 101001001100100 | 1110001010011 | 101001010110110 | 1110010000101 | 101001100100100 | 1110010110111 | 101001101101100 |
| 1110000100010 | 101001001100101 | 1110001010100 | 101001011000000 | 1110010000110 | 101001100100101 | 1110010111000 | 101001101101101 |
| 1110000100011 | 101001001100110 | 1110001010101 | 101001011000001 | 1110010000111 | 101001100100110 | 1110010111001 | 101010000000100 |
| 1110000100100 | 101001001101000 | 1110001010110 | 101001011000010 | 1110010001000 | 101001100101000 | 1110010111010 | 101010000000101 |
| 1110000100101 | 101001001101001 | 1110001010111 | 101001011000011 | 1110010001001 | 101001100101001 | 1110010111011 | 101010000000110 |
| 1110000100110 | 101001001101010 | 1110001011000 | 101001011000100 | 1110010001010 | 101001100101010 | 1110010111100 | 101010000001000 |
| 1110000100111 | 101001001101011 | 1110001011001 | 101001011000101 | 1110010001011 | 101001100101011 | 1110010111101 | 101010000001001 |
| 1110000101000 | 101001001101100 | 1110001011010 | 101001011000110 | 1110010001100 | 101001100101100 | 1110010111110 | 101010000001010 |
| 1110000101001 | 101001001101101 | 1110001011011 | 101001011001000 | 1110010001101 | 101001100101101 | 1110010111111 | 101010000001011 |
| 1110000101010 | 101001010000001 | 1110001011100 | 101001011001001 | 1110010001110 | 101001100110000 | 1110011000000 | 101010000001100 |
| 1110000101011 | 101001010000010 | 1110001011101 | 101001011001010 | 1110010001111 | 101001100110001 | 1110011000001 | 101010000001101 |
| 1110000101100 | 101001010000011 | 1110001011110 | 101001011001011 | 1110010010000 | 101001100110010 | 1110011000010 | 101010000010000 |
| 1110000101101 | 101001010000100 | 1110001011111 | 101001011001100 | 1110010010001 | 101001100110011 | 1110011000011 | 101010000010001 |
| 1110000101110 | 101001010000101 | 1110001100000 | 101001011001101 | 1110010010010 | 101001100110100 | 1110011000100 | 101010000010010 |
| 1110000101111 | 101001010000110 | 1110001100001 | 101001011010000 | 1110010010011 | 101001100110101 | 1110011000101 | 101010000010011 |
| 1110000110000 | 101001010001000 | 1110001100010 | 101001011010001 | 1110010010100 | 101001100110110 | 1110011000110 | 101010000010100 |
| 1110000110001 | 101001010001001 | 1110001100011 | 101001011010010 | 1110010010101 | 101001101000000 | 1110011000111 | 101010000010101 |
| 1110000110010 | 101001010001010 | 1110001100100 | 101001011010011 | 1110010010110 | 101001101000001 | 1110011001000 | 101010000010110 |
| 1110000110011 | 101001010001011 | 1110001100101 | 101001011010100 | 1110010010111 | 101001101000010 | 1110011001001 | 101010000011000 |
| 1110000110100 | 101001010001100 | 1110001100110 | 101001011010101 | 1110010011000 | 101001101000011 | 1110011001010 | 101010000011001 |
| 1110000110101 | 101001010001101 | 1110001100111 | 101001011010110 | 1110010011001 | 101001101000100 | 1110011001011 | 101010000011010 |
| 1110000110110 | 101001010010000 | 1110001101000 | 101001011011000 | 1110010011010 | 101001101000101 | 1110011001100 | 101010000100000 |
| 1110000110111 | 101001010010001 | 1110001101001 | 101001011011001 | 1110010011011 | 101001101000110 | 1110011001101 | 101010000100001 |
| 1110000111000 | 101001010010010 | 1110001101010 | 101001011011010 | 1110010011100 | 101001101001000 | 1110011001110 | 101010000100010 |
| 1110000111001 | 101001010010011 | 1110001101011 | 101001100000001 | 1110010011101 | 101001101001001 | 1110011001111 | 101010000100011 |
| 1110000111010 | 101001010010100 | 1110001101100 | 101001100000010 | 1110010011110 | 101001101001010 | 1110011010000 | 101010000100100 |
| 1110000111011 | 101001010010101 | 1110001101101 | 101001100000011 | 1110010011111 | 101001101001011 | 1110011010001 | 101010000100101 |
| 1110000111100 | 101001010010110 | 1110001101110 | 101001100000100 | 1110010100000 | 101001101001100 | 1110011010010 | 101010000100110 |
| 1110000111101 | 101001010011000 | 1110001101111 | 101001100000101 | 1110010100001 | 101001101001101 | 1110011010011 | 101010000101000 |
| 1110000111110 | 101001010011001 | 1110001110000 | 101001100000110 | 1110010100010 | 101001101010000 | 1110011010100 | 101010000101001 |
| 1110000111111 | 101001010011010 | 1110001110001 | 101001100001000 | 1110010100011 | 101001101010001 | 1110011010101 | 101010000101010 |
| 1110001000000 | 101001010100000 | 1110001110010 | 101001100001001 | 1110010100100 | 101001101010010 | 1110011010110 | 101010000101011 |
| 1110001000001 | 101001010100001 | 1110001110011 | 101001100001010 | 1110010100101 | 101001101010011 | 1110011010111 | 101010000101100 |
| 1110001000010 | 101001010100010 | 1110001110100 | 101001100001011 | 1110010100110 | 101001101010100 | 1110011011000 | 101010000101101 |
| 1110001000011 | 101001010100011 | 1110001110101 | 101001100001100 | 1110010100111 | 101001101010101 | 1110011011001 | 101010000110000 |
| 1110001000100 | 101001010100100 | 1110001110110 | 101001100001101 | 1110010101000 | 101001101010110 | 1110011011010 | 101010000110001 |
| 1110001000101 | 101001010100101 | 1110001110111 | 101001100010000 | 1110010101001 | 101001101011000 | 1110011011011 | 101010000110010 |
| 1110001000110 | 101001010100110 | 1110001111000 | 101001100010001 | 1110010101010 | 101001101011001 | 1110011011100 | 101010000110011 |
| 1110001000111 | 101001010101000 | 1110001111001 | 101001100010010 | 1110010101011 | 101001101011010 | 1110011011101 | 101010000110100 |
| 1110001001000 | 101001010101001 | 1110001111010 | 101001100010011 | 1110010101100 | 101001101100000 | 1110011011110 | 101010000110101 |
| 1110001001001 | 101001010101010 | 1110001111011 | 101001100010100 | 1110010101101 | 101001101100001 | 1110011011111 | 101010000110110 |
| 1110001001010 | 101001010101011 | 1110001111100 | 101001100010101 | 1110010101110 | 101001101100010 | 1110011100000 | 101010001000000 |
| 1110001001011 | 101001010101100 | 1110001111101 | 101001100010110 | 1110010101111 | 101001101100011 | 1110011100001 | 101010001000001 |
| 1110001001100 | 101001010101101 | 1110001111110 | 101001100011000 | 1110010110000 | 101001101100100 | 1110011100010 | 101010001000010 |
| 1110001001101 | 101001010110000 | 1110001111111 | 101001100011001 | 1110010110001 | 101001101100101 | 1110011100011 | 101010001000011 |
| 1110001001110 | 101001010110001 | 1110010000000 | 101001100011010 | 1110010110010 | 101001101100110 | 1110011100100 | 101010001000100 |
| 1110001001111 | 101001010110010 | 1110010000001 | 101001100100000 | 1110010110011 | 101001101101000 | 1110011100101 | 101010001000101 |
| 1110001010000 | 101001010110011 | 1110010000010 | 101001100100001 | 1110010110100 | 101001101101001 | 1110011100110 | 101010001000110 |
| 1110001010001 | 101001010110100 | 1110010000011 | 101001100100010 | 1110010110101 | 101001101101010 | 1110011100111 | 101010001001000 |

FIG. 12L

| Source | Codeword | Source | Codeword | Source | Codeword | Source | Codeword |
|---|---|---|---|---|---|---|---|
| 1110011101000 | 101010001001001 | 1110100011010 | 101010010100000 | 1110101001100 | 101010100001001 | 1110101111110 | 101010101010010 |
| 1110011101001 | 101010001001010 | 1110100011011 | 101010010100001 | 1110101001101 | 101010100001010 | 1110101111111 | 101010101010011 |
| 1110011101010 | 101010001001011 | 1110100011100 | 101010010100010 | 1110101001110 | 101010100001011 | 1110110000000 | 101010101010100 |
| 1110011101011 | 101010001001100 | 1110100011101 | 101010010100011 | 1110101001111 | 101010100001100 | 1110110000001 | 101010101010101 |
| 1110011101100 | 101010001001101 | 1110100011110 | 101010010100100 | 1110101010000 | 101010100001101 | 1110110000010 | 101010101010110 |
| 1110011101101 | 101010001010000 | 1110100011111 | 101010010100101 | 1110101010001 | 101010100010000 | 1110110000011 | 101010101011000 |
| 1110011101110 | 101010001010001 | 1110100100000 | 101010010100110 | 1110101010010 | 101010100010001 | 1110110000100 | 101010101011001 |
| 1110011101111 | 101010001010010 | 1110100100001 | 101010010101000 | 1110101010011 | 101010100010010 | 1110110000101 | 101010101011010 |
| 1110011110000 | 101010001010011 | 1110100100010 | 101010010101001 | 1110101010100 | 101010100010011 | 1110110000110 | 101010101100000 |
| 1110011110001 | 101010001010100 | 1110100100011 | 101010010101010 | 1110101010101 | 101010100010100 | 1110110000111 | 101010101100001 |
| 1110011110010 | 101010001010101 | 1110100100100 | 101010010101011 | 1110101010110 | 101010100010101 | 1110110001000 | 101010101100010 |
| 1110011110011 | 101010001010110 | 1110100100101 | 101010010101100 | 1110101010111 | 101010100010110 | 1110110001001 | 101010101100011 |
| 1110011110100 | 101010001011000 | 1110100100110 | 101010010101101 | 1110101011000 | 101010100011000 | 1110110001010 | 101010101100100 |
| 1110011110101 | 101010001011001 | 1110100100111 | 101010010110000 | 1110101011001 | 101010100011001 | 1110110001011 | 101010101100101 |
| 1110011110110 | 101010001011010 | 1110100101000 | 101010010110001 | 1110101011010 | 101010100011010 | 1110110001100 | 101010101100110 |
| 1110011110111 | 101010001100000 | 1110100101001 | 101010010110010 | 1110101011011 | 101010100100000 | 1110110001101 | 101010101101000 |
| 1110011111000 | 101010001100001 | 1110100101010 | 101010010110011 | 1110101011100 | 101010100100001 | 1110110001110 | 101010101101001 |
| 1110011111001 | 101010001100010 | 1110100101011 | 101010010110100 | 1110101011101 | 101010100100010 | 1110110001111 | 101010101101010 |
| 1110011111010 | 101010001100011 | 1110100101100 | 101010010110101 | 1110101011110 | 101010100100011 | 1110110010000 | 101010101101011 |
| 1110011111011 | 101010001100100 | 1110100101101 | 101010010110110 | 1110101011111 | 101010100100100 | 1110110010001 | 101010101101100 |
| 1110011111100 | 101010001100101 | 1110100101110 | 101010011000000 | 1110101100000 | 101010100100101 | 1110110010010 | 101010101101101 |
| 1110011111101 | 101010001100110 | 1110100101111 | 101010011000001 | 1110101100001 | 101010100100110 | 1110110010011 | 101010110000001 |
| 1110011111110 | 101010001101000 | 1110100110000 | 101010011000010 | 1110101100010 | 101010100101000 | 1110110010100 | 101010110000010 |
| 1110011111111 | 101010001101001 | 1110100110001 | 101010011000011 | 1110101100011 | 101010100101001 | 1110110010101 | 101010110000011 |
| 1110100000000 | 101010001101010 | 1110100110010 | 101010011000100 | 1110101100100 | 101010100101010 | 1110110010110 | 101010110000100 |
| 1110100000001 | 101010001101011 | 1110100110011 | 101010011000101 | 1110101100101 | 101010100101011 | 1110110010111 | 101010110000101 |
| 1110100000010 | 101010001101100 | 1110100110100 | 101010011000110 | 1110101100110 | 101010100101100 | 1110110011000 | 101010110000110 |
| 1110100000011 | 101010001101101 | 1110100110101 | 101010011001000 | 1110101100111 | 101010100101101 | 1110110011001 | 101010110001000 |
| 1110100000100 | 101010010000001 | 1110100110110 | 101010011001001 | 1110101101000 | 101010100110000 | 1110110011010 | 101010110001001 |
| 1110100000101 | 101010010000010 | 1110100110111 | 101010011001010 | 1110101101001 | 101010100110001 | 1110110011011 | 101010110001010 |
| 1110100000110 | 101010010000011 | 1110100111000 | 101010011001011 | 1110101101010 | 101010100110010 | 1110110011100 | 101010110001011 |
| 1110100000111 | 101010010000100 | 1110100111001 | 101010011001100 | 1110101101011 | 101010100110011 | 1110110011101 | 101010110001100 |
| 1110100001000 | 101010010000101 | 1110100111010 | 101010011001101 | 1110101101100 | 101010100110100 | 1110110011110 | 101010110001101 |
| 1110100001001 | 101010010000110 | 1110100111011 | 101010011010000 | 1110101101101 | 101010100110101 | 1110110011111 | 101010110010000 |
| 1110100001010 | 101010010001000 | 1110100111100 | 101010011010001 | 1110101101110 | 101010100110110 | 1110110100000 | 101010110010001 |
| 1110100001011 | 101010010001001 | 1110100111101 | 101010011010010 | 1110101101111 | 101010101000000 | 1110110100001 | 101010110010010 |
| 1110100001100 | 101010010001010 | 1110100111110 | 101010011010011 | 1110101110000 | 101010101000001 | 1110110100010 | 101010110010011 |
| 1110100001101 | 101010010001011 | 1110100111111 | 101010011010100 | 1110101110001 | 101010101000010 | 1110110100011 | 101010110010100 |
| 1110100001110 | 101010010001100 | 1110101000000 | 101010011010101 | 1110101110010 | 101010101000011 | 1110110100100 | 101010110010101 |
| 1110100001111 | 101010010001101 | 1110101000001 | 101010011010110 | 1110101110011 | 101010101000100 | 1110110100101 | 101010110010110 |
| 1110100010000 | 101010010010000 | 1110101000010 | 101010011011000 | 1110101110100 | 101010101000101 | 1110110100110 | 101010110011000 |
| 1110100010001 | 101010010010001 | 1110101000011 | 101010011011001 | 1110101110101 | 101010101000110 | 1110110100111 | 101010110011001 |
| 1110100010010 | 101010010010010 | 1110101000100 | 101010011011010 | 1110101110110 | 101010101001000 | 1110110101000 | 101010110011010 |
| 1110100010011 | 101010010010011 | 1110101000101 | 101010100000001 | 1110101110111 | 101010101001001 | 1110110101001 | 101010110100000 |
| 1110100010100 | 101010010010100 | 1110101000110 | 101010100000010 | 1110101111000 | 101010101001010 | 1110110101010 | 101010110100001 |
| 1110100010101 | 101010010010101 | 1110101000111 | 101010100000011 | 1110101111001 | 101010101001011 | 1110110101011 | 101010110100010 |
| 1110100010110 | 101010010010110 | 1110101001000 | 101010100000100 | 1110101111010 | 101010101001100 | 1110110101100 | 101010110100011 |
| 1110100010111 | 101010010011000 | 1110101001001 | 101010100000101 | 1110101111011 | 101010101001101 | 1110110101101 | 101010110100100 |
| 1110100011000 | 101010010011001 | 1110101001010 | 101010100000110 | 1110101111100 | 101010101010000 | 1110110101110 | 101010110100101 |
| 1110100011001 | 101010010011010 | 1110101001011 | 101010100001000 | 1110101111101 | 101010101010001 | 1110110101111 | 101010110100110 |

FIG. 12M

| Source | Codeword | Source | Codeword | Source | Codeword | Source | Codeword |
|---|---|---|---|---|---|---|---|
| 1110110110000 | 101010110101000 | 1110111100010 | 101011000110011 | 1111000010100 | 101011010001100 | 1111001000110 | 101011011010101 |
| 1110110110001 | 101010110101001 | 1110111100011 | 101011000110100 | 1111000010101 | 101011010001101 | 1111001000111 | 101011011010110 |
| 1110110110010 | 101010110101010 | 1110111100100 | 101011000110101 | 1111000010110 | 101011010010000 | 1111001001000 | 101011011011000 |
| 1110110110011 | 101010110101011 | 1110111100101 | 101011000110110 | 1111000010111 | 101011010010001 | 1111001001001 | 101011011011001 |
| 1110110110100 | 101010110101100 | 1110111100110 | 101011001000000 | 1111000011000 | 101011010010010 | 1111001001010 | 101011011011010 |
| 1110110110101 | 101010110101101 | 1110111100111 | 101011001000001 | 1111000011001 | 101011010010011 | 1111001001011 | 101100000001000 |
| 1110110110110 | 101010110110000 | 1110111101000 | 101011001000010 | 1111000011010 | 101011010010100 | 1111001001100 | 101100000001001 |
| 1110110110111 | 101010110110001 | 1110111101001 | 101011001000011 | 1111000011011 | 101011010010101 | 1111001001101 | 101100000001010 |
| 1110110111000 | 101010110110010 | 1110111101010 | 101011001000100 | 1111000011100 | 101011010010110 | 1111001001110 | 101100000001011 |
| 1110110111001 | 101010110110011 | 1110111101011 | 101011001000101 | 1111000011101 | 101011010011000 | 1111001001111 | 101100000001100 |
| 1110110111010 | 101010110110100 | 1110111101100 | 101011001000110 | 1111000011110 | 101011010011001 | 1111001010000 | 101100000001101 |
| 1110110111011 | 101010110110101 | 1110111101101 | 101011001001000 | 1111000011111 | 101011010011010 | 1111001010001 | 101100000010000 |
| 1110110111100 | 101010110110110 | 1110111101110 | 101011001001001 | 1111000100000 | 101011010100000 | 1111001010010 | 101100000010001 |
| 1110110111101 | 101011000000010 | 1110111101111 | 101011001001010 | 1111000100001 | 101011010100001 | 1111001010011 | 101100000010010 |
| 1110110111110 | 101011000000011 | 1110111110000 | 101011001001011 | 1111000100010 | 101011010100010 | 1111001010100 | 101100000010011 |
| 1110110111111 | 101011000000100 | 1110111110001 | 101011001001100 | 1111000100011 | 101011010100011 | 1111001010101 | 101100000010100 |
| 1110111000000 | 101011000000101 | 1110111110010 | 101011001001101 | 1111000100100 | 101011010100100 | 1111001010110 | 101100000010101 |
| 1110111000001 | 101011000000110 | 1110111110011 | 101011001010000 | 1111000100101 | 101011010100101 | 1111001010111 | 101100000010110 |
| 1110111000010 | 101011000001000 | 1110111110100 | 101011001010001 | 1111000100110 | 101011010100110 | 1111001011000 | 101100000011000 |
| 1110111000011 | 101011000001001 | 1110111110101 | 101011001010010 | 1111000100111 | 101011010101000 | 1111001011001 | 101100000011001 |
| 1110111000100 | 101011000001010 | 1110111110110 | 101011001010011 | 1111000101000 | 101011010101001 | 1111001011010 | 101100000011010 |
| 1110111000101 | 101011000001011 | 1110111110111 | 101011001010100 | 1111000101001 | 101011010101010 | 1111001011011 | 101100000100000 |
| 1110111000110 | 101011000001100 | 1110111111000 | 101011001010101 | 1111000101010 | 101011010101011 | 1111001011100 | 101100000100001 |
| 1110111000111 | 101011000001101 | 1110111111001 | 101011001010110 | 1111000101011 | 101011010101100 | 1111001011101 | 101100000100010 |
| 1110111001000 | 101011000010000 | 1110111111010 | 101011001011000 | 1111000101100 | 101011010101101 | 1111001011110 | 101100000100011 |
| 1110111001001 | 101011000010001 | 1110111111011 | 101011001011001 | 1111000101101 | 101011010110000 | 1111001011111 | 101100000100100 |
| 1110111001010 | 101011000010010 | 1110111111100 | 101011001011010 | 1111000101110 | 101011010110001 | 1111001100000 | 101100000100101 |
| 1110111001011 | 101011000010011 | 1110111111101 | 101011001100000 | 1111000101111 | 101011010110010 | 1111001100001 | 101100000100110 |
| 1110111001100 | 101011000010100 | 1110111111110 | 101011001100001 | 1111000110000 | 101011010110011 | 1111001100010 | 101100000101000 |
| 1110111001101 | 101011000010101 | 1110111111111 | 101011001100010 | 1111000110001 | 101011010110100 | 1111001100011 | 101100000101001 |
| 1110111001110 | 101011000010110 | 1111000000000 | 101011001100011 | 1111000110010 | 101011010110101 | 1111001100100 | 101100000101010 |
| 1110111001111 | 101011000011000 | 1111000000001 | 101011001100100 | 1111000110011 | 101011010110110 | 1111001100101 | 101100000101011 |
| 1110111010000 | 101011000011001 | 1111000000010 | 101011001100101 | 1111000110100 | 101011011000000 | 1111001100110 | 101100000101100 |
| 1110111010001 | 101011000011010 | 1111000000011 | 101011001100110 | 1111000110101 | 101011011000001 | 1111001100111 | 101100000101101 |
| 1110111010010 | 101011000100000 | 1111000000100 | 101011001101000 | 1111000110110 | 101011011000010 | 1111001101000 | 101100000110000 |
| 1110111010011 | 101011000100001 | 1111000000101 | 101011001101001 | 1111000110111 | 101011011000011 | 1111001101001 | 101100000110001 |
| 1110111010100 | 101011000100010 | 1111000000110 | 101011001101010 | 1111000111000 | 101011011000100 | 1111001101010 | 101100000110010 |
| 1110111010101 | 101011000100011 | 1111000000111 | 101011001101011 | 1111000111001 | 101011011000101 | 1111001101011 | 101100000110011 |
| 1110111010110 | 101011000100100 | 1111000001000 | 101011001101100 | 1111000111010 | 101011011000110 | 1111001101100 | 101100000110100 |
| 1110111010111 | 101011000100101 | 1111000001001 | 101011001101101 | 1111000111011 | 101011011001000 | 1111001101101 | 101100000110101 |
| 1110111011000 | 101011000100110 | 1111000001010 | 101011010000001 | 1111000111100 | 101011011001001 | 1111001101110 | 101100000110110 |
| 1110111011001 | 101011000101000 | 1111000001011 | 101011010000010 | 1111000111101 | 101011011001010 | 1111001101111 | 101100001000000 |
| 1110111011010 | 101011000101001 | 1111000001100 | 101011010000011 | 1111000111110 | 101011011001011 | 1111001110000 | 101100001000001 |
| 1110111011011 | 101011000101010 | 1111000001101 | 101011010000100 | 1111000111111 | 101011011001100 | 1111001110001 | 101100001000010 |
| 1110111011100 | 101011000101011 | 1111000001110 | 101011010000101 | 1111001000000 | 101011011001101 | 1111001110010 | 101100001000011 |
| 1110111011101 | 101011000101100 | 1111000001111 | 101011010000110 | 1111001000001 | 101011011010000 | 1111001110011 | 101100001000100 |
| 1110111011110 | 101011000101101 | 1111000010000 | 101011010001000 | 1111001000010 | 101011011010001 | 1111001110100 | 101100001000101 |
| 1110111011111 | 101011000110000 | 1111000010001 | 101011010001001 | 1111001000011 | 101011011010010 | 1111001110101 | 101100001000110 |
| 1110111100000 | 101011000110001 | 1111000010010 | 101011010001010 | 1111001000100 | 101011011010011 | 1111001110110 | 101100001001000 |
| 1110111100001 | 101011000110010 | 1111000010011 | 101011010001011 | 1111001000101 | 101011011010100 | 1111001110111 | 101100001001001 |

FIG. 12N

| Source | Codeword | Source | Codeword | Source | Codeword | Source | Codeword |
|---|---|---|---|---|---|---|---|
| 1111001111000 | 101100001001010 | 1111010101010 | 101100010100001 | 1111011011100 | 101100100001010 | 1111100001110 | 101100101010011 |
| 1111001111001 | 101100001001011 | 1111010101011 | 101100010100010 | 1111011011101 | 101100100001011 | 1111100001111 | 101100101010100 |
| 1111001111010 | 101100001001100 | 1111010101100 | 101100010100011 | 1111011011110 | 101100100001100 | 1111100010000 | 101100101010101 |
| 1111001111011 | 101100001001101 | 1111010101101 | 101100010100100 | 1111011011111 | 101100100001101 | 1111100010001 | 101100101010110 |
| 1111001111100 | 101100001010000 | 1111010101110 | 101100010100101 | 1111011100000 | 101100100010000 | 1111100010010 | 101100101011000 |
| 1111001111101 | 101100001010001 | 1111010101111 | 101100010100110 | 1111011100001 | 101100100010001 | 1111100010011 | 101100101011001 |
| 1111001111110 | 101100001010010 | 1111010110000 | 101100010101000 | 1111011100010 | 101100100010010 | 1111100010100 | 101100101011010 |
| 1111001111111 | 101100001010011 | 1111010110001 | 101100010101001 | 1111011100011 | 101100100010011 | 1111100010101 | 101100101100000 |
| 1111010000000 | 101100001010100 | 1111010110010 | 101100010101010 | 1111011100100 | 101100100010100 | 1111100010110 | 101100101100001 |
| 1111010000001 | 101100001010101 | 1111010110011 | 101100010101011 | 1111011100101 | 101100100010101 | 1111100010111 | 101100101100010 |
| 1111010000010 | 101100001010110 | 1111010110100 | 101100010101100 | 1111011100110 | 101100100010110 | 1111100011000 | 101100101100011 |
| 1111010000011 | 101100001011000 | 1111010110101 | 101100010101101 | 1111011100111 | 101100100011000 | 1111100011001 | 101100101100100 |
| 1111010000100 | 101100001011001 | 1111010110110 | 101100010110000 | 1111011101000 | 101100100011001 | 1111100011010 | 101100101100101 |
| 1111010000101 | 101100001011010 | 1111010110111 | 101100010110001 | 1111011101001 | 101100100011010 | 1111100011011 | 101100101100110 |
| 1111010000110 | 101100001100000 | 1111010111000 | 101100010110010 | 1111011101010 | 101100100100000 | 1111100011100 | 101100101101000 |
| 1111010000111 | 101100001100001 | 1111010111001 | 101100010110011 | 1111011101011 | 101100100100001 | 1111100011101 | 101100101101001 |
| 1111010001000 | 101100001100010 | 1111010111010 | 101100010110100 | 1111011101100 | 101100100100010 | 1111100011110 | 101100101101010 |
| 1111010001001 | 101100001100011 | 1111010111011 | 101100010110101 | 1111011101101 | 101100100100011 | 1111100011111 | 101100101101011 |
| 1111010001010 | 101100001100100 | 1111010111100 | 101100010110110 | 1111011101110 | 101100100100100 | 1111100100000 | 101100101101100 |
| 1111010001011 | 101100001100101 | 1111010111101 | 101100011000000 | 1111011101111 | 101100100100101 | 1111100100001 | 101100101101101 |
| 1111010001100 | 101100001100110 | 1111010111110 | 101100011000001 | 1111011110000 | 101100100100110 | 1111100100010 | 101100110000001 |
| 1111010001101 | 101100001101000 | 1111010111111 | 101100011000010 | 1111011110001 | 101100100101000 | 1111100100011 | 101100110000010 |
| 1111010001110 | 101100001101001 | 1111011000000 | 101100011000011 | 1111011110010 | 101100100101001 | 1111100100100 | 101100110000011 |
| 1111010001111 | 101100001101010 | 1111011000001 | 101100011000100 | 1111011110011 | 101100100101010 | 1111100100101 | 101100110000100 |
| 1111010010000 | 101100001101011 | 1111011000010 | 101100011000101 | 1111011110100 | 101100100101011 | 1111100100110 | 101100110000101 |
| 1111010010001 | 101100001101100 | 1111011000011 | 101100011000110 | 1111011110101 | 101100100101100 | 1111100100111 | 101100110000110 |
| 1111010010010 | 101100001101101 | 1111011000100 | 101100011001000 | 1111011110110 | 101100100101101 | 1111100101000 | 101100110001000 |
| 1111010010011 | 101100010000001 | 1111011000101 | 101100011001001 | 1111011110111 | 101100100110000 | 1111100101001 | 101100110001001 |
| 1111010010100 | 101100010000010 | 1111011000110 | 101100011001010 | 1111011111000 | 101100100110001 | 1111100101010 | 101100110001010 |
| 1111010010101 | 101100010000011 | 1111011000111 | 101100011001011 | 1111011111001 | 101100100110010 | 1111100101011 | 101100110001011 |
| 1111010010110 | 101100010000100 | 1111011001000 | 101100011001100 | 1111011111010 | 101100100110011 | 1111100101100 | 101100110001100 |
| 1111010010111 | 101100010000101 | 1111011001001 | 101100011001101 | 1111011111011 | 101100100110100 | 1111100101101 | 101100110001101 |
| 1111010011000 | 101100010000110 | 1111011001010 | 101100011010000 | 1111011111100 | 101100100110101 | 1111100101110 | 101100110010000 |
| 1111010011001 | 101100010001000 | 1111011001011 | 101100011010001 | 1111011111101 | 101100100110110 | 1111100101111 | 101100110010001 |
| 1111010011010 | 101100010001001 | 1111011001100 | 101100011010010 | 1111011111110 | 101100101000000 | 1111100110000 | 101100110010010 |
| 1111010011011 | 101100010001010 | 1111011001101 | 101100011010011 | 1111011111111 | 101100101000001 | 1111100110001 | 101100110010011 |
| 1111010011100 | 101100010001011 | 1111011001110 | 101100011010100 | 1111100000000 | 101100101000010 | 1111100110010 | 101100110010100 |
| 1111010011101 | 101100010001100 | 1111011001111 | 101100011010101 | 1111100000001 | 101100101000011 | 1111100110011 | 101100110010101 |
| 1111010011110 | 101100010001101 | 1111011010000 | 101100011010110 | 1111100000010 | 101100101000100 | 1111100110100 | 101100110010110 |
| 1111010011111 | 101100010010000 | 1111011010001 | 101100011011000 | 1111100000011 | 101100101000101 | 1111100110101 | 101100110011000 |
| 1111010100000 | 101100010010001 | 1111011010010 | 101100011011001 | 1111100000100 | 101100101000110 | 1111100110110 | 101100110011001 |
| 1111010100001 | 101100010010010 | 1111011010011 | 101100011011010 | 1111100000101 | 101100101001000 | 1111100110111 | 101100110011010 |
| 1111010100010 | 101100010010011 | 1111011010100 | 101100100000001 | 1111100000110 | 101100101001001 | 1111100111000 | 101100110100000 |
| 1111010100011 | 101100010010100 | 1111011010101 | 101100100000010 | 1111100000111 | 101100101001010 | 1111100111001 | 101100110100001 |
| 1111010100100 | 101100010010101 | 1111011010110 | 101100100000011 | 1111100001000 | 101100101001011 | 1111100111010 | 101100110100010 |
| 1111010100101 | 101100010010110 | 1111011010111 | 101100100000100 | 1111100001001 | 101100101001100 | 1111100111011 | 101100110100011 |
| 1111010100110 | 101100010011000 | 1111011011000 | 101100100000101 | 1111100001010 | 101100101001101 | 1111100111100 | 101100110100100 |
| 1111010100111 | 101100010011001 | 1111011011001 | 101100100000110 | 1111100001011 | 101100101010000 | 1111100111101 | 101100110100101 |
| 1111010101000 | 101100010011010 | 1111011011010 | 101100100001000 | 1111100001100 | 101100101010001 | 1111100111110 | 101100110100110 |
| 1111010101001 | 101100010100000 | 1111011011011 | 101100100001001 | 1111100001101 | 101100101010010 | 1111100111111 | 101100110101000 |

RATE-13/15 MAXIMUM TRANSITION RUN CODE ENCODING AND DECODING METHOD AND APPARATUS

This application claims the priority of Korean Patent Application No. 10-2004-0001298, filed on Jan. 8, 2004, in the Korean Intellectual Property Office, the disclosure of which is incorporated herein in its entirety by reference.

BACKGROUND OF THE INVENTION

1. Field of the Invention

The present invention relates to coding and signal processing for a high density magnetic recording system, and more particularly, to a rate-13/15 maximum transition run (MTR) code encoding and decoding method and apparatus suitable for a high density recording system.

2. Description of the Related Art

Conventional codes include a general modulation code and a relatively low rate maximum transition run (MTR) code. Examples of general modulation codes used for hard disc drives of magnetic recording systems include a rate-8/9 code and a rate-16/17 code. In the rate-8/9 code and the rate-16/17 code, since the number of consecutive data transitions increases and recording density increases, a decrease in data detection performance results, and an increase in recording density is limited.

To solve these problems, recent development efforts have focused on MTR coding technologies. In a conventional MTR code, to allow improvement of detection performance in a high density write channel, code technologies where the number of consecutive data transitions is equal to or less than 2 have been developed. However, an increase in a code rate is limited.

An MTR coding technology will be described in brief. A run-length limited (RLL) modulation code is most frequently used in magnetic or optical recording/reproducing systems. In the RLL code, a (d, k) constraint condition allows a generation interval of transition in a modulated non-return-to-zero inversion (NRZI) waveform to be between at least (d+1) bits and at most (k+1) bits by allowing the number of consecutive '0s' between any two '1's to be between at least d and at most k. The (d, k) code allows inter-symbol interference (ISI) to decrease and simplifies timing recovery.

The MTR code dramatically improves detection performance as compared with a conventional recording (0, k) code by improving a minimum distance characteristic for recorded data in a high density magnetic recording system. By preventing 3 or more consecutive recording transitions from being generated, 4/5, 5/6, and 6/7 coding technologies have been developed. These codes have relatively high code rates while having detection performance gains similar to a gain of a (1, 7) code. Here, if the maximum number of acceptable transitions (j) is 2, a capacity of the MTR code is obtained according to a k value as shown in Table 1.

TABLE 1

| k | Capacity |
|---|---|
| 4 | 0.8376 |
| 5 | 0.8579 |
| 6 | 0.8680 |
| 7 | 0.8732 |
| 8 | 0.8760 |
| 9 | 0.8774 |
| 10 | 0.8782 |
| ∞ | 0.8791 |

A rate-4/5 MTR coding technology will now be described. In rate-4/5 MTR code building method, ① codewords including a '111' pattern are removed from all codewords composed of 5 bits, ② by removing codewords including a '11' pattern at a beginning part or an ending part, a condition j=2 can be satisfied when a code sequence is composed, and ③ a codeword '00000' is removed so as not to allow a codeword where k=∞ to be generated.

According to the method, since the number of acceptable codewords is 16, a rate-4/5 code can be built, and the highest acceptable value of k in the code is 8 as shown in Table 2. That is, Table 2 shows a rate-4/5 MTR code having a condition (j=2; k=8).

TABLE 2

| | | | |
|---|---|---|---|
| 00001 | 00110 | 01100 | 10010 |
| 00010 | 01000 | 01101 | 10100 |
| 00100 | 10000 | 10000 | 10101 |
| 00101 | 01010 | 10001 | 10110 |

A rate-5/6 MTR code conversion table is shown in Table 3.

TABLE 3

| "STATE-0" Conversion Table | | "STATE-1" Conversion Table | |
|---|---|---|---|
| Input | Output | Input | Output |
| 00000 | 000000 | 00000 | 000000 |
| 00001 | 000001 | 00001 | 000001 |
| 00010 | 000010 | 00010 | 000010 |
| 00011 | 000001 | 00011 | 000001 |
| 00100 | 000100 | 00100 | 000100 |
| 00101 | 000101 | 00101 | 000101 |
| 00110 | 000110 | 00110 | 000110 |
| 00111 | 100101 | 00111 | 100101 |
| 01000 | 001000 | 01000 | 001000 |
| 01001 | 001001 | 01001 | 001001 |
| 01010 | 001010 | 01010 | 001010 |
| 01011 | 100100 | 01011 | 100100 |
| 01100 | 001100 | 01100 | 001100 |
| 01110 | 001101 | 01110 | 001101 |
| 01111 | 100010 | 01111 | 100010 |
| 10000 | 100000 | 10000 | 100000 |
| 10001 | 010000 | 10001 | 010000 |
| 10010 | 010001 | 10010 | 010001 |
| 10011 | 010100 | 10011 | 010100 |
| 10100 | 010101 | 10100 | 010101 |
| 10101 | 010110 | 10101 | 010110 |
| 10110 | 101101 | 10110 | 101101 |
| 11000 | 011000 | 11000 | 011000 |
| 11001 | 011001 | 11001 | 011001 |
| 11010 | 011010 | 11010 | 011010 |
| 11011 | 101100 | 11011 | 101100 |
| 11100 | 101000 | 11100 | 101000 |
| 11101 | 101010 | 11101 | 101010 |
| 11110 | 110100 | 11110 | 110010 |
| 11111 | 110101 | 11111 | 110110 |

Table 3 shows a rate-5/6 MTR code having a condition (j=2, k=6). The rate-5/6 MTR (j=2) code is converted using conversion tables divided into two states, and an encoding and decoding method is as follows: ① To allocate a code to each of $2^5$ (32) possible input data, each of "STATE-0" and "STATE-1" includes 32 codes 5-bit input data is encoded by selecting one of two conversion states. The last two codewords of "STATE-0" and "STATE-1" are different from each other, and state selection is determined according to whether the least significant bit of an encoded previous codeword is '0' or '1'. In other words, if the least significant bit of the previous codeword is '0', input data is converted to a codeword of "STATE-0", and if the least significant bit of the previous codeword is '1', input data is converted to a codeword of "STATE-1."② When "STATE-1" is selected, if input data is '11110' or '11111', a least significant bit of a previous codeword is converted to '0' to satisfy a j=2 constraint condition. ③ If an encoded 6-bit output is '000000' and a most significant bit of a subsequent codeword is '0', the last two bits of a current codeword are converted to '1'. ④ If a least significant bit of a previous codeword is '0 and the first 5 bits of a current codeword are '0', the first 2 bits of the current codeword are converted to '1'. ⑤ If 7 or more consecutive 0s span between a last portion of a previous codeword and a first portion of a current codeword and the condition of the item ④ is not satisfied, the last two bits of the previous codeword are converted to '1'. Accordingly, the highest acceptable value of k in the code is 6. ⑥ When decoding is performed, if the last two bits of a codeword are '1', the bits are converted to '00', and if the first 5 bits of a codeword are '11000', the bits are converted to '00000'. Also, if the first 3 bits of a current codeword are '110' and the last 2 bits are '10', a least significant bit '0' of a previous codeword is converted to '1'. Likewise, after a conversion process corresponding to each condition is performed, an input corresponding to each codeword is decoded using the code table.

A rate-6/7 MTR code building method includes the following steps: ① Codewords including a '111' pattern among all codewords composed of 7 bits are removed. ② If a k-constraint condition is not considered, the number of valid codewords not including '11' at the first 2 bits or last 2 bits is 57. Therefore, to build codewords for 6-bit inputs, at least 7 ($2^6-57$) additional codewords are necessary. ③ To build 64 codewords, 9 codewords, each beginning with '110' and satisfying a j=2 MTR condition at the other 4 bits, that is, '1100000', '1100001', '1100010', '1100100', '1100101', 1100110', '1101000', '1101001', and '1101010', are considered. ④ When the 9 additional codewords are used, if a least significant bit of a previous codeword is '0', the MTR constraint condition is satisfied. However, if the least significant bit of the previous codeword is '1', to satisfy a j=2 condition, the last 3 bits of the previous codeword and the first 3 bits '110' of a current codeword are converted as follows:

. . . 001,110 . . . ⇒. . . 011,001 . . .

. . . 101,110 . . . ⇒. . . 011,010 . . .

⑤ So as not to generate a codeword where k=∞ among 66 available codewords, a codeword '0000000' is removed. Here, since the longest length of consecutively generated '0s' is '1000000,0000001', a maximum run-length is 12 bits. ⑥ To reduce the k-condition more, codewords are converted as follows:

. . . 000,000 . . . ⇒. . . 011,000 . . .

If the codewords are converted as shown above, since the longest length of consecutively generated '0s' is '1000000, 0000001 . . . ' or ' . . . 100,0000001', k becomes 8. ⑦ A decoding process of an encoded code sequence is achieved by performing these steps in reverse order.

According to the code built according to the above method, the number of available codewords is 65. Accordingly, a rate-6/7 code table can be built by selecting 64 codewords out of the 65 codewords listed in Table 4, and the highest acceptable value of k in the code is 8. That is, Table 4 shows a rate-6/7 MTR (j=2; k=8) code.

TABLE 4

| | | | |
|---|---|---|---|
| 0001000↵ | 0101000↵ | 1001000↵ | 1101000↵ |
| 0000001↵ | 0100001↵ | 1000001↵ | 1100001↵ |
| 0000010↵ | 0100010↵ | 1000010↵ | 1100010↵ |
| 0001001↵ | 0101001↵ | 1001001↵ | 1101001↵ |
| 0000100↵ | 0100100↵ | 1000100↵ | 1100100↵ |
| 0000101↵ | 0100101↵ | 1000101↵ | 1100101↵ |
| 0000110↵ | 0100110↵ | 1000110↵ | 1100110↵ |
| 0001010↵ | 0101010↵ | 1001010↵ | 1101010↵ |
| 0011000↵ | 0110001↵ | 1011000↵ | 0001100↵ |
| 0010001↵ | 0010000↵ | 1010001↵ | 0001101↵ |
| 0010010↵ | 0100000↵ | 1010010↵ | 0101100↵ |
| 0011001↵ | 0110000↵ | 1011001↵ | 0101101↵ |
| 0010100↵ | 1000000↵ | 1010100↵ | 1001100↵ |
| 0010101↵ | 1010000↵ | 1010101↵ | 1001101↵ ↵ |
| 0010110↵ | 1100000↵ | 1010110↵ | 0110100↵ |
| 0011010↵ | 0110010↵ | 1011010↵ | 0110101↵ |

SUMMARY OF THE INVENTION

The present invention provides a rate-13/15 MTR code encoding/decoding method and apparatus allowing each codeword to have a relatively higher code rate than conventional MTR codes where the number of data transitions is 2 or less while improving detection performance compared to conventional general modulation codes.

The present invention also provides a computer readable medium having recorded thereon a computer readable program for performing the rate-13/15 MTR code encoding/decoding method.

According to an aspect of the present invention, there is provided a rate-13/15 MTR code encoding method comprising: (a) generating a predetermined rate-13/15 MTR code in which 13-bit data corresponds to 15-bit data one to one; (b) outputting input 13-bit data as a 15-bit codeword according to the rate-13/15 MTR code; (c) checking whether codewords satisfy a predetermined constraint condition by connecting the 15-bit codeword and a subsequent 15-bit codeword; and (d) converting specific bits of the codewords if the codewords violate the constraint condition and not converting the codewords if the codewords do not violate the constraint condition. The rate-13/15 MTR (j=2, k=8) code in step (a) comprises: 8192 codewords obtained by excluding optional 40 codewords from 8232 codewords obtained by excluding 230 codewords having '11011' at each trailing edge, 420 codewords, each having equal to or more than 8 consecutive '0's, and 22 codewords having 7 consecutive '0's at each leading edge or each trailing edge from selected 8904 codewords (7473 codewords in which the numbers of 1s at each leading two bits and each trailing two bits are at most 1, respectively, and 1431 codewords in which each trailing edge is '11') in order to prevent the number of consecutive transitions from becoming 3 at code boundaries in a modulation coding process, and the MTR constraint condition in step (c) comprises: a constraint condition (j=2) allowing up to 2 consecutive data transitions; and a constraint condition (k=8) satisfying that the number of consecutive '0's is less than 8, and the checking of the MTR constraint condition comprises: when optional two codewords among the 8192 codewords are connected and it is assumed that $c(k)=[x_{14}x_{13}x_{12} \ldots x_2x_1x_0]$ represents a current codeword for which the codeword violation checking is performed and $c(k+1)=[y_{14}y_{13}y_{12} \ldots y_2y_1y_0]$ represents a subsequent codeword, determining whether the last 3 bits ($x_2$, $x_1$, $x_0$) of the current codeword and the first 3 bits ($y_{14}$, $y_{13}$, $y_{12}$) of the subsequent codeword violate the MTR constraint condition, and the codeword conversion in step (d) comprises: when it is assumed that $z_0$ and $z_1$ indicate parameters for determining whether two codewords satisfy a constraint condition (j=2) and $z_2$ indicates a parameter for determining whether the number of consecutive '0's is equal to or less than 8, calculating $z_0$, $z_1$, and $z_2$ using $z_0=x_1 \cdot x_0 \cdot y_{14} \cdot \overline{y_{12}}$, $z_1=x_1 \cdot x_0 \cdot y_{14} \cdot y_{12}$, and $z_2=x_2+x_1+x_0+y_{14}+y_{13}+y_{12}$ (here, + indicates a modulo-2 add operation); and converting $x_1$ and $x_0$ into 0 and $x_2$ and $y_{13}$ into 1 so that j does not exceed 2 when $z_0=1$, converting $x_0$ and $y_{12}$ into 0 and $y_{13}$ into 1 so that j does not exceed 2 when $z_1=1$, and converting $y_{14}$ and $y_{13}$ into 1 so that k does not exceed 8 when $z_2=1$.

According to another aspect of the present invention, there is provided a rate-13/15 MTR code encoding apparatus comprising: a 13/15 encoder generating a rate-13/15 MTR code for outputting 13-bit data as a predetermined 15-bit codeword; and an MTR violation checking & converting unit checking whether codewords satisfy a predetermined constraint condition by connecting the 15-bit codeword and a subsequent 15-bit codeword, converting specific bits of the codewords if the codewords violate the constraint condition, and not converting the codewords if the codewords do not violate the constraint condition. The rate-13/15 MTR (j=2, k=8) code comprises: 8192 codewords obtained by excluding optional 40 codewords from 8232 codewords obtained by excluding 230 codewords having '11011' at each trailing edge, 420 codewords, each having equal to or more than 8 consecutive '0's, and 22 codewords having 7 consecutive '0's at each leading edge or each trailing edge from selected 8904 codewords (7473 codewords in which the numbers of 1s at each leading two bits and each trailing two bits are at most 1, respectively, and 1431 codewords in which each trailing edge is '11') in order to prevent the number of consecutive transitions from becoming 3 at code boundaries in a modulation coding process. The MTR violation checking & converting unit comprises: an MTR constraint condition checker determining whether the last 3 bits ($x_2$, $x_1$, $x_0$) of a current codeword and the first 3 bits ($y_{14}$, $y_{13}$, $y_{12}$) of a subsequent codeword violate the MTR constraint condition when optional two codewords among the 8192 codewords are connected to each other and it is assumed that c(k) represents the current codeword for which the codeword violation checking is performed and c(k+1) represents the subsequent codeword; and a codeword converter converting $x_1$ and $x_0$ into 0 and $x_2$ and $y_{13}$ into 1 so that j does not exceed 2 when $z_0=1$, converting $x_0$ and $y_{12}$ into 0 and $y_{13}$ into 1 so that j does not exceed 2 when $z_1=1$, and converting $y_{14}$ and $y_{13}$ into 1 so that k does not exceed 8 when $z_2=1$ by calculating $z_0$, $z_1$, and $z_2$ using $z_0=x_1 \cdot x_0 \cdot y_{14} \cdot \overline{y_{12}}$, $z_1=x_1 \cdot x_0 \cdot y_{14} \cdot y_{12}$, and $z_2=x_2+x_1+x_0+y_{14}+y_{13}+y_{12}$ (here, + indicates a modulo-2 add operation) when it is assumed that $z_0$ and $z_1$ indicate parameters for determining whether two codewords satisfy the j constraint condition (j=2) and $z_2$ indicates a parameter for determining whether the number of consecutive '0's is equal to or less than 8.

The rate-13/15 MTR code encoding apparatus can further comprise: a parallel-to-serial converter converting parallel codewords of the MTR violation checking & converting unit into serial data; and a precoder changing a signal level of the serial data in order to record the serial data in a channel.

According to another aspect of the present invention, there is provided a rate-13/15 MTR code decoding method comprising: (1) checking whether two codewords were MTR-code-converted to satisfy a predetermined MTR constraint condition when they were encoded by connecting a currently input 15-bit codeword and a subsequently input 15-bit codeword; (2) if the codewords were MTR-code-converted as the checking result, converting specific bits of the codewords, and if the codewords were not MTR-code-converted as the checking result, not converting the codewords; and (3) decoding each 15-bit codeword, which has passed through step (2), into 13-bit data using a predetermined MTR code, and the rate-13/15 MTR (j=2, k=8) code in step (1) comprises: 8192 codewords obtained by excluding optional 40 codewords from 8232 codewords obtained by excluding 230 codewords having '11011' at each trailing edge, 420 codewords, each having equal to or more than 8 consecutive '0's, and 22 codewords having 7 consecutive '0's at each leading edge or each trailing edge from selected 8904 codewords (7473 codewords in which the numbers of 1s at each leading two bits and each trailing two bits are at most 1, respectively, and 1431 codewords in which each trailing edge is '11') in order to prevent the number of consecutive transitions from becoming 3 at code boundaries in a modulation coding process. The MTR code conversion checking in step (1) comprises: when it is assumed that $\overline{c(k)}=[x_{14}x_{13}x_{12} \ldots x_2x_1x_0]$ represents a current codeword for which the codeword violation checking is performed and $\overline{c(k+1)}=[y_{14}y_{13}y_{12} \ldots y_2y_1y_0]$ represents a subsequent codeword, determining whether the last 3 bits ($x_2$, $x_1$, $x_0$) of the current codeword and the first 3 bits ($y_{14}$, $y_{13}$, $y_{12}$) of the subsequent codeword violate the MTR constraint condition, and the codeword conversion in step (2) comprises: calculating $z_0$, $z_1$, and $z_2$ using $z_0=x_2 \cdot y_{14} \cdot y_{13}$, $z_1=x_1 \cdot y_{14} \cdot y_{13}$, and $z_2=\overline{x_2} \cdot \overline{x_1} \cdot \overline{x_0} \cdot y_{14} \cdot y_{13}$; and converting $x_1$ and $x_0$ into 1 and $x_2$ and $y_{13}$ into 0 when $z_0=1$, converting $x_0$ and $y_{12}$ into 1 and $y_{13}$ into 0 when $z_1=1$, and converting $y_{14}$ and $y_{13}$ into 0 when $z_2=1$.

According to another aspect of the present invention, there is provided a rate-13/15 MTR code decoding apparatus comprising: an MTR condition checking & converting unit checking whether two codewords were MTR-code-converted to satisfy a predetermined MTR constraint condition when they were encoded by connecting a currently input 15-bit codeword and a subsequently input 15-bit codeword, converting specific bits of the codewords if the codewords were MTR-code-converted, and not converting the codewords if the codewords were not MTR-code-converted; and a 13/15 decoder decoding each 15-bit codeword output from the MTR condition checking & converting unit to 13-bit data using a predetermined MTR code, and the rate-13/15 MTR code comprises: 8192 codewords obtained by excluding optional 40 codewords from 8232 codewords obtained by excluding 230 codewords having '11011' at each trailing edge, 420 codewords, each having equal to or more than 8 consecutive '0's, and 22 codewords having 7 consecutive '0's at each leading edge or each trailing edge from selected 8904 codewords (7473 codewords in which the numbers of 1s at each leading two bits and each trailing two bits are at most 1, respectively, and 1431 codewords in which each trailing edge is '11') in order to prevent the number of consecutive transitions from becoming 3 at code boundaries in a modulation coding process. The MTR condition checking & converting unit comprises: an MTR code conversion checker, when it is assumed that $\overline{c(k)}=[x_{14}x_{13}x_{12} \ldots x_2x_1x_0]$ represents a current codeword for which the codeword violation checking is performed and $\overline{c(k+1)}=[y_{14}y_{13}y_{12} \ldots$ $y_2y_1y_0$] represents a subsequent codeword, determining whether the last 3 bits ($x_2$, $x_1$, $x_0$) of the current codeword and the first 3 bits ($y_{14}$, $y_{13}$, $y_{12}$) of the subsequent codeword were MTR-code-converted when they were encoded; and a codeword converter converting $x_1$ and $x_0$ into 1 and $x_2$ and $y_{13}$ into 0 when $z_0=1$, converting $x_0$ and $y_{12}$ into 1 and $y_{13}$ into 0 when $z_1=1$, and converting $y_{14}$ and $y_{13}$ into 0 when $z_2=1$ by calculating $z_0$, $z_1$, and $z_2$ using $z_0=x_2 \cdot y_{14} \cdot y_{13}$, $z_1=x_1 \cdot y_{14} \cdot y_{13}$, and $z_2=\overline{x_2} \cdot \overline{x_1} \cdot \overline{x_0} \cdot y_{14} \cdot y_{13}$.

According to another aspect of the present invention, there is provided a computer readable medium having recorded thereon a computer readable program for performing the method described above.

BRIEF DESCRIPTION OF THE DRAWINGS

The above and other features and advantages of the present invention will become more apparent by describing in detail exemplary embodiments thereof with reference to the attached drawings in which:

FIGS. 11A through 11Z and 12A through 12N are codeword tables of a rate-13/15 MTR code according to an embodiment of the present invention.

DETAILED DESCRIPTION OF THE INVENTION

Hereinafter, the present invention will now be described more fully with reference to the accompanying drawings, in which embodiments of the invention are shown.

Figure 1:
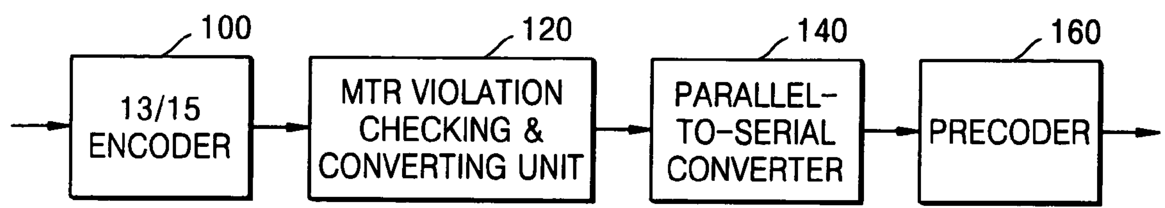
FIG. 1 is a block diagram of a rate-13/15 MTR encoding apparatus according to an embodiment of the present invention.

FIG. 1 is a block diagram of a rate-13/15 MTR encoding apparatus according to an embodiment of the present invention. Referring to FIG. 1, a rate-13/15 MTR encoding apparatus includes a 13/15 encoder 100, an MTR violation checking & converting unit 120, a parallel-to-serial converter 140, and a precoder 160.

The 13/15 encoder 100 generates a rate-13/15 MTR code for inputting 13-bit data and outputting a predetermined 15-bit codeword.

First, a method of constructing the rate-13/15 MTR code will now be described. A k constraint condition is defined as a condition where the number of consecutive 0s is less than k in a codeword, and a j constraint condition is defined as a condition where the number of consecutive transitions between 0 and 1 is less than j. The number of codewords is 8674 when the length of each codeword is 15 bits with satisfying the j constraint condition (j=2) regardless of the k constraint condition. Here, to satisfy the j constraint condition (j=2) in two consecutive codewords, 7473 codewords in which the numbers of 1s at each leading two bits and each trailing two bits are respectively at most 1 are selected. However, since the number of codewords required for encoding 13-bit input data to a 15-bit codeword is 8192 ($2^{13}$), 719 (8192−7473) additional codewords are required. Therefore, codewords in which each trailing edge is '11' are additionally used to satisfy the required number of codewords. There exist 1431 codewords in which each trailing edge is '11'. To prevent the number of consecutive transitions from being 3 at codeword boundaries in a modulated encoding process, 230 codewords, which end with '11011', are excluded from the 1431 codewords. Accordingly, the number of available codewords is 8674 (7473+(1431−230)).

Among the codewords satisfying the condition described above, the rate-13/15 MTR code used for the embodiment of the present invention is constructed so that the k constraint condition (k=8) is satisfied. To construct the rate-13/15 MTR code in which the k constraint condition (k=8) is satisfied, 420 codewords in which the number of consecutive 0s is equal to or more than 8 are excluded, and 22 codewords in which the number of consecutive 0s at each leading edge or each trailing edge is 7 are excluded. Accordingly, the number of codewords, which can be used in the modulated encoding process, becomes 8232 (8674−420−22). Finally, 8192 codewords are selected by excluding optional 40 codewords from the 8232 codewords selected by the method described above.

Examples of the constructed 8192 codewords are shown in FIGS. 11A through 11Z and 12A through 12N.

Therefore, the code developed by the embodiment of the present invention is an MTR code in which a code rate is 13/15 and the maximum number of consecutive transitions is equal to or less than 2. However, if codewords corresponding to each input data are simply found using the codeword table, the j constraint condition (j=2) is not always satisfied at boundaries between codewords. Therefore, it is required to generate codewords, which can satisfy the j constraint condition (j=2), using the MTR violation checking & converting unit 120 at boundaries between codewords.

The MTR violation checking & converting unit 120 checks whether codewords satisfy a predetermined MTR constraint condition by connecting the 15-bit codeword and a subsequent 15-bit codeword, converts specific bits of the codewords if the codewords violate the MTR constraint condition, and does not convert the codewords if the codewords do not violate the MTR constraint condition.

Figure 2:
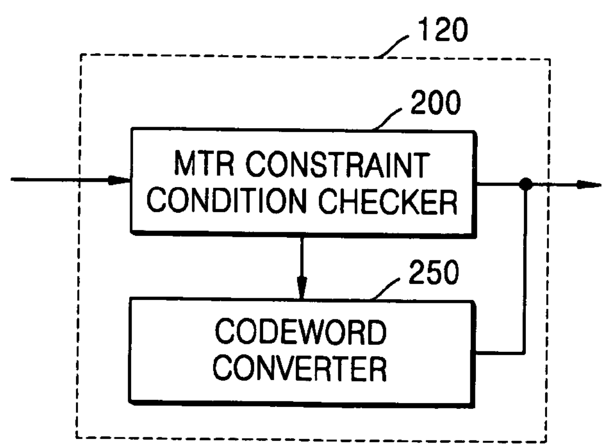
FIG. 2 is a block diagram of an MTR violation checking & converting unit of FIG. 1.

FIG. 2 is a block diagram of the MTR violation checking & converting unit 120 of FIG. 1. Referring to FIG. 2, the MTR violation checking & converting unit 120 includes an MTR constraint condition checker 200 and a codeword converter 250. When optional two codewords among the 8192 codewords are connected to each other and it is assumed that $c(k)=[x_{14}x_{13}x_{12} \ldots x_2x_1x_0(LSB)]$ represents a current codeword for which the codeword violation checking is performed and $c(k+1)=[y_{14}(MSB)y_{13}y_{12}\ldots y_2y_1y_0]$ represents a subsequent codeword, the MTR constraint condition checker 200 determines whether the last 3 bits ($x_2$, $x_1$, $x_0$) of the current codeword and the first 3 bits ($y_{14}$, $y_{13}$, $y_{12}$) of the subsequent codeword violate the MTR constraint condition.

When it is assumed that $z_0$ and $z_1$ indicate parameters for determining whether two codewords satisfy the j constraint condition (j=2) and $z_2$ indicates a parameter for determining whether the number of consecutive '0's is equal to or less than 8, the codeword converter 250 calculates $z_0$, $z_0$ and $z_2$ using Equation 1, Equation 2 and Equation 3. Accordingly the codeword converter 250 converts $x_1$ and $x_0$ into 0 and $x_2$ and $y_{13}$ into 1 so that j does not exceed 2 when $z_0=1$, converts $x_0$ and $y_{12}$ into 0 and $y_{13}$ into 1 so that j does not exceed 2 when $z_1=1$, and converts $y_{14}$ and $y_{13}$ into 1 so that k does not exceed 8 when $z_2=1$.

$$z_0=x_1\cdot x_0\cdot y_{14}\cdot \overline{y_{12}} \quad \text{[Equation 1]}$$

$$z_1=x_1\cdot x_0\cdot y_{14}\cdot y_{12} \quad \text{[Equation 2]}$$

$$z_2=x_2+x_1+x_0+y_{14}+y_{13}+y_{12} \quad \text{[Equation 3]}$$

Here, + indicates a modulo-2 add operation.

The parallel-to-serial converter 140 converts parallel codewords of the MTR violation checking & converting unit 120 to serial data. The precoder 160 changes a signal level of the serial data in order to record the serial data in a channel.

An operation of the rate-13/15 MTR encoding apparatus will now be described.

Figure 3:
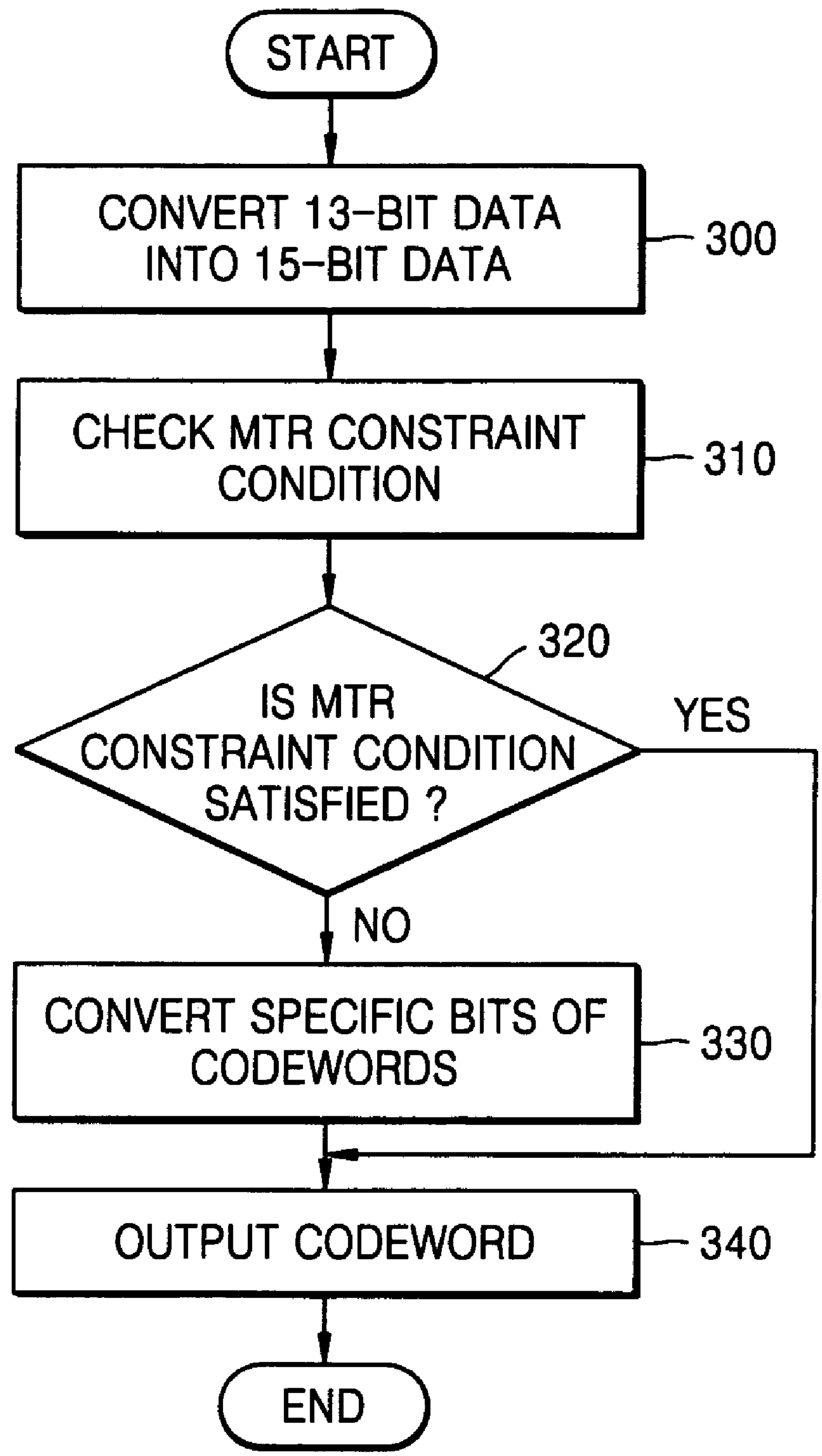
FIG. 3 is a flowchart of a rate-13/15 MTR encoding method according to an embodiment of the present invention.

FIG. 3 is a flowchart of a rate-13/15 MTR encoding method according to an embodiment of the present invention. Data is modulation-encoded from 13-bit data to 15-bit data using a code conversion table in operation 300. When the converted codewords are connected to each other, it is checked to determine whether a constraint condition (j=2, k=8) is satisfied at the boundary of the codewords in operation 310. If the constraint condition (j=2, k=8) is not satisfied in operation 320, specific bits of the codewords are converted in operation 330, and the converted codewords are output in operation 340.

In detail, 13-bit user data is input the 13/15 encoder 100, and a 15-bit codeword is output according to the rate-13/15 MTR code. The output codeword is checked with a previous converted codeword to determine whether the two codewords violate the MTR constraint condition by the MTR constraint condition checker 200. If the two codewords violate the MTR constraint condition, specific bits of the codewords are converted by the codeword converter 250. The codewords output from the MTR violation checking & converting unit 120 pass through the parallel-to-serial converter 140 and the precoder 160 and recorded in a magnetic write channel.

Figure 4:
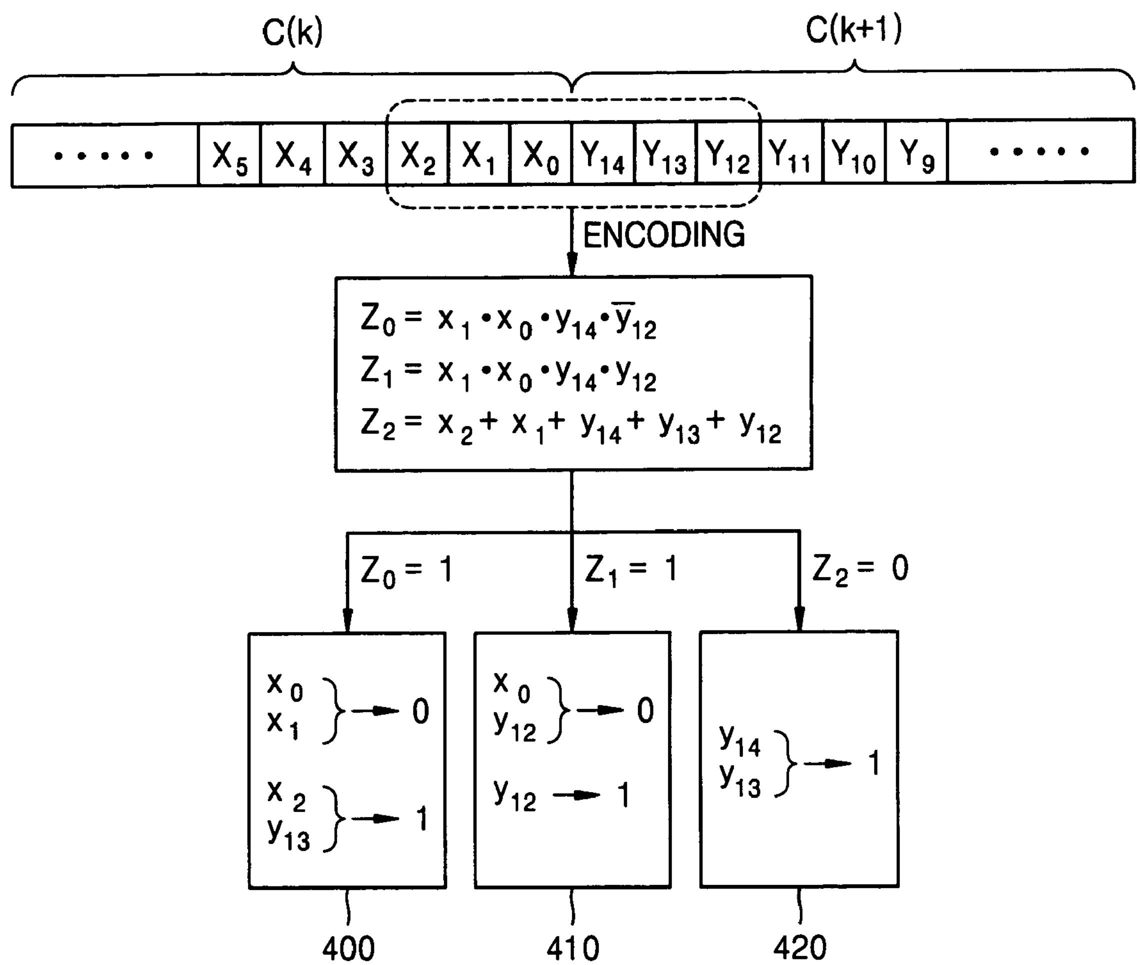
FIG. 4 is a diagram of an MTR condition violation checking and converting process for encoding.

FIG. 4 is a diagram of an MTR condition violation checking and converting process for encoding. A method of converting specific bits of codewords is as follows.

If a trailing edge of a codeword is '011' and a leading edge of a connected codeword is '100' or '101', the j constraint condition (j=2) is violated, that is, j=3. In this case, conversion is performed using codewords, which begin with '110', excluded from the code construction as follows;

. . . 011,100 . . . ⇒. . . 100,110 . . .

. . . 011,101 . . . ⇒. . . 010,110 . . . .

Also, if a trailing edge of a codeword is '000' and a leading edge of a connected codeword is '000', the k constraint condition (k=8) may not be satisfied. In this case, conversion is performed as follows;

. . . 000,000 . . . ⇒. . . 000,110 . . .

This will now be described in detail with reference to FIG. 4. When input data is ". . . 011,100 . . . ", since $x_0=1$, $x_1=1$, $x_2=0$, $y_{14}=1$, $y_{13}=0$, and $y_{12}=0$, $z_0=1$, $z_1=0$, and $z_2=1$ using Equations 1 through 3. Therefore, $x_1$ and $x_0$ are converted into 0, and $x_2$ and $y_{13}$ are converted into 1 as a reference number 400 of FIG. 4. That is, ". . . 011,100 . . . " becomes ". . . 100,110 . . . ."

When input data is ". . . 011,101 . . . ", since $x_0=1$, $x_1=1$, $x_2=0$, $y_{14}=1$, $y_{13}=0$, and $y_{12}=1$, $z_0=0$, $z_1=1$, and $z_2=1$ using Equations 1 through 3. Therefore, $x_0$ and $y_{12}$ are converted into 0, and $y_{13}$ is converted into 1 as a reference number 410 of FIG. 4. That is, ". . . 011,101 . . . " becomes ". . . 010,110 . . . "

When input data is ". . . 000,000 . . . ", since $x_0=0$, $x_1=0$, $x_2=0$, $y_{14}=0$, $y_{13}=0$, and $y_{12}=0$, $z_0=0$, $z_1=0$, and $z_2=0$ using Equations 1 through 3. Therefore, $y_{14}$ and $y_{13}$ are converted into 1 as a reference number 420 of FIG. 4. That is, ". . . 000,000 . . . " becomes ". . . 000,110 . . ."

All codewords except the above three cases satisfy the MTR constraint condition (j=2, k=8).

Figure 5:
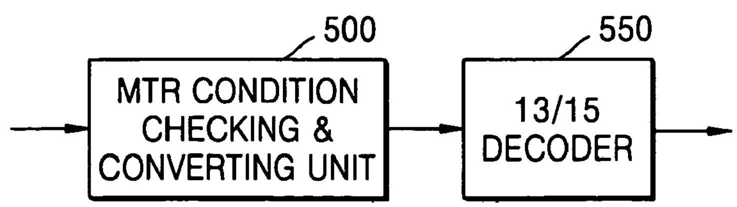
FIG. 5 is a block diagram of a rate-13/15 MTR decoding apparatus according to an embodiment of the present invention.

FIG. 5 is a block diagram of a rate-13/15 MTR decoding apparatus according to an embodiment of the present invention. Referring to FIG. 5, the rate-13/15 MTR decoding apparatus includes an MTR condition checking & converting unit 500 and a 13/15 decoder 550.

The MTR condition checking & converting unit 500 checks whether two codewords were MTR-code-converted to satisfy a predetermined MTR constraint condition when they were encoded by connecting a currently input 15-bit codeword and a subsequently input 15-bit codeword, converts specific bits of the codewords if the codewords were MTR-code-converted, and does not convert the codewords if the codewords were not MTR-code-converted.

The 13/15 decoder 550 decodes each 15-bit codeword output from the MTR condition checking & converting unit 500 to 13-bit data using a predetermined MTR code.

Figure 6:
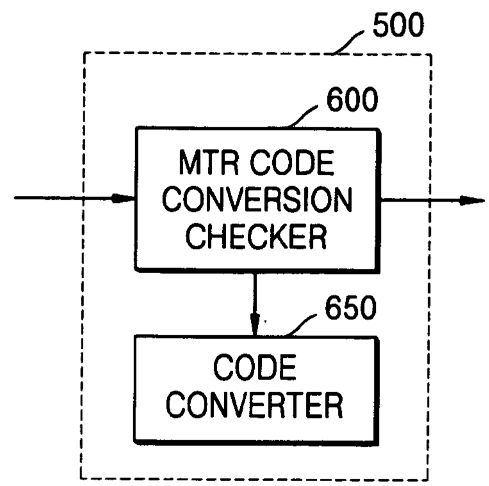
FIG. 6 is a block diagram of an MTR condition checking & converting unit of FIG. 5.

FIG. 6 is a block diagram of the MTR condition checking & converting unit 500 of FIG. 5. Referring to FIG. 6, the MTR condition checking & converting unit 500 includes an MTR code conversion checker 600 and a code converter 650.

When it is assumed that $\overline{c(k)}=[x_{14}x_{13}x_{12}\ldots x_2x_1x_0(LSB)]$ represents a current codeword for which the codeword violation checking is performed and $\overline{c(k+1)}=[y_{14}(MSB)y_{13}y_{12}\ldots y_2y_1y_0]$ represents a subsequent codeword, the MTR code conversion checker 600 determines whether the last 3 bits ($x_2$, $x_1$, $x_0$) of the current codeword and the first 3 bits ($y_{14}$, $y_{13}$, $y_{12}$) of the subsequent codeword were MTR-code-converted in order to check whether the codewords were converted to satisfy the MTR constraint condition when they were encoded.

The codeword converter 650 calculates $z_0$, $z_1$, and $z_2$ using Equation 4, Equation 5 and Equation 6, converts $x_1$ and $x_0$ into 1 and $x_2$ and $y_{13}$ into 0 when $z_0=1$, converting $x_0$ and $y_{12}$ into 1 and $y_{13}$ into 0 when $z_1=1$, and converting $y_{14}$ and $y_{13}$ into 0 when $z_2=1$.

$$z_0=x_2\cdot y_{14}\cdot y_{13} \quad \text{[Equation 4]}$$

$$z_1=x_1\cdot y_{14}\cdot y_{13} \quad \text{[Equation 5]}$$

$$z_2=\overline{x_2}\cdot\overline{x_1}\cdot\overline{x_0}\cdot y_{14}\cdot y_{13} \quad \text{[Equation 6 ]}$$

Figure 7:
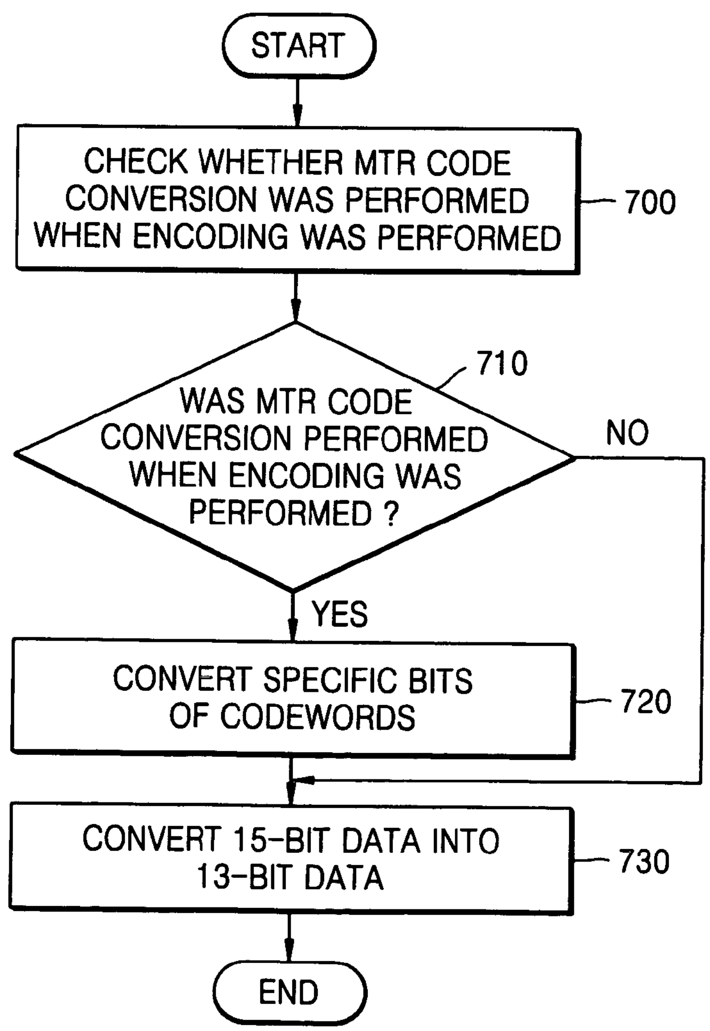
FIG. 7 is a flowchart of a rate-13/15 MTR decoding method according to an embodiment of the present invention.

An operation of the rate-13/15 MTR decoding apparatus will now be described. FIG. 7 is a flowchart of a rate-13/15

MTR decoding method according to an embodiment of the present invention. Referring to FIG. 7, it is checked to determine whether an input codeword was converted to satisfy the MTR constraint condition when the codeword was encoded in operation 700. If the input codeword was converted in operation 710, specific bits of the input codeword is converted in operation 720, and 15-bit data is modulated to 13-bit data in operation 730. If the input codeword was not converted in operation 710, 15-bit data is directly modulated to 13-bit data in operation 730.

In detail, when 15-bit data is input to the MTR condition checking & converting unit 500, the MTR code conversion checker 600 stores the input 15-bit data and checks whether the input 15-bit data was converted to satisfy the MTR constraint condition when the input 15-bit data was encoded by connecting the input 15-bit data to subsequent 15-bit data. That is, the MTR code conversion checker 600 determines whether the last 3 bits ($x_2$, $x_1$, $x_0$) of a current codeword $\overline{c(k)}$ and the first 3 bits ($y_{14}$, $y_{13}$, $y_{12}$) of a subsequent codeword $\overline{c(k+1)}$ were MTR-code-converted.

As a determination result of the MTR code conversion checker 600, if the input 15-bit data was converted when it was encoded, specific bits of the input 15-bit data are converted by the code converter 650, and the converted 15-bit data becomes original data by being modulated from 15-bit data to 13-bit data by the 13/15 decoder 550. If the input 15-bit data was not converted when it was encoded, the input 15-bit data directly becomes original data by being modulated from 15-bit data to 13-bit data by the 13/15 decoder 550.

Figure 8:
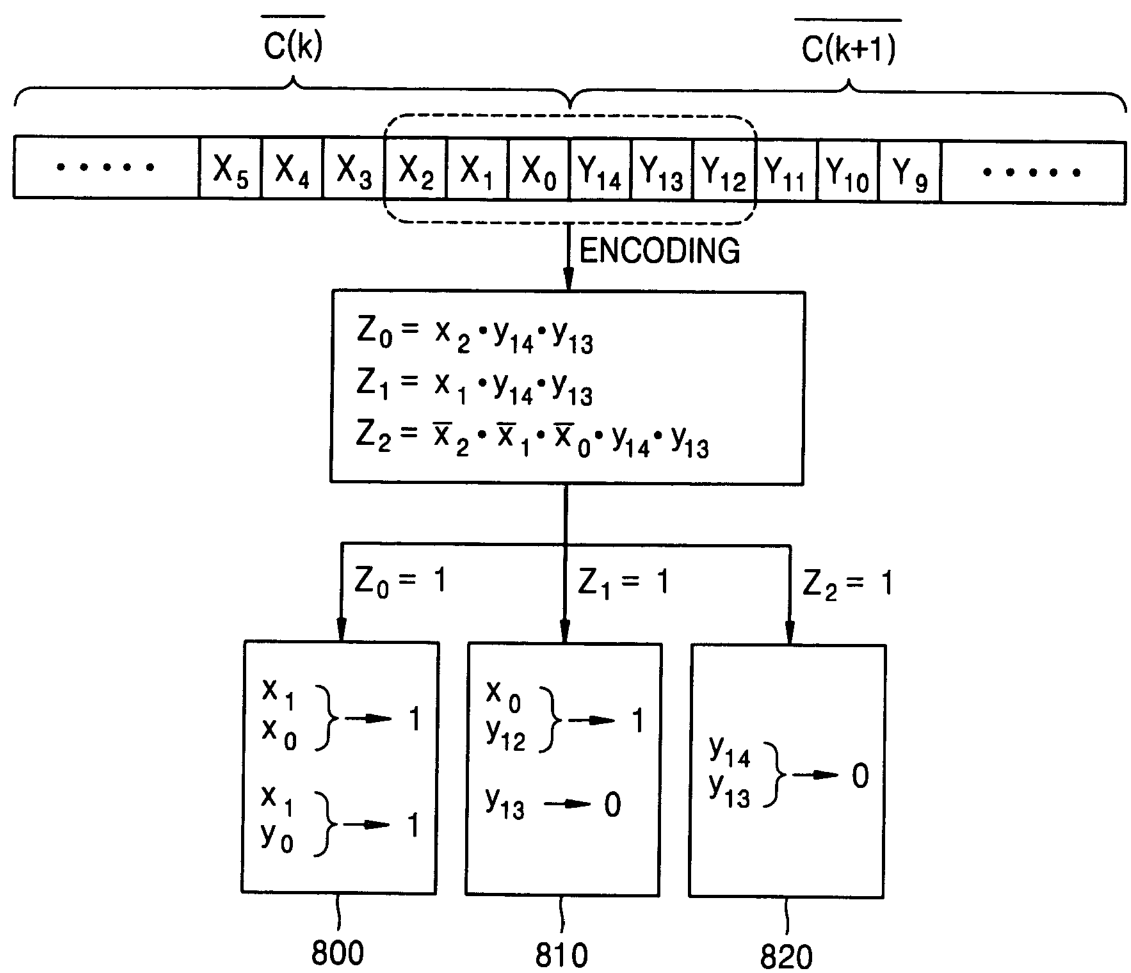
FIG. 8 is a diagram of an MTR condition conversion status checking and converting process for decoding.

FIG. 8 is a diagram of an MTR condition conversion status checking and converting process for decoding. A method of converting specific bits of codewords is as follows.

If a trailing edge of a codeword is '100' and a leading edge of a connected codeword is '110', the j constraint condition (j=2) was violated, that is, j=3 when the codewords were encoded. In this case, conversion is performed in reverse order of the encoding process as follows;

. . . 100,110 . . . ⇒. . . 011,100 . . .

. . . 010,110 . . . ⇒. . . 011,101 . . . .

Also, if a trailing edge of a codeword is '000' and a leading edge of a connected codeword is '110', the codewords were converted since the k constraint condition (k=8) might not be satisfied when the codewords were encoded. In this case, conversion is performed as follows;

. . . 000,110 . . . ⇒. . . 000,000 . . . .

This will now be described in detail with reference to FIG. 8. When input data is ". . . 100,110 . . . ", since $x_0$=0, $x_1$=0, $x_2$=1, $y_{14}$=1, $y_{13}$=1, and $y_{12}$=0, $z_0$=1, $z_1$=0, and $z_2$=0 using Equations 4 through 6. Therefore, $x_1$ and $x_0$ are converted into 1, and $x_2$ and $y_{13}$ are converted into 0 as a reference number 800 of FIG. 8. That is, ". . . 100,110 . . . " becomes ". . . 011,100 . . . ."

When input data is ". . . 010,110 . . . ", since $x_0$=0, $x_1$=1, $x_2$=0, $y_{14}$=1, $y_{13}$=1, and $y_{12}$=0, $z_0$=0, $z_1$=1, and $z_2$=0 using Equations 4 through 6. Therefore, $x_0$ and $y_{12}$ are converted into 1, and $y_{13}$ is converted into 0 as a reference number 810 of FIG. 8. That is, ". . . 010,110 . . . " becomes ". . . 011,101 . . . ."

When input data is ". . . 000,110 . . . ", since $x_0$=0, $x_1$=0, $x_2$=0, $y_{14}$=1, $y_{13}$=1, and $y_{12}$=0, $z_0$=0, $z_1$=0, and $z_2$=1 using Equations 4 through 6. Therefore, $y_{14}$ and $y_{13}$ are converted into 0 as a reference number 820 of FIG. 8. That is, ". . . 000,110 . . . " becomes ". . . 000,000 . . . ."

Figure 9:
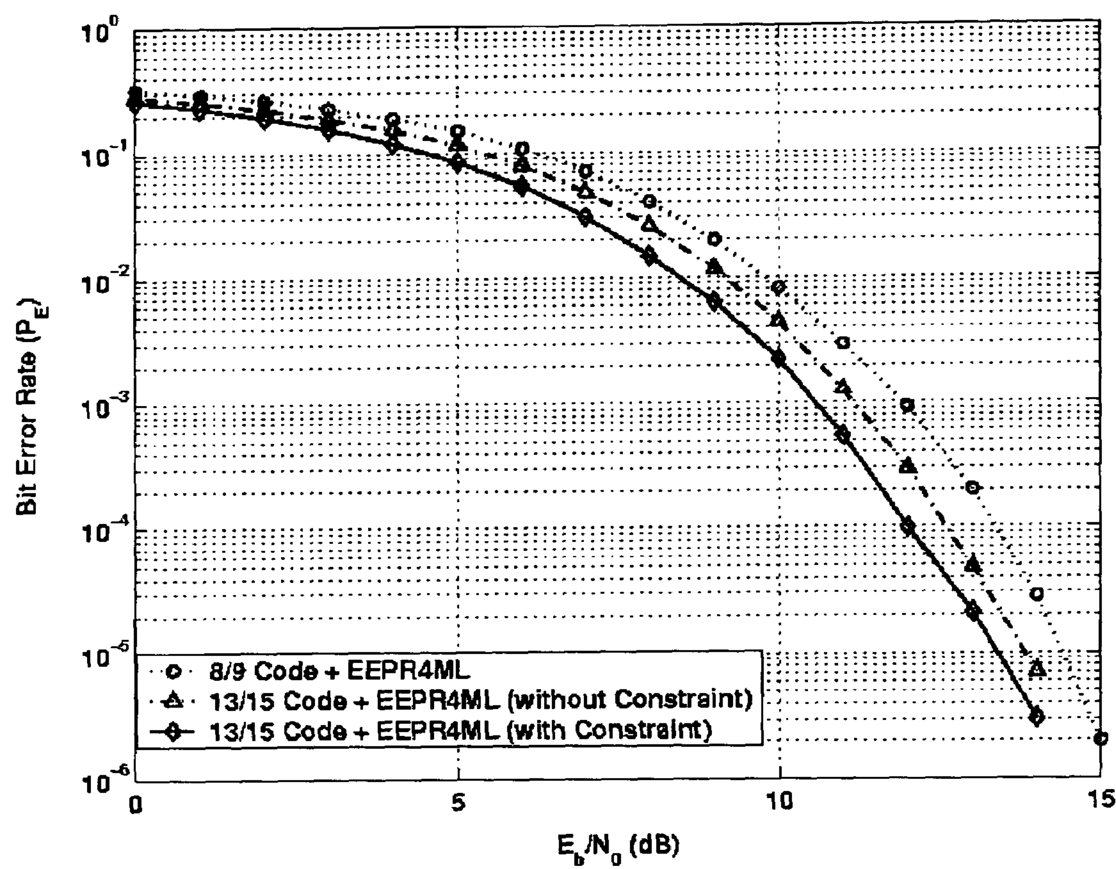
FIG. 9 is a graph used to compare performance of a rate-13/15 MTR code according to an embodiment of the present invention and a $4^{th}$ order PRML detector with performance of a rate-8/9 MTR code used in a conventional linear horizontal magnetic write system.

FIG. 9 is a graph used to compare performance of a rate-13/15 MTR code according to an embodiment of the present invention and a $4^{th}$ order partial response maximum likelihood (PRML) detector with performance of a rate-8/9 MTR code used in a conventional linear horizontal magnetic write system.

Here, a Lorentzian pulse is used in the used horizontal magnetic write channel, and an EEPR4ML detector is used when normalized density of a user bit is 2.5. As shown in FIG. 9, on the basis of a BER of $10^{-5}$ in high write density, the detection performance of the rate-8/9 code is deteriorated by more than 1.5 dB compared to the performance of the rate-13/15 code according to an embodiment of the present invention. As a reason of the comparison result, in a case of the 8/9 code, since consecutive transitions can be generated for up to 12 bits, interference between neighboring symbols become severe if write density becomes higher, thereby decreasing detection performance.

Figure 10:
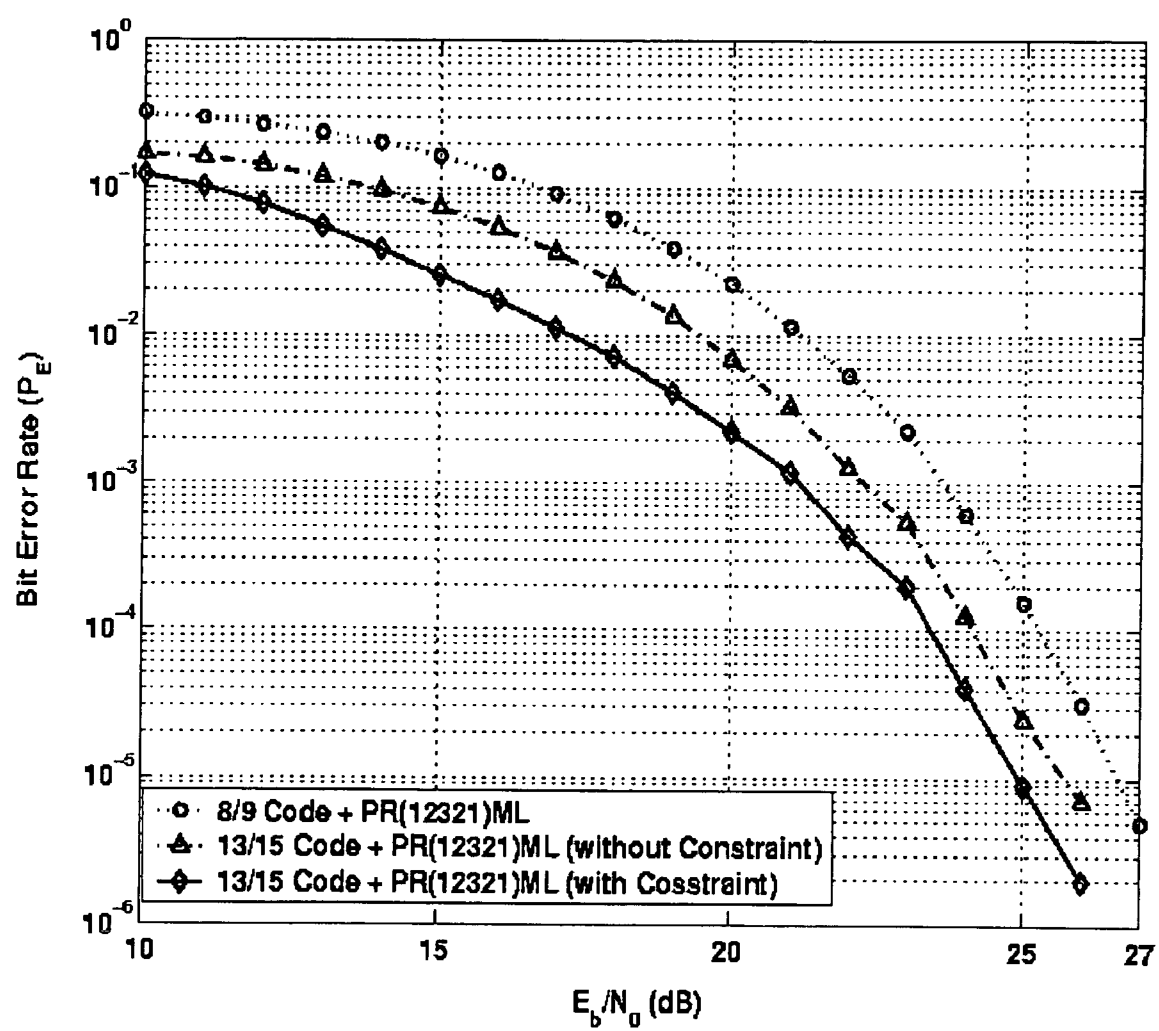
FIG. 10 is a graph used to compare performance of a rate-13/15 MTR code according to an embodiment of the present invention and a $4^{th}$ order PRML detector with performance of a rate-8/9 MTR code used in a conventional linear vertical magnetic write system.

FIG. 10 is a graph used to compare performance of a rate-13/15 MTR code according to an embodiment of the present invention and a $4^{th}$ order PRML detector with performance of a rate-8/9 MTR code used in a conventional linear vertical magnetic write system.

Here, a PR(12321)ML detector is used in a vertical magnetic write channel when normalized density of a user bit is 1.5. As shown in FIG. 10, on the basis of a BER of $10^{-5}$ in high write density, the detection performance of the rate-8/9 code is deteriorated by about 2 dB compared to the performance of the rate-13/15 code according to an embodiment of the present invention.

The invention can also be embodied as computer (including all apparatuses having a information processing function) readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices.

As described above, according to a rate-13/15 MTR code encoding/decoding method and apparatus according to embodiments of the present invention, detection performance is improved compared to conventional general modulation codes, and a relatively higher code rate than conventional MTR codes where the number of data transitions is 2 or less is achieved.

Also, since data can be reliably reproduced with high write density, a large amount of data can be stored in and reproduced from a magnetic recording information storage medium.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A rate-13/15 maximum transition run (MTR) code encoding method comprising:

(a) generating a predetermined rate-13/15 MTR code in which 13-bit data corresponds to 15-bit data;

(b) outputting inputted 13-bit data as a 15-bit codeword according to the predetermined rate-13/15 MTR code;

(c) checking whether a plurality of 15-bit codewords satisfy a predetermined constraint condition by connecting a current 15-bit codeword of the plurality of 15-bit codewords and a subsequent 15-bit codeword of the plurality of 15-bit codewords; and (d) converting specific bits of at least one of the current and the subsequent 15-bit codewords if the current and the subsequent 15-bit codewords violate the predetermined constraint condition and not converting the current and the subsequent 15-bit codewords if the current and the subsequent 15-bit codewords do not violate the predetermined constraint condition, and the rate-13/15 MTR code comprises 8192 codewords.

2. The method of claim 1, wherein the predetermined constraint condition in (c) comprises:

a constraint condition (j=2) allowing at most 2 consecutive data transitions; and a constraint condition (k=8) allowing a number of consecutive '0's to be equal to or less than 8, and the (c) checking comprises:

when the current and the subsequent 15-bit codewords among the 8192 codewords are connected and $c(k)=[x_{14}x_{13}x_{12} \ldots x_2x_1x_0]$ represents the current 15-bit codeword for which codeword violation checking is performed and $c(k+1)=[y_{14}y_{13}y_{12} \ldots y_2y_1y_0]$ represents the subsequent 15-bit codeword, determining whether last 3 bits ($x_2$, $x_1$, $x_0$) of the current 15-bit codeword and first 3 bits ($y_{14}$, $y_{13}$, $y_{12}$) of the subsequent 15-bit codeword violate the predetermined constraint condition, and the (d) converting comprises:

when $z_0$ and $z_1$ indicate parameters for determining whether the current and the subsequent 15-bit codewords satisfy the constraint condition (j=2) and $z_2$ indicates a parameter for determining whether the current and the subsequent 15-bit codewords satisfy the constraint condition (k=8), calculating $z_0$, $z_1$, and $z_2$ using $z_0=x_1 \cdot x_0 \cdot y_{14} \cdot \overline{y_{12}}$, $z_1=x_1 \cdot x_0 \cdot y_{14} \cdot y_{12}$, and $z_2=x_2+x_1+x_0+y_{14}+y_{13}+y_{12}$, wherein + indicates a modulo-2 add operation; and converting $x_1$ and $x_0$ into 0 and $x_2$ and $y_{13}$ into 1 so that j does not exceed 2 when $z_0=1$, converting $x_0$ and $y_{12}$ into 0 and $y_{13}$ into 1 so that j does not exceed 2 when $z_1=1$, and converting $y_{14}$ and $y_{13}$ into 1 so that k does not exceed 8 when $z_2=1$.

3. The method of claim 1, wherein the 8192 codewords are obtained by excluding optional 40 codewords from 8232 codewords, the 8232 codewords being obtained by excluding 230 codewords, each having '11011' at a corresponding trailing edge, 420 codewords, each having 8 or more consecutive '0's, and 22 codewords, each having 7 consecutive '0's at a corresponding leading edge or a corresponding trailing edge, from selected 8904 codewords, the selected 8904 codewords being obtained by adding 7473 codewords, each having a number of 1s at corresponding leading two bits and/or a number of 1s at corresponding trailing two bits of at most 1, respectively, and 1431 codewords, each having '11' at a corresponding trailing edge.

4. The method of claim 1, wherein the 8192 codewords are obtained in order to prevent the number of consecutive transitions from becoming 3 at code boundaries in a modulation coding process.

5. A rate-13/15 maximum transition run (MTR) code encoding apparatus comprising:

a 13/15 encoder generating a rate-13/15 MTR code for outputting 13-bit data as a predetermined 15-bit codeword; and an MTR violation checking & converting unit checking whether a plurality of predetermined 15-bit codewords satisfy a predetermined constraint condition by connecting a current 15-bit codeword of the plurality of 15-bit codewords and a subsequent 15-bit codeword of the plurality of 15-bit codewords, converting specific bits of at least one of the current and the subsequent 15-bit codewords if the current and the subsequent 15-bit codewords violate the predetermined constraint condition, and not converting the current and the subsequent 15-bit codewords if the current and the subsequent 15-bit codewords do not violate the predetermined constraint condition, and the rate-13/15 MTR code comprises 8192 codewords.

6. The apparatus of claim 5, wherein the MTR violation checking & converting unit comprises:

an MTR constraint condition checker determining whether last 3 bits ($x_2$, $x_1$, $x_0$) of the current 15-bit codeword and first 3 bits ($y_{14}$, $y_{13}$, $y_{12}$) of the subsequent 15-bit codeword violate the predetermined constraint condition when the current and the subsequent 15-bit codewords among the 8192 codewords are connected to each other and c(k) represents the current 15-bit codeword for which the codeword violation checking is performed and c(k+1) represents the subsequent 15-bit codeword; and a codeword converter converting $x_1$ and $x_0$ into 0 and $x_2$ and $y_{13}$ into 1 so that j does not exceed 2 when $z_0=1$, converting $x_0$ and $y_{12}$ into 0 and $y_{13}$ into 1 so that j does not exceed 2 when $z_1=1$, and converting $y_{14}$ and $y_{13}$ into 1 so that k does not exceed 8 when $z_2=1$ by calculating $z_0$, $z_1$, and $z_2$ using $z_0=x_1 \cdot x_0 \cdot y_{14} \cdot \overline{y_{12}}$, $z_1=x_1 \cdot x_0 \cdot y_{14} \cdot y_{12}$, and $z_2=x_2+x_1+x_0+y_{14}+y_{13}+y_{12}$, wherein + indicates a modulo-2 add operation, when $z_0$ and $z_1$ indicate parameters for determining whether the current and the subsequent 15-bit codewords satisfy the j constraint condition (j=2) and $z_2$ indicates a parameter for determining whether the current and the subsequent 15-bit codewords satisfy the constraint condition (k=8).

7. The apparatus of claim 5, further comprising:

a parallel-to-serial converter converting parallel codewords of the MTR violation checking & converting unit into serial data; and a precoder changing a signal level of the serial data in order to record the serial data in a channel.

8. The apparatus of claim 5, wherein the 8192 codewords are obtained by excluding optional 40 codewords from 8232 codewords, the 8232 codewords being obtained by excluding 230 codewords, each having '11011' at a corresponding trailing edge, 420 codewords, each having 8 or more consecutive '0's, and 22 codewords, each having 7 consecutive '0's at a corresponding leading edge or a corresponding trailing edge from selected 8904 codewords, the selected 8904 codewords being obtained by adding 7473 codewords, each having a number of 1s at corresponding leading two bits and/or a number of 1s at corresponding trailing two bits of at most 1, respectively, and 1431 codewords, each having '11' at a corresponding trailing edge.

9. The apparatus of claim 5, wherein the 8192 codewords are obtained in order to prevent the number of consecutive transitions from becoming 3 at code boundaries in a modulation coding process.

10. A rate-13/15 maximum transition run (MTR) code decoding method comprising:

(1) checking whether two codewords were MTR-code-converted to satisfy a predetermined MTR constraint condition when the two codewords were encoded by connecting a currently input 15-bit codeword and a subsequently input 15-bit codeword;

(2) if the current and the subsequent 15-bit codewords were MTR-code-converted, converting specific bits of at least one of the current and the subsequent 15-bit codewords, and if the current and the subsequent 15-bit codewords were not MTR-code-converted, not converting the current and the subsequent 15-bit codewords; and (3) decoding each of a plurality of 15-bit codewords, which has passed through (2), into 13-bit data using a predetermined MTR code, wherein the predetermined MTR code comprises:

8192 codewords obtained by excluding optional 40 codewords from 8232 codewords, the 8232 codewords being obtained by excluding 230 codewords, each having '11011' at a corresponding trailing edge, 420 codewords, each having 8 or more consecutive '0's, and 22 codewords, each having 7 consecutive '0's at a corresponding leading edge or a corresponding trailing edge, from selected 8904 codewords, the selected 8904 codewords being obtained by adding 7473 codewords, each having a number of 1s at corresponding leading two bits and/or a number of 1s at corresponding trailing two bits of at most 1, respectively, and 1431 codewords, each having '11' at a corresponding trailing edge.

11. The method of claim 10, wherein the (1) checking comprises:

when $\overline{c(k)}=[x_{14}x_{13}x_{12}\ldots x_2x_1x_0]$ represents the current 15-bit codeword for which codeword violation checking is performed and $\overline{c(k+1)}=[y_{14}y_{13}y_{12}\ldots y_2y_1y_0]$ represents the subsequent 15-bit codeword, determining whether last 3 bits ($x_2$, $x_1$, $x_0$) of the current 15-bit codeword and first 3 bits ($y_{14}$, $y_{13}$, $y_{12}$) of the subsequent 15-bit codeword violate the predetermined MTR constraint condition, and the (2) converting comprises:

calculating $z_0$, $z_1$, and $z_2$ using $z_0=x_2\cdot y_{14}\cdot y_{13}$, $z_1=x_1\cdot y_{14}\cdot y_{13}$, and $z_2=\overline{x_2}\cdot\overline{x_1}\cdot\overline{x_0}\cdot y_{14}\cdot y_{13}$; and converting $x_1$ and $x_0$ into 1 and $x_2$ and $y_{13}$ into 0 when $z_0=1$, converting $x_0$ and $y_{12}$ into 1 and $y_{13}$ into 0 when $z_1=1$, and converting $y_{14}$ and $y_{13}$ into 0 when $z_2=1$.

12. The method of claim 10, wherein the 8192 codewords are obtained in order to prevent the number of consecutive transitions from becoming 3 at code boundaries in a modulation coding process.

13. A rate-13/15 maximum transition run (MTR) code decoding apparatus comprising:

an MTR condition checking & converting unit checking whether two codewords were MTR-code-converted to satisfy a predetermined MTR constraint condition when the two codewords were encoded by connecting a currently input 15-bit codeword and a subsequently input 15-bit codeword, converting specific bits of at least one of the current and the subsequent 15-bit codewords if the current and the subsequent 15-bit codewords were MTR-code-converted, and not converting the current and the subsequent 15-bit codewords if the current and the subsequent 15-bit codewords were not MTR-code-converted; and a 13/15 decoder decoding each of a plurality of 15-bit codewords output from the MTR condition checking & converting unit to 13-bit data using a predetermined MTR code, and the predetermined MTR code comprises:

8192 codewords obtained by excluding optional 40 codewords from 8232 codewords, the 8232 codewords being obtained by excluding 230 codewords, each having '11011' at a corresponding trailing edge, 420 codewords, each having 8 or more consecutive '0's, and 22 codewords, each having 7 consecutive '0's at a corresponding leading edge or a corresponding trailing edge, from selected 8904 codewords, the selected 8904 codewords being obtained by adding 7473 codewords, each having a number of 1s at corresponding leading two bits and/or a number of 1s at corresponding trailing two bits of at most 1, respectively, and 1431 codewords, each having '11' at a corresponding trailing edge.

14. The apparatus of claim 13, wherein the MTR condition checking & converting unit comprises:

an MTR code conversion checker, when $\overline{c(k)}=[x_{14}x_{13}x_{12}\ldots x_2x_1x_0]$ represents the current 15-bit codeword for which codeword violation checking is performed and $\overline{c(k+1)}=[y_{14}y_{13}y_{12}\ldots y_2y_1y_0]$ represents the subsequent 15-bit codeword, determining whether the last 3 bits ($x_2$, $x_1$, $x_0$) of the current 15-bit codeword and the first 3 bits ($y_{14}$, $y_{13}$,$y_{12}$) of the subsequent 15-bit codeword were MTR-code-converted when the current and the subsequent 15-bit codewords were encoded; and a codeword converter converting $x_1$ and $x_0$ into 1 and $x_2$ and $y_{13}$ into 0 when $z_0=1$, converting $x_0$ and $y_{12}$ into 1 and $y_{13}$ into 0 when $z_1=1$, and converting $y_{14}$ and $y_{13}$ into 0 when $z_2=1$by calculating $z_0$, $z_1$, and $z_2$ using $z_0=x_2\cdot y_{14}\cdot y_{13}$, $z_1=x_1\cdot y_{14}\cdot y_{13}$, and $z_2=\overline{x_2}\cdot\overline{x_1}\cdot\overline{x_0}\cdot y_{14}\cdot y_{13}$.

15. The method of claim 13, wherein the 8192 codewords are obtained in order to prevent the number of consecutive transitions from becoming 3 at code boundaries in a modulation coding process.

16. A computer readable medium having recorded thereon a computer readable program for performing the method of rate-13/15 maximum transition run (MTR) code encoding comprising:

(a) generating a predetermined rate-13/15 MTR code in which 13-bit data corresponds to 15-bit data;

(b) outputting inputted 13-bit data as a 15-bit codeword according to the predetermined rate-13/15 MTR code;

(c) checking whether a plurality of 15-bit codewords satisfy a predetermined constraint condition by connecting a current 15-bit codeword of the plurality of 15-bit codewords and a subsequent 15-bit codeword of the plurality of 15-bit codewords; and (d) converting specific bits of at least one of the current and the subsequent 15-bit codewords if the current and the subsequent 15-bit codewords violate the predetermined constraint condition and not converting the current and the subsequent 15-bit codewords if the current and the subsequent 15-bit codewords do not violate the predetermined constraint condition, and the rate-13/15 MTR code comprises 8192 codewords.

17. The computer readable medium of claim 16 having recorded thereon a computer readable program for performing the method of rate-13/15 maximum transition run (MTR) code encoding, wherein the 8192 codewords are obtained by excluding optional 40 codewords from 8232 codewords, the 8232 codewords being obtained by excluding 230 codewords, each having '11011' at a corresponding trailing edge, 420 codewords, each having 8 or more consecutive '0's, and 22 codewords, each having 7 consecutive '0's at a corresponding leading edge or a corresponding trailing edge, from selected 8904 codewords, the selected 8904 codewords being obtained by adding 7473 codewords, each having a number of 1s at corresponding leading two bits and/or a number of 1s at corresponding trailing two bits of at most 1, respectively, and 1431 codewords, each having '11' at a corresponding trailing edge.

18. The computer readable medium of claim 16 having recorded thereon a computer readable program for performing the method of rate-13/15 maximum transition run (MTR) code encoding, wherein the predetermined constraint condition in (c) comprises:

a constraint condition (j=2) allowing at most 2 consecutive data transitions; and a constraint condition (k=8) allowing a number of consecutive '0's to be equal to or less than 8, and the (c) checking comprises:

when the current and the subsequent 15-bit codewords among the 8192 codewords are connected and $c(k)=[x_{14}x_{13}x_{12} \ldots x_2x_1x_0]$ represents the current 15-bit codeword for which codeword violation checking is performed and $c(k+1)=[y_{14}y_{13}y_{12} \ldots y_2y_1y_0]$ represents the subsequent 15-bit codeword, determining whether last 3 bits ($x_2$, $x_1$, $x_0$) of the current 15-bit codeword and first 3 bits ($y_{14}$, $y_{13}$, $y_{12}$) of the subsequent 15-bit codeword violate the predetermined constraint condition, and the (d) converting comprises:

when $z_0$ and $z_1$ indicate parameters for determining whether the current and the subsequent 15-bit codewords satisfy the constraint condition (j=2) and $z_2$ indicates a parameter for determining whether the current and the subsequent 15-bit codewords satisfy the constraint condition (k=8), calculating $z_0$, $z_1$, and $z_2$ using $z_0=x_1 \cdot x_0 \cdot y_{14} \cdot \overline{y_{12}}$, $z_1=x_1 \cdot x_0 \cdot y_{14} \cdot y_{12}$, and $z_2=x_2+x_1+x_0+y_{14}+y_{13}+y_{12}$, wherein + indicates a modulo-2 add operation; and converting $x_1$ and $x_0$ into 0 and $x_2$ and $y_{13}$ into 1 so that j does not exceed 2 when $z_0=1$, converting $x_0$ and $y_{12}$ into 0 and $y_{13}$ into 1 so that j does not exceed 2 when $z_1=1$, and converting $y_{14}$ and $y_{13}$ into 1 so that k does not exceed 8 when $z_2=1$.

19. A computer readable medium having recorded thereon a computer readable program for performing the method of rate-13/15 maximum transition run (MTR) code decoding comprising:

(1) checking whether two codewords were MTR-code-converted to satisfy a predetermined MTR constraint condition when the two codewords were encoded by connecting a currently input 15-bit codeword and a subsequently input 15-bit codeword;

(2) if the current and the subsequent 15-bit codewords were MTR-code-converted, converting specific bits of at least one of the current and the subsequent 15-bit codewords, and if the current and the subsequent 15-bit codewords were not MTR-code-converted, not converting the current and the subsequent 15-bit codewords; and (3) decoding each of a plurality of 15-bit codewords, which has passed through (2), into 13-bit data using a predetermined MTR code, wherein the predetermined MTR code comprises:

8192 codewords obtained by excluding optional 40 codewords from 8232 codewords, the 8232 codewords being obtained by excluding 230 codewords, each having '11011' at a corresponding trailing edge, 420 codewords, each having 8 or more consecutive '0's, and 22 codewords, each having 7 consecutive '0's at a corresponding leading edge or a corresponding trailing edge, from selected 8904 codewords, the selected 8904 codewords being obtained by adding 7473 codewords, each having a number of 1s at corresponding leading two bits and/or a number of 1s at corresponding trailing two bits of at most 1, respectively, and 1431 codewords, each having '11' at a corresponding trailing edge.

20. The computer readable medium of claim 19 having recorded thereon a computer readable program for performing the method of rate-13/15 maximum transition run (MTR) code decoding, wherein the (1) checking comprises:

when $\overline{c(k)}=[x_{14}x_{13}x_{12} \ldots x_2x_1x_0]$ represents the current 15-bit codeword for which codeword violation checking is performed and $\overline{c(k+1)}=[y_{14}y_{13}y_{12} \ldots y_2y_1y_0]$ represents the subsequent 15-bit codeword, determining whether last 3 bits ($x_2$, $x_1$, $x_0$) of the current 15-bit codeword and first 3 bits ($y_{14}$, $y_{13}$, $y_{12}$) of the subsequent 15-bit codeword violate the predetermined MTR constraint condition, and the (2) converting comprises:

calculating $z_0$, $z_1$, and $z_2$ using $z_0=x_2 \cdot y_{14} \cdot y_{13}$, $z_1=x_1 \cdot y_{14} \cdot y_{13}$, and $z_2=\overline{x_2} \cdot \overline{x_1} \cdot \overline{x_0} \cdot y_{14} \cdot y_{13}$; and converting $x_1$ and $x_0$ into 1 and $x_2$ and $y_{13}$ into 0 when $z_0=1$, converting $x_0$ and $y_{12}$ into 1 and $y_{13}$ into 0 when $z_1=1$, and converting $y_{14}$ and $y_{13}$ into 0 when $z_2=1$.

* * * * *